(12) United States Patent
Li et al.

(10) Patent No.: US 12,713,547 B2
(45) Date of Patent: Aug. 18, 2026

(54) ROTATING SHAFT ASSEMBLY AND ELECTRONIC DEVICE

(71) Applicant: Huawei Technologies Co., Ltd., Shenzhen (CN)

(72) Inventors: Liang Li, Dongguan (CN); Wei Chen, Shenzhen (CN); Zhangjun Chen, Dongguan (CN); Xianchun Zhang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 92 days.

(21) Appl. No.: 18/723,785

(22) PCT Filed: Dec. 29, 2022

(86) PCT No.: PCT/CN2022/143354

§ 371 (c)(1),
(2) Date: Jun. 24, 2024

(87) PCT Pub. No.: WO2023/125794

PCT Pub. Date: Jul. 6, 2023

(65) Prior Publication Data

US 2025/0107025 A1 Mar. 27, 2025

(30) Foreign Application Priority Data

Dec. 31, 2021 (CN) ........................ 202111677019.6

(51) Int. Cl.
*H05K 5/02* (2006.01)

(52) U.S. Cl.
CPC .................................. *H05K 5/0226* (2013.01)

(58) Field of Classification Search
None
See application file for complete search history.

(56) References Cited

U.S. PATENT DOCUMENTS 4,986,763 A * 1/1991 Boyle .................. G06F 1/1635 439/165
6,266,238 B1 * 7/2001 Paulsel .................. G06F 1/189 361/679.55

(Continued)

FOREIGN PATENT DOCUMENTS

CN 1420675 A 5/2003
CN 1688825 A 10/2005

(Continued)

*Primary Examiner* — James Wu
*Assistant Examiner* — Christopher L Augustin
(74) *Attorney, Agent, or Firm* — Slater Matsil, LLP

(57) ABSTRACT

A rotating shaft assembly, including a shaft sleeve which has an inner cavity, a second shaft, and a flexible circuit board. A part of the second shaft is located in the inner cavity and is rotatably connected to the shaft sleeve, and the other part of the second shaft is located outside the inner cavity. The flexible circuit board includes a first electrical connection end and a second electrical connection end located outside the inner cavity, a mounting part located between the first electrical connection end and the second electrical connection end, which includes a wound part and a laminated part that are connected, the wound part is wound around the part that is of the second shaft and located in the inner cavity, the laminated part is in a folded state, and at least a part of the laminated part is accommodated in a channel of the second shaft.

30 Claims, 78 Drawing Sheets

(56) References Cited

U.S. PATENT DOCUMENTS

| | | | | |
|---|---|---|---|---|
| 2004/0020012 | A1 | 2/2004 | Gupte | |
| 2005/0035912 | A1* | 2/2005 | Takagi | H04M 1/0212 343/702 |
| 2009/0007379 | A1 | 1/2009 | Zhang et al. | |
| 2022/0035411 | A1* | 2/2022 | Abe | G02F 1/1345 |

FOREIGN PATENT DOCUMENTS

| | | | |
|---|---|---|---|
| EP | 1182749 | A1 | 2/2002 |
| JP | 2009144926 | A | 7/2009 |
| JP | 2009246380 | A | 10/2009 |

* cited by examiner

26

Direction A

ROTATING SHAFT ASSEMBLY AND ELECTRONIC DEVICE

CROSS-REFERENCE TO RELATED APPLICATIONS

This application is a national stage of International Application No. PCT/CN2022/143354, filed on Dec. 29, 2022, which claims priority to Chinese Patent Application No. 202111677019.6, filed on Dec. 31, 2021. Both of the aforementioned applications are incorporated herein by reference in their entireties.

TECHNICAL FIELD

This application relates to the field of electronic products, and in particular, to a rotating shaft assembly and an electronic device.

BACKGROUND

Some electronic devices have rotating shafts. An electronic device may implement opening and closing by using a rotating shaft. An electrical signal needs to be transmitted between two parts that are connected by using the rotating shaft in the electronic device. How to implement signal transmission by using a rotating shaft becomes an urgent problem to be resolved.

SUMMARY

Embodiments of this application provide a rotating shaft assembly and an electronic device, so that signal transmission between two parts of the electronic device can be implemented by using a rotating shaft structure.

According to a first aspect, an embodiment of this application provides a rotating shaft assembly, including: a shaft sleeve, a second shaft, and a flexible circuit board, where the shaft sleeve has an inner cavity; a channel is formed on the second shaft, a part of the second shaft is located in the inner cavity and is rotatably connected to the shaft sleeve, and the other part of the second shaft is located outside the inner cavity; and the flexible circuit board includes a first electrical connection end, a mounting part, and a second connection end, the mounting part is located between the first electrical connection end and the second electrical connection end, both the first electrical connection end and the second electrical connection end are located outside the inner cavity, the mounting part includes a wound part and a laminated part that are connected, the wound part is wound around the part that is of the second shaft and that is located in the inner cavity, the laminated part is in a folded state, and at least a part of the laminated part is accommodated in the channel of the second shaft.

In this solution, the flexible circuit board is wound around the second shaft, the flexible circuit board is folded and accommodated in the second shaft, and the two electrical connection ends of the flexible circuit board are respectively and electrically connected to two parts of an electronic device, so that signal transmission between the two parts of the electronic device can be implemented by using the rotating shaft assembly. In addition, the winding design helps to use internal space of the shaft sleeve to accommodate the flexible circuit board having a length design requirement, and the folding design helps to use internal space of the second shaft to accommodate the flexible circuit board having a width design requirement, thereby ensuring that performance of the flexible circuit board can meet a product requirement.

In an implementation of the first aspect, a joint between the wound part and the laminated part is fastened to the second shaft. In this design, the wound part can be reliably fastened on the second shaft, and it can be ensured that a length of a movable part of the wound part meets a relaxation motion or a tightening motion of the wound part caused by opening and closing of the electronic device.

In an implementation of the first aspect, the flexible circuit board includes a separation bracket, and the separation bracket is fastened between folded layers of the laminated part. The separation bracket can avoid excessive bending of the flexible circuit board.

In an implementation of the first aspect, the inner cavity of the shaft sleeve has an opening that communicates with the outside; the rotating shaft assembly includes a clamping member, the clamping member is provided with a clamping gap, the clamping member is fastened on an outer side of the shaft sleeve and blocks at least a part of an area of the opening of the inner cavity, and the clamping gap communicates with the inner cavity; and the flexible circuit board includes a connection part, the connection part connects the first electrical connection end and the wound part, and the connection part passes through the opening of the inner cavity and the clamping gap. The clamping member can limit the flexible circuit board, ensure that motion of the flexible circuit board is controllable, and further facilitate assembly of the flexible circuit board.

In an implementation of the first aspect, an edge of the connection part forms a limiting portion, and the limiting portion is clamped with an edge of the clamping gap. This design can limit the flexible circuit board and facilitate positioning of the flexible circuit board during mounting.

In an implementation of the first aspect, the flexible circuit board includes a protective layer, and the protective layer is attached to a surface of the laminated part. The protective layer can prevent the flexible circuit board from being scratched, and ensure reliability of the flexible circuit board.

In an implementation of the first aspect, the flexible circuit board includes a grounding portion, and the grounding portion is configured to be grounded. In this way, the flexible circuit board can be grounded to avoid interference from the flexible circuit board to an antenna of the electronic device.

In an implementation of the first aspect, the rotating shaft assembly includes a driven member, an elastic member, and a first shaft; the driven member has a shaft matching surface and a through hole, the through hole of the driven member penetrates the shaft matching surface, the driven member is located in the inner cavity, and the driven member is capable of sliding along a surface of the inner cavity, but is not capable of rotating relative to the shaft sleeve; the elastic member is located in the inner cavity, and presses against a surface that is of the driven member and that is away from the shaft matching surface; the first shaft and the second shaft are respectively located at two opposite ends of the shaft sleeve; a part of the first shaft is located in the inner cavity and is rotatably connected to the shaft sleeve; the part that is of the first shaft and that is located in the inner cavity passes through the through hole of the driven member, and matches the shaft matching surface of the driven member to form a cam mechanism; and the other part of the first shaft is located outside the inner cavity; and the shaft sleeve is capable of rotating around the first shaft and the second shaft, and a rotation stroke of the shaft sleeve includes a first stroke segment, a second stroke segment, and a third stroke segment, where in the first stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft; in the second stroke segment, the shaft sleeve is capable of being driven by an external force to rotate around the first shaft and the second shaft, to drive the driven member to rotate around the first shaft; and in the third stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft.

In this solution, the shaft sleeve may be fixedly connected to a part of the electronic device, and the part of the electronic device rotates synchronously with the shaft sleeve. By enabling the shaft sleeve to have different motion characteristics in each stroke, the part of the electronic device can also have a same motion characteristic as the shaft sleeve. This can create a special hand feeling for a user, and greatly improve user experience.

In an implementation of the first aspect, the shaft matching surface includes a first slope, a plane, and a second slope that are sequentially connected, the first slope and the plane form an obtuse angle, the plane and the second slope form an obtuse angle, and the first slope, the plane, and the slope form a two-step ladder; in the first stroke segment, the first slope is in slidable contact with the part that is of the first shaft and that is located in the inner cavity; in the second stroke segment, the plane is in slidable contact with the part that is of the first shaft and that is located in the inner cavity; and in the third stroke segment, the second slope is in slidable contact with the part that is of the first shaft and that is located in the inner cavity. The three-segment stroke design of the shaft sleeve can be realized reliably by using the design of a matching surface of a cam mechanism.

In an implementation of the first aspect, a spacer plate is disposed in the inner cavity of the shaft sleeve, at least two matching grooves and two chutes are disposed on a surface of the spacer plate, the at least two matching grooves are located between the two chutes, the at least two matching grooves are sequentially connected, every two adjacent matching grooves have a common side wall, and each chute is connected to one matching groove; the rotating shaft assembly includes a bump matching member, a bump is disposed on a surface of the bump matching member, the bump matching member penetrates the part that is of the first shaft and that is located in the inner cavity, the bump matching member is capable of moving along the first shaft but is not capable of rotating around the first shaft, and the bump of the bump matching member matches the chute or the matching groove; the elastic member is located between the driven member and the bump matching member, and two opposite ends of the elastic member press against the driven member and the bump matching member respectively; in the first stroke segment, the shaft sleeve rotates relative to the bump matching member, and the bump of the bump matching member is in slidable contact with an inner wall of one chute; in the second stroke segment, the shaft sleeve rotates relative to the bump matching member, and the bump of the bump matching member is in slidable contact with inner walls of the at least two matching grooves in sequence; and in the third stroke segment, the shaft sleeve rotates relative to the bump matching member, and the bump of the bump matching member is in slidable contact with an inner wall of the other chute.

By designing the matching between the bump matching member and the matching groove/chute on the shaft sleeve, when the bump matching member enters and exits each matching groove, the bump matching member impacts the shaft sleeve, and the impact is conducted to the first part of the electronic device connected to the shaft sleeve, so that the user generates a touch feeling feedback; and when the bump matching member slides in the chute, the bump matching member does not impact the shaft sleeve, and therefore the user does not generate a touch feeling feedback. User experience can be improved by manufacturing a hand feeling feedback within a manual rotation stroke of the shaft sleeve.

In an implementation of the first aspect, the part that is of the first shaft and that is located in the inner cavity passes through the spacer plate, and the part that is of the first shaft and that passes through the spacer plate has a slot; and the rotating shaft assembly includes a limiting member, the limiting member has an opening, the limiting member is in contact with a surface that is of the spacer plate and that is away from the matching groove, and an edge of the opening of the limiting member is clamped into the slot of the first shaft. Because there is a relatively large amount of movement at the first shaft, the end part of the first shaft is limited by using the limiting member, so that the first shaft can be prevented from being detached from the shaft sleeve.

In an implementation of the first aspect, an end part of the part that is of the second shaft and that is located in the inner cavity has a groove, the groove of the second shaft is located on an inner surface of the channel, and an end part of the part that is of the first shaft and that is located in the inner cavity is inserted into the groove of the second shaft. The connection design of the two shafts in this solution can absorb assembly tolerances and reduce stress caused by the discentricity of the two shafts.

According to a second aspect, an embodiment of this application provides an electronic device, including a first part, a second part, and a rotating shaft assembly, where the first part is fixedly connected to an outer side of a shaft sleeve, the second part is fixedly connected to a part that is of a second shaft and that is located outside an inner cavity of the shaft sleeve, and the first part is capable of rotating relative to the second part by using the rotating shaft assembly, and is opened relative to the second part to open the electronic device or is closed with the second part to close the electronic device; and the first part has a first host circuit board assembly, the second part has a second host circuit board assembly, a first electrical connection end is electrically connected to the first host circuit board assembly, and a second electrical connection end is electrically connected to the second host circuit board assembly.

In this solution, the flexible circuit board is wound around the second shaft, the flexible circuit board is folded and accommodated in the second shaft, and the two electrical connection ends of the flexible circuit board are respectively and electrically connected to two parts of an electronic device, so that signal transmission the two parts of the electronic device can be implemented by using the rotating shaft assembly. In addition, the winding design helps to use internal space of the shaft sleeve to accommodate the flexible circuit board having a length design requirement, and the folding design helps to use internal space of the second shaft to accommodate the flexible circuit board having a width design requirement, thereby ensuring that performance of the flexible circuit board can meet a product requirement.

In an implementation of the second aspect, the inner cavity of the shaft sleeve has an opening that communicates with the outside; the first part includes a first host housing, an edge of the first host housing has a through hole, the first host housing is fixedly connected to a side that is of the shaft sleeve and that forms the opening, and the through hole of the first host housing corresponds to the opening of the shaft sleeve; the first host circuit board assembly is fastened to the first host housing, and is located on a side that is of the first host housing and that is away from the shaft sleeve; the rotating shaft assembly includes a clamping member, the clamping member is provided with a clamping gap, the clamping member is fastened on the outer side of the shaft sleeve and blocks at least a part of an area of the opening of the inner cavity, the clamping gap communicates with the inner cavity, and the clamping member is located between the shaft sleeve and the first host housing; a flexible circuit board includes a connection part, the connection part connects the first electrical connection end and a wound part, and the connection part passes through the opening of the inner cavity, the clamping gap, and the through hole of the first host housing; and the through hole of the first host housing is filled with a sealing material. The foregoing waterproof design is performed on the movable flexible circuit board, so that liquid can be prevented from intruding into the electronic device, and reliability of the electronic device is ensured.

In an implementation of the second aspect, the first host circuit board assembly includes a circuit board, and the circuit board has a ground point and a feed point; and the first part includes the first host housing, the first host housing is fixedly connected to the outer side of the shaft sleeve, the first host circuit board assembly is fastened to the side that is of the first host housing and that is away from the shaft sleeve, the first host housing is electrically connected to both the ground point and the feed point, and the first host housing is used as an antenna of the electronic device. In this solution, an antenna function of a host is implemented by using the first host housing and a proper structure design.

In an implementation of the second aspect, the rotating shaft assembly includes a shaft contact member, and the shaft contact member is fastened in the shaft sleeve and is in slidable contact with a part that is of the second shaft and that is located in the inner cavity; and the second part includes a third host housing, the third host housing is fixedly connected to the part that is of the second shaft and that is located outside the inner cavity, and the third host housing is used as an antenna of the electronic device. In this solution, an antenna system is constructed by using the first host housing, the rotating shaft assembly, and the third host housing by using a proper structure design, to implement the antenna function of the host.

In an implementation of the second aspect, when the electronic device is closed, there is a gap between the first host housing and the third host housing, and the first host housing is coupled to the second host housing. In this solution, a feeding path in a coupling manner is designed, so that different communication requirements of the host in an open state and a closed state can be met, and antenna performance of the host in different states can be ensured.

In an implementation of the second aspect, the flexible circuit board includes a grounding portion, and the grounding portion is electrically connected to the first host housing, so that the flexible circuit board is grounded. In this way, the flexible circuit board can be grounded to avoid interference from the flexible circuit board to an antenna of the electronic device.

In an implementation of the second aspect, the rotating shaft assembly includes a driven member, an elastic member, and a first shaft; the driven member has a shaft matching surface and a through hole, the through hole of the driven member penetrates the shaft matching surface, the driven member is located in the inner cavity, and the driven member is capable of sliding along a surface of the inner cavity, but is not capable of rotating relative to the shaft sleeve; the elastic member is located in the inner cavity, and presses against a surface that is of the driven member and that is away from the shaft matching surface; the first shaft and the second shaft are respectively located at two opposite ends of the shaft sleeve; a part of the first shaft is located in the inner cavity and is rotatably connected to the shaft sleeve; the part that is of the first shaft and that is located in the inner cavity passes through the through hole of the driven member, and matches the shaft matching surface of the driven member to form a cam mechanism; and the other part of the first shaft is located outside the inner cavity, and is fixedly connected to the second part; and in a process of switching the electronic device from a closed state to an open state, a rotation stroke of the first part sequentially includes a first stroke segment, a second stroke segment, and a third stroke segment, where in the first stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft, so that the shaft sleeve drives the first part to rotate relative to the second part; in the second stroke segment, the first part is capable of being driven by an external force to rotate relative to the second part, to drive the shaft sleeve and the driven member to rotate around the first shaft; and in the third stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft, so that the shaft sleeve drives the first part to rotate relative to the second part. In this solution, the first part has different motion characteristics in each stroke, so that a user can create a special hand feeling, thereby greatly improving user experience.

In an implementation of the second aspect, the outer side of the shaft sleeve has a limiting protrusion, and the second part has a limiting groove; and when the third stroke segment ends, the limiting protrusion abuts against an inner wall of the limiting groove, so that the shaft sleeve and the first part stop rotating, and the first part is opened to a limit position relative to the second part. By using a design of the limiting protrusion and the limiting groove, the first part can be reliably limited when the first part is rotated to the limiting position, so that the first part can be reliably kept at the limiting position, thereby avoiding overturning.

In an implementation of the second aspect, the electronic device includes an open button; and the open button is mounted on the first part, the open button is configured to form a detachable connection to the second part, a part of the open button is exposed outside the first part, and when the part that is of the open button and that is exposed outside the first part is pressed, the detachable connection is released; or the open button is mounted on the second part, the open button is configured to form a detachable connection to the first part, a part of the open button is exposed outside the second part, and when the part that is of the open button and that is exposed outside the second part is pressed, the detachable connection is released. Locking and unlocking the electronic device by using the open button can ensure that the first part and the second part are reliably closed and conveniently opened.

In an implementation of the second aspect, the electronic device includes a wrist strap, and the wrist strap is connected to two opposite sides of the second part. The electronic device may be a wearable device like a smartwatch or a smart band. In this solution, signal transmission between two parts of the wearable device can be implemented.

BRIEF DESCRIPTION OF DRAWINGS

FIG. 120 is a schematic diagram of a B-B sectional structure of the earphone rear-housing assembly in FIG. 113;

FIG. 121 is a schematic diagram of a sectional structure of a first earphone;

FIG. 122 is a schematic diagram of a partially enlarged structure at a position A in FIG. 121;

FIG. 123 is a schematic diagram of a structure of another first earphone;

FIG. 124 is a schematic diagram of a structure of another first earphone;

FIG. 125 is a schematic diagram of a structure of an electronic assembly in a first earphone;

FIG. 126 is a schematic diagram of a structure of an electronic assembly in a first earphone;

FIG. 127 is a schematic diagram of a sectional structure of a first earphone;

FIG. 128 is a schematic diagram of a partially enlarged structure at a position A in FIG. 127;

FIG. 129 is a schematic diagram of a partially enlarged structure at a position B in FIG. 127;

FIG. 130 is a schematic diagram of a matching relationship between a first host attachment magnet in a host and an earphone magnet in a first earphone;

FIG. 131 is a schematic diagram of a magnet design of a first host attachment magnet and an earphone magnet;

Figure 132:
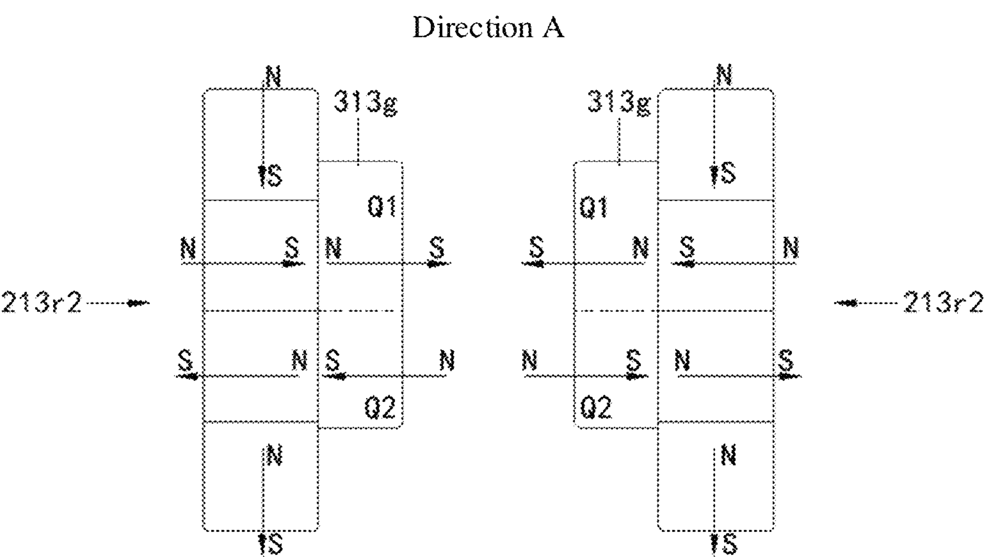
Figure 133:
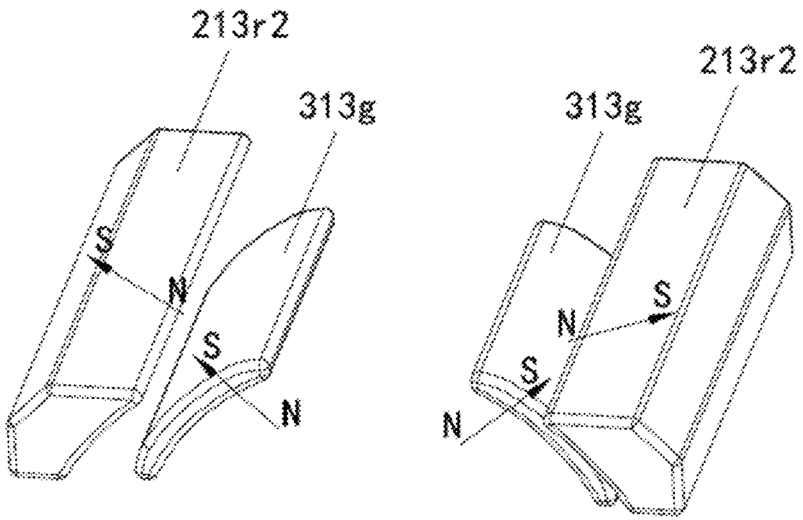
Figure 134:
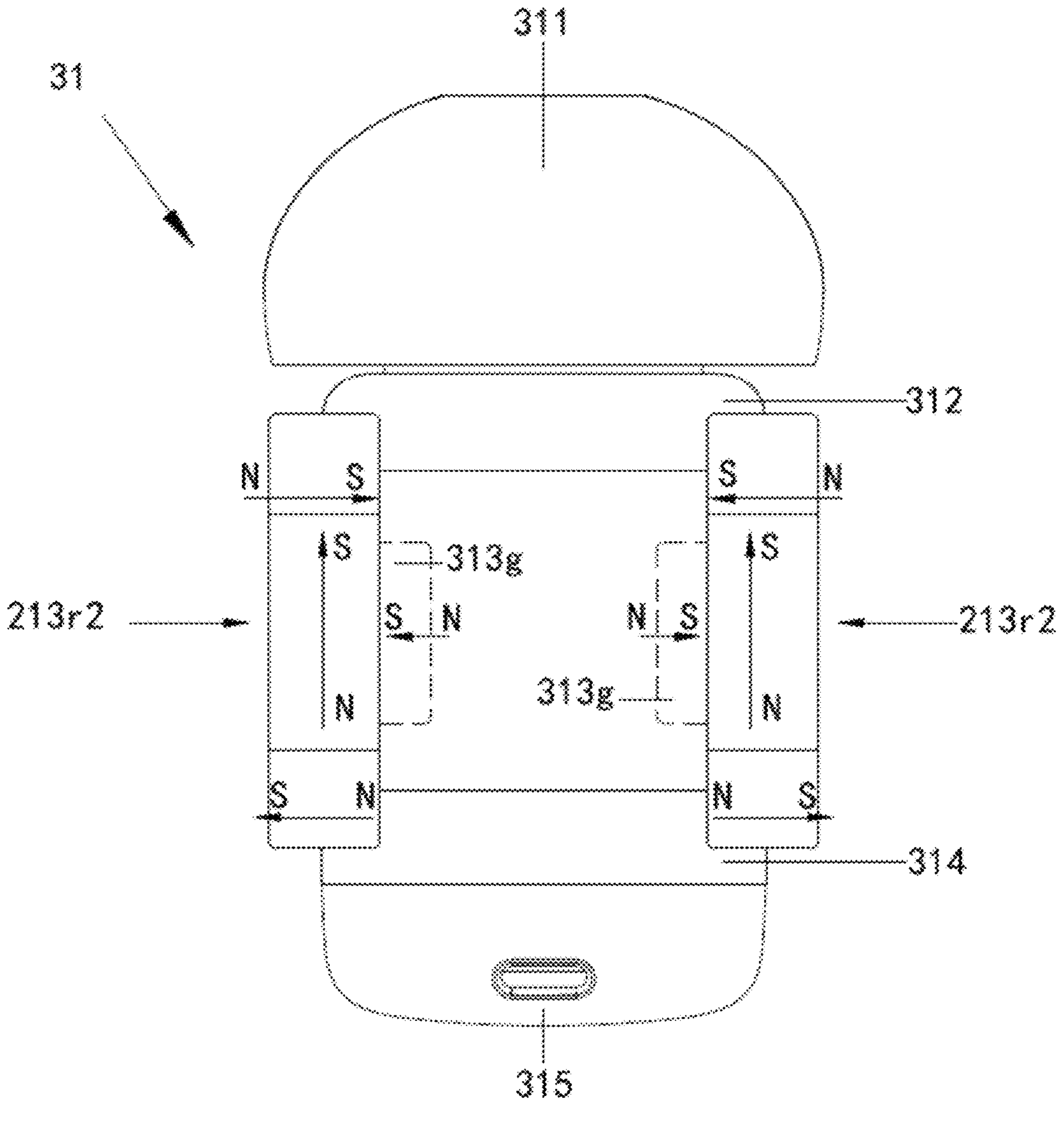
Figure 135:
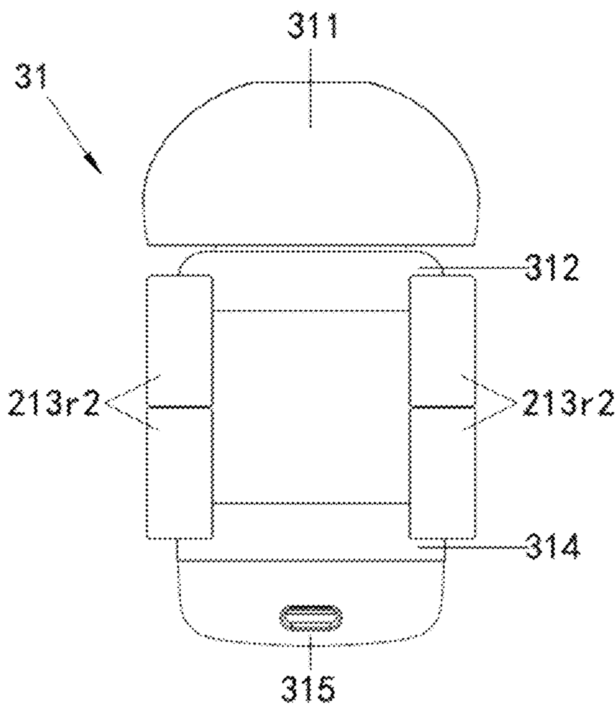
Figure 136:
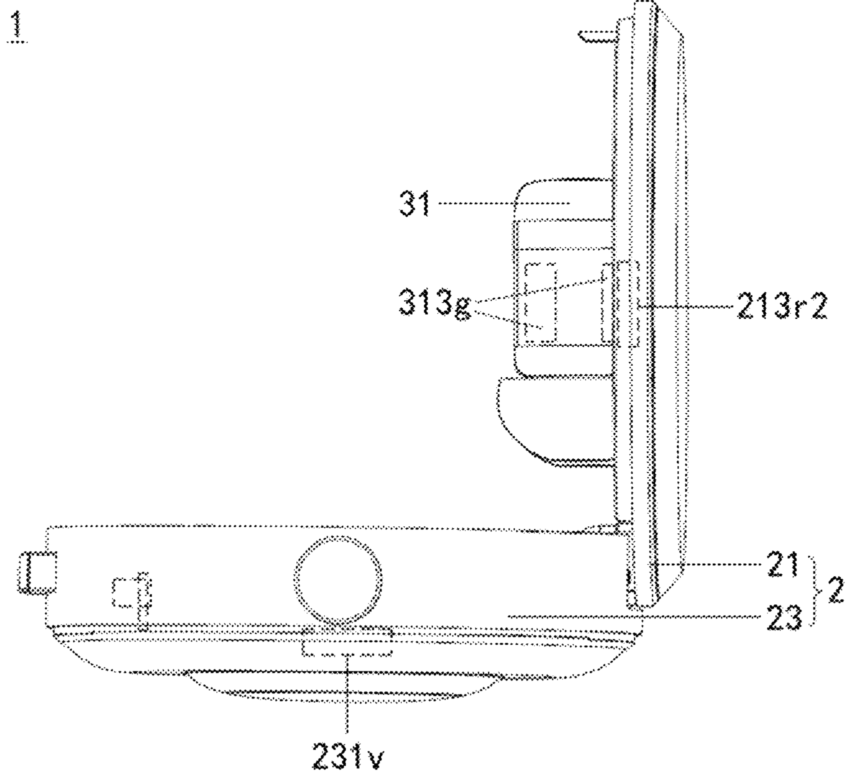
Figure 137:
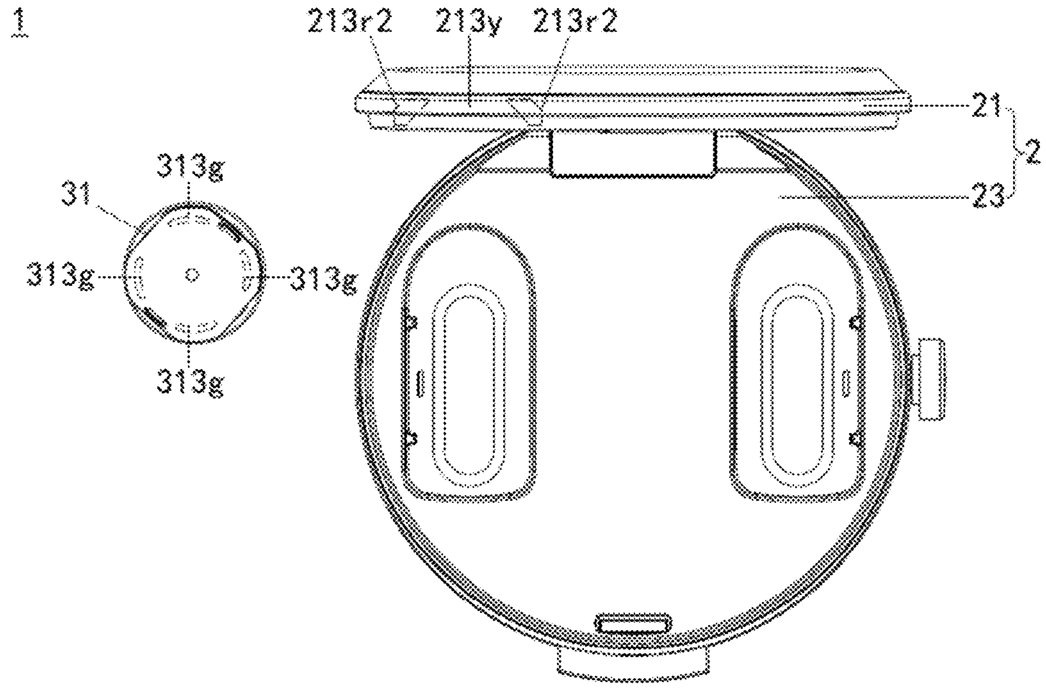
Figure 138:
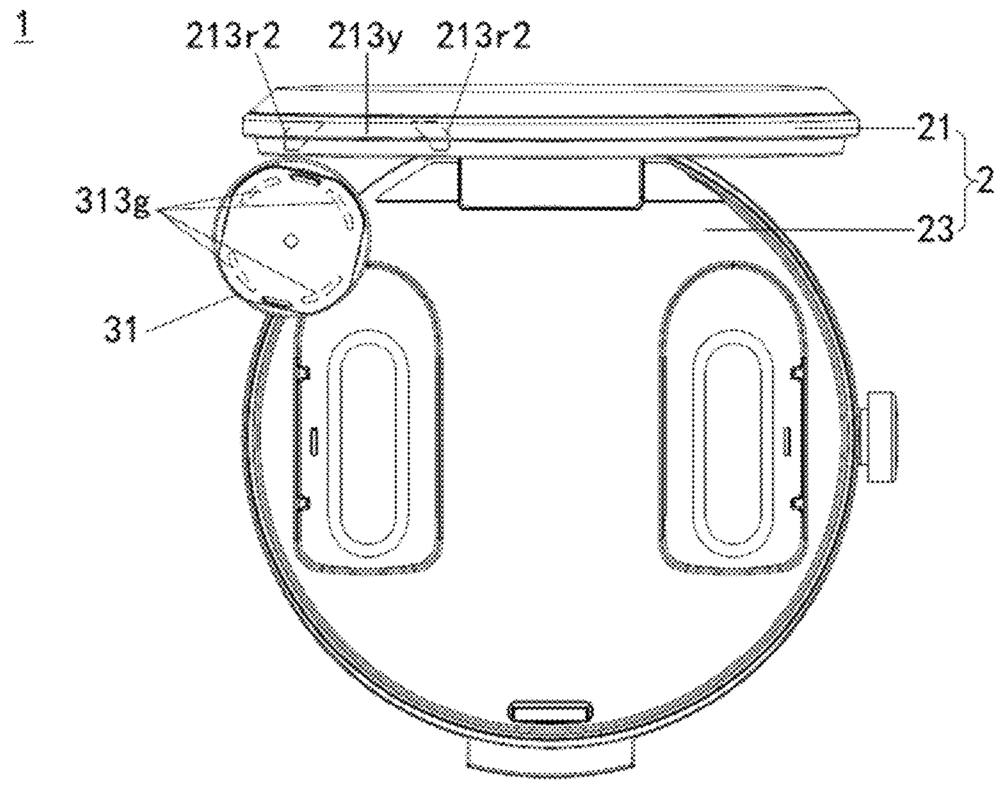
Figure 139:
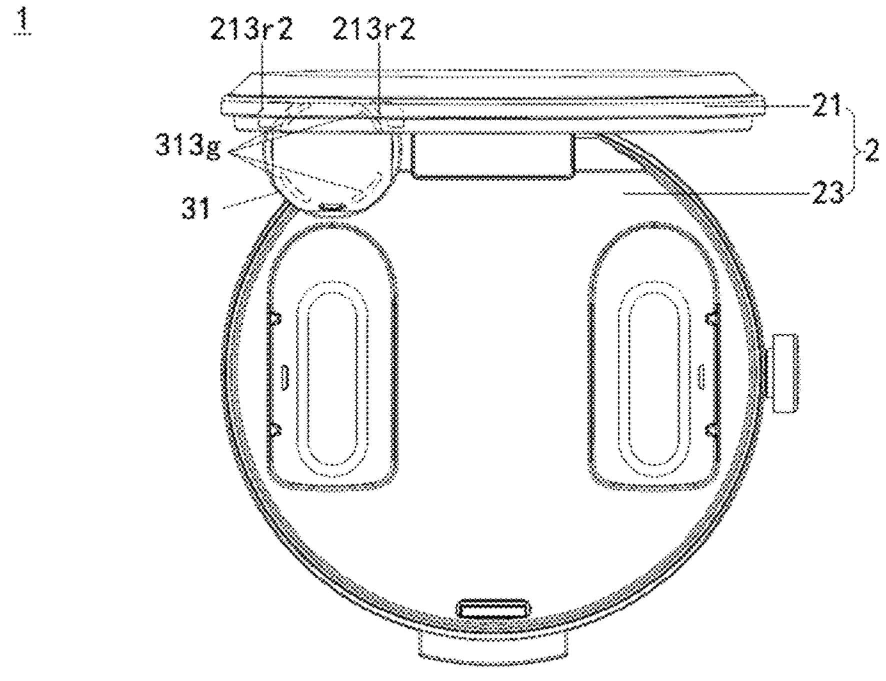
Figure 140:
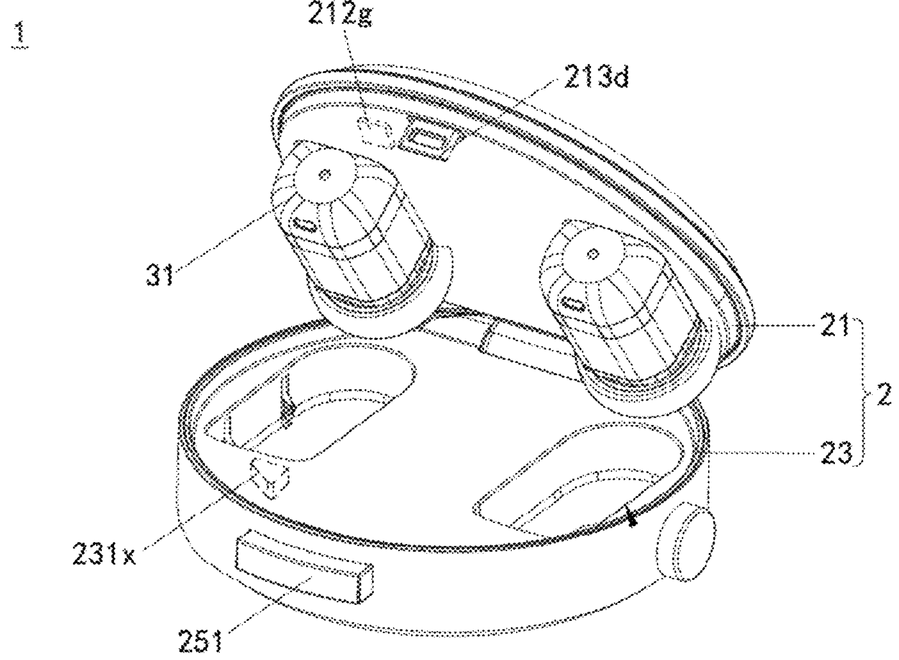
Figure 141:
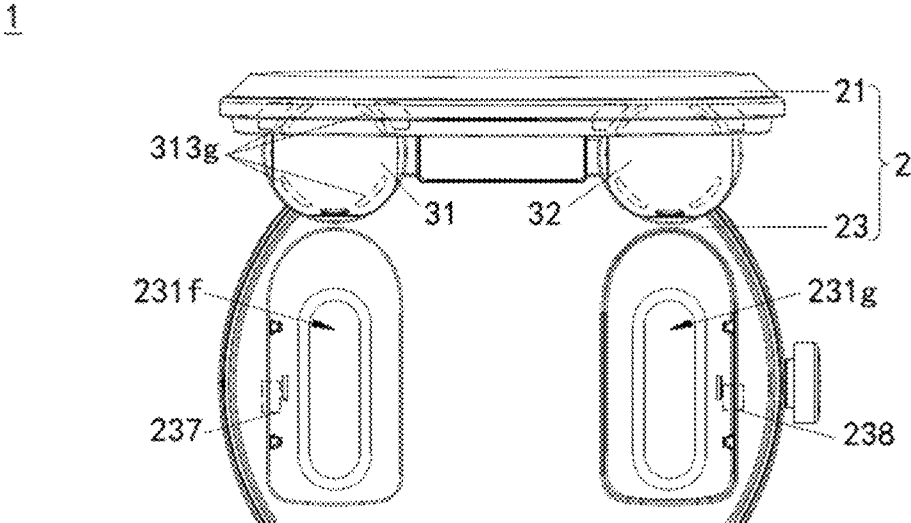
Figure 142:
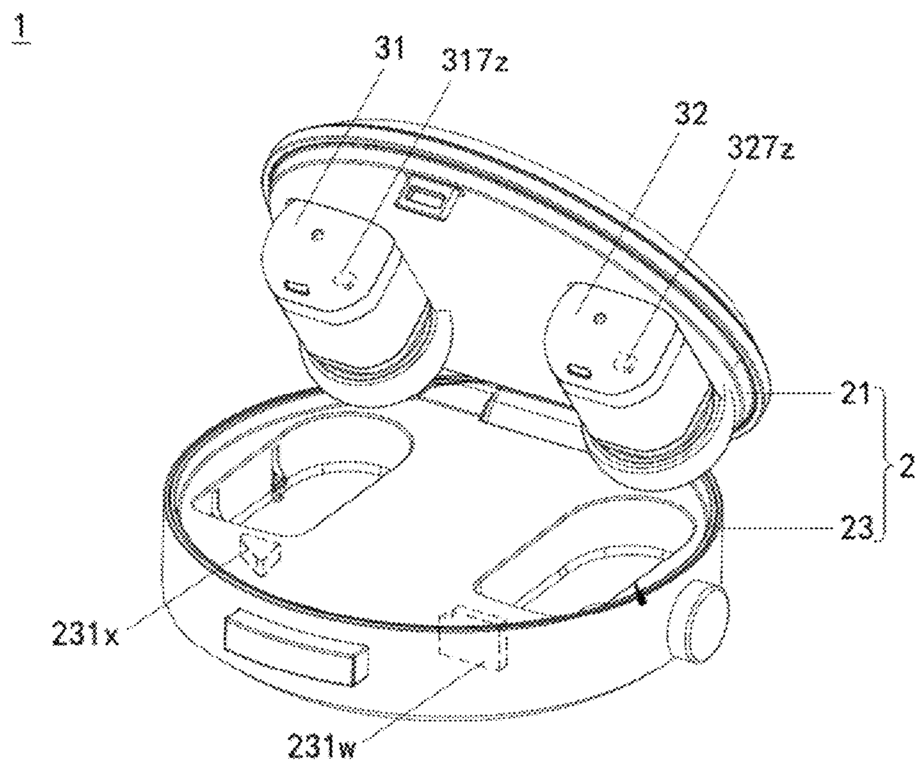
Figure 143:
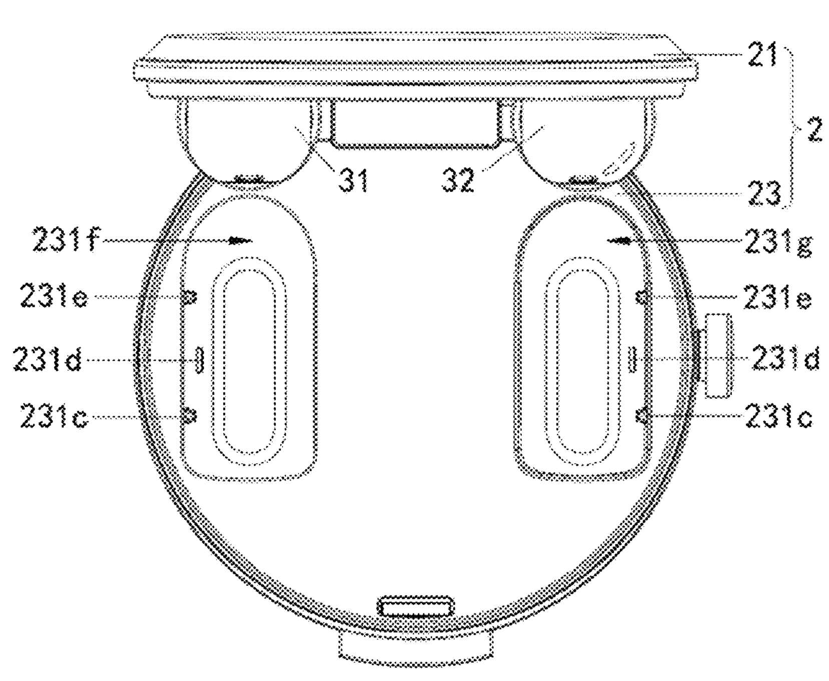

FIG. 132 is a schematic diagram of another magnet design of a first host attachment magnet and an earphone magnet;

FIG. 133 is a schematic diagram of another magnet design of a first host attachment magnet and an earphone magnet;

FIG. 134 is a schematic diagram of another magnet design of a first host attachment magnet and an earphone magnet;

FIG. 135 is a schematic diagram of a design in which a first host attachment magnet is magnetically attracted to a first electrode and a second electrode in an earphone;

FIG. 136 is a schematic diagram of a structure in which a first earphone is attached to a first part after a host is opened;

FIG. 137 is a schematic diagram of a process in which a first earphone is automatically placed in position when the first earphone is placed from the outside of a host to a first part;

FIG. 138 is a schematic diagram of a process in which a first earphone is automatically placed in position when the first earphone is placed from the outside of a host to a first part;

FIG. 139 is a schematic diagram of a process in which a first earphone is automatically placed in position when the first earphone is placed from the outside of a host to a first part;

FIG. 140 is a schematic diagram of detecting an open/closed state of a host;

FIG. 141 is a schematic diagram in which a host detects an in-box/out-box state of an earphone;

FIG. 142 is a schematic diagram in which an earphone detects an in-box/out-box state of the earphone; and FIG. 143 is a schematic diagram in which a host performs foreign matter detection.

DETAILED DESCRIPTION OF THE EMBODIMENTS

The following embodiments of this application provide a wearable device. The wearable device is a brand new product form in which a host and an earphone are integrated. A product form of the host includes but is not limited to a smartwatch, an electronic blood pressure meter, a smart band, a smart helmet, smart clothing, smart glasses, mobile Wi-Fi, a smart backpack, or another electronic device. The earphone is a wireless earphone, and includes but is not limited to a Bluetooth earphone (for example, a true wireless stereo (True Wireless Stereo, TWS) earphone), an infrared earphone, or the like. The following uses an example in which the host has a product form of a smartwatch and the earphone is a Bluetooth earphone for description.

As shown in FIG. 1, FIG. 2, FIG. 3, FIG. 4, and FIG. 5, a wearable device 1 in this embodiment may include a host 2 and earphones 3, and the earphones 3 may be accommodated in the host 2. The following first describes a related design of the host 2, then describes a related design of the earphones 3, and finally describes an overall feature and functions of the wearable device 1.

Product Form and Motion Design of the Host 2

As shown in FIG. 1 to FIG. 4, the host 2 may include a first part 21, a rotating shaft assembly 22, a second part 23, a function button 24, and an open button 25. The first part 21 may also be referred to as a cover, and the second part 23 may also be referred to as a body.

The host 2 may further include a wrist strap, and the wrist strap may be connected to two opposite sides of the second part 23.

Figure 1:
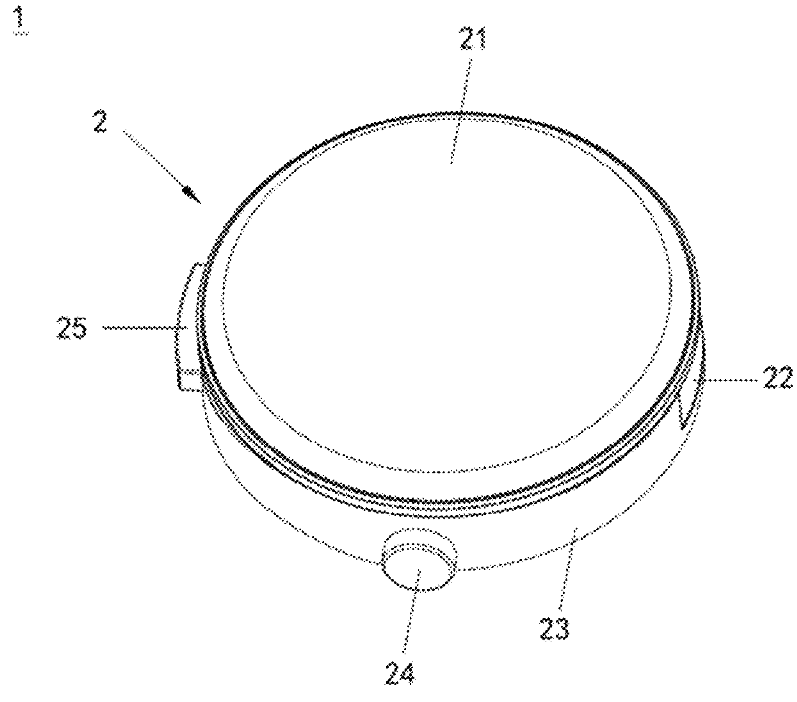
FIG. 1 is a schematic diagram of an assembly structure of a wearable device according to an embodiment of this application.
Figure 2:
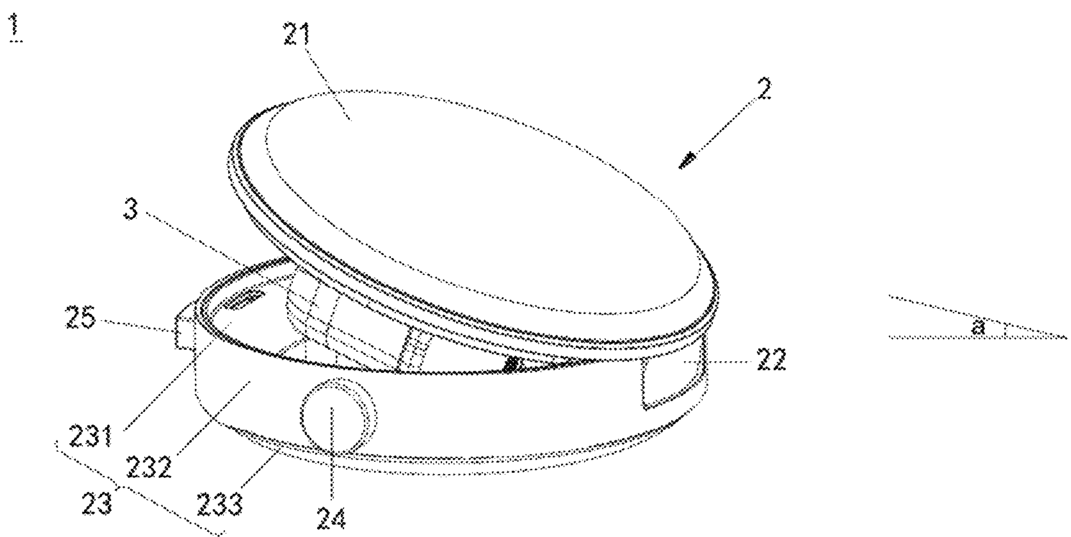
FIG. 2 is a schematic diagram of an assembly structure of a wearable device according to an embodiment of this application.
Figure 3:
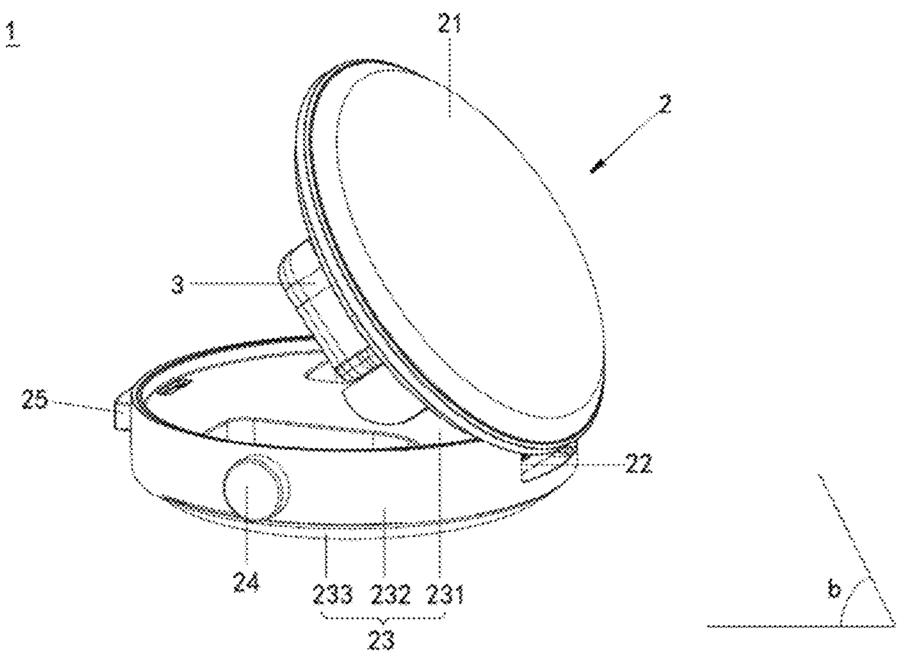
FIG. 3 is a schematic diagram of an assembly structure of a wearable device according to an embodiment of this application.

As shown in FIG. 1 to FIG. 3, the rotating shaft assembly 22 is connected to the first part 21 and the second part 23, and the first part 21 can rotate relative to the second part 23 through the rotating shaft assembly 22, so that the host 2 is in a closed state or an open state. When the host 2 is closed, the first part 21 and the second part 23 may enclose an accommodation space, and the earphones 3 are accommodated in the accommodation space.

In FIG. 1, the host 2 is in the closed state. In this case, the first part 21 and the second part 23 are closed. In all of FIG. 2 to FIG. 5, the host 2 is in the open state. In this case, the first part 21 is opened at a specific angle relative to the second part 23. For example, an opening angle a of the first part 21 in FIG. 2 may be roughly 15 degrees; an opening angle b of the first part 21 in FIG. 3 may be roughly 75 degrees; and the first part 21 in FIG. 5 rotates to a limit position, and an opening angle c of the first part 21 may be roughly 90 degrees. It may be understood that a specific value of the opening angle c generated when the first part 21 is in the limit position may be designed based on a product requirement, and is not limited to the foregoing descriptions.

Figure 4:
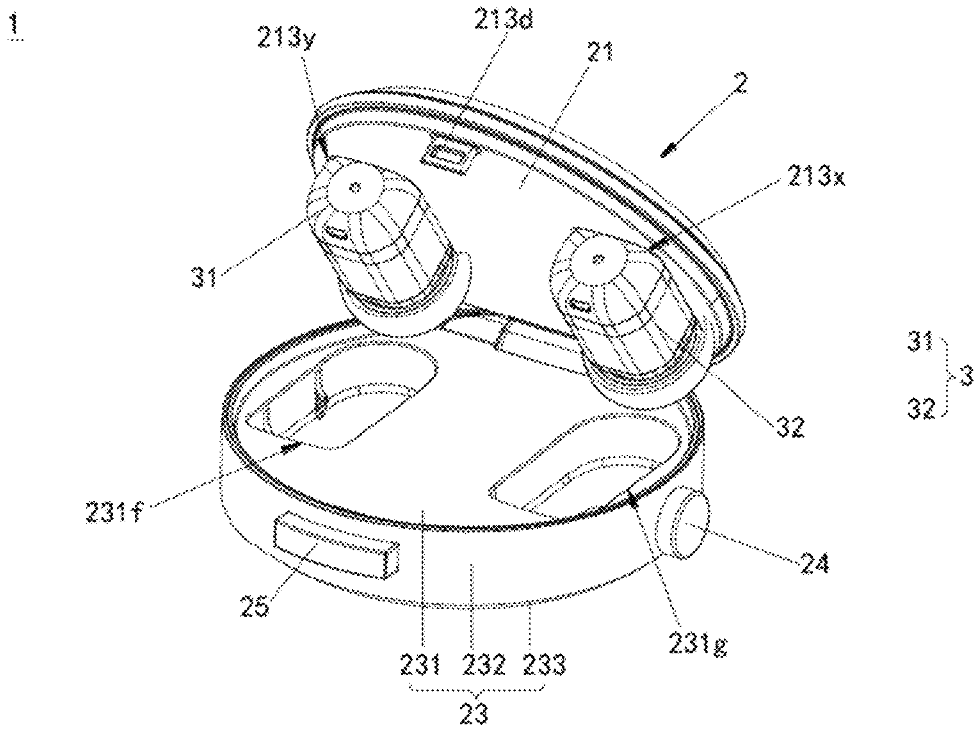
FIG. 4 is a schematic diagram of an assembly structure of a wearable device according to an embodiment of this application.

In addition, in this embodiment, as shown in FIG. 2 to FIG. 4, when the host 2 is in the open state, the earphones 3 may be detached from the second part 23 and attached to the first part 21. This design is convenient for a user to take and place the earphones 3 (descriptions are further provided below). In another embodiment, after the host 2 is opened, the earphones 3 may be accommodated in the second part 23.

In this embodiment, through a special structure design of the rotating shaft assembly 22, a rotation stroke of the first part 21 can be segmented, and in each stroke segment, the first part 21 has a corresponding rotation feature. In a specific stroke segment, the first part 21 can provide a touch feeling feedback (a specific principle is described in detail below).

For example, in a process of opening the closed host 2, the rotation stroke of the first part 21 may be divided into three segments. A stroke from the state shown in FIG. 1 to the state shown in FIG. 2 may represent a first stroke segment of the first part 21. In the first stroke segment, the opening angle of the first part 21 gradually increases to the opening angle a, and the first part 21 automatically rotates under torque driving of the rotating shaft assembly 22 without an external force. A stroke from the state shown in FIG. 2 to the state shown in FIG. 3 may represent a second stroke segment of the first part 21. In the second stroke segment, the opening angle of the first part 21 gradually increases from the opening angle a to the opening angle b, the rotating shaft assembly 22 no longer provides torque for the first part 21, and the first part 21 needs to rotate under external force driving. A stroke from the state shown in FIG. 3 to the state shown in FIG. 5 may represent a third stroke segment of the first part 21. In the third stroke segment, the opening angle of the first part 21 gradually increases from the opening angle b to the opening angle c, and the first part 21 automatically rotates under torque driving of the rotating shaft assembly 22 without an external force. When the opening angle of the first part 21 is the opening angle c, the torque of the rotating shaft assembly 22 may continue to exist. It is easy to understand that the host 2 has a limiting structure, and the first part 21 may maintain a balanced state under a joint action of the limiting structure and the rotating shaft assembly 22.

A flip of a conventional flip electronic device (for example, a notebook computer or a flip mobile phone) can be opened only after the user continuously applies a force, and touch feeling experience is monotonous. However, in this embodiment, the rotation stroke of the first part 21 is segmented by using a structure design of the rotating shaft assembly 22, so that the first part 21 needs to be driven by a force applied by the user only in the second stroke segment, and may automatically rotate in other stroke segments without the force applied by the user. This provides novel touch feeling experience.

In addition, in the third stroke segment, the first part 21 is driven by the rotating shaft assembly 22 to move in a direction away from the second part 23. When the opening angle of the first part 21 reaches the opening angle c, the driving force of the rotating shaft assembly 22 still exists. Therefore, it is difficult for the user to pull the first part 21 towards the second part 23 by removing the earphones 3 from the first part 21. This design is convenient for the user to remove the earphones 3, and can improve user experience.

In another embodiment, a structure of a rotating shaft may be designed, so that the rotation stroke of the first part 21 does not need to be segmented, and the first part 21 rotates in a manner of continuously applying a force by the user or in an always automatic manner.

As shown in FIG. 1 to FIG. 3, the open button 25 may be mounted in the second part 23, and the open button 25 and the rotating shaft assembly 22 may be respectively located at two ends of the second part 23 in a radial direction. A part of the open button 25 may be exposed outside the second part 23 for the user to press. A latch structure (descriptions are provided below) in the open button 25 may form a detachable connection with a latch structure (descriptions are provided below) in the first part 21. The open button 25 cooperates with the latch structure in the first part 21, to open and latch the host 2.

For example, as shown in FIG. 1, when the host 2 is in the closed state, the latch structure in the open button 25 forms the detachable connection with the latch structure in the first part 21.

With reference to FIG. 1 and FIG. 2, when the user needs to open the host 2, the user may press the open button 25, so that the open button 25 generates a mechanism motion, and the latch structure in the open button 25 no longer cooperates with the latch structure in the first part 21. In this case, the first part 21 may be automatically opened under driving of the rotating shaft assembly 22, and perform the first stroke segment. On the contrary, when the user intends to close the host 2, the user may press down the first part 21 to enable the first part 21 to rotate towards the second part 23. When a latch structure in the second part 23 is in contact with the latch structure in the open button 25, the open button 25 generates a mechanism motion, and the latch structure in the open button 25 restores cooperation with the latch structure in the first part 21.

A specific principle of opening and latching the host 2 by using the open button 25 and the latch structure in the first part 21 is described in detail below.

In another embodiment, the open button may alternatively be mounted in the first part, and the second part has a latch structure. The open button cooperates with the latch structure in the second part, to open and latch the host. The first part may be a cover, and the second part may be a body. The following continues to provide descriptions by using the design in which the open button 25 is mounted in the second part 23 as an example.

The foregoing briefly describes the product form and the motion design of the wearable device 1. The following describes a specific structure of the wearable device 1 in detail in a sequence of first describing the first part 21, the second part 23, the open button 25, and the function button 24, and then describing the rotating shaft assembly 22.

Structure of the Host 2

Figure 5:
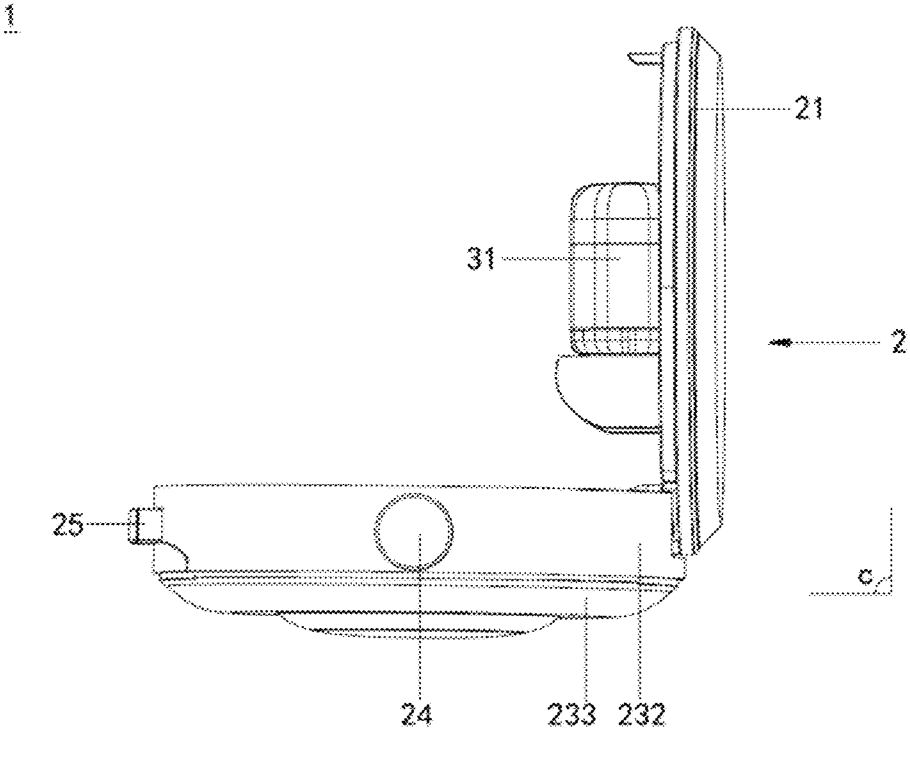
FIG. 5 is a schematic diagram of an assembly structure of a wearable device according to an embodiment of this application.
Figure 6:
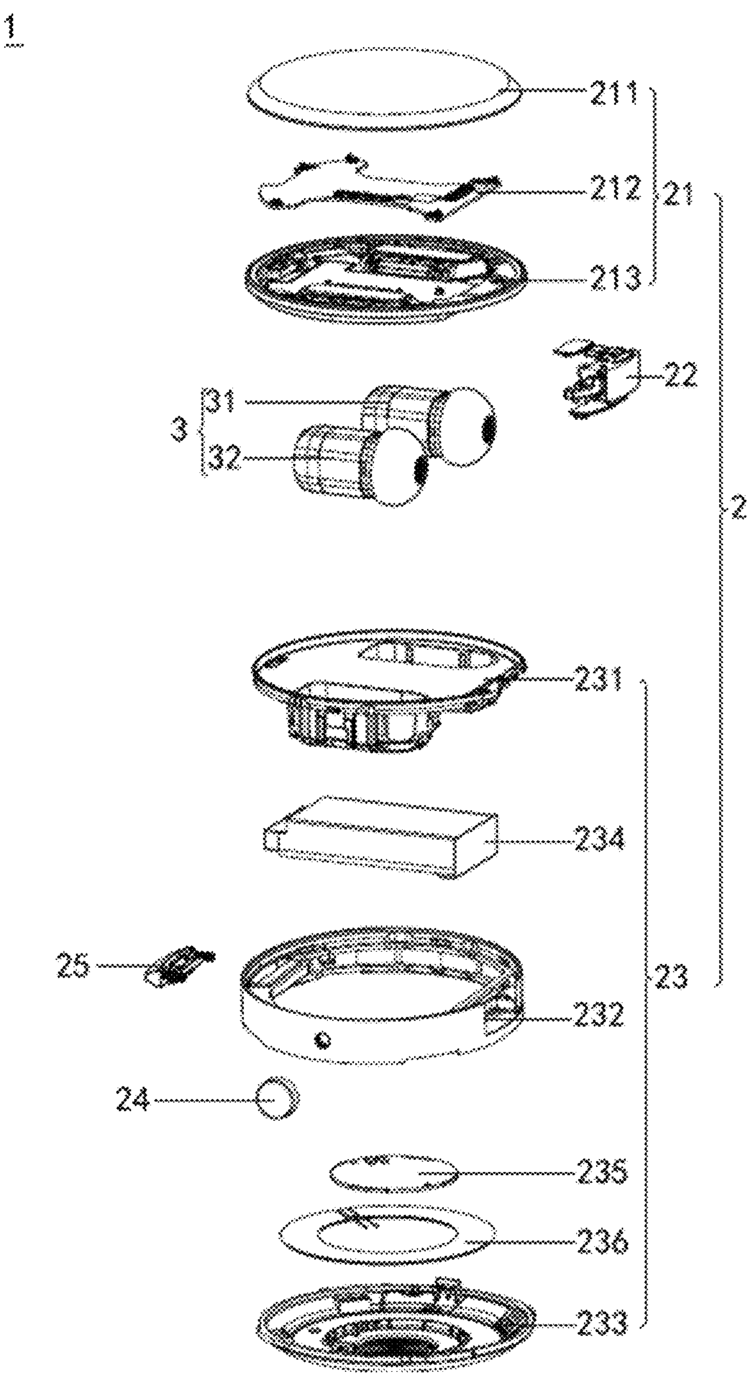
FIG. 6 is a schematic exploded view of a structure of a wearable device according to an embodiment of this application.

As shown in FIG. 5 and FIG. 6, the first part 21 of the host 2 of the wearable device 1 may include a display 211, a first host circuit board assembly 212, and a first host housing 213. The display 211 and the first host circuit board assembly 212 are both mounted on the first host housing 213, and the first host circuit board assembly 212 is located between the display 211 and the first host housing 213.

Structure of the First Host Housing 213

Figure 7:
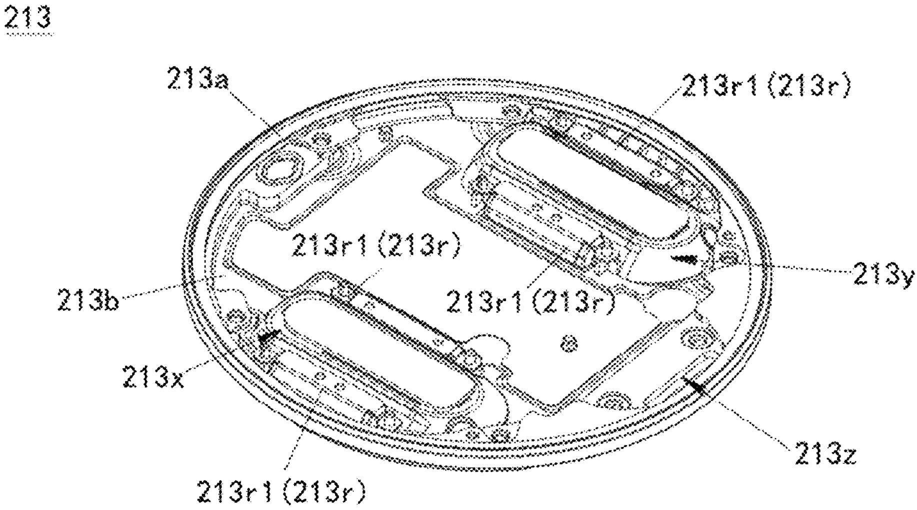
FIG. 7 is a schematic diagram of an assembly structure of a first host housing of the wearable device in FIG. 6.
Figure 8:
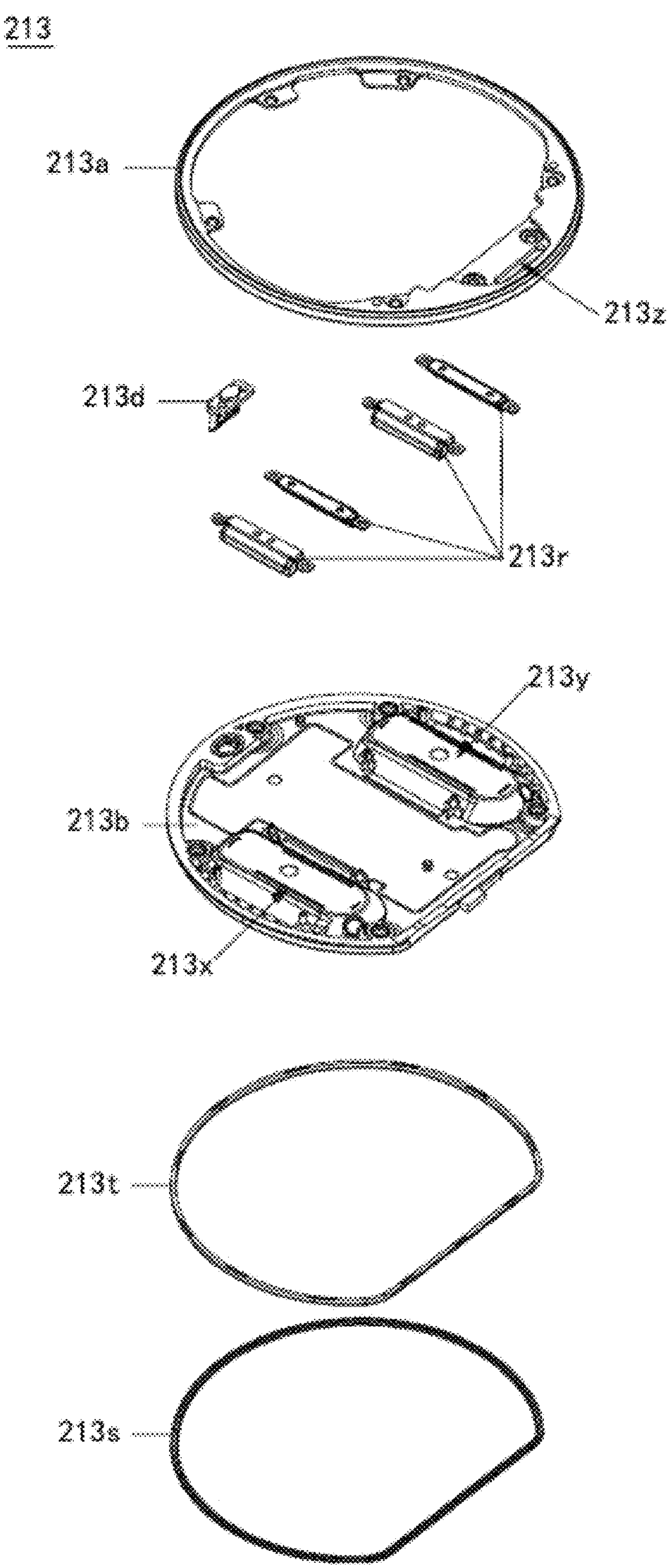
FIG. 8 is a schematic exploded view of a structure of the first host housing in FIG. 7.

As shown in FIG. 7 and FIG. 8, an appearance of the first host housing 213 may be approximately in a disk shape. The first host housing 213 may be assembled by several components. For example, the first host housing 213 may include a first frame body 213*a*, a first bracket 213*b*, a magnet assembly 213*r*, a latch portion 213*d* (namely, the latch structure in the first part 21 described above), a sealing bracket 213*t*, and a sealing ring 213*s*.

Figure 9:
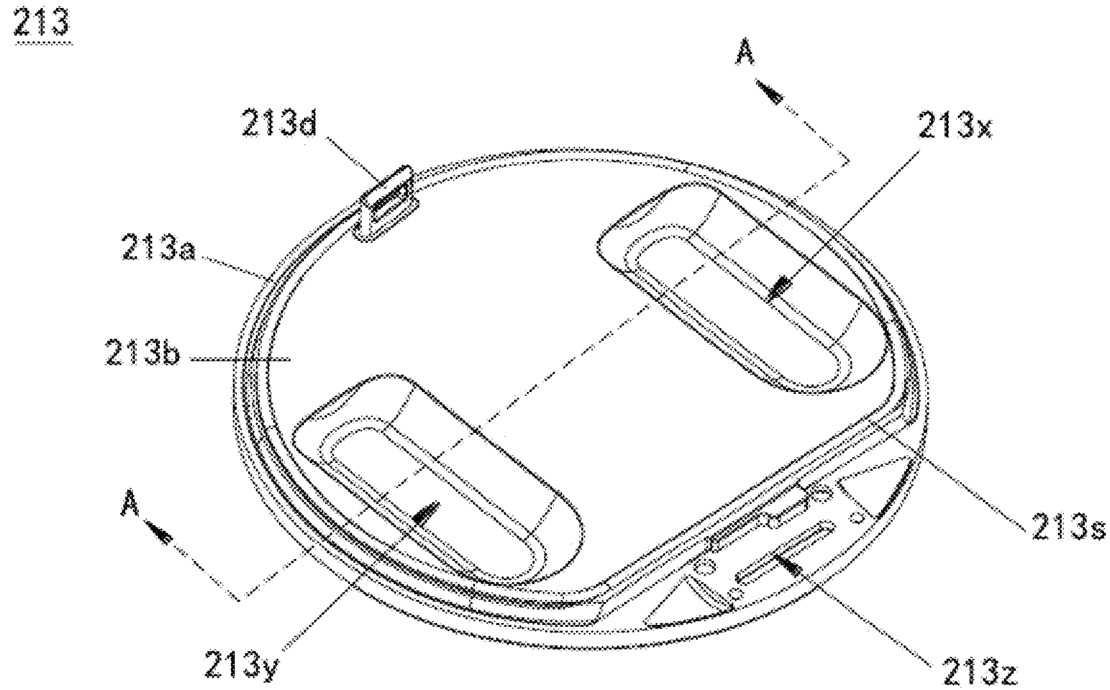
FIG. 9 is a schematic diagram of an assembly structure of a first host housing of the wearable device in FIG. 6.

As shown in FIG. 7 to FIG. 9, the first frame body 213*a* may be roughly of a frame structure having a circular outer contour. A through hole 213*z* may be provided at an edge of the first frame body 213*a*, and the through hole 213*z* may be a waist-shaped hole (or referred to as a runway-shaped hole). The first frame body 213*a* may be made of a conductive material, for example, metal. The first frame body 213*a* may be used as an antenna (descriptions are provided below).

As shown in FIG. 7 to FIG. 9, the first bracket 213*b* may be approximately of a disk-shaped structure. A first accommodation groove 213*y* and a second accommodation groove 213*x* may be formed in a local region of the first bracket 213*b*, and the first accommodation groove 213*y* and the second accommodation groove 213*x* are arranged at a spacing. As shown in FIG. 9, from a perspective of one side of the first bracket 213*b*, the local region in which the first accommodation groove 213*y* and the second accommodation groove 213*x* are formed is in a concave shape. As shown in FIG. 7 and FIG. 8, from a perspective of the other side of the first bracket 213*b*, the local region in which the first accommodation groove 213*y* and the second accommodation groove 213*x* are formed is in a protrusion shape. As shown in FIG. 4 and FIG. 9, the first accommodation groove 213*y* may be configured to accommodate a first earphone 31, and the second accommodation groove 213*x* may be configured to accommodate a second earphone 32.

As shown in FIG. 9, a groove surrounding the first bracket 213*b* may be further provided on a circumferential edge of the first bracket 213*b*, and an opening of the groove and an opening of the first accommodation groove 213*y* are located on a same side of the first bracket 213*b*. The groove surrounds a periphery of the first accommodation groove 213*y* and the second accommodation groove 213*x*. As described below, the groove is configured to mount the sealing bracket 213*t* and the sealing ring 213*s*.

As shown in FIG. 7 to FIG. 9, the first bracket 213*b* is fixedly connected to the first frame body 213*a*, a circumferential region of the first frame body 213*a* surrounds the periphery of the first bracket 213*b*, and the through hole 213*z* of the first frame body 213*a* is also located on an outer side of the first bracket 213*b*.

Figure 10:
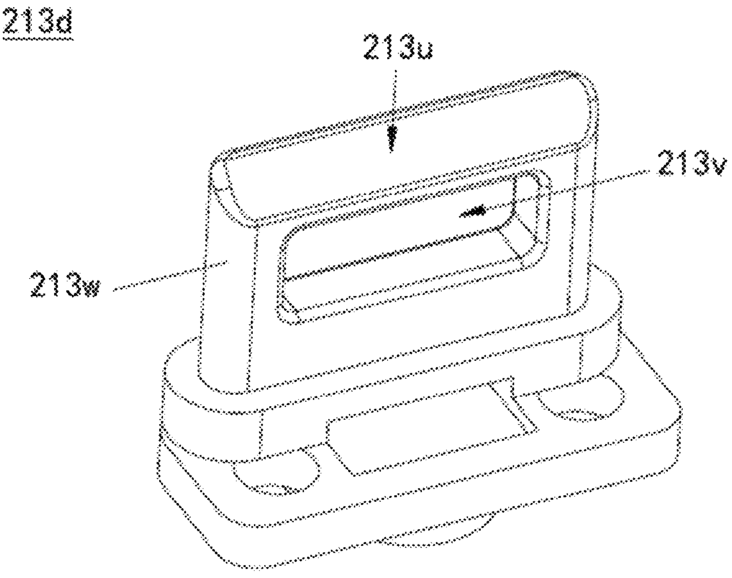
FIG. 10 is a schematic diagram of an assembly structure of a latch portion of the first host housing in FIG. 8.

As shown in FIG. 9, the latch portion 213*d* may be fastened at an edge of the first bracket 213*b*, and may be disposed opposite to the through hole 213*z* of the first frame body 213*a*. With reference to FIG. 9 and FIG. 10, a frame structure 213*w* may be provided at an end that is of the latch portion 213*d* and that is far away from the first bracket 213*b*, and the frame structure 213*w* may be located on a same side of the first bracket 213*b* as the opening of the first accommodation groove 213*y*. The frame structure 213*w* may enclose a through hole 213*v*. A slope 213*u* may be provided on a side that is of the frame structure 213*w* and that is far away from the first bracket 213*b*. The frame structure 213*w* of the latch portion 213*d* is configured to form a detachable buckle connection (descriptions are provided below) with the latch structure in the open button 25. The slope 213*u* serves as a guide, so that the frame structure 213*w* can smoothly cooperate with the latch structure in the open button 25.

Magnet Assembly 213*r*

Figure 11:
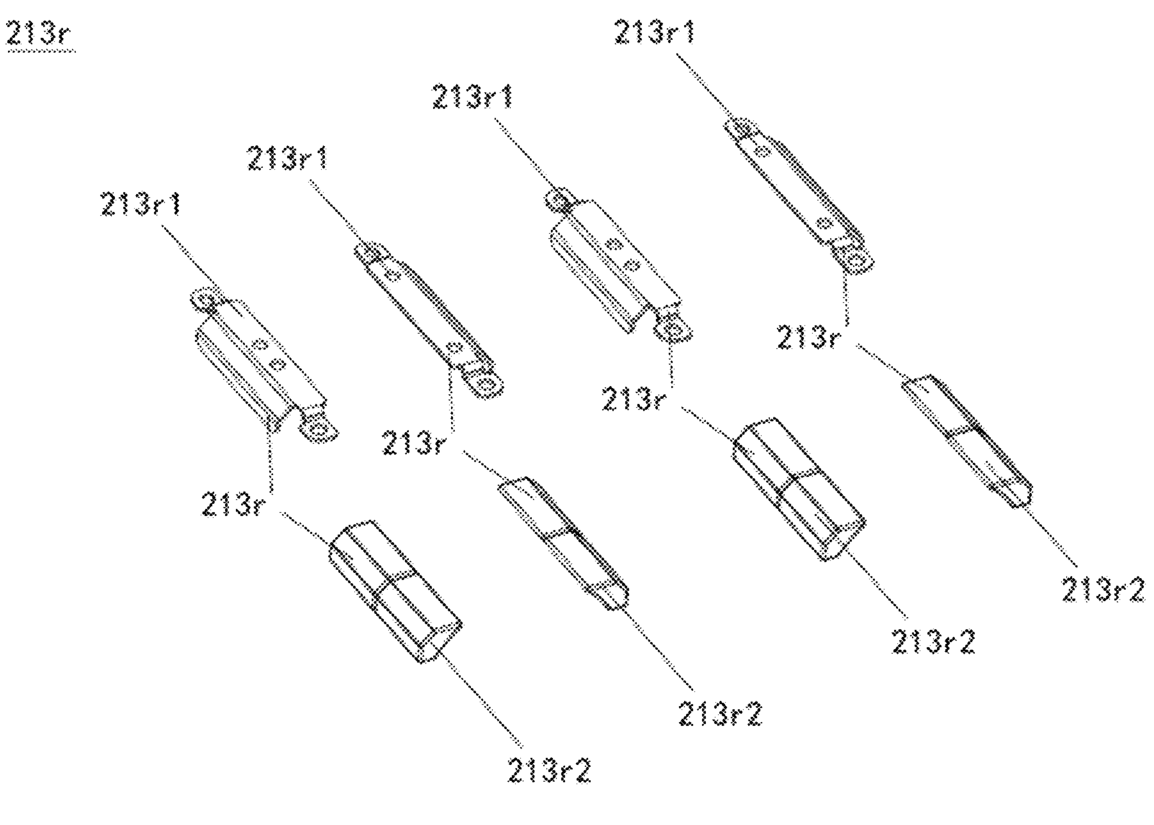
FIG. 11 is a schematic exploded view of a structure of a magnet assembly of the first host housing in FIG. 8.

As shown in FIG. 8 and FIG. 11, the magnet assembly 213*r* may include a fastening bracket 213*r*1 and a first host attachment magnet 213*r*2.

For example, the first host attachment magnet 213*r*2 may be formed by splicing two single magnets, and each single magnet has a single magnetic field direction. The first host attachment magnet 213*r*2 formed by the two single magnets may have two magnetic field directions, and the first host attachment magnet 213*r*2 may form a Halbach array.

Based on a product requirement, in another embodiment, the first host attachment magnet may be a Halbach array formed by splicing another quantity of single magnets. For example, the first host attachment magnet is a Halbach array formed by splicing three single magnets, and the first host attachment magnet may have three magnetic field directions. Alternatively, the first host attachment magnet is a Halbach array formed by splicing four single magnets, and the first host attachment magnet may have four magnetic field directions.

Alternatively, in another embodiment, the first host attachment magnet may be a single magnet and has a single magnetic field direction. Alternatively, the first host attachment magnet may be a single magnet, but the first host attachment magnet may form a Halbach array having at least two magnetic field directions (which may be obtained by magnetizing different physical regions of a single magnet in different directions).

As shown in FIG. 11 and FIG. 7, a shape of the first host attachment magnet 213*r*2 in this embodiment may adapt to a shape of an outer surface of a groove wall of the first accommodation groove 213*y* (or the second accommodation groove 213*x*) in the first bracket 213*b*. The first host attachment magnet 213*r*2 may be fastened to the outer surface of the groove wall of the first accommodation groove 213*y* and the outer surface of the groove wall of the second accommodation groove 213*x*.

As shown in FIG. 11, there may be, for example, four first host attachment magnets 213*r*2, and structures of the four first host attachment magnets 213*r*2 may be, for example, consistent. With reference to FIG. 11 and FIG. 7, the four first host attachment magnets 213*r*2 may be grouped in pairs. A first group is mounted on the outer surface of the groove wall of the first accommodation groove 213*y*, and two first host attachment magnets 213*r*2 in the first group may be symmetrically mounted on two sides (for example, left and right sides in a perspective in FIG. 7) of the groove wall of the first accommodation groove 213*y*. A second group is mounted on the outer surface of the groove wall of the second accommodation groove 213*x*, and two first host attachment magnets 213*r*2 in the second group are symmetrically mounted on two sides (for example, left and right sides in the perspective in FIG. 7) of the groove wall of the second accommodation groove 213*x*.

In another embodiment, a quantity of first host attachment magnets 213*r*2 may be designed based on a product requirement, and is not limited to the foregoing descriptions.

As shown in FIG. 11, a quantity of fastening brackets 213*r*1 may be consistent with the quantity of first host attachment magnets 213*r*2. For example, there are also four fastening brackets 213*r*1. With reference to FIG. 11 and FIG. 7, the fastening brackets 213*r*1 may be mounted on the first bracket 213*b*, and one fastening bracket 213*r*1 may correspond to one first host attachment magnet 213*r*2, so that each first host attachment magnet 213*r*2 is fastened between one fastening bracket 213*r*1 and the first bracket 213*b*.

In this embodiment, the fastening bracket 213*r*1 can ensure reliable fastening of the first host attachment magnet 213*r*2 attached to the first host. In another embodiment, based on a product requirement, the fastening bracket 213*r*1 may not be provided.

Sealing Bracket 213*t* and Sealing Ring 213*s*

Figure 12:
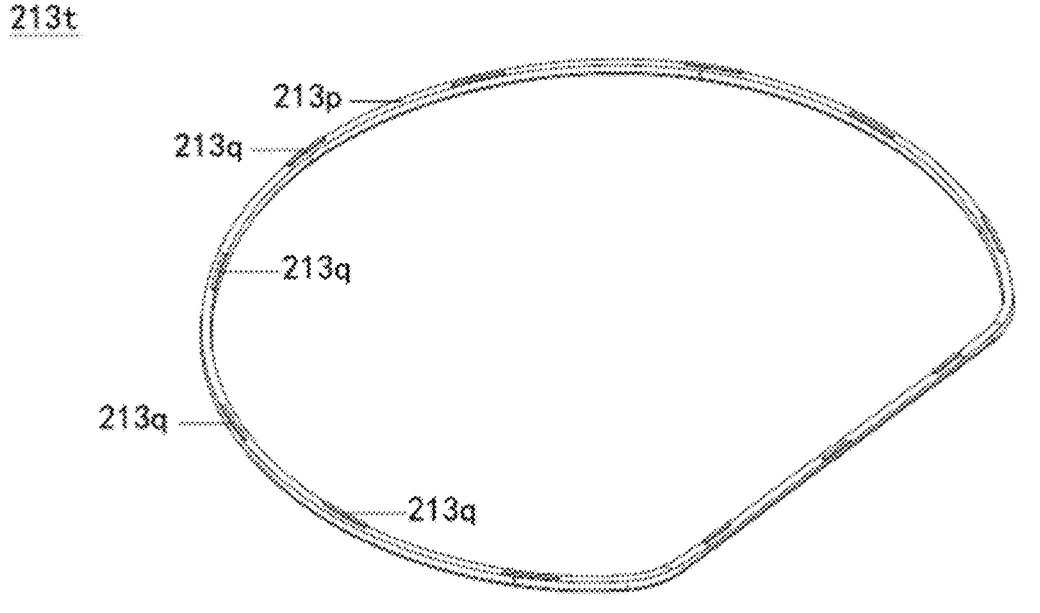
FIG. 12 is a schematic diagram of a structure of a sealing bracket of the first host housing in FIG. 8.

As shown in FIG. 8 and FIG. 12, the sealing bracket 213*t* may enclose a circle, and a shape of the sealing bracket 213*t* matches a shape of the circumferential edge of the first bracket 213*b*. The sealing bracket 213 may include a bracket main portion 213*p* and several protrusions 213*q* protruding from a side of the bracket main portion 213*p*. All the protrusions 213*q* may be spaced from each other. A previous protrusion 213*q* may be close to an outer side of the bracket main portion 213*p*, a current protrusion 213*q* adjacent to the previous protrusion 213*q* may be close to an inner side of the bracket main portion 213*p*, and all the protrusions 213*q* may be arranged according to this rule. In another embodiment, all the protrusions 213*q* may alternatively not be arranged in a "one inside one outside" manner. For example, all the protrusions 213*q* may be located on the outer side or the inner side of the bracket main portion 213*p*.

As shown in FIG. 8, the sealing ring 213*s* may enclose a circle, and a shape of the sealing ring 213*s* matches the shape of the sealing bracket 213*t*. The sealing ring 213*s* is fixedly connected to the sealing bracket 213*t*. For example, the sealing ring 213*s* and the sealing bracket 213*t* may be integrally formed, for example, formed by using an integral injection molding technique. The sealing bracket 213*t* may have a hard material and large structural strength, and is not easily deformed. The sealing ring 213*s* may have a soft material and small structural strength, and is easily deformed. A component including the sealing ring 213*s* and the sealing bracket 213*t* may be referred to as a sealing member.

Figure 13:
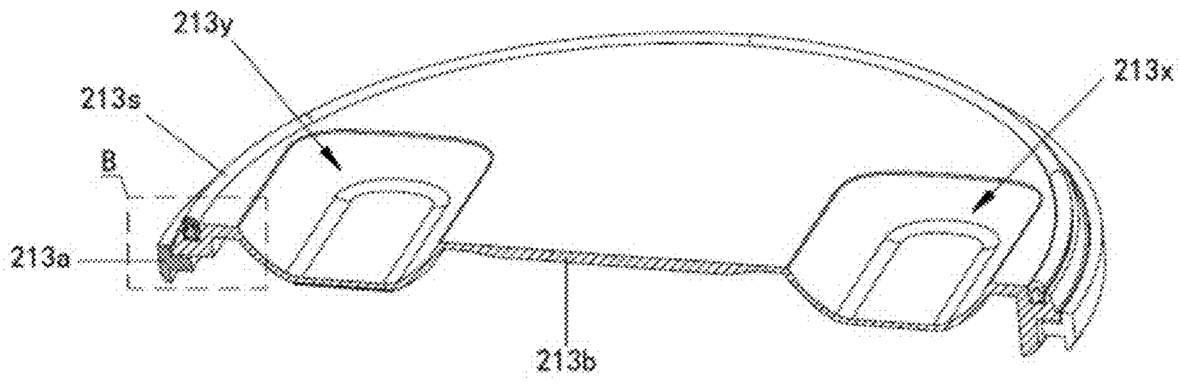
FIG. 13 is a schematic diagram of an A-A sectional structure of the first host housing in FIG. 9.
Figure 14:
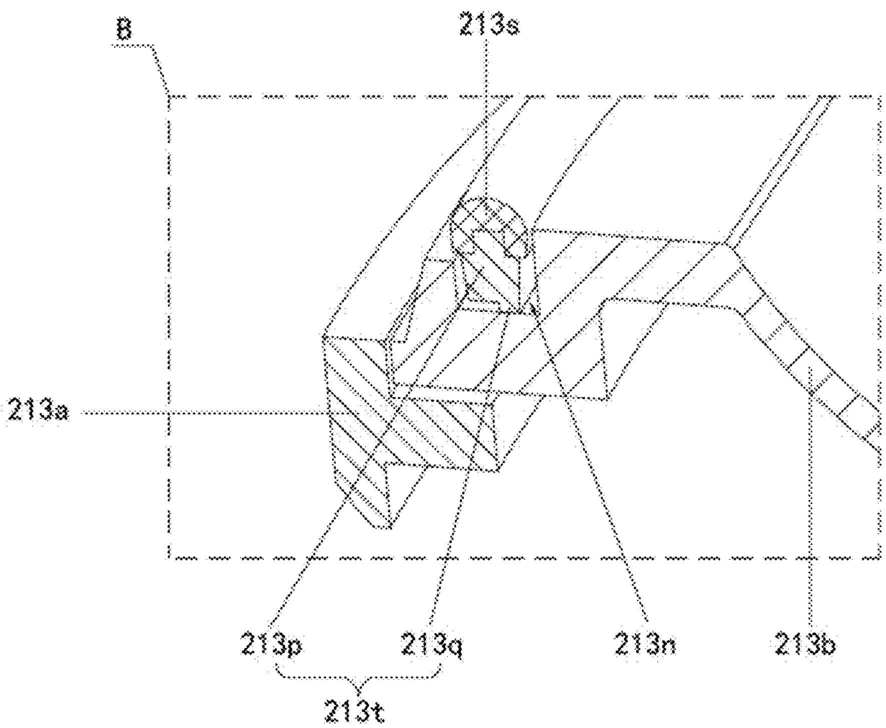
FIG. 14 is a schematic diagram of a partially enlarged structure at a position B in FIG. 13.

FIG. 13 shows an assembly structure including the first frame body 213*a*, the first bracket 213*b*, the sealing bracket 213*t*, and the sealing ring 213*s*. FIG. 14 is a partially enlarged schematic diagram at a position B in FIG. 13.

As shown in FIG. 14, a groove 213*n* may be provided on the circumferential edge of the first bracket 213*b*. With reference to FIG. 13 and FIG. 14, the groove 213*n* surrounds the circumferential edge of the first bracket 213*b*, and the groove 213*n* may surround the periphery of the first accommodation groove 213*y* and the second accommodation groove 213*x*. The sealing bracket 213*t* is fastened in the groove 213*n*, and the protrusion 213*q* may be in contact with a bottom surface of the groove 213*n*. A gap is formed between a part that is on the bracket main portion 213*p* and on which no protrusion 213*q* is disposed and the bottom surface of the groove 213*n*.

For example, the sealing bracket 213*t* may be bonded in the groove 213*n* by using a dispensing technique. An adhesive may be filled in the groove 213*n*, and filled in the gap between the part that is of the bracket main portion 213*p* and on which no protrusion 213*q* is disposed and the bottom surface of the groove 213*n*. Because the sealing bracket 213*t* has several protrusions 213*q* that are distributed at a spacing, several gaps are formed between the sealing bracket 213*t* and the bottom surface of the groove 213*n*. In this way, a filling amount of the adhesive can be ensured, and bonding strength can be ensured. In addition, due to existence of the gaps, the adhesive is not easy to overflow. In this way, a yield rate of the dispensing technique can be ensured As shown in FIG. 14, the sealing ring 213*s* is located on a side that is of the sealing bracket 213*t* and that is far away from the protrusion 213*q*. In the following descriptions, the sealing ring 213*s* is configured to seal a gap between the first bracket 213*b* and a second host housing 231 of the host 2.

In this embodiment, the groove 213*n* of the first frame body 213*a* is narrow, and the sealing ring 213*s* is thin and soft (in other words, material hardness of the sealing ring 213*s* is small). If the sealing ring 213*s* is separately mounted into the groove 213*n*, it may be difficult to mount the sealing ring 213*s*. However, if the soft sealing ring 213*s* is connected to the hard sealing bracket 213*t* (material hardness of the sealing bracket 213*t* is large), and then the sealing bracket 213*t* is mounted into the groove 213*n*, the sealing ring 213*s* can be more easily assembled to the first frame body 213*a*.

First Host Circuit Board Assembly 212

Figure 15:
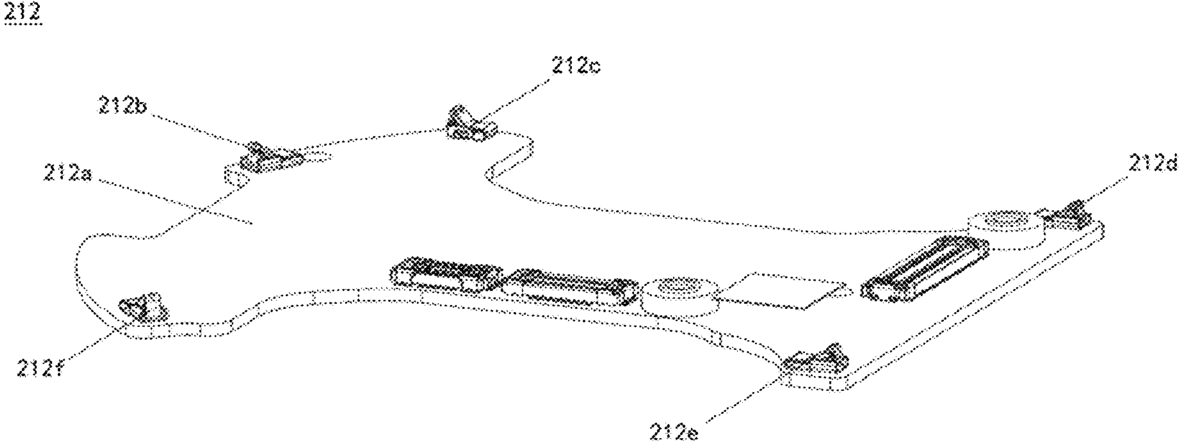
FIG. 15 is a schematic diagram of a structure of a first host circuit board assembly of the wearable device in FIG. 6.

As shown in FIG. 15, the first host circuit board assembly 212 may include a circuit board 212*a* and components disposed on the circuit board 212*a*. The circuit board 212*a* may be, for example, a primary circuit board of the host 2. The components on the circuit board 212*a* may include, for example, a grounding spring 212*b*, a grounding spring 212*c*, a grounding spring 212*d*, a grounding spring 212*e*, and a feeding spring 212*f*. The grounding spring 212*b*, the grounding spring 212*c*, the grounding spring 212*d*, and the grounding spring 212*e* all may be electrically connected to a ground on the circuit board 212*a*, and the feeding spring 212*f* may be connected to a feed point on the circuit board 212*a*. The components on the circuit board 212*a* may further include a magnetic field sensor, for example, a Hall sensor or a magnetometer.

With reference to FIG. 6 and FIG. 7, the first host circuit board assembly 212 may be mounted on a side that is of the first bracket 213*b* and that is far away from the opening of the first accommodation groove 213*y*, and is partially located between the groove wall of the first accommodation groove 213*y* and the groove wall of the second accommodation groove 213*x*.

Display 211

As shown in FIG. 6, the display 211 may have a circular outline, and an edge of the display 211 may have a transition rounded corner. The display 211 may be connected to both the first frame body 213*a* and the first bracket 213*b* of the first host housing 213. The display 211 may face the first host circuit board assembly 212. The display 211 may be electrically connected to the first host circuit board assembly 212, to implement image display. The display 211 may further have a touch control function.

As shown in FIG. 4 and FIG. 6, the second part 23 of the host 2 of the wearable device 1 may include the second host housing 231, a host battery 234, a third host housing 232, a second host circuit board assembly 235, a wireless charging coil 236, and a fourth host housing 233.

Second Host Housing 231

Figure 16:
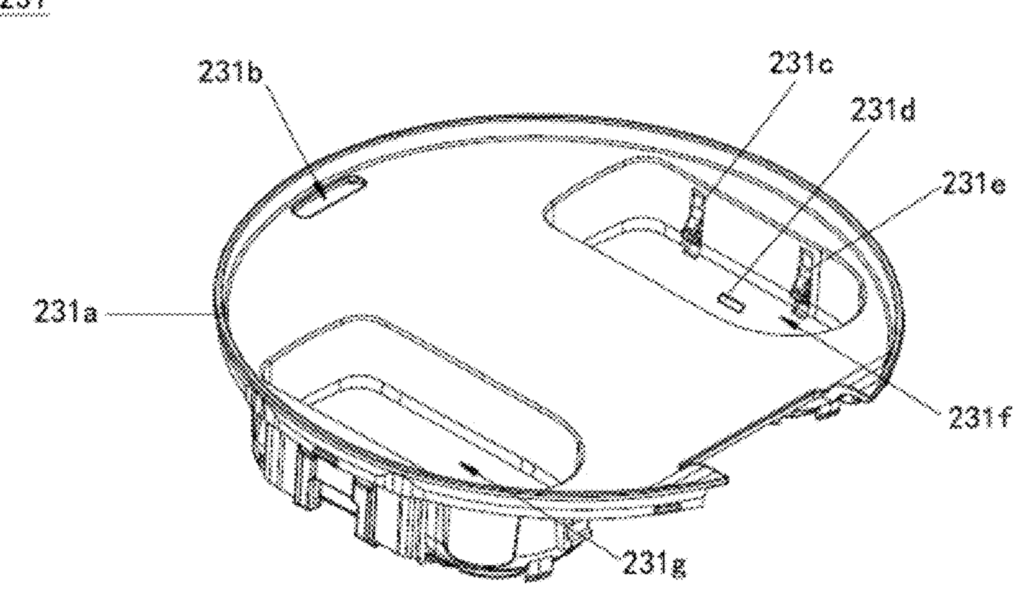
FIG. 16 is a schematic diagram of a structure of a second host housing of the wearable device in FIG. 6.
Figure 17:
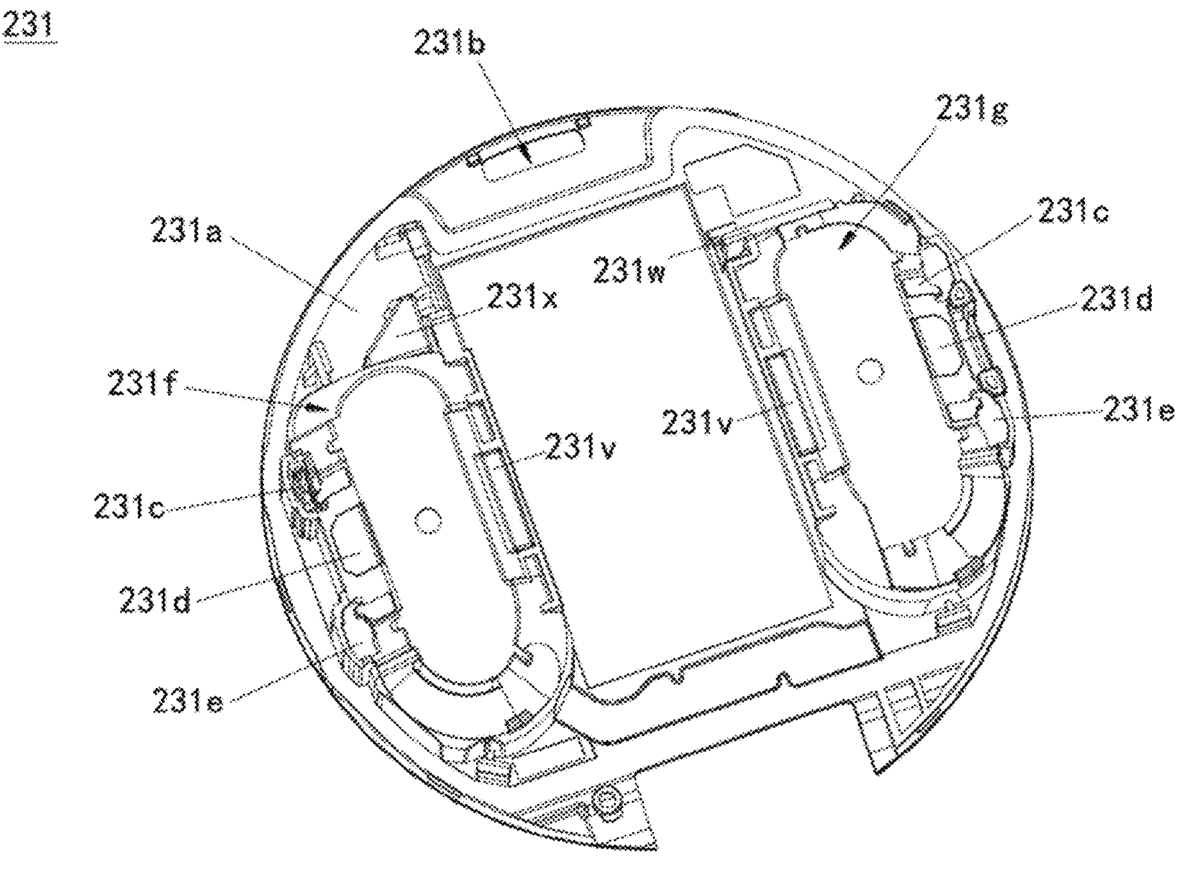
FIG. 17 is a schematic diagram of a structure of a second host housing of the wearable device in FIG. 6.
Figure 18:
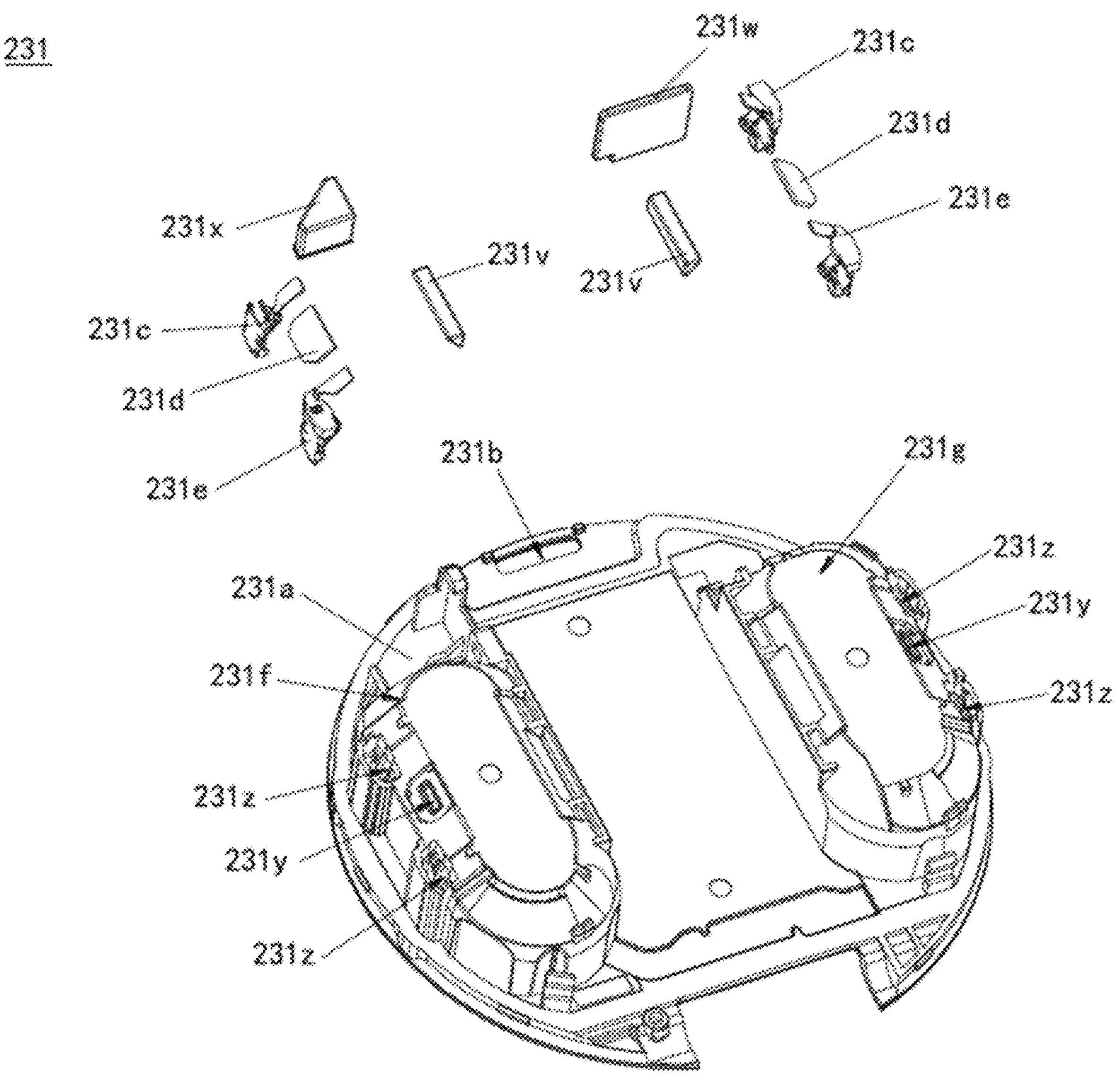
FIG. 18 is a schematic exploded view of a structure of the second host housing in FIG. 17.

As shown in FIG. 16, FIG. 17, and FIG. 18, the second host housing 231 may include a second bracket 231*a*, a second charging spring 231*c*, a first charging spring 231*e*, a foreign matter detection spring 231*d*, a state detection magnet 231*x*, a state detection magnet 231*w*, and a second host attachment magnet 231*v*.

Figure 19:
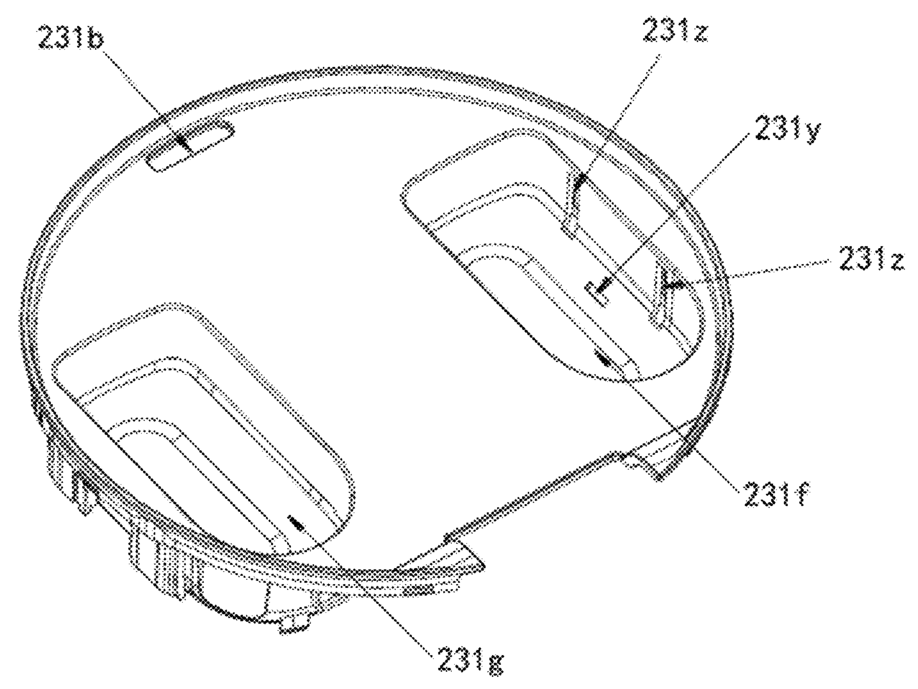
FIG. 19 is a schematic diagram of a structure of a second bracket of the second host housing in FIG. 16.

As shown in FIG. 19, the second bracket 231*a* may have a roughly circular outline. A third accommodation groove 231*f* and a fourth accommodation groove 231*g* may be formed in a local region of the second bracket 231*a*, and the third accommodation groove 231*f* and the fourth accommodation groove 231*g* are arranged at a spacing. Structures of the third accommodation groove 231*f* and the fourth accommodation groove 231*g* may be basically consistent. From a perspective of one side of the second bracket 231*a*, the local region in which the third accommodation groove 231*f* and the fourth accommodation groove 231*g* are formed is in a concave shape. From a perspective of the other side of the second bracket 231*a*, the local region in which the third accommodation groove 231*f* and the fourth accommodation groove 231*g* are formed is in a protrusion shape.

With reference to FIG. 19 and FIG. 4, the third accommodation groove 231*f* is configured to accommodate the first earphone 31, and the fourth accommodation groove 231*g* is configured to accommodate the second earphone 32. When the host 2 is closed, the third accommodation groove 231*f* and the first accommodation groove 213*y* enclose an accommodation space used to accommodate the first earphone 31, and the fourth accommodation groove 231*g* and the second accommodation groove 213*x* enclose an accommodation space used to accommodate the second earphone 32.

In this embodiment, a groove depth of the third accommodation groove **231*f* may be greater than a groove depth of the first accommodation groove 213*y*, and a groove depth of the fourth accommodation groove 231*g* may be greater than a groove depth of the second accommodation groove 213*x*. A groove depth may be defined as a maximum distance from an opening of an accommodation groove (a collective name of the first accommodation groove 213*y*, the second accommodation groove 213*x*, the third accommodation groove 231*f*, and the fourth accommodation groove 231*g*) to a groove bottom surface of the accommodation groove in a normal direction of the circuit board in the host 2**.

In this embodiment, when the host 2 is opened, the earphones 3 may be attached to the first part 21. A part of the first earphone 31 is located in the first accommodation groove **213*y*, and the other part is located outside the first accommodation groove 213*y*. A maximum distance between the part that is of the first earphone 31 and that is located in the first accommodation groove 213*y* and a plane on which the opening of the first accommodation groove 213*y* is located may be defined as a first distance, and a maximum distance between the part that is of the first earphone 31 and that is outside the first accommodation groove 213*y* and the plane on which the opening of the first accommodation groove 213*y* is located may be defined as a second distance, where the first distance is less than the second distance. In other words, when the host 2 is opened, a small part of the first earphone 31 is located in the first accommodation groove 213*y*, and a large part of the first earphone 31 is exposed outside the first accommodation groove 213*y*. For the second earphone 32, similarly, when the host 2 is opened, a small part of the second earphone 32 is located in the second accommodation groove 213*x*, and a large part of the second earphone 32 is located outside the second accommodation groove 213*x***. The foregoing design is further described below.

As shown in FIG. 19, the groove wall of the third accommodation groove **231*f* may be provided with two through holes 231*z*, and the two through holes 231*z* may be provided, for example, on a side wall that is of the third accommodation groove 231*f* and that is far away from the fourth accommodation groove 231*g*. There is a spacing between the two through holes 231*z*. The two through holes 231*z* are respectively configured to mount the second charging spring 231*c* and the first charging spring 231*e* (descriptions are further provided below). The groove wall of the third accommodation groove 231*f* may be further provided with a through hole 231*y*, and the through hole 231*y* may be, for example, roughly located on a bottom wall of the third accommodation groove 231*f*. There is a spacing between the through hole 231*y* and each of the two through holes 231*z*. The through hole 231*y* is configured to mount the foreign matter detection spring 231*d*** (descriptions are further provided below).

As shown in FIG. 19, a groove wall of the fourth accommodation groove **231*g* may also be provided with the through hole 231*z* and the through hole 231*y* (which are collectively referred to as a through hole below). The through hole on the groove wall of the fourth accommodation groove 231*g* may be located on a side that is of the fourth accommodation groove 231*g* and that is far away from the third accommodation groove 231*f*. The through hole on the groove wall of the fourth accommodation groove 231*g* and the through hole on the groove wall of the third accommodation groove 231*f* may be basically symmetrically distributed on two sides of a symmetric surface of the second bracket 231*a***.

As shown in FIG. 19, a through hole **231*b* may be formed at an edge of the second bracket 231*a*. The through hole 231*b* may be located between the third accommodation groove 231*f* and the fourth accommodation groove 231*g*, and distances between the through hole 231*b* and the third accommodation groove 231*f* and between the through hole 231*b* and the fourth accommodation groove 231*g* may be basically equal. With reference to FIG. 19 and FIG. 4, the through hole 231*b* is configured to be passed through by the latch portion 213*d* in the first part 21** (descriptions are further provided below).

Charging Spring

As shown in FIG. 18, there may be two second charging springs **231*c* and two first charging springs 231*e*. With reference to FIG. 16 to FIG. 19, one second charging spring 231*c* and one first charging spring 231*e* are mounted on the groove wall of the third accommodation groove 231*f*, and the other second charging spring 231*c* and the other first charging spring 231*e* are mounted on the groove wall of the fourth accommodation groove 231*g*. For the third accommodation groove 231*f*, the second charging spring 231*c* may be located at a through hole 231*z* of the third accommodation groove 231*f*, and a contact head of the second charging spring 231*c* may extend into the third accommodation groove 231*f* through the through hole 231*z*. The first charging spring 231*e* may be located at another through hole 231*z* of the third accommodation groove 231*f*, and a contact head of the first charging spring 231*e* may extend into the third accommodation groove 231*f* through the another through hole 231*z*. For the fourth accommodation groove 231*g*, the second charging spring 231*c* may be located at a through hole 231*z* of the fourth accommodation groove 231*g*, and a contact head of the second charging spring 231*c* may extend into the fourth accommodation groove 231*g* through the through hole 231*z*. The first charging spring 231*e* may be located at another through hole 231*z* of the fourth accommodation groove 231*g*, and a contact head of the first charging spring 231*e* may extend into the fourth accommodation groove 231*g* through the another through hole 231*z***.

In this embodiment, the two second charging springs **231*c* and the two first charging springs 231*e* all may be electrically connected to the first host circuit board assembly 212 through a line (for example, a flexible circuit board). The second charging spring 231*c* and the first charging spring 231*e* in the third accommodation groove 231*f* are respectively configured to be in elastic contact with two electrodes on the first earphone 31, and the second charging spring 231*c* and the first charging spring 231*e* in the fourth accommodation groove 231*g* are respectively configured to be in elastic contact with two electrodes on the second earphone 32 (descriptions are further provided below). In this way, the first earphone 31 may be charged by using the second charging spring 231*c* and the first charging spring 231*e* in the third accommodation groove 231*f*, and the second earphone 32 may be charged through the second charging spring 231*c* and the first charging spring 231*e* in the fourth accommodation groove 231*g***.

Foreign Matter Detection Spring

As shown in FIG. 18, there may be two foreign matter detection springs **231*d*. With reference to FIG. 16 to FIG. 19, one foreign matter detection spring 231*d* may be mounted on the groove wall of the third accommodation groove 231*f*, the foreign matter detection spring 231*d* may be located at the through hole 231*y* of the third accommodation groove 231*f*, and a contact head of the foreign matter detection spring 231*d* may penetrate the through hole 231*y*. The other foreign matter detection spring 231*d* may be mounted on the groove wall of the fourth accommodation groove 231***g*, the foreign matter detection spring 231*d* may be located at the through hole 231*y* of the fourth accommodation groove 231*g*, and a contact head of the foreign matter detection spring 231*d* may penetrate the through hole 231*y*.

In this embodiment, the foreign matter detection spring 231*d* may be electrically connected to the first host circuit board assembly 212 through a line (for example, a flexible circuit board). The foreign matter detection spring 231*d* is configured to implement foreign matter detection (detecting whether foreign matter enters the third accommodation groove 231*f* and the fourth accommodation groove 231*g*). A specific principle is described below.

State Detection Magnet

As shown in FIG. 18, for example, the state detection magnet 231*x* may be a single magnet. The state detection magnet 231*x* may have a single magnetic field direction, or have at least two magnetic field directions (that is, a Halbach array is formed). The state detection magnet 231*w* may be a single magnet. The state detection magnet 231*x* may have a single magnetic field direction, or have at least two magnetic field directions (that is, the magnet may be a Halbach array).

In another embodiment, the state detection magnet may be a Halbach array formed by splicing at least two single magnets.

As shown in FIG. 18 and FIG. 17, the state detection magnet 231*x* may be fastened to a side that is of the second bracket 231*a* and that is far away from the opening of the third accommodation groove 231*f*, and the state detection magnet 231*x* may be adjacent to the groove wall of the third accommodation groove 231*f*, and may be further close to the through hole 231*b*. The state detection magnet 231*w* and the state detection magnet 231*x* are located on the same side of the second bracket 231*a*, and the state detection magnet 231*w* may be adjacent to the groove wall of the fourth accommodation groove 231*g*.

Second Host Attachment Magnet 231*v*

As shown in FIG. 18, for example, the second host attachment magnet 231*v* may be a single magnet. The second host attachment magnet 231*v* may have a single magnetic field direction, or have at least two magnetic field directions (that is, a Halbach array is formed).

Based on a product requirement, in another embodiment, the second host attachment magnet 231*v* may alternatively be a Halbach array formed by splicing at least two single magnets.

As shown in FIG. 18 and FIG. 17, in this embodiment, there may be, for example, two second host attachment magnets 231*v*, and structures of the two second host attachment magnets 231*v* may be, for example, consistent. Both the two second host attachment magnets 231*v* may be fastened on a side that is of the second bracket 231*a* and that is far away from the opening of the third accommodation groove 231*f*. One second host attachment magnet 231*v* may be located on a side that is of the groove wall of the third accommodation groove 231*f* and that faces the fourth accommodation groove 231*g*, and the other second host attachment magnet 231*v* may be located on a side that is of the groove wall of the fourth accommodation groove 231*g* and that faces the third accommodation groove 231*f*.

In another embodiment, a quantity and positions of second host attachment magnets 231*v* may be designed based on a product requirement. For example, one second host attachment magnet 231*v* may be mounted on each of two sides of the groove wall of the third accommodation groove 231*f*, and one second host attachment magnet 231*v* may be mounted on each of two sides of the groove wall of the fourth accommodation groove 231*g*.

Host Battery 234

Figure 20:
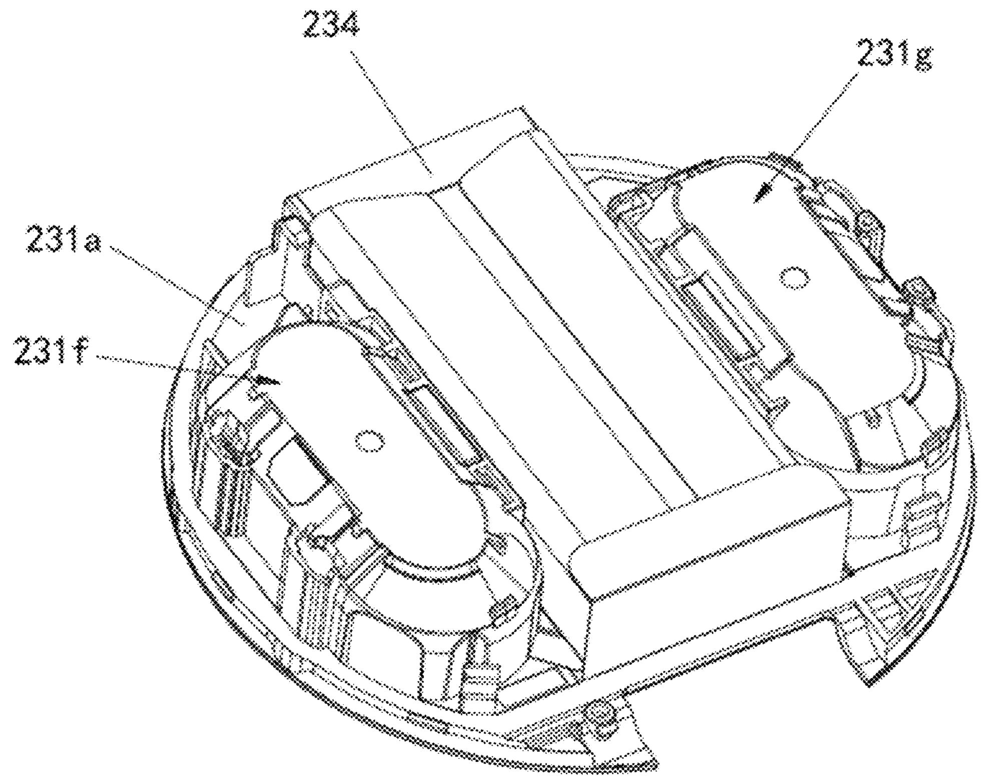
FIG. 20 is a schematic diagram of an assembly structure including a second host housing and a host battery.

As shown in FIG. 6 and FIG. 20, the host battery 234 may be fastened to the second bracket 231*a*, and is located on a side that is of the second bracket 231*a* and that is far away from the opening of the third accommodation groove 231*f*. The host battery 234 may be located between the groove wall of the third accommodation groove 231*f* and the groove wall of the fourth accommodation groove 231*g*. The host battery 234 may be electrically connected to the second host circuit board assembly 235 through a line (for example, a flexible circuit board), and the second host circuit board assembly 235 may be electrically connected to the first host circuit board assembly 212 through a line (for example, a flexible circuit board). Therefore, the host battery 234 can be electrically connected to the first host circuit board assembly 212.

Third Host Housing 232

Figure 21:
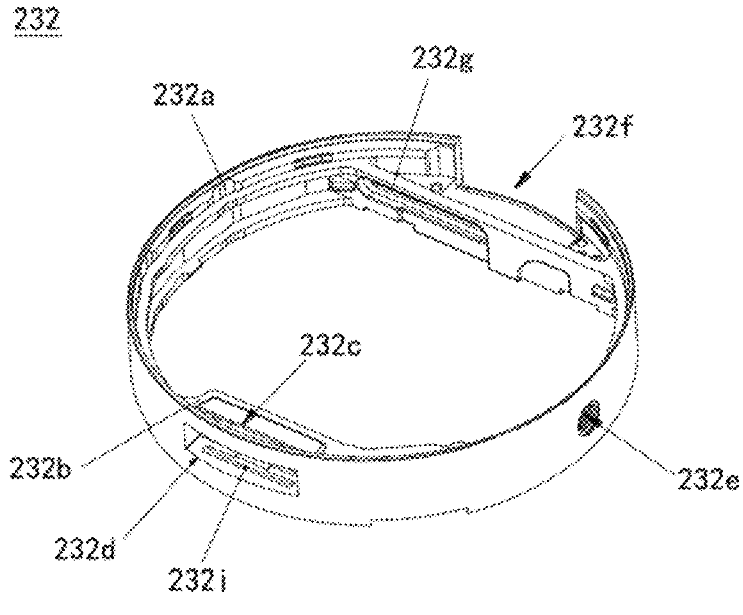
FIG. 21 is a schematic diagram of an assembly structure of a third host housing of the wearable device in FIG. 6.

As shown in FIG. 21, the third host housing 232 may be roughly of a ring-shaped structure. The third host housing 232 may include a circumferential side wall 232*a*, an inner bearing platform 232*b*, and an inner bearing platform 232*g*. The circumferential side wall 232*a* may enclose a ring shape. Both the inner bearing platform 232*b* and the inner bearing platform 232*g* are connected to an inner side of the circumferential side wall 232*a*, and the inner bearing platform 232*b* and the inner bearing platform 232*g* may be disposed at a spacing. For example, the inner bearing platform 232*b* and the inner bearing platform 232*g* may be roughly located at two ends of the circumferential side wall 232*a* in a radial direction.

Figure 22:
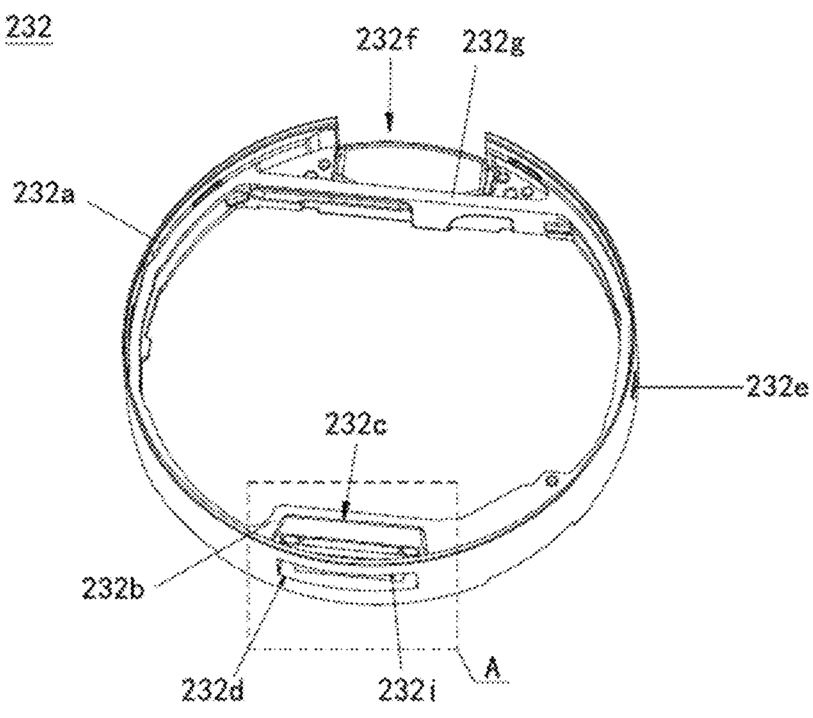
FIG. 22 is a schematic diagram of an assembly structure of a third host housing of the wearable device in FIG. 6.
Figure 24:
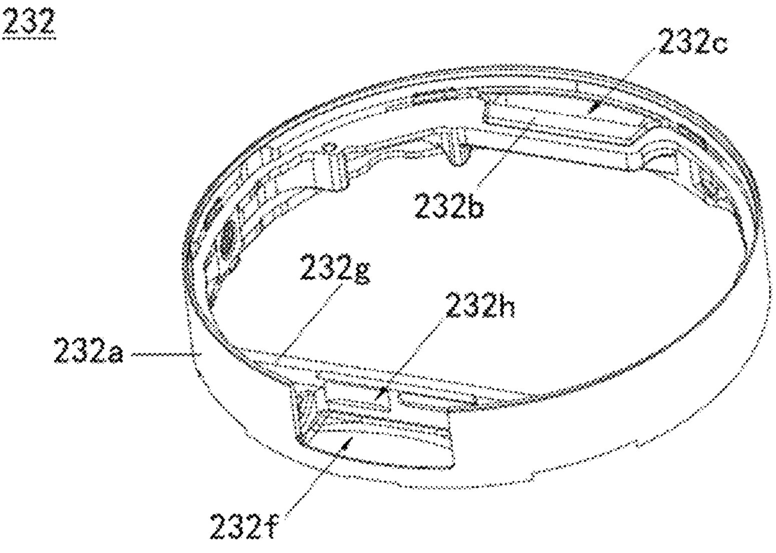
FIG. 24 is a schematic diagram of an assembly structure of a third host housing of the wearable device in FIG. 6.

As shown in FIG. 22, the third host housing 232 may have a rotating shaft mounting space 232*f*, and the rotating shaft mounting space 232*f* may be a groove formed on the inner bearing platform 232*g* and passing through the circumferential side wall 232*a*. The rotating shaft mounting space 232*f* is used to mount the rotating shaft assembly 22. As shown in FIG. 24, an inner surface of the rotating shaft mounting space 232*f* may have a limiting groove 232*h*, and the limiting groove 232*h* may be opposite to an opening formed by the rotating shaft mounting space 232*f* on the circumferential side wall 232*a*.

As shown in FIG. 22, the third host housing 232 may further have an open button mounting space. The open button mounting space may form a second opening 232*c* on the inner bearing platform 232*b*, and the open button mounting space may further pass through the circumferential side wall 232*a* and form a first opening 232*d* on the circumferential side wall 232*a*. The open button mounting space may be opposite to the rotating shaft mounting space 232*f*. For example, the two may be roughly located at two opposite ends of a same diameter of the third host housing 232.

Figure 23:
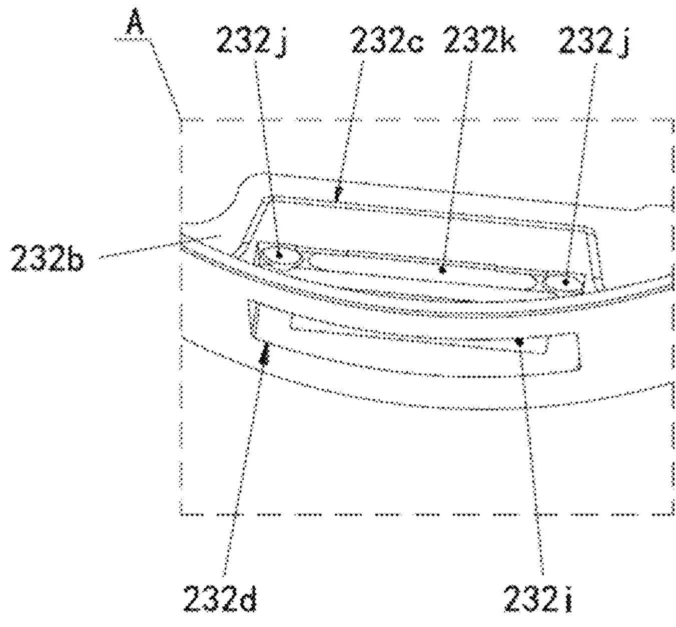
FIG. 23 is a schematic diagram of a partially enlarged structure at a position A in FIG. 22.

As shown in FIG. 22 and FIG. 23, a groove 232*i* may be provided on an inner surface that is in the open button mounting space and that is opposite to the second opening 232*c*. The groove 232*i* may be a long-strip groove. A guiding slot 232*j* and a groove 232*k* may be provided on an inner surface that is in the open button mounting space and that is opposite to the first opening 232*d*. The guiding slot 232*j* may be a round hole, and there may be two guiding slots 232*j*. The groove 232*k* may be in a runway shape, and the groove 232*k* may be located between the two guiding slots 232*j*.

As shown in FIG. 21 and FIG. 22, the third host housing 232 may further have a function button mounting through hole 232*e*, and the function button mounting through hole 232*e* may be provided on the circumferential side wall 232*a*, and may be located between the rotating shaft mounting space 232*f* and the first opening 232*d*. The function button mounting through hole 232*e* is configured to mount the function button 24.

Open Button 25

Figure 25:
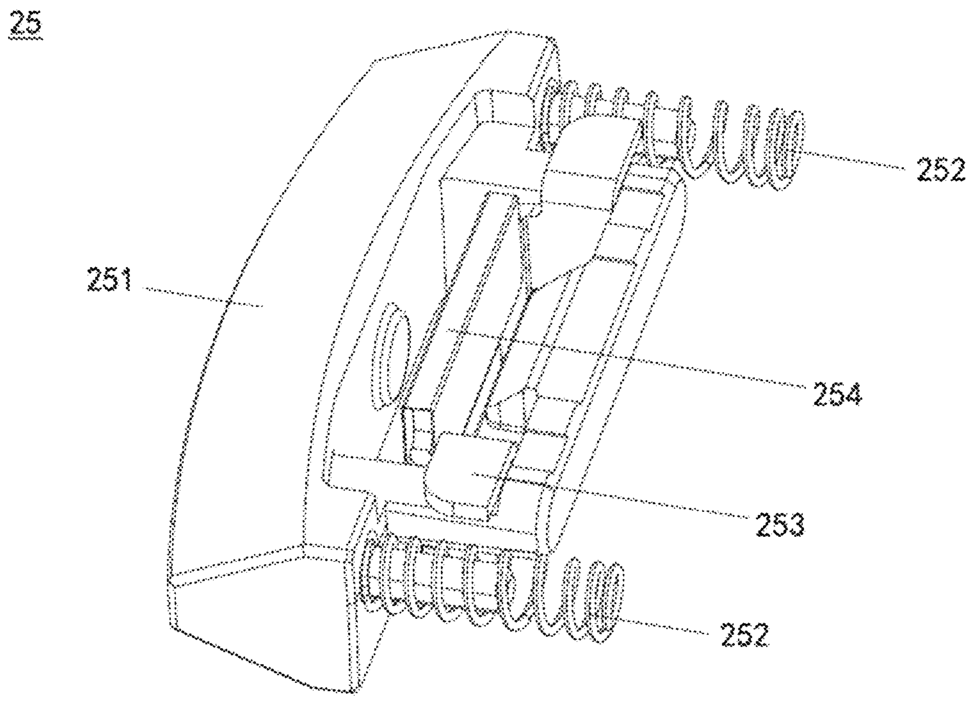
FIG. 25 is a schematic diagram of an assembly structure of an open button of the wearable device in FIG. 6.
Figure 26:
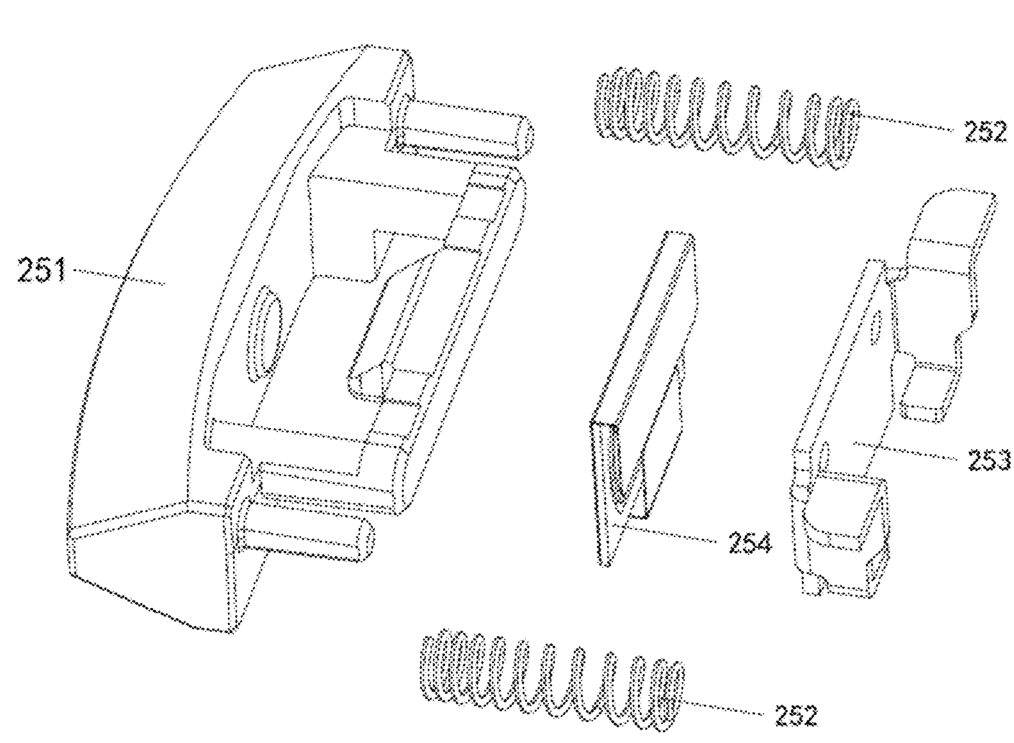
FIG. 26 is a schematic exploded view of a structure of the open button in FIG. 25.

As shown in FIG. 25 and FIG. 26, the open button 25 may include a cap 251, an elastic member 252, a button support 253, and a touch-sensitive spring 254.

Figure 27:
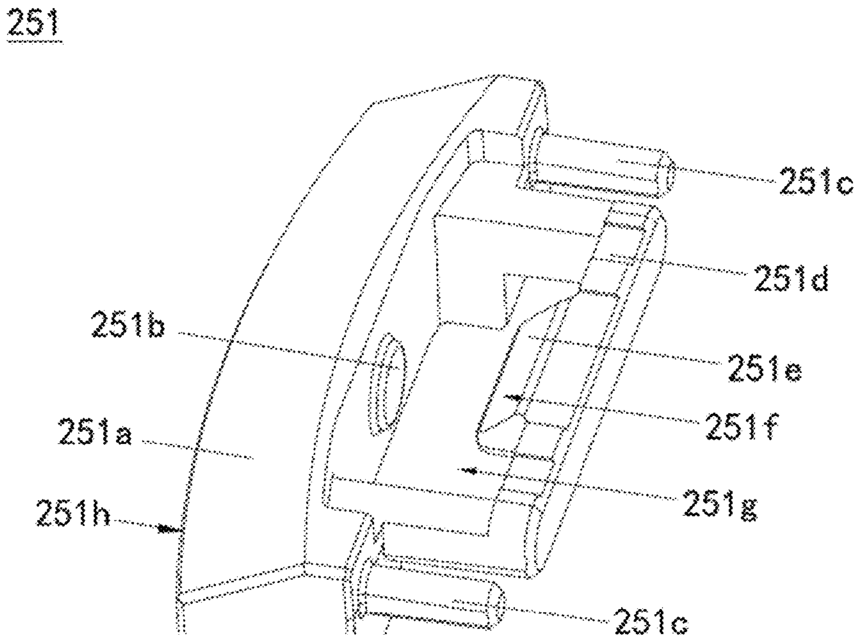
FIG. 27 is a schematic diagram of a structure of a cap of the open button in FIG. 25.

As shown in FIG. 27, the cap 251 may be of an integrated frame structure. The cap 251 may include a pressing portion 251*a*, a bump 251*b*, a guiding portion 251*c*, a bearing portion 251*d*, and a buckle 251*e*.

As shown in FIG. 27, the pressing portion 251*a* may be roughly in a long-strip shape, and a cross section shape of the pressing portion 251*a* is roughly a trapezoid (the cross section may be perpendicular to a length direction of the pressing portion 251*a*). The pressing portion 251*a* has a surface 251*h*, and the surface 251*h* is a surface on which an upper bottom of the trapezoidal cross section of the pressing portion 251*a* is located.

As shown in FIG. 27, the bump 251*b* may be disposed on another surface of the pressing portion 251*a*, and is opposite to the surface 251*h* of the pressing portion 251*a*. A surface of the bump 251*b* may be an arc surface or a plane, or may be formed by connecting an arc surface to a plane.

As shown in FIG. 27, the guiding portion 251*c* may be a column, for example, a cylinder. The guiding portion 251*c* may protrude from the another surface of the pressing portion 251*a*, and the guiding portion 251*c* and the bump 251*b* may be located on a same side of the pressing portion 251*a*. There may be two guiding portions 251*c*, and the two guiding portions 251*c* may be respectively located at two opposite ends of the pressing portion 251*a*. The guiding portions 251*c* are configured to guide the cap 251 when the cap 251 moves.

As shown in FIG. 27, the bearing portion 251*d* is connected to a side that is of the pressing portion 251*a* and that is far away from the surface 251*h*, and the bearing portion 251*d* is located between the two guiding portions 251*c*. The bearing portion 251*d* may be roughly C-shaped, two free ends of a C-shaped structure of the bearing portion 251*d* are both connected to the pressing portion 251*a*, and the bearing portion 251*d* and the pressing portion 251*a* may jointly form an open space 251*g*. The bearing portion 251*d* is configured to bear the button support 253.

As shown in FIG. 27, the buckle 251*e* may be connected to the bearing portion 251*d*, and is located in the open space 251*g*. The buckle 251*e* may face the bump 251*b*. The buckle 251*e* may have an assembly guide slope 251*f*. The buckle 251*e* is the latch structure in the open button 25 described above.

As shown in FIG. 25 and FIG. 26, the elastic member 252 may be a spring. Alternatively, the elastic member 252 may be another component that can be elastically scaled. There may be two elastic members 252. With reference to FIG. 26 and FIG. 27, one elastic member 252 may be sleeved on one guiding portion 251*c*, and the other elastic member 252 may be sleeved on the other guiding portion 251*c*.

Figure 28:
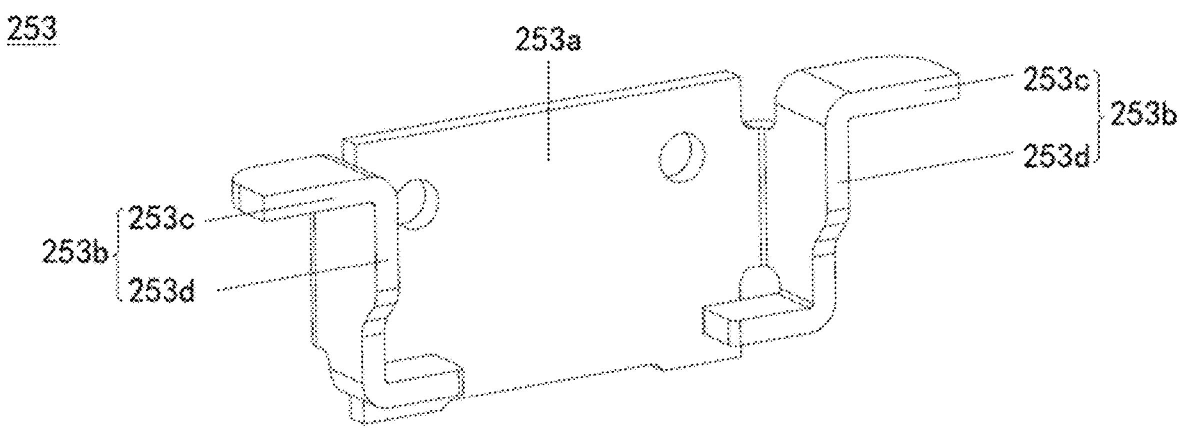
FIG. 28 is a schematic diagram of a structure of a button support of the open button in FIG. 25.

As shown in FIG. 28, the button support 253 may include a support body 253*a* and two mounting ears 253*b* respectively connected to two sides of the support body 253*a*. The support body 253*a* may be in a flat-plate shape. The mounting ear 253*b* may be in a bent-plate shape. The mounting ear 253*b* may include a first plate 253*c* and a second plate 253*d*, and the first plate 253*c* and the second plate 253*d* may be roughly bent by 90 degrees. Two first plates 253*c* in the two mounting ears 253*b* may be bent backwards relative to second plates 253*d*. For example, in a perspective of the figure, a first plate 253*c* on the left may be bent leftwards relative to a second plate 253*d* on the left, and a first plate 253*c* on the right may be bent rightwards relative to a second plate 253*d* on the right.

In another embodiment, the two mounting ears may alternatively be bent in a same direction.

With reference to FIG. 27 and FIG. 28, the button support 253 may be mounted into the open space 251*g* of the cap 251, and the two mounting ears 253*b* of the button support 253 may be supported on the bearing portion 251*d* of the cap 251. The button support 253 is configured to fasten the touch-sensitive spring 254, and may be further configured to limit the cap 251 when the cap 251 moves to a limit position.

Figure 29:
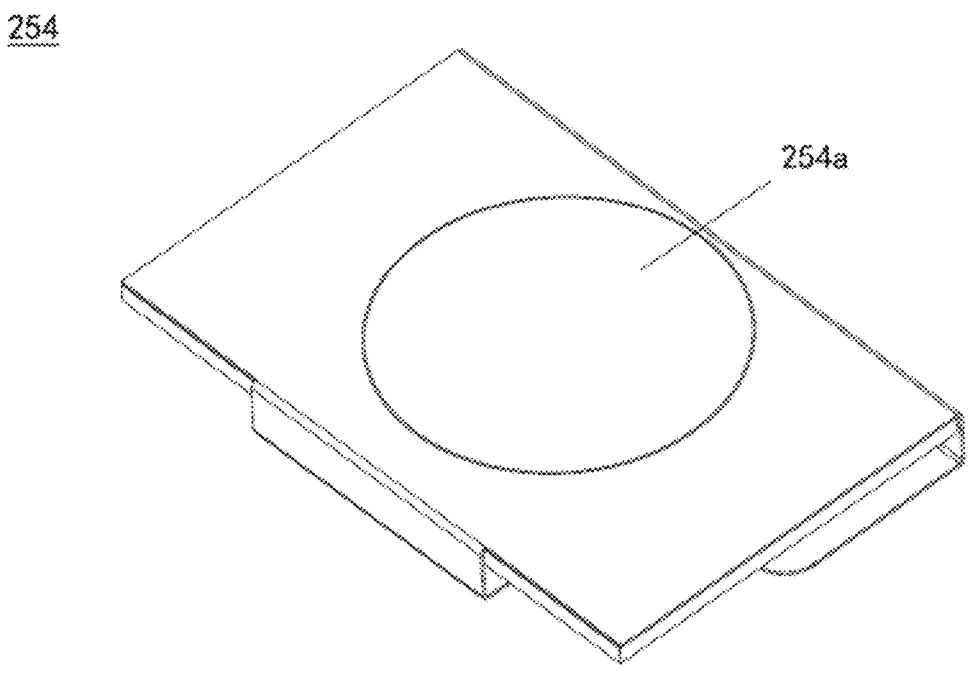
FIG. 29 is a schematic diagram of a structure of a touch-sensitive spring of the open button in FIG. 25.

In this embodiment, the touch-sensitive spring 254 has elastic deformation performance, and can be compressed when a force is applied, and rebound after pressure disappears. As shown in FIG. 29, the touch-sensitive spring 254 may be, for example, a dome spring, where the dome spring may be formed by a polyethylene glycol terephthalate (polyethylene glycol terephthalate, PET) sheet, a metal dome (or referred to as a button spring), an adhesive, a film, or the like. The touch-sensitive spring 254 may have an elastic region 254*a*. The elastic region 254*a* may be in a protrusion shape when being not pressed, concave after being pressed, and restore to the protrusion shape after pressure disappears.

With reference to FIG. 29 and FIG. 25, the touch-sensitive spring 254 may be fastened to the button support 253, and the elastic region 254*a* may face the bump 251*b*.

The foregoing describes a detailed structure of the open button 25. The following describes assembly of the open button 25 and the third host housing 232 and cooperation between the open button 251 and the latch portion 213*d* on the first bracket 213*b*.

Figure 30:
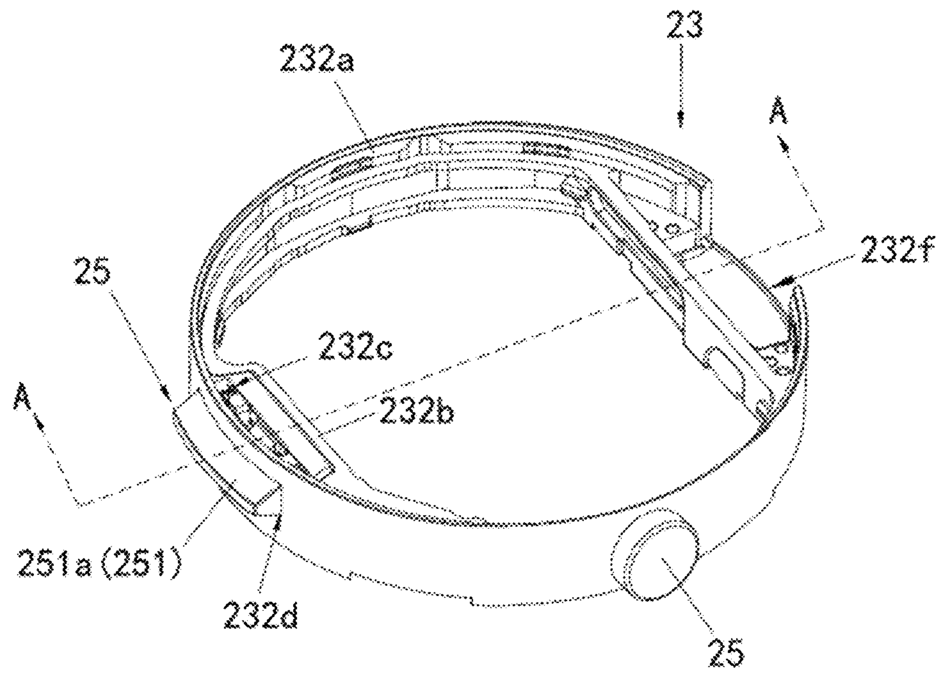
FIG. 30 is a schematic diagram of an assembly structure including an open button and a third host housing.
Figure 31:
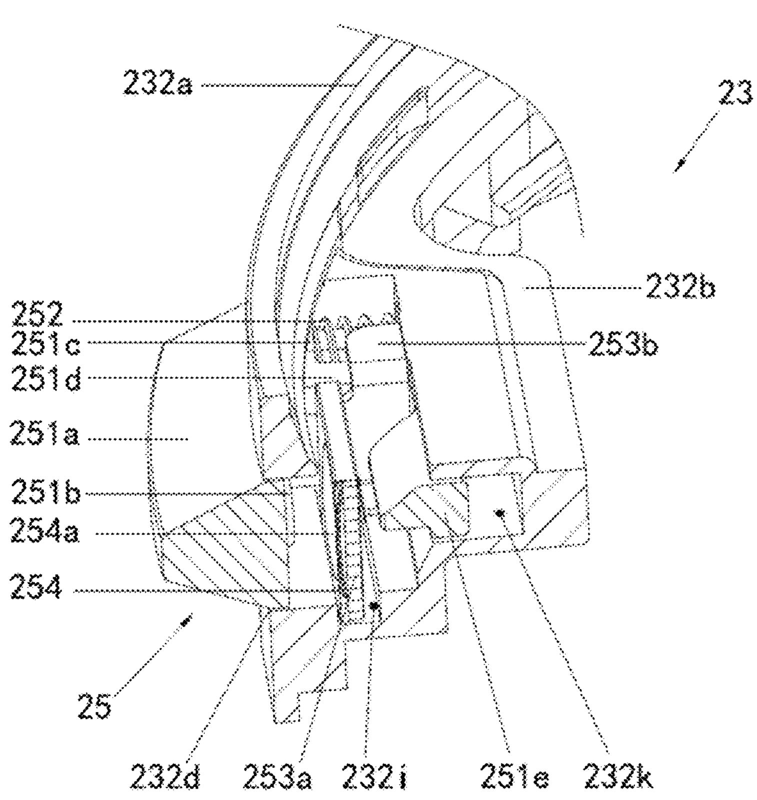
FIG. 31 is a schematic diagram of an A-A sectional structure of FIG. 30.

As shown in FIG. 30 and FIG. 31, the open button 25 may be mounted in the open button mounting space of the third host housing 232. A state of the open button 25 shown in FIG. 30 and FIG. 31 corresponds to the closed state of the host 2.

As shown in FIG. 31, the pressing portion 251*a* may be exposed from the first opening 232*d* of the open button mounting space. With reference to FIG. 31 and FIG. 23, a part of the guiding portion 251*c* may be located in the guiding slot 232*j*, but is not in contact with a bottom surface of the guiding slot 232*j*. As shown in FIG. 31, a part that is of the bearing portion 251*d* and that is spaced opposite to the pressing portion 251*a* may be located in the groove 232*k*. The buckle 251*e* may be located in the open button mounting space and outside the groove 232*k*. The cap 251 may move in an axial direction of the guiding portion 251*c*. Because the first opening 232*d* limits the pressing portion 251*a*, the cap 251 basically cannot move in another direction.

With reference to FIG. 31 and FIG. 23, the elastic member 252 is sleeved on the guiding portion 251*c*, and a part of the elastic member 252 may be located in the guiding slot 232*j*. One end of the elastic member 252 is in contact with the pressing portion 251*a*, and the other end is in contact with the bottom surface of the guiding slot 232*j*.

As shown in FIG. 31 and FIG. 27, the button support 253 may be assembled with the cap 251, and is fastened in the open button mounting space. The support body 253*a* of the button support 253 may be located in the open space 251*g* of the cap 251 and inserted into the groove 232*i*, and the support body 253*a* may press against a side wall that is of the groove 232*i* and that is close to the first opening 232*d*.

The two mounting ears 253*b* of the button support 253 may be respectively supported (or referred to as overlapping) on two sides of the bearing portion 251*d*. Each mounting ear 253*b* may abut against a part that is of the bearing portion 251*d* and that is spaced opposite to the pressing portion 251*a*, so that the cap 251 cannot continue to move out of the open button mounting space. In other words, this is a limiting function of the button support 253 on the cap 251 at the limit position. Each mounting ear 253*b* may press against a top surface of a side wall of the groove 232*k* (a surface that is of the side wall and that faces the first opening 232*d*). In this way, a side wall of the groove 232*i* and a side wall of the groove 232*k* may limit the button support 253 in opposite directions, so that the button support 253 basically cannot move in an axial direction of the guiding slot 232*j*.

As shown in FIG. 31, the touch-sensitive spring 254 may be fastened to the support body 253*a*. The touch-sensitive spring 254 may be inserted into the groove 232*i*, or the touch-sensitive spring 254 may be located outside the groove 232*i*. The touch-sensitive spring 254 is located between the bump 251*b* and the buckle 251*e*, and the elastic region 254*a* of the touch-sensitive spring 254 faces the bump 251*b*. There is a specific spacing between the touch-sensitive spring 254 and the buckle 251*e*.

As shown in FIG. 31, when the user presses the cap 251 from the pressing portion 251*a*, the cap 251 moves into the open button mounting space. The guiding portion 251*c* moves into the guiding slot 232*j*, and the elastic member 252 is gradually compressed. The bearing portion 251*d* slides into the groove 232*k* relative to the mounting ears 253*b*, and the buckle 251*e* moves into the groove 232*k*. The bump 251*b* is close to the touch-sensitive spring 254. When the bump 251*b* squeezes the elastic region 254*a* and enables the elastic region 254*a* to elastically deform, the user can experience a touch feeling feedback.

On the contrary, when the pressing portion 251*a* is no longer pressed, the elastic member 252 rebounds and pushes the cap 251 to move out of the open button mounting space. The guiding portion 251*c* moves outwards the guiding slot 232*j*, and the elastic member 252 gradually extends. The bearing portion 251*d* slides outwards the groove 232*k* relative to the mounting ears 253*b*, and the buckle 251*e* moves outwards the groove 232*k*. The bump 251*b* is far away from the touch-sensitive spring 254. After a part that is of the bearing portion 251*d* and that is spaced opposite to the pressing portion 251*a* re-presses against the mounting ears 253*b*, the cap 251 stops moving.

Figure 32:
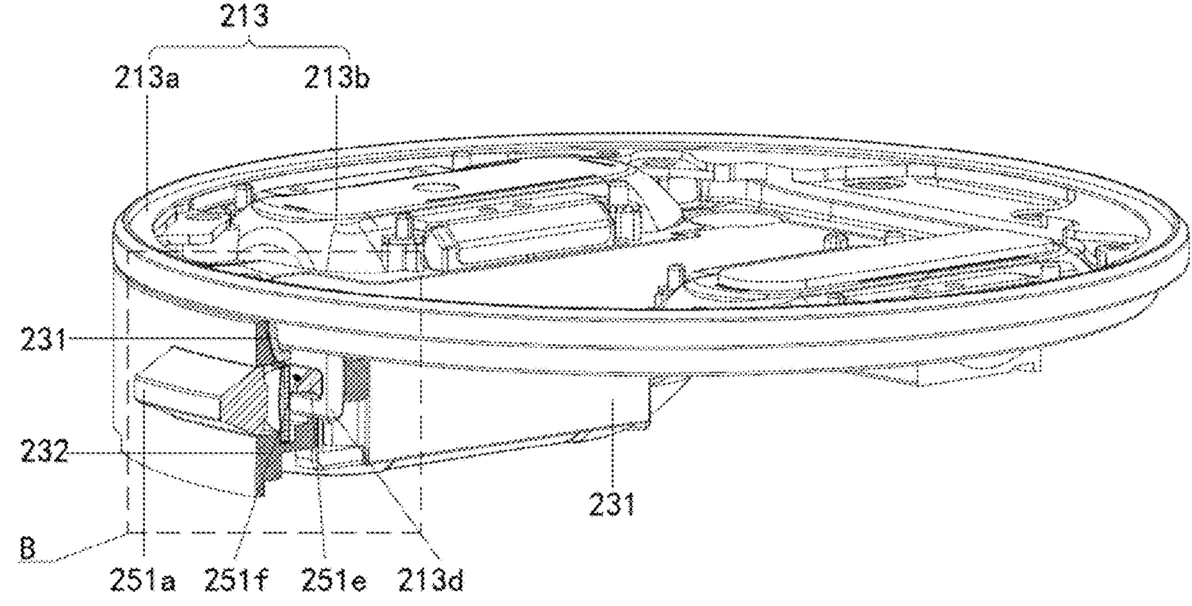
FIG. 32 is a schematic diagram of an assembly structure including an open button and a first host housing.
Figure 33:
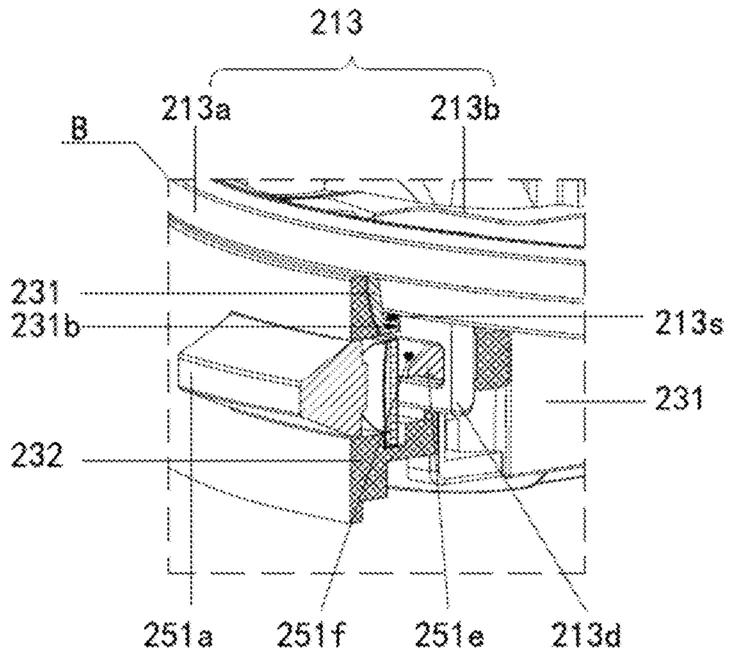
FIG. 33 is a schematic diagram of a partially enlarged structure at a position B in FIG. 32.

FIG. 32 is a schematic sectional view of assembly of the first host housing 213, the second host housing 231, the third host housing 232, and the open button 25. To clearly display an assembly structure, the first host housing 213 is not sectioned. FIG. 33 is a partially enlarged schematic diagram at a position B in FIG. 32.

With reference to FIG. 33 and FIG. 16, the latch portion 213*d* on the first bracket 213*b* of the first host housing 213 may pass through the through hole 231*b* on the second host housing 231, and enter the open button mounting space of the third host housing 232. In addition, the latch portion 213*d* may form a buckle connection with the buckle 251*e*, and the buckle connection is a detachable connection. In this way, through cooperation between the latch portion 213*d* and the buckle 251*e*, it can be maintained that the first host housing 213 and the third host housing 232 are closed. In other words, the first part 21 and the second part 23 of the host 2 can be closed.

As shown in FIG. 33, when the user presses the pressing portion 251*a*, the buckle 251*e* moves and no longer maintains the buckle connection with the latch portion 213*d*. In this case, the first host housing 213 automatically opens under driving of the rotating shaft assembly 22. When the user intends to close the first part 21 and the second part 23, after the latch portion 213*d* is in contact with the buckle 251*e*, the latch portion 213*d* may squeeze the buckle 251*e* until the latch portion 213*d* forms the buckle connection with the buckle 251*e* again. In this case, the first part 21 and the second part 23 are latched.

In the open button 25 of this embodiment, the buckle 251*e* that can reciprocally move is designed, so that the host 2 can be opened and latched. The touch-sensitive spring 254 is designed, so that the touch feeling feedback can be added in a process of opening the host 2, thereby improving user experience.

In another embodiment, based on a product requirement, the host may be opened and latched by using an open button having another structure. For example, a buckle may be disposed on the first support of the first host housing (the buckle corresponds to the buckle 251*e*), and a latch portion is disposed in the open button (for example, the latch portion is disposed on the bearing portion of the cap, and the latch portion corresponds to the latch portion 213*d*). Alternatively, for example, a torsion spring mechanism may be used to provide a rebound force for a movable cap, a buckle (or a latch portion) is designed on the cap of the open button, and the host is opened and closed through cooperation between the buckle (or the latch portion) and the buckle (or the latch portion) that is on the first bracket of the first host housing. In other embodiments, the touch-sensitive spring may be canceled.

In addition, with reference to FIG. 33 and FIG. 13, when the first part 21 and the second part 23 are closed, the first bracket 213*b* and the second host housing 231 are closed and match each other, and the sealing ring 213*s* on the first bracket 213*b* abuts against the circumferential edge of the second host housing 231. In this way, the sealing ring 213*s* can seal the gap between the first bracket 213*b* and the second host housing 231, to prevent external water vapor from entering the inside of the host 2 from the gap.

In another embodiment, it is easy to understand that the sealing bracket and the sealing ring may alternatively be mounted on the circumferential edge of the second host housing 231. An assembly structure including the sealing bracket, the sealing ring, and the second host housing is similar to that described above, and details are not described herein again. When the first part 21 and the second part 23 are closed, the sealing ring on the second host housing 231 abuts against the circumferential edge of the first bracket, to seal the gap between the second host housing 231 and the first bracket 213*b*.

Alternatively, different from that in the foregoing sealing design, in another embodiment, the sealing bracket 213*t* may not be disposed, but a sealing ring is disposed only on the first bracket 213*b* or the second host housing 231. In this way, the gap between the first bracket 213*b* and the second host housing 231 may also be sealed.

As shown in FIG. 6 and FIG. 21, the function button 24 may be roughly a cylinder. The function button 24 may be mounted into the function button mounting through hole 232*e* of the third host housing 232, and is movably connected to the third host housing 232. The function button 24 may move along an axis of the function button mounting through hole 232*e* in the function button mounting through hole 232*e*, and/or the function button 24 may rotate around the axis of the function button mounting through hole 232*e*. The function button 24 is configured to be pressed and/or rotated by the user, so that the host 2 implements a corresponding function, for example, selection, confirmation, or image display switching.

Figure 34:
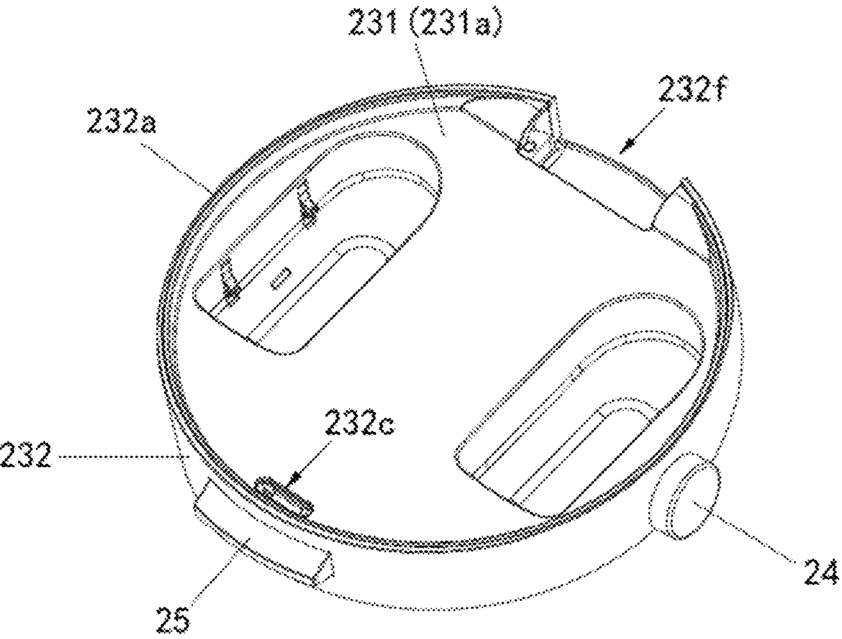
FIG. 34 is a schematic diagram of an assembly structure including a second host housing, a third host housing, and an open button.

As shown in FIG. 34 and FIG. 6, the open button 25 and the function button 24 may be assembled to the third host housing 232, and the third host housing 232 may be further assembled with the second host housing 231. The circumferential side wall 232*a* of the third host housing 232 surrounds a periphery of the second host housing 231 and the host battery 234. With reference to FIG. 34 and FIG. 16, the second opening 232*c* of the third host housing 232 may communicate with the through hole 231*b* of the second bracket 231*a*. The wall of the second bracket 231*a* may avoid the rotating shaft mounting space 232*f* of the third host housing 232, to facilitate mounting of the rotating shaft assembly 22.

Fourth Host Housing 233

Figure 35:
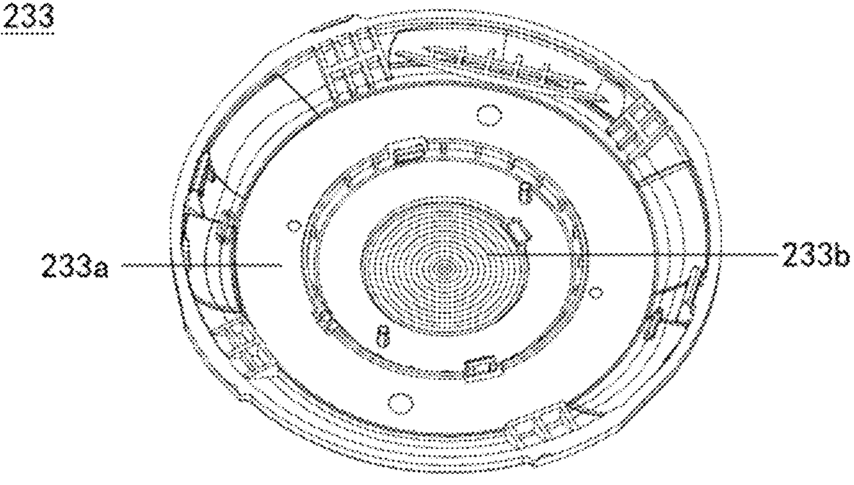
FIG. 35 is a schematic diagram of an assembly structure of a fourth host housing of the wearable device in FIG. 6.
Figure 36:
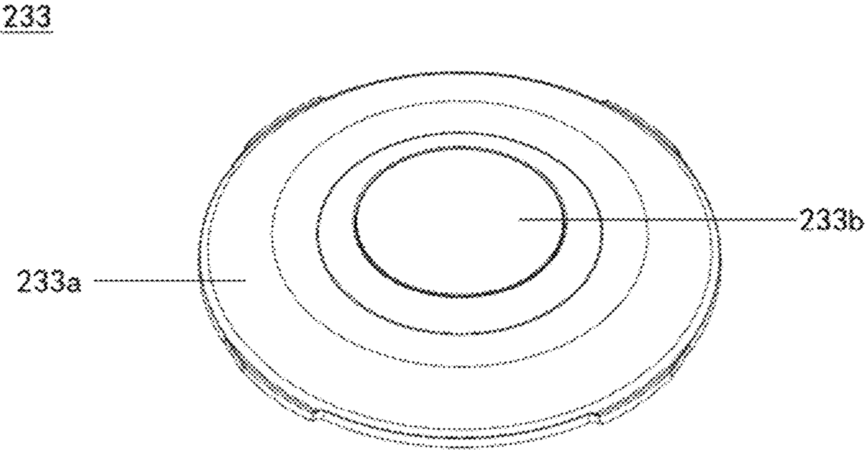
FIG. 36 is a schematic diagram of an assembly structure of a fourth host housing of the wearable device in FIG. 6.
Figure 37:
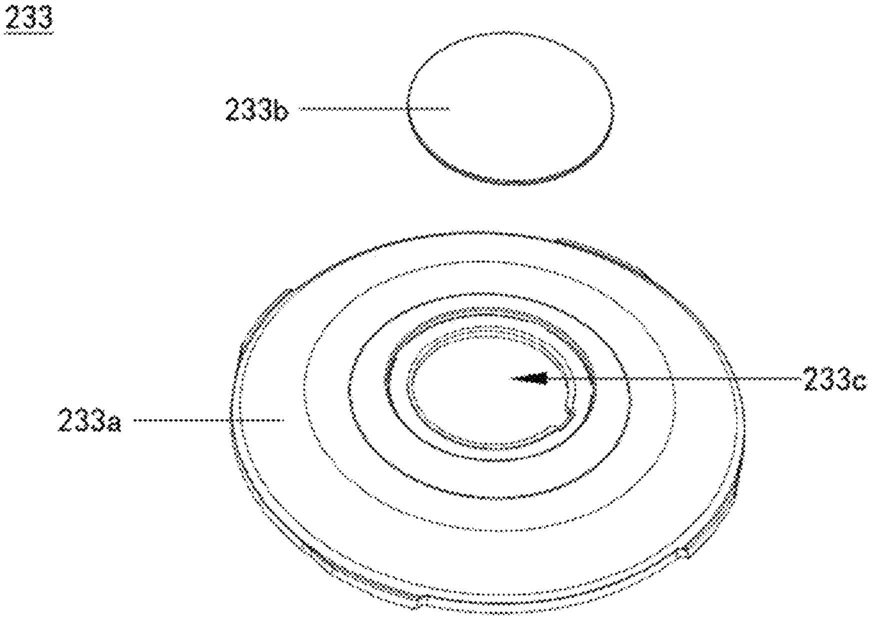
FIG. 37 is a schematic exploded view of a structure of the fourth host housing in FIG. 36.

As shown in FIG. 35, FIG. 36, and FIG. 37, the fourth host housing 233 may be roughly in a disk shape. The fourth host housing 233 may include a third holder 233*a* and a lens 233*b*. The third bracket 233*a* may be roughly in a disk shape. The third bracket 233*a* may have a mounting through hole 233*c*. The lens 233*b* is mounted on the third bracket 233*a*, and covers the mounting through hole 233*c*. The lens 233*b* may be configured to transmit light emitted by a photoplethysmography (photoplethysmography, PPG) sensor (descriptions are provided below) and transmit light reflected back by a human body.

Second Host Circuit Board Assembly 235

As shown in FIG. 6, the second host circuit board assembly 235 may include a circuit board and lines and components disposed on the circuit board. The circuit board in the second host circuit board assembly 235 may be, for example, a secondary circuit board of the host 2. For example, a device like a PPG sensor may be disposed on the secondary circuit board. As shown in FIG. 6, the second host circuit board assembly 235 may be mounted on the fourth host housing 233.

Wireless Charging Coil 236

The wireless charging coil 236 is configured to implement wireless charging. The wireless charging coil 236 may be mounted on the fourth host housing 233. The wireless charging coil 236 may be electrically connected to the circuit board in the second host circuit board assembly 235. For example, a pin of the wireless charging coil 236 may be soldered to the circuit board. As shown in FIG. 6, for example, the wireless charging coil 236 may be located on a periphery of the second host circuit board assembly 235.

As shown in FIG. 5 and FIG. 6, the fourth host housing 233 may be assembled and fastened to the third host housing 232, and the fourth host housing 233 and the third host housing 232 jointly enclose the second host housing 231, the host battery 234, the second host circuit board assembly 235, and the wireless charging coil 236. Both the second host circuit board assembly 235 and the wireless charging coil 236 may be located between the host battery 234 and the fourth host housing 233.

Rotating Shaft Assembly 22

Figure 38:
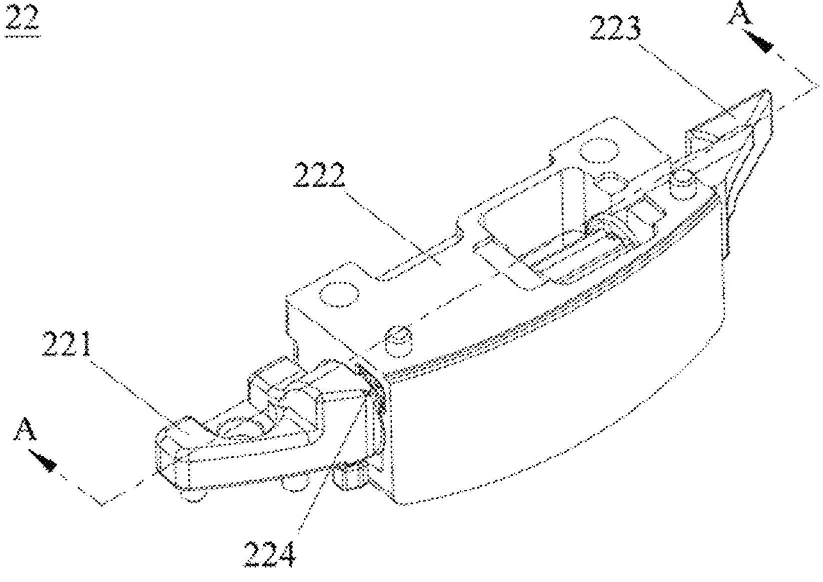
FIG. 38 is a schematic diagram of an assembly structure of a rotating shaft assembly of the wearable device in FIG. 6.
Figure 39:
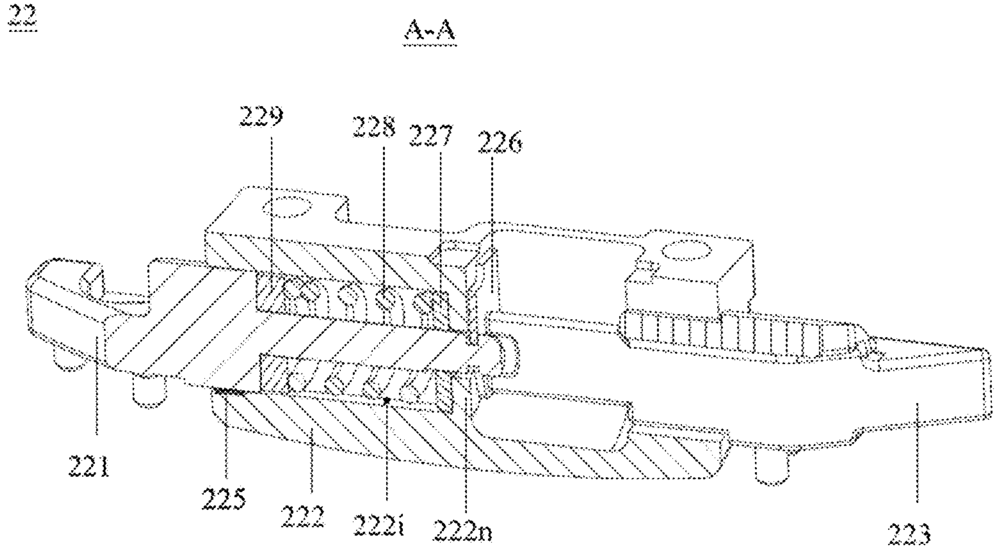
FIG. 39 is a schematic diagram of an A-A sectional structure of FIG. 38.
Figure 40:
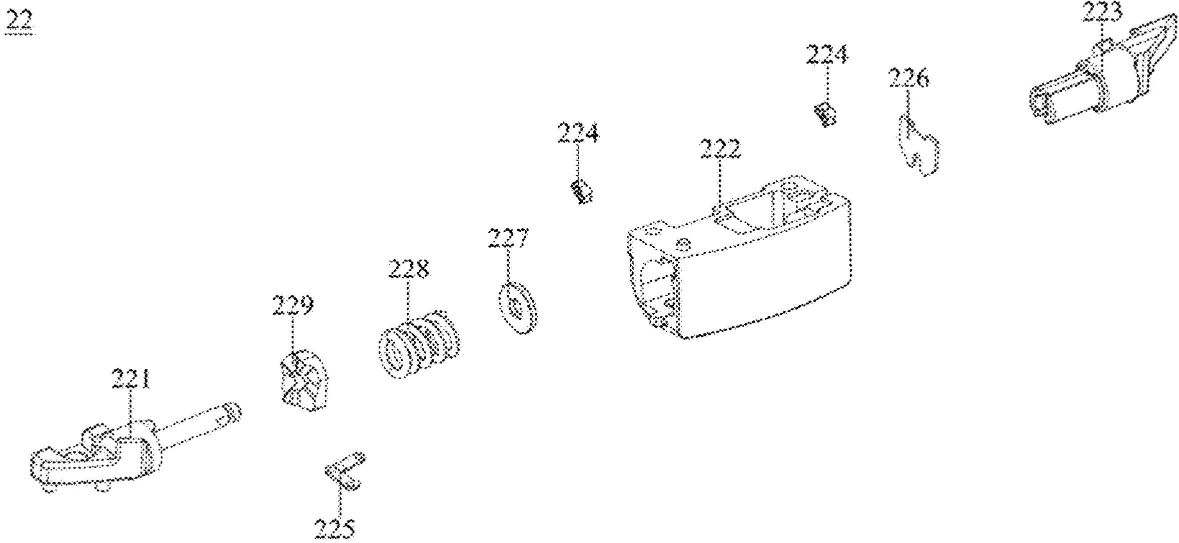
FIG. 40 is a schematic exploded view of a structure of the rotating shaft assembly in FIG. 38.

As shown in FIG. 38, FIG. 39, and FIG. 40, in an implementation 1 of this embodiment, the rotating shaft assembly 22 may include a shaft sleeve 222, a bump matching member 227, a driven member 229, a gasket 225, an elastic member 228, a first shaft 221, a limiting member 226, a second shaft 223, and a shaft contact member 224.

Figure 41:
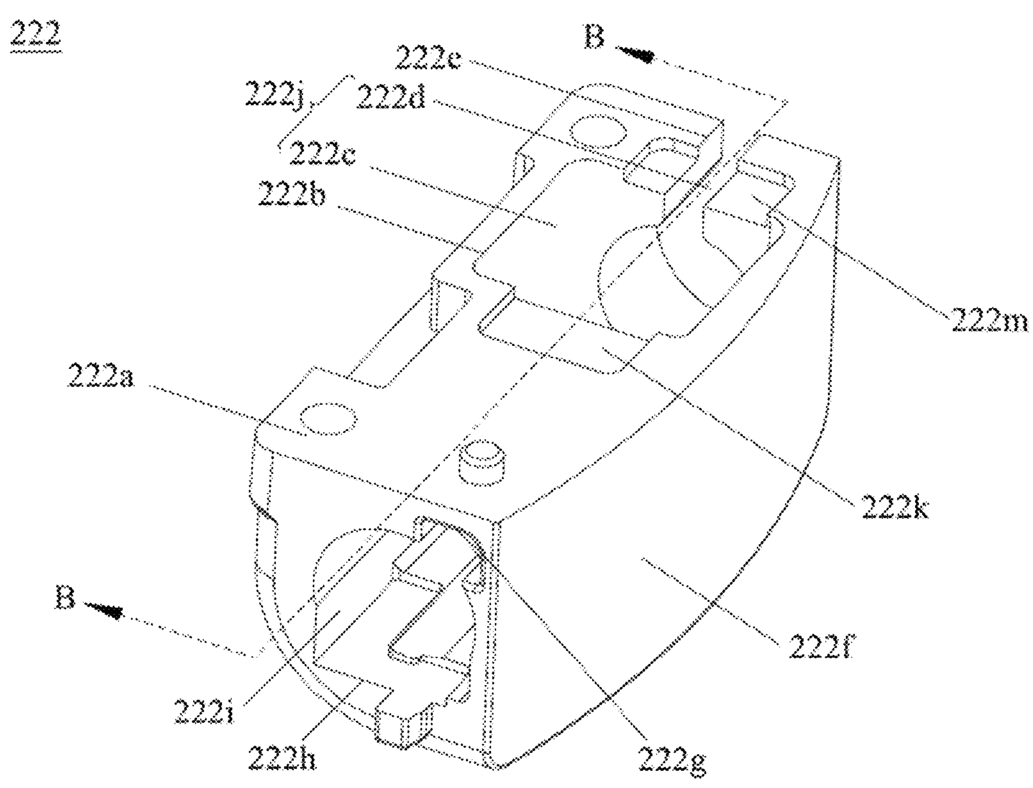
FIG. 41 is a schematic diagram of a structure of a shaft sleeve in a rotating shaft assembly.

As shown in FIG. 41, the shaft sleeve 222 may be roughly of a hollow cuboid structure. The shaft sleeve 222 may have a first outer surface 222*a* and a second outer surface 222*f*, and the first outer surface 222*a* and the second outer surface 222*f* are two intersected outer surfaces on the shaft sleeve 222. In the host 2, a side on which the first outer surface 222*a* of the shaft sleeve 222 is located may be fixedly connected to the first frame body 213*a* in the first part 21, and is covered by the first part 21 and invisible (descriptions are further provided below). When the host 2 is in the closed state, the second outer surface 222*f* may be seen as an appearance surface of the host 2 (descriptions are further provided below).

Figure 42:
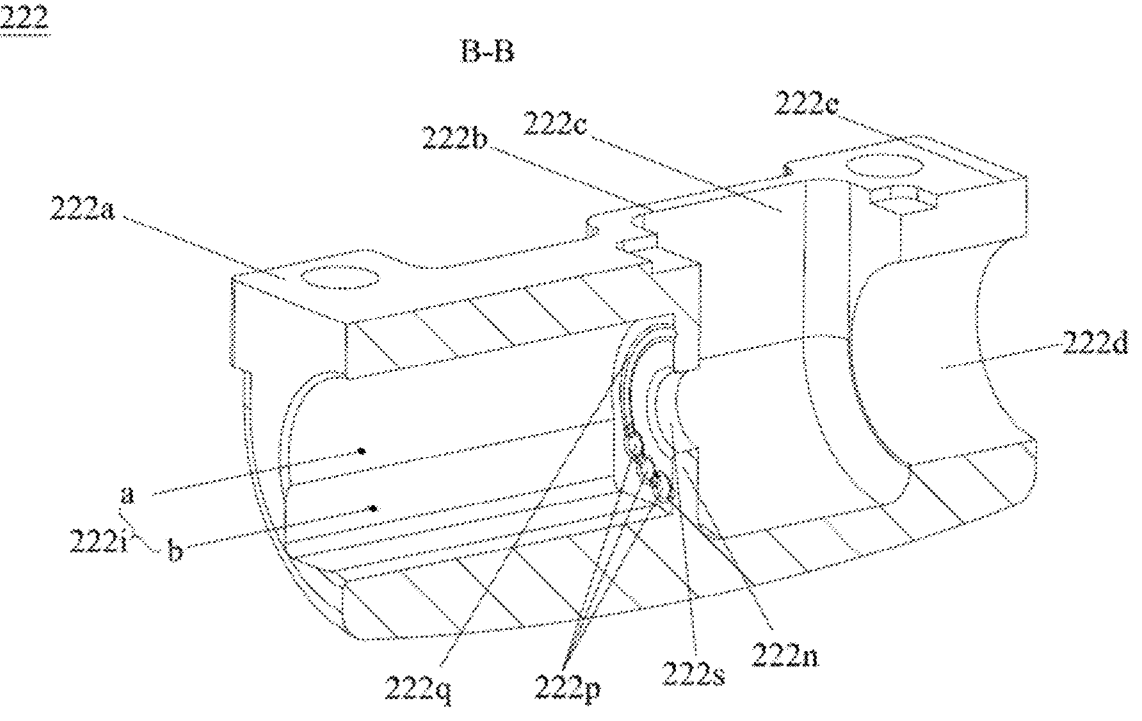
FIG. 42 is a schematic diagram of a B-B sectional structure of the shaft sleeve in FIG. 41.

As shown in FIG. 41 and FIG. 42, an inner cavity of the shaft sleeve 222 has a spacer plate 222*n*, and the spacer plate 222*n* divides the inner cavity into a first inner cavity 222*i* and a second inner cavity 222*j*. The spacer plate 222*n* is provided with a through hole 222*s*, and the through hole 222*s* communicates the first inner cavity 222*i* and the second inner cavity 222*j*.

Figure 43:
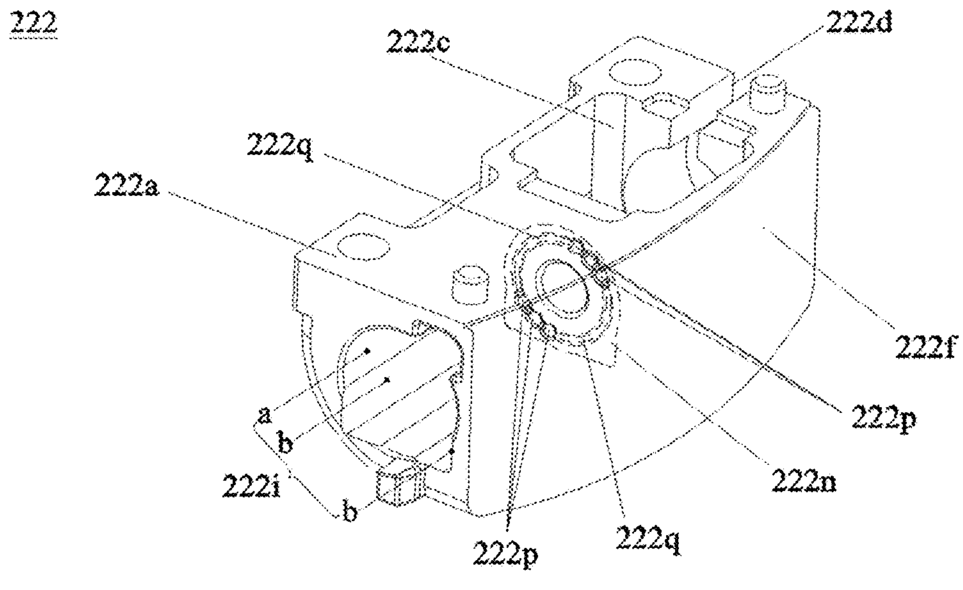
FIG. 43 is a schematic diagram of a structure of a shaft sleeve in a rotating shaft assembly.

As shown in FIG. 42 and FIG. 43, a chute 222*q* and several matching grooves 222*p* may be provided on a surface of a side that is of the spacer plate 222*n* and that faces the first inner cavity 222*i*. The chute 222*q* and all the matching grooves 222*p* may be connected to form a ring. The ring is located on a periphery of the through hole 222*s* and may be concentric with the through hole 222*s*.

As shown in FIG. 42, the matching groove 222*p* may be in a "dent" shape, and an inner surface of the matching groove 222*p* may be an arc surface. All the matching grooves 222*p* may be arranged along an arc. All the matching grooves 222*p* may be divided into two groups, and the two groups are separated. Several matching grooves 222*p* in each group are sequentially connected. Quantities of matching grooves 222*p* in the two groups may be consistent, for example, may be 3. In each group, two adjacent matching grooves 222*p* have a common side wall. A side of the side wall may have a round corner. A top surface of the side wall may be further sunk relative to a surface on which an opening of the matching groove 222*p* is located (that is, a step difference exists).

As shown in FIG. 42 and FIG. 43, the chute 222*q* may be a long-strip groove, and an extension track of the chute 222*q* may be an arc. There may be two chutes 222*q*, and the two chutes 222*q* are on a same circumference. Positions of the two chutes 222*q* on the circumference may be symmetrical, and each of two central angles corresponding to the two chutes 222*q* (an included angle formed by connection lines between two ends of the chute 222*q* and a center of the circumference) may be a vertical angle. The two chutes 222*q* and the two groups of matching grooves 222*p* are alternately arranged along the circumference. To be specific, the two chutes 222*q* and the two groups of matching grooves 222*p* are distributed on the circumference in an arrangement sequence of one chute 222*q*, one group of matching grooves 222*p*, the other chute 222*q*, the other group of matching grooves 222*p*. One end of each chute 222*q* is connected to one matching groove 222*p* in a group of matching grooves 222*p*, and the other end of the chute 222*q* is connected to one matching groove 222*p* in another group of matching grooves 222*p*. There may be a common side wall between the chute 222*q* and the matching groove 222*p*. Alternatively, there is no side wall between the chute 222*q* and the matching groove 222*p*, and the chute 222*q* and the matching groove 222*p* communicate with each other.

The foregoing designs such as a quantity, structures, and positions of chutes 222*q* and designs such as a quantity, structures, and positions of matching grooves 222*p* are merely examples for description, and this embodiment is not limited thereto.

In this embodiment, the chute 222_q_ and the matching grooves 222_p_ are configured to match the bump on the bump matching member 227 (descriptions are provided below). In another embodiment, the spacer plate 222_n_ may not be provided with the chute 222_q_ and the matching grooves 222_p_, and the rotating shaft may not be provided with the bump matching member 227.

As shown in FIG. 41 and FIG. 42, an end that is of the first inner cavity 222_i_ and that is far away from the spacer plate 222_n_ may pass through the shaft sleeve 222 to form an opening 222_h_. As shown in FIG. 41 and FIG. 43, the inner surface of the first inner cavity 222_i_ may include an arc surface a and two planes b, and the two planes b are respectively connected to two opposite sides of the arc surface a. The arc surface a is close to the first outer surface 222_a_, and the plane b is far away from the first outer surface 222_a_. In other words, the first inner cavity 222_i_ has a shape approximate to an arch, and the opening 222_h_ is approximate to an arch.

As shown in FIG. 41 and FIG. 42, the second inner cavity 222_j_ may include a first region 222_c_ and a second region 222_d_ that communicate with each other. The first region 222_c_ is located between the spacer plate 222_n_ and the second region 222_d_. The first region 222_c_ forms an opening 222_b_ on the first outer surface 222_a_. The second region 222_d_ may be a circular hole with an axis facing the spacer plate 222_n_. The second region 222_d_ forms an opening 222_e_ on the first outer surface 222_a_, and an end that is of the second region 222_d_ and that is far away from the spacer plate 222_n_ may pass through the shaft sleeve 222.

As shown in FIG. 41, a groove 222_k_ and a groove 222_m_ may be further provided on the first outer surface 222_a_ of the shaft sleeve 222. The groove 222_k_ and the groove 222_m_ are respectively located on two opposite sides of the first region 222_c_, and the groove 222_m_ may be further located above the second region 222_d_. A side that is of the groove 222_k_ and that faces the groove 222_m_ communicates with the first region 222_c_, and a side that is of the groove 222_m_ and that faces the groove 222_k_ communicates with the first region 222_c_.

Figure 44:
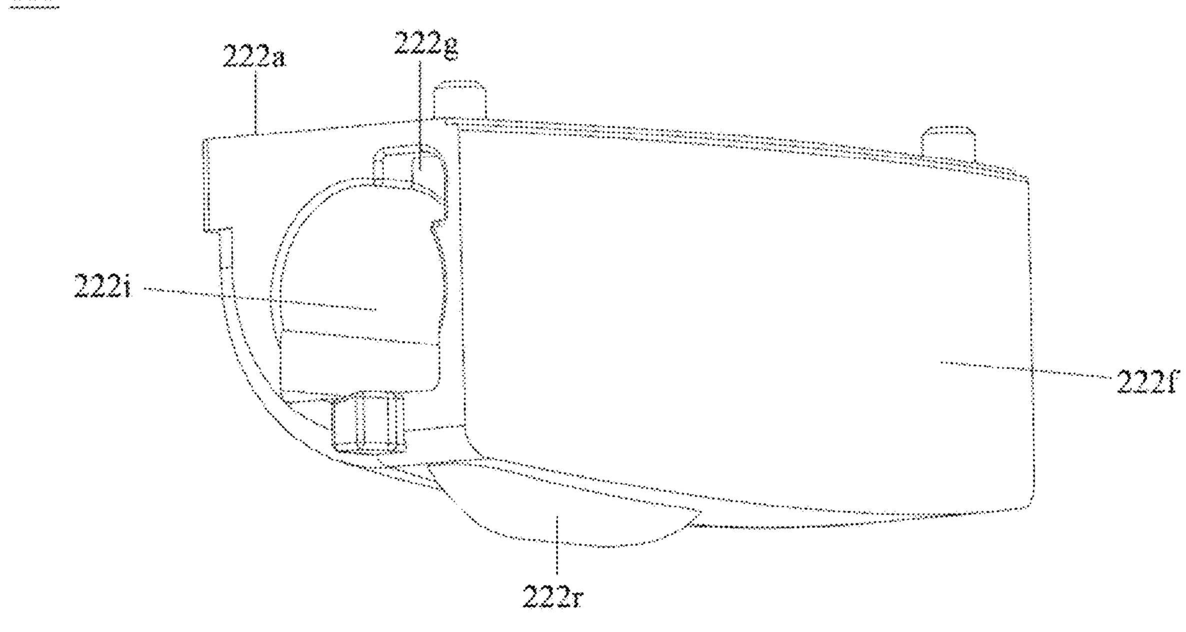
FIG. 44 is a schematic diagram of a structure of a shaft sleeve in a rotating shaft assembly.

As shown in FIG. 44, a limiting protrusion 222_r_ is provided on a side that is of the shaft sleeve 222 and that is opposite to the first outer surface 222_a_. A structure of the limiting protrusion 222_r_ may be designed based on a requirement. This is not limited in this embodiment. In this embodiment, the limiting protrusion 222_r_ may be located on a side that is of the shaft sleeve 222 and on which the first inner cavity 222_i_ is located. In another embodiment, a position of the limiting protrusion 222_r_ may be flexibly determined based on a requirement, and is not limited to being located on a side that is of the spacer plate 222_n_ and that is close to the first inner cavity 222_i_. Alternatively, the limiting protrusion 222_r_ may not be provided.

As shown in FIG. 44, a mounting groove 222_g_ may be further provided on a surface that is of the shaft sleeve 222 and that forms the opening 222_h_, and the mounting groove 222_g_ may communicate with the first inner cavity 222_i_. Similarly, another mounting groove 222_g_ may also be provided on a surface of an end that is of the shaft sleeve 222 and that is opposite to the opening 222_h_, and the another mounting groove 222_g_ may communicate with the second region 222_d_. The mounting groove 222_g_ is configured to mount the shaft contact member 24 (descriptions are further provided below). In another embodiment, a position of the mounting groove 222_g_ may be flexibly determined based on a requirement, and is not limited to the foregoing descriptions. Alternatively, the mounting groove 222_g_ may not be provided.

Figure 45:
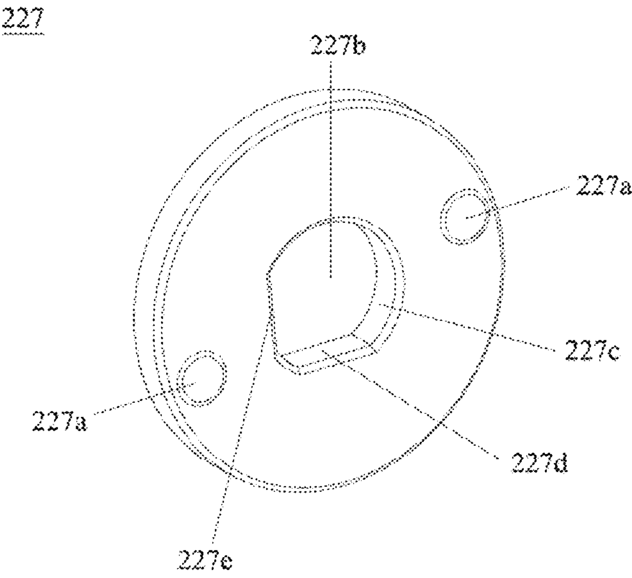
FIG. 45 is a schematic diagram of a structure of a bump matching member in a rotating shaft assembly.

As shown in FIG. 45, a shape of the bump matching member 227 may be roughly cylindrical. A bump 227_a_ may be provided on a bottom surface of the bump matching member 227, and the bump 227_a_ may have an arc surface protruding relative to the bottom surface. There is at least one bump 227_a_. For example, two bumps 227_a_ are shown in FIG. 45. When a quantity of bumps 227_a_ is at least two, the bumps 227_a_ may be evenly distributed at a spacing along the circumference. The bumps 227_a_ are configured to match the chute 222_q_ and the matching grooves 222_p_ on the spacer plate 222_n_ of the shaft sleeve 222 (descriptions are further provided below).

As shown in FIG. 45, the bump matching member 227 may further have a through hole 227_b_, and the through hole 227_b_ may pass through the bump matching member 227 in a direction of a center line of the bump matching member 227. In this embodiment, an inner surface of the through hole 227_b_ may include an arc surface 227_c_, a plane 227_d_, and a plane 227_e_. Two sides of the arc surface 227_c_ are respectively connected to the plane 227_d_ and the plane 227_e_, and the plane 227_d_ and the plane 227_e_ may form an included angle. The bump matching member 227 may be mounted on the first shaft 221, and the through hole 227_b_ may match the first shaft 221. The through hole 227_b_ in the structure may enable the bump matching member 227 to move along the first shaft 221, but the bump matching member 227 cannot rotate relative to the first shaft 221 (descriptions are further provided below).

In another embodiment, the rotating shaft may not be provided with the bump matching member 227.

Figure 46:
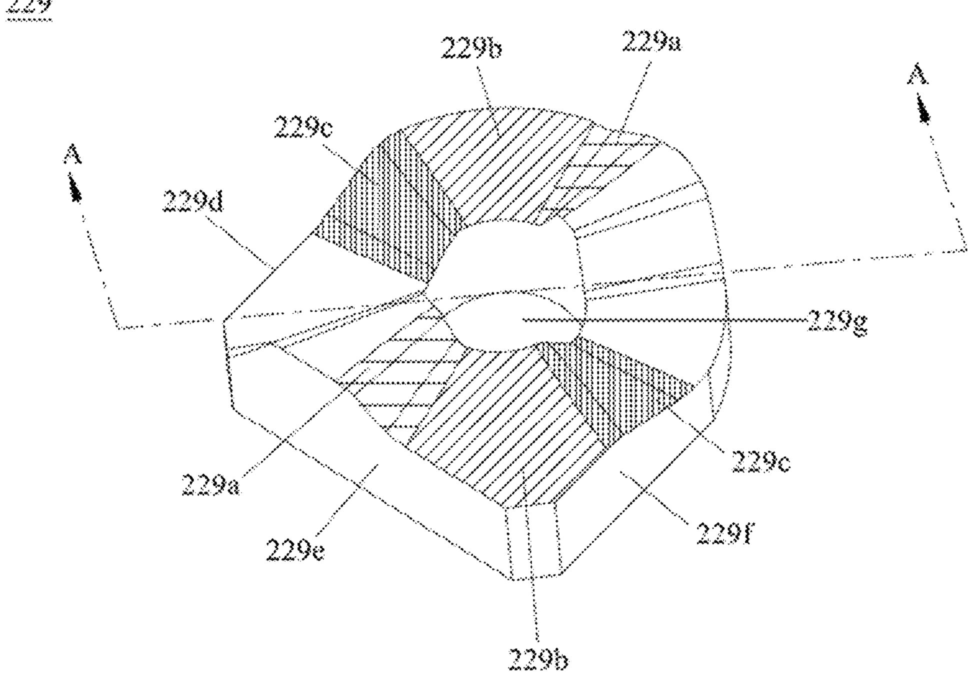
FIG. 46 is a schematic diagram of a structure of a driven member in a rotating shaft assembly.
Figure 47:
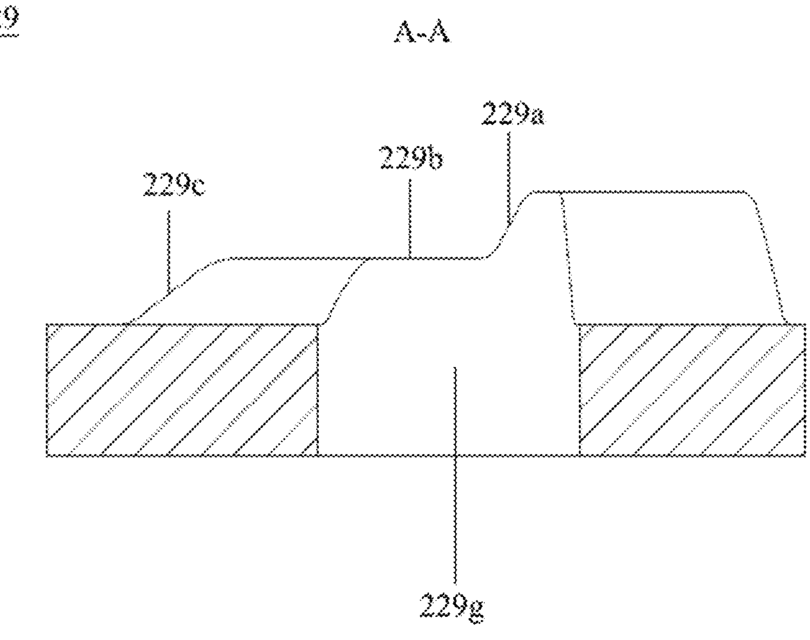
FIG. 47 is a schematic diagram of an A-A sectional structure of the driven member in FIG. 46.

As shown in FIG. 46 and FIG. 47, the driven member 229 may be roughly in a block shape or a sheet shape. The driven member 229 has a through hole 229_g_, and an axis of the through hole 229_g_ is roughly in a thickness direction of the driven member 229. A surface on a side of the driven member 229 in the thickness direction may be referred to as a shaft matching surface. The shaft matching surface may form a two-step ladder. The shaft matching surface may include a first slope 229_a_, a plane 229_b_, and a second slope 229_c_ that are sequentially connected (to highlight the three regions, the three regions are represented by shadows). A normal line of the plane 229_b_ may be in an axial direction of the through hole 229_g_. The first slope 229_a_ and the plane 229_b_ form an obtuse angle, and the plane 229_b_ and the second slope 229_c_ form an obtuse angle. There is a step difference between the first slope 229_a_ and the second slope 229_c_. A side that is of the first slope 229_a_ and that is far away from the plane 229_b_ may be higher than the plane 229_b_, and a side that is of the second slope 229_c_ and that is far away from the plane 229_b_ may be lower than the plane 229_b_.

As shown in FIG. 46, the shaft matching surface of the driven member 229 may include two first slopes 229_a_, two planes, and two second slopes 229_c_. The shaft matching surface may form two two-step ladders and may extend downward step by step in a circumferential direction of the shaft matching surface. The two two-step ladders may be arranged at a spacing. For example, the two-step ladders may be center-symmetric with respect to the through hole 229_g_.

Figure 48:
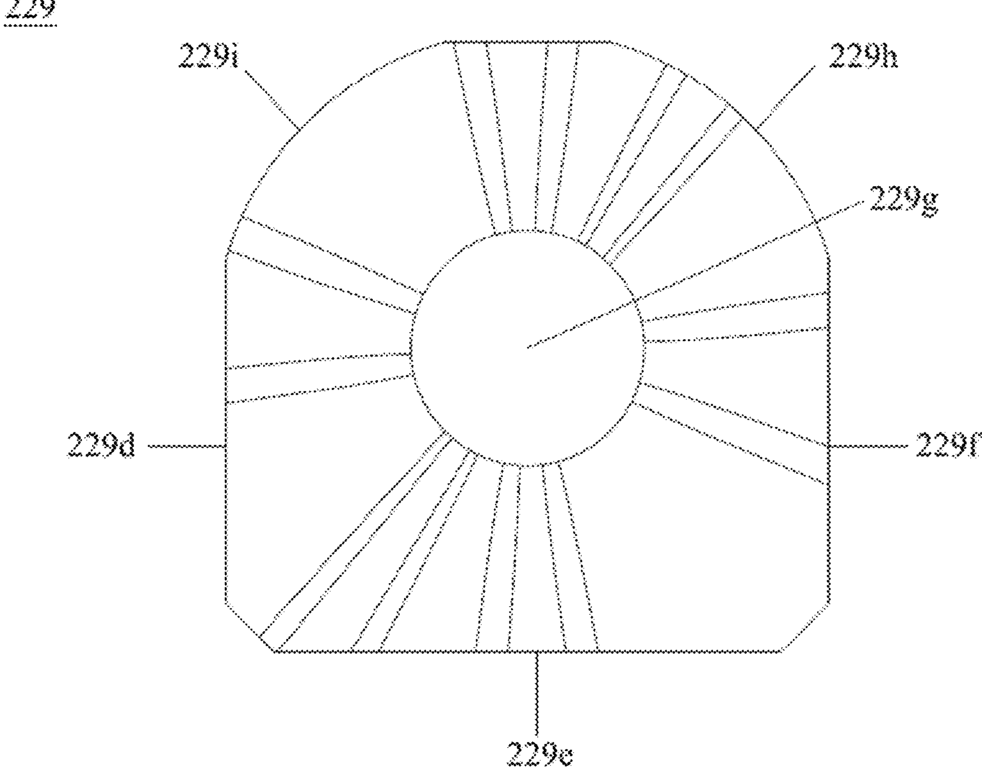
FIG. 48 is a schematic diagram of a structure of a driven member in a rotating shaft assembly.

As shown in FIG. 48, an outer side surface (a normal line of the outer side surface points to the through hole 229_g_) of the driven member 229 may be approximately an arch. The outer side surface may include an arc surface 229_h_, an arc surface 229_i_, a plane 229_d_, a plane 229_e_, and a plane 229_f_.

The arc surface 229*h* and the arc surface 229*i* may be used as a top of the arch, and the arc surface 229*h* and the arc surface 229*i* may be roughly symmetrical with respect to the axis of the through hole 229*g*. The plane 229*e* may be used as a bottom of the arch. The plane 229*f* may be located between the arc surface 229*h* and the plane 229*e*, and a side of the plane 229*f* may be connected to the arc surface 229*h*. The plane 229*d* may be located between the arc surface 229*i* and the plane 229*e*, and a side of the plane 229*d* may be connected to the arc surface 229*i*.

The driven member 229 may be mounted in the first inner cavity 222*i* of the shaft sleeve 222, and the outer side surface of the driven member 229 has the foregoing structure, so that the driven member 229 can move in the first inner cavity 222*i* without rotating (descriptions are further provided below). In another embodiment, the outer side surface of the driven member 229 may have another appropriate structure, provided that a design requirement that the driven member 229 moves in the first inner cavity 222*i* without rotating is met.

Figure 49:
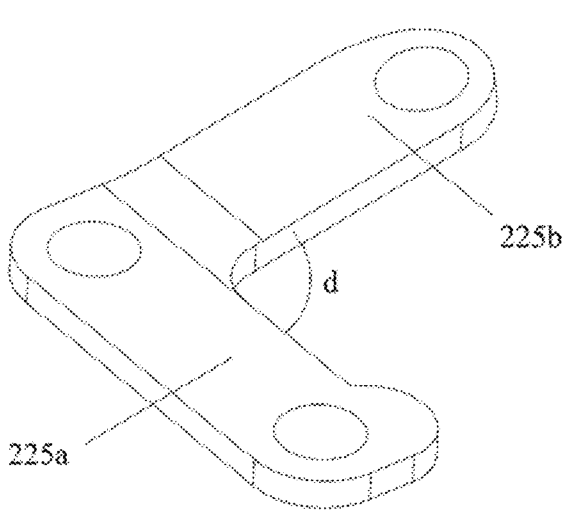
FIG. 49 is a schematic diagram of a structure of a gasket in a rotating shaft assembly.
Figure 50:
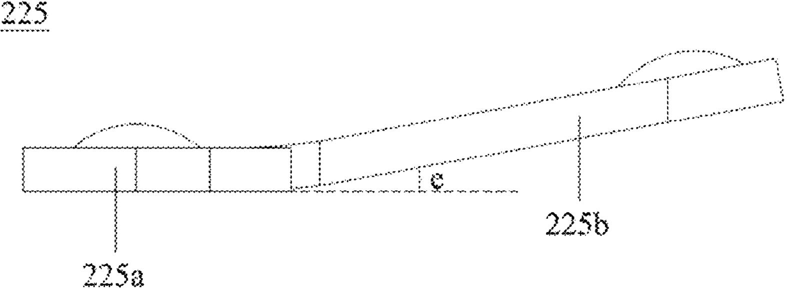
FIG. 50 is a schematic diagram of a structure of a gasket in a rotating shaft assembly.

As shown in FIG. 49 and FIG. 50, the gasket 225 may be roughly in a sheet shape. The gasket 225 may include a first part 225*a* and a second part 225*b*, the first part 225*a* and the second part 225*b* may be connected (for example, connected as a whole), and the first part 225*a* and the second part 225*b* may form, for example, an included angle d. The included angle d is, for example, roughly 90°. The first part 225*a* and the second part 225*b* may not be on a same plane, and the second part 225*b* and a plane on which the first part 225*a* is located may form an included angle e. For example, in a perspective of FIG. 50, the second part 225*b* may be tilted upward relative to the first part 225*a*, and form the included angle e with the plane on which the first part 225*a* is located (in other words, form the included angle e with the first part 225*a*).

The first part 225*a* of the gasket 225 may be fastened in the first inner cavity 222*i* of the shaft sleeve 222, and the second part 225*b* of the gasket 225 may press against the plane 229*e* of the driven member 229 (descriptions are further provided below).

Figure 51:
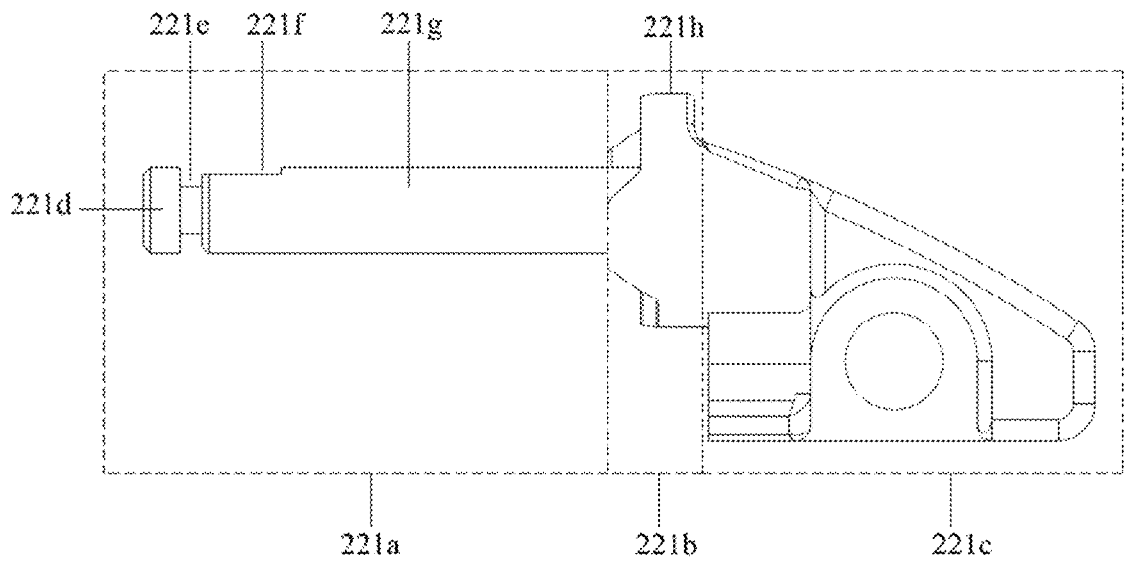
FIG. 51 is a schematic diagram of a structure of a first shaft in a rotating shaft assembly.

As shown in FIG. 51, the first shaft 221 may be of an integrated structure, and may include a first part 221*a*, a second part 221*b*, and a third part 221*c* that are sequentially connected. It may be understood that, in FIG. 51, three dashed-line boxes are used to distinguish the first part 221*a*, the second part 221*b*, and the third part 221*c*. This is merely intended to intuitively describe rough positions of the first part 221*a*, the second part 221*b*, and the third part 221*c*, and is not intended to strictly limit boundaries between the first part 221*a*, the second part 221*b*, and the third part 221*c*.

Figure 52:
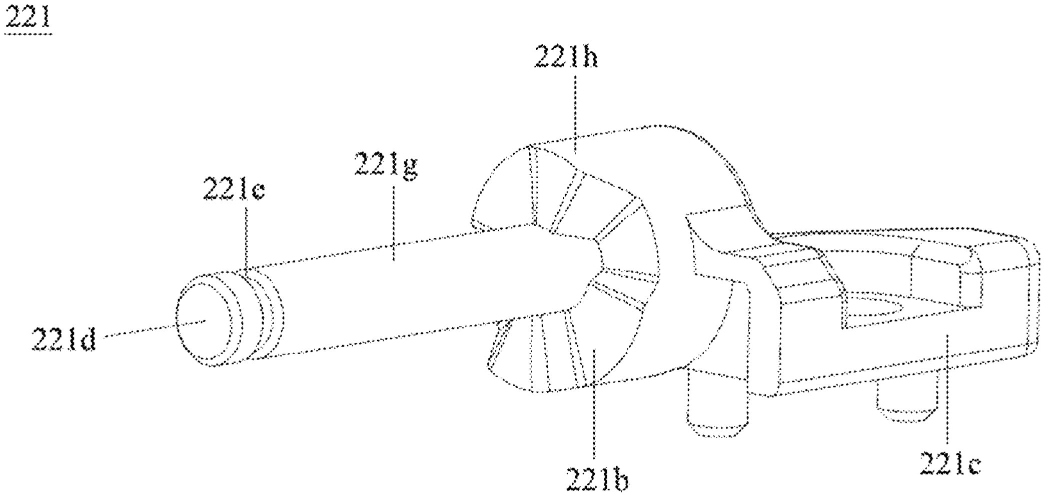
FIG. 52 is a schematic diagram of a structure of a first shaft in a rotating shaft assembly.

As shown in FIG. 51 and FIG. 52, the first part 221*a* may include an end portion 221*d* and a main portion 221*g*, and both the end portion 221*d* and the main portion 221*g* may be roughly cylinders. The main portion 221*g* is connected to the second part 221*b*, and the end portion 221*d* is far away from the second part 221*b*. A slot 221*e* may be formed between the end portion 221*d* and the main portion 221*g*, and the slot 221*e* may surround an axis of the end portion 221*d*. A bottom surface of the slot 221*e* is lower than an outer circumferential surface of the end portion 221*d*, and is also lower than an outer circumferential surface of the main portion 221*g*.

Figure 53:
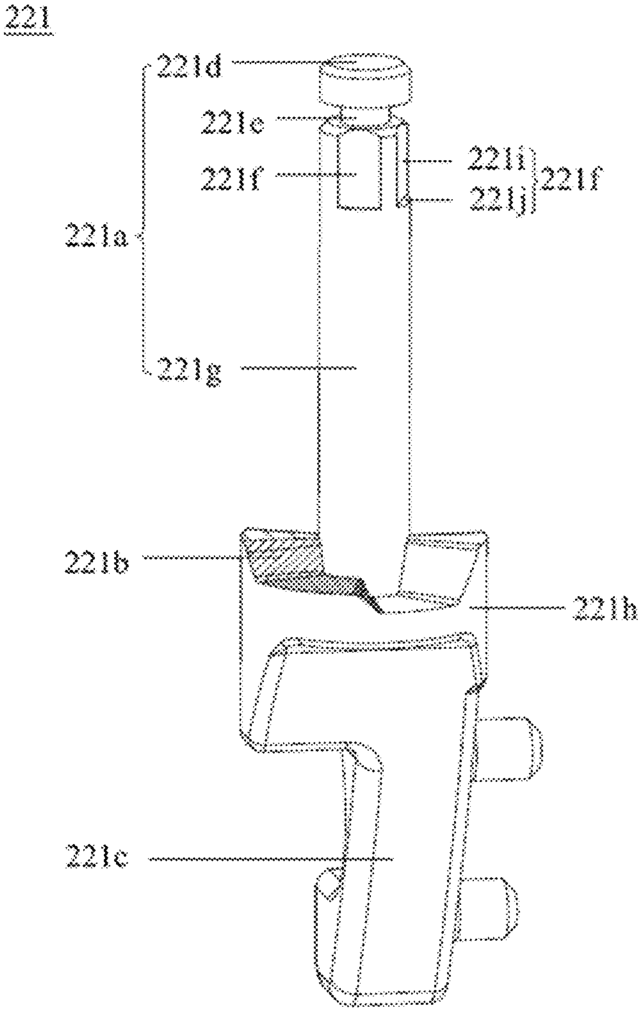
FIG. 53 is a schematic diagram of a structure of a first shaft in a rotating shaft assembly.

As shown in FIG. 51 and FIG. 53, an end that is of the main portion 221*g* and that is close to the end portion 221*d* may form a concave space 221*f*. The concave space 221*f* may have a plane 221*i* and a plane 221*j*. The plane 221*i* may be basically parallel to an axis of the end portion 221*d*, the plane 221*j* may be basically perpendicular to the axis of the end portion 221*d*, and the plane 221*i* may be basically perpendicular to the plane 221*j*. The plane 221*j* may connect the outer circumferential surface of the main portion 221*g* and the plane 221*i*. Both sides of the plane 221*i* may be connected to the outer circumferential surface of the main portion 221*g*. The concave space 221*f* may be formed by cutting the outer circumferential surface of the main portion 221*g*.

As shown in FIG. 53, there may be two concave spaces 221*f*, and there is a specific spacing between the two concave spaces 221*f*. In another embodiment, a quantity of concave spaces 221*f* is not limited to the foregoing descriptions, for example, may be one or more than three.

In this embodiment, an end that is of the main portion 221*g* and that is close to the end portion 221*d* may match the through hole 227*b* of the bump matching member 227, and a surface of the end of the main portion 221*g* may match the inner wall of the through hole 227*b*, so that the bump matching member 227 may move along the main portion 221*g* but cannot rotate (descriptions are further provided below). In another embodiment, if the bump matching member 227 is not provided, the end that is of the main portion 221*g* and that is close to the end portion 221*d* may not form the concave space 221*f*.

As shown in FIG. 51 to FIG. 53, the second part 221*b* may have an outer circumferential surface 221*h*, and the outer circumferential surface 221*h* may be roughly a cylindrical surface. In this embodiment, the second part 221*b* may be mounted into the first inner cavity 222*i* of the shaft sleeve 22, and the outer circumferential surface 221*h* may rotate and match the arc surface a of the first inner cavity 222*i*.

As shown in FIG. 52 and FIG. 53, a two-step ladder may be formed on a surface that is of the second part 221*b* and that faces the end portion 221*d* (a surface of the two-step ladder is shown by using a shadow in FIG. 53), and the two-step ladder has a similar (or roughly similar) structure to the two-step ladder of the driven member 229 described above. With reference to FIG. 52, FIG. 46, and FIG. 40, the second part 221*b* may be assembled with the driven member 229 to form a cam mechanism, and the surface of the two-step ladder of the second part 221*b* may move and match the surface of the two-step ladder of the driven member 229, so that the driven member 229 implements a specific motion (descriptions are further provided below).

A structure of the third part 221*c* may be designed based on a requirement, and is not limited to that shown in FIG. 51 to FIG. 53. The third part 221*c* is configured to be fastened to the inner bearing platform 232*g* of the third host housing 232 (descriptions are further provided below). As shown in FIG. 40, the elastic member 228 is a component that can provide a rebound force, for example, may be a spring.

The foregoing separately describes structures of the shaft sleeve 222, the bump matching member 227, the first shaft 221, the driven member 229, and the elastic member 228. The following describes an assembly structure including the components.

As shown in FIG. 39, FIG. 45, FIG. 43, and FIG. 46, the driven member 229, the elastic member 228, and the bump matching member 227 all may be located in the first inner cavity 222*i* of the shaft sleeve 222. The bump matching member 227 is close to the spacer plate 222*n* of the shaft sleeve 222, and the bump 227*a* of the bump matching member 227 may face the chute 222*q* of the spacer plate 222*n* (or face the matching groove 222*p*). The driven member 229 is far away from the spacer plate 222*n*, and the two-step ladder of the driven member 229 is back to the spacer plate 222*n*. Both the arc surface 229*h* and the arc surface 229*i* of the driven member 229 may be opposite to and match the arc surface a of the first inner cavity 222*i*, and both the plane 229*e* and the plane 229*f* of the driven member 229 may be opposite to and match the plane b of the first inner cavity 222*i*. In this way, the driven member 229 may move in the first inner cavity 222*i*, but cannot rotate relative to the first inner cavity 222*i*.

It is easy to understand that the matching structure including the driven member 229 and the first inner cavity 222*i* is merely an example. In another embodiment, another appropriate matching structure may be designed based on a requirement, so that the driven member 229 can only move in the first inner cavity 222*i*, but cannot rotate relative to the first inner cavity 222*i* (descriptions that the driven member 229 may rotate with the shaft sleeve 222 are provided below).

As shown in FIG. 39, the elastic member 228 is located between the driven member 229 and the bump matching member 227. One end of the elastic member 228 may press against the driven member 229, and the other end may press against the bump matching member 227.

As shown in FIG. 51, FIG. 39, FIG. 41, and FIG. 42, both the main portion 221*g* of the first part 221*a* of the first shaft 221 and the second part 221*b* may be located in the first inner cavity 222*i* of the shaft sleeve 222. The end portion 221*d* of the first part 221*a* may be located in the first region 222*c* of the second inner cavity 222*j* of the shaft sleeve 222, and a part or all of the slot 221*e* of the first part 221*a* may be located in the first region 222*c*.

As shown in FIG. 51, FIG. 46, FIG. 45, and FIG. 42, the first part 221*a* may pass through the through hole 229*g* of the driven member 229, the elastic member 228, the through hole 227*c* of the bump matching member 227, and the through hole of the spacer plate 222*n*. The two-step ladder of the second part 221*b* may face the two-step ladder of the driven member 229, and the two-step ladder of the second part 221*b* may match the two-step ladder of the driven member 229, so that the second part 221*b* and the driven member 229 form a cam mechanism.

As shown in FIG. 53 and FIG. 45, a plane 221*i* of one concave space 221*f* of the main portion 221*g* may be opposite to and match the plane 227*d* of the through hole 227*b* of the bump matching member 227. A plane 221*i* of the other concave space 221*f* of the main portion 221*g* may be opposite to and match the plane 227*e* of the through hole 227*b* of the bump matching member 227. The outer circumferential surface of the main portion 221*g* may be opposite to and match the arc surface 227*c* of the through hole 227*b* of the bump matching member 227. In this way, the bump matching member 227 may move along the main portion 221*g* in the first inner cavity 222*i*, but cannot rotate around the main portion 221*g*.

It is easy to understand that the matching structure including the main portion 221*g* and the bump matching member 227 is merely an example. In another embodiment, another appropriate matching structure may be designed based on a requirement, so that the bump matching member 227 can only move along the main portion 221*g* but cannot rotate around the main portion 221*g*.

With reference to FIG. 51 and FIG. 39, the third part 221*c* of the first shaft 221 may be located outside the shaft sleeve 222.

Figure 54:
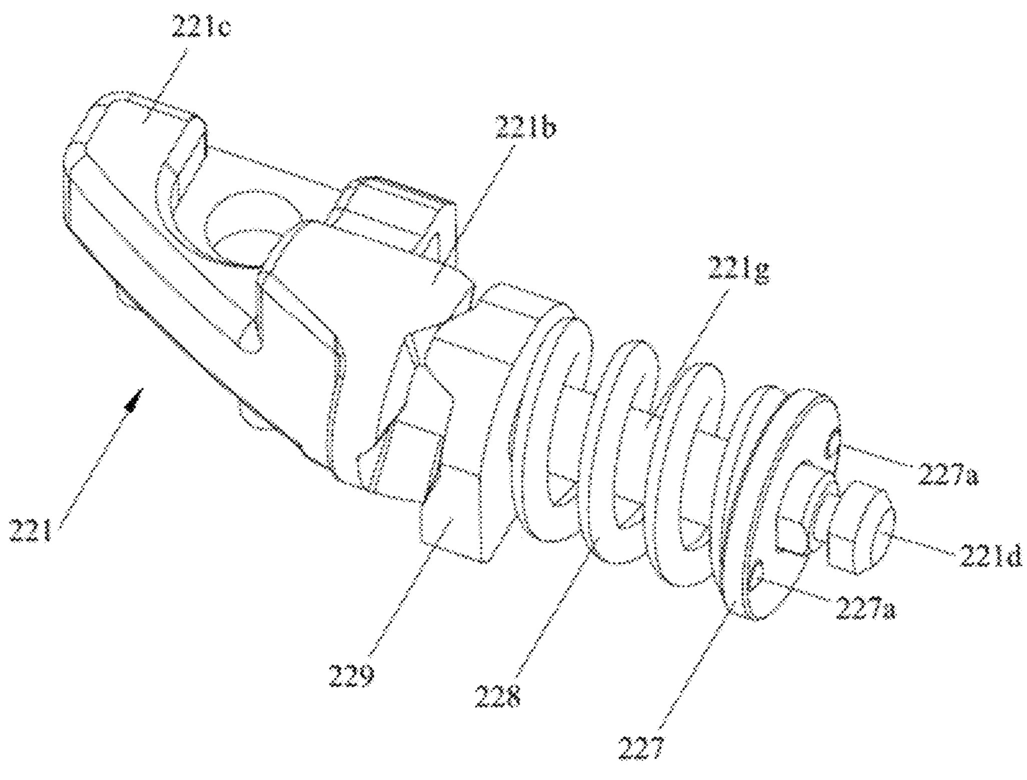
FIG. 54 is a schematic diagram of an assembly structure including a first shaft, a driven member, and an elastic member in a rotating shaft assembly.

FIG. 54 may intuitively show an assembly structure including the first shaft 221, the driven member 229, the elastic member 228, and the bump matching member 227.

As shown in FIG. 39 and FIG. 50, the gasket 225 may be fastened to the first inner cavity 222*i* of the shaft sleeve 222. The first part 225*a* of the gasket 225 may be located between the third part 221*c* of the first shaft 221 and the shaft sleeve 222. The second part 225*b* of the gasket 225 may be located between the driven member 229 and the shaft sleeve 222. In an entire motion process of the driven member 229, the second part 225*b* may always press against the driven member 229. Because the second part 225*b* is tilted relative to the first part 225*a*, the second part 225*b* can press the driven member 229 against the inner surface of the first inner cavity 222*i* of the shaft sleeve 222, so that the driven member 229 closely matches the inner surface of the first inner cavity 222*i*. In this way, it can be avoided that the driven member 229 shakes due to a manufacturing error during moving. In another embodiment, based on an actual requirement, the gasket 225 may not be provided.

Figure 55:
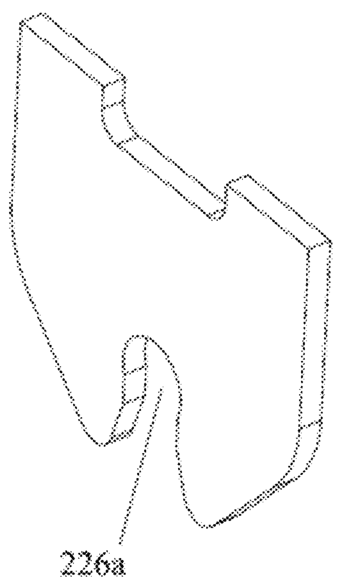
FIG. 55 is a schematic diagram of a structure of a limiting member in a rotating shaft assembly.

As shown in FIG. 55, the limiting member 226 may be basically in a plate shape, and a structure of the limiting member 226 may be designed based on a requirement. For example, an outline of the limiting member 226 may adapt to a shape of the first region 222*c* of the second inner cavity 222*i* of the shaft sleeve 22. An opening 226*a* may be formed on the limiting member 226.

With reference to FIG. 39, FIG. 52, and FIG. 55, the limiting member 226 may be located in the first region 222*c* of the second inner cavity 222*i* of the shaft sleeve 22 and be in contact with the spacer plate 222*n* of the shaft sleeve 22, and an edge of the opening 226*a* of the limiting member 226 may be clamped into the slot 221*e* of the first part 221*a* of the first shaft 221. Therefore, the limiting member 226 can limit the first shaft 221, prevent the first shaft 221 from being detached from the shaft sleeve 22, and ensure that relative positions of the first shaft 221 and the shaft sleeve 22 remain unchanged, so as to ensure reliable assembly of the driven member 229, the elastic member 228, the bump matching member 227, and the shaft sleeve 22.

Figure 56:
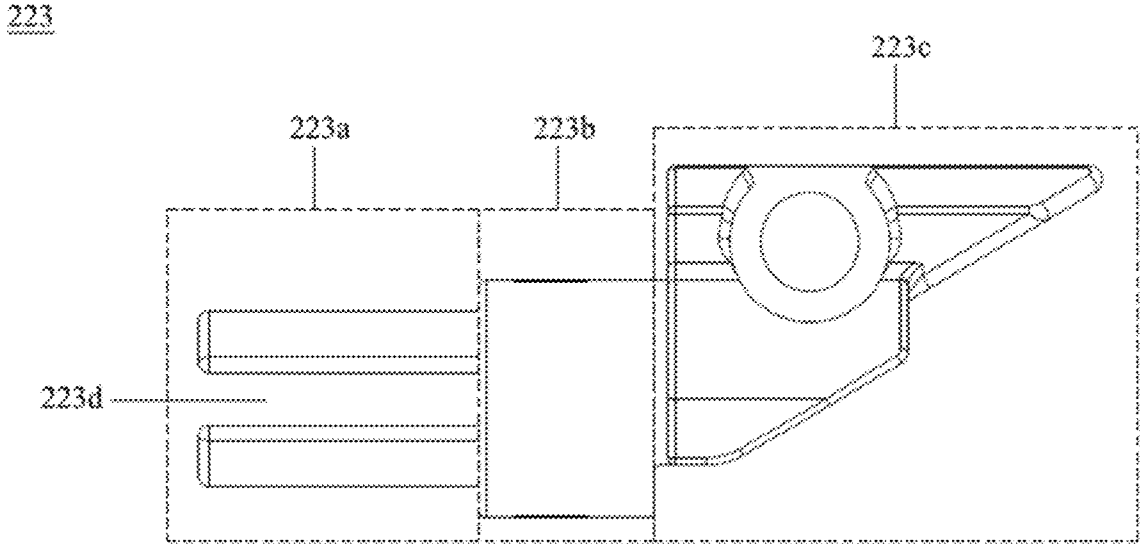
FIG. 56 is a schematic diagram of a structure of a second shaft in a rotating shaft assembly.
Figure 57:
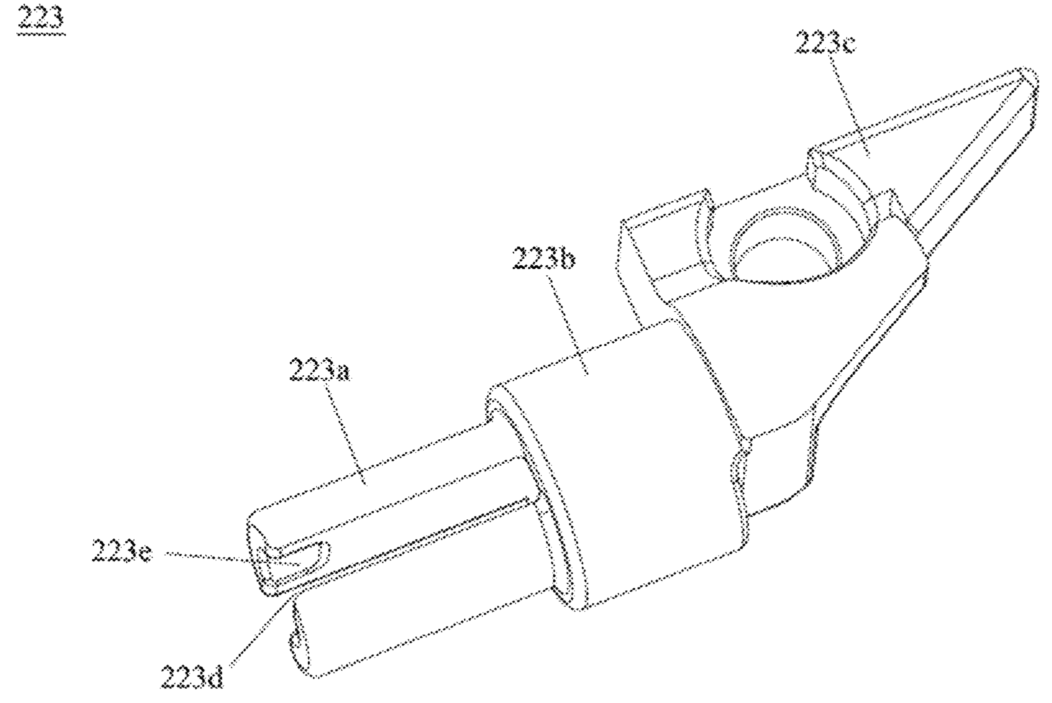
FIG. 57 is a schematic diagram of a structure of a second shaft in a rotating shaft assembly.
Figure 58:
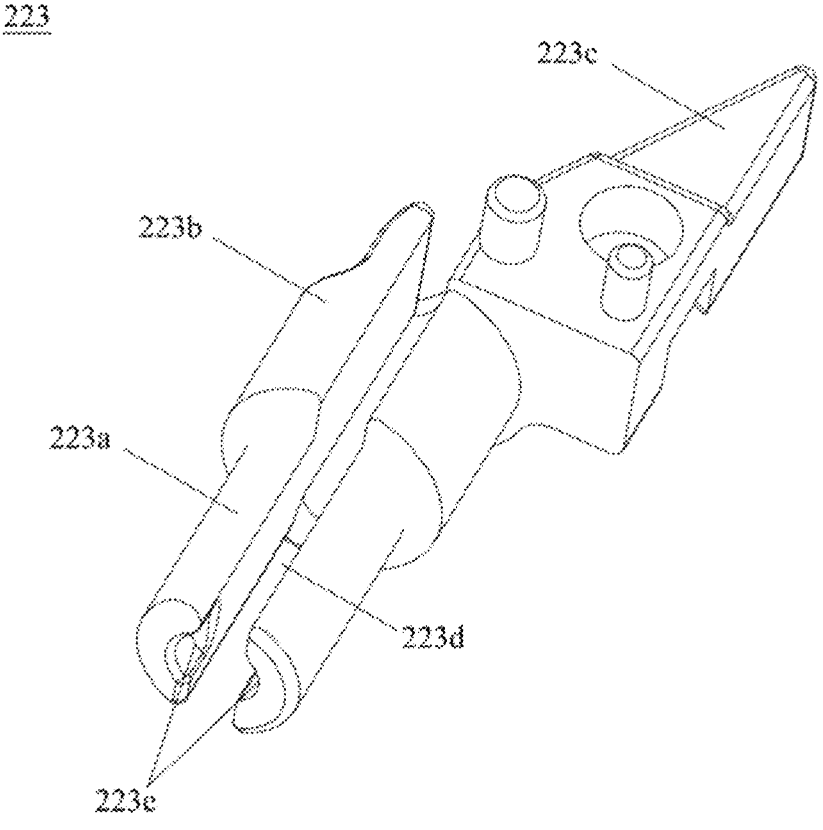
FIG. 58 is a schematic diagram of a structure of a second shaft in a rotating shaft assembly.

As shown in FIG. 56, FIG. 57, and FIG. 58, the second shaft 223 may be of an integrated structure, and may include a first part 223*a*, a second part 223*b*, and a third part 223*c* that are sequentially connected. It may be understood that, in FIG. 56, three dashed-line boxes are used to distinguish the first part 223*a*, the second part 223*b*, and the third part 223*c*. This is merely intended to intuitively describe rough positions of the first part 223*a*, the second part 223*b*, and the third part 223*c*, and is not intended to strictly limit boundaries between the first part 223*a*, the second part 223*b*, and the third part 223*c*.

As shown in FIG. 56 to FIG. 58, both the first part 223*a* and the second part 223*b* may be roughly cylinders. A structure of the third part 223*c* may be designed based on a requirement. FIG. 56 to FIG. 58 are merely examples. A channel 223*d* may be formed on the second shaft 223, and the channel 223*d* may basically extend in an axial direction of the first part 223*a*. The channel 223*d* may pass through two opposite ends of the first part 223*a* in the radial direction, and pass through one end of the second part 223*b* and one end of the third part 223*c* in the radial direction of the second part 223*b*. In this way, the first part 223*a* may be divided into two completely disconnected parts by the channel 223*d*, and the second part 223*b* and the third part 223*c* each may be divided into two connected parts by the channel 223*d*.

As shown in FIG. 57 and FIG. 58, an end that is of the first part 223*a* and that is far away from the second part 223*b* has a groove 223*e*, and the groove 223*e* may be specifically provided on an inner surface of the channel 223*d*. There may be two grooves 223_e_, each part of the first part 223_a_ has one groove 223_e_, and openings of the two grooves 223_e_ are opposite.

In this embodiment, a flexible circuit board may be mounted on the second shaft 223. Details are described below.

Figure 59:
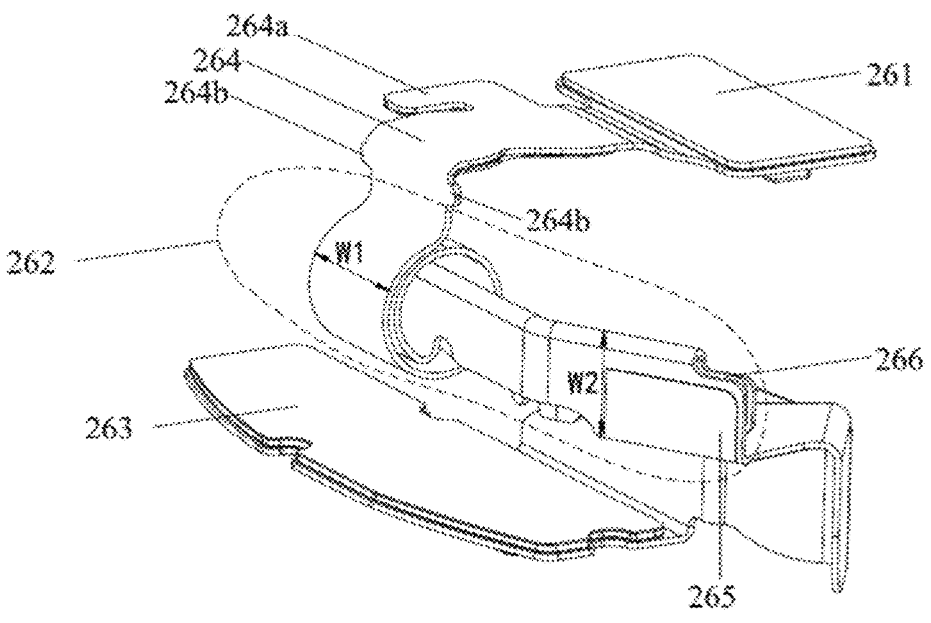
FIG. 59 is a schematic diagram of a structure of a flexible circuit board in a rotating shaft assembly.
Figure 60:
FIG. 60 is a schematic diagram of a structure of a flexible circuit board in a rotating shaft assembly.
Figure 60:
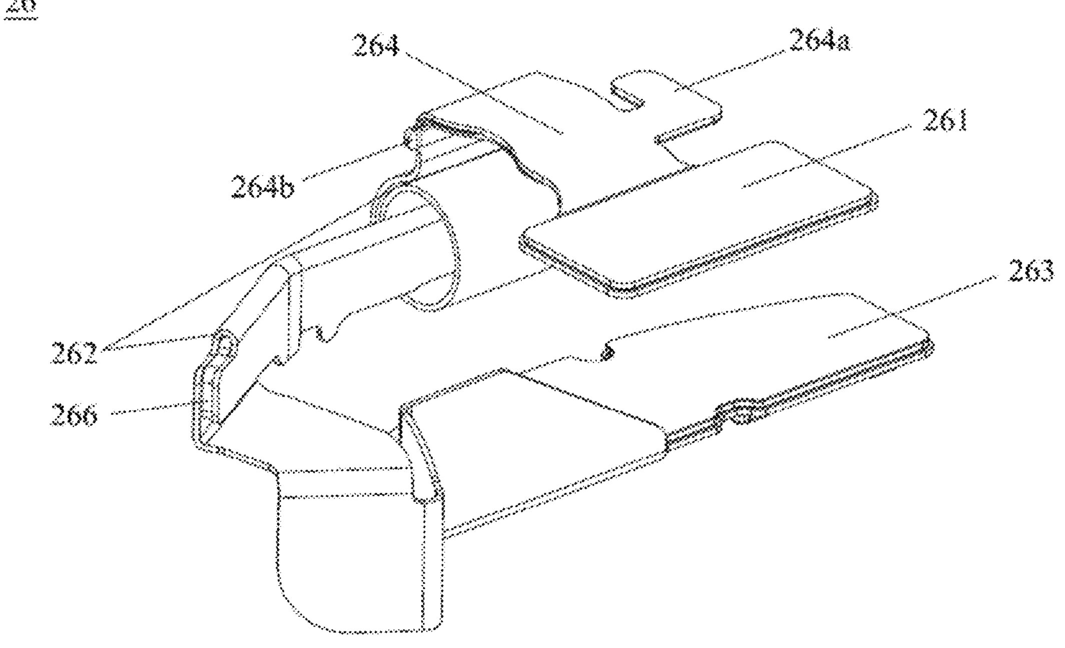
Figure 61:
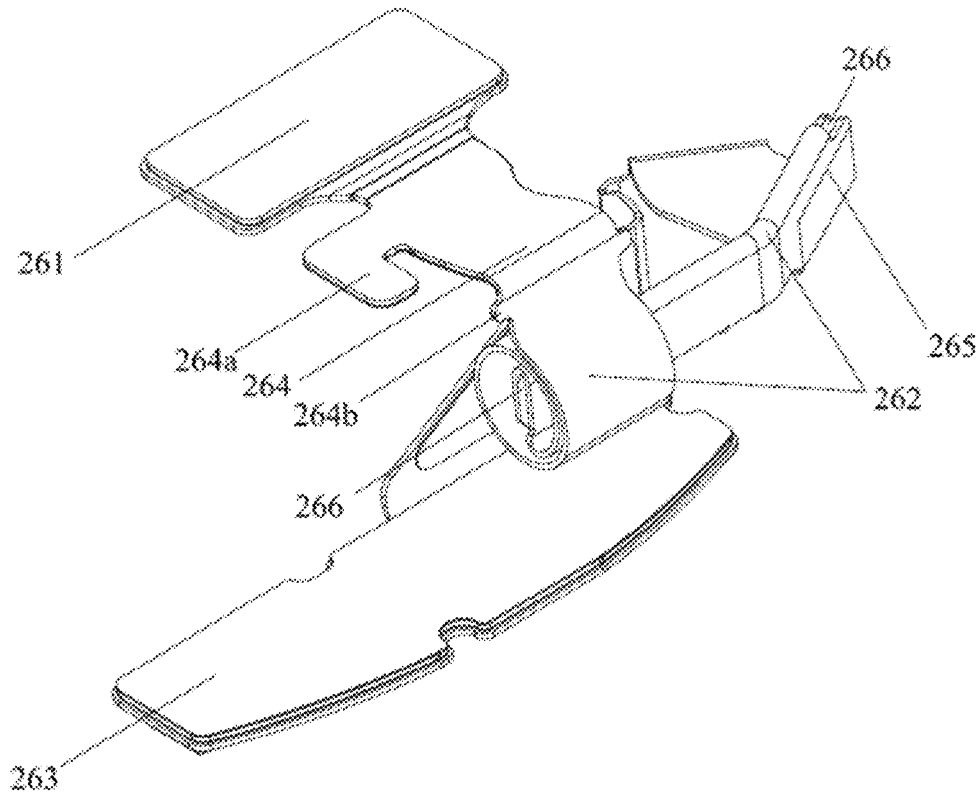
FIG. 61 is a schematic diagram of a structure of a flexible circuit board in a rotating shaft assembly.

FIG. 59, FIG. 60, and FIG. 61 show schematic structures after a flexible circuit board 26 is bent and wound (the flexible circuit board 26 is bent and wound after being mounted on the second shaft 223). Actually, the flexible circuit board 26 is in an unfolded state before being mounted on the second shaft 223, and in the unfolded state, the flexible circuit board 26 may be roughly of a long strip-shaped structure.

As shown in FIG. 59 to FIG. 61, the flexible circuit board 26 may include an electrical connection end 261 and an electrical connection end 263. After the flexible circuit board 26 is unfolded, the electrical connection end 261 and the electrical connection end 263 are respectively two ends in an extension direction of the flexible circuit board 26. The electrical connection end 261 and the electrical connection end 263 each are configured for electrical signal transmission, and may include a connector.

For example, the electrical connection end 261 may be connected to the first host circuit board assembly 212. For example, the connector of the electrical connection end 261 may be connected to a connector on the circuit board 212_a_ of the first host circuit board assembly 212, to electrically connect the flexible circuit board 26 and the first host circuit board assembly 212.

For example, the electrical connection end 263 may be electrically connected to the second host circuit board assembly 235, a flexible circuit board connecting the function button 24 and a motor (for example, the function button 24 and the motor may share the same flexible circuit board), and the like. The flexible circuit board connecting the function button 24 and the motor may be fastened, for example, on a side that is of the second bracket 231_a_ and that is far away from the opening of the third accommodation groove 231_f_. A magnetic field sensor (for example, a Hall effect sensor or a magnetometer) may be further disposed on the flexible circuit board. For example, there may be two magnetic field sensors, and the two magnetic field sensors may be respectively close to the groove wall of the third accommodation groove 231_f_ and the groove wall of the fourth accommodation groove 231_g_.

As shown in FIG. 59 to FIG. 61, the flexible circuit board 26 may further include a connection part 264 and a mounting part 262. The connection part 264 connects the mounting part 262 and the electrical connection end 261, and the mounting part 262 is further connected to the electrical connection end 263.

As shown in FIG. 59 to FIG. 61, the connection part 264 has a grounding portion 264_a_ and a limiting portion 264_b_. The grounding portion 264_a_ may be, for example, close to the electrical connection end 261, and the limiting portion 264_b_ may be, for example, far away from the electrical connection end 261. The limiting portion 264_b_ may be, for example, in a lug shape. For example, there may be two limiting portions 264_b_, and the two limiting portions 264_b_ are respectively located at edges of two sides of the connection part 264.

As shown in FIG. 59 to FIG. 61, the mounting part 262 is configured to match the second shaft 223, and may be in a bent and wound state. For example, in a perspective of FIG. 59, a part of the mounting part 262 may be folded to form a laminated layer, and therefore the part may be referred to as a laminated part. The other part of the mounting part 262 may be connected to the laminated part and wound to form a ring, and therefore the part may be referred to as a wound part. The wound part may be located at an end of the laminated part. It may be understood that, in FIG. 59, the mounting part 262 is marked by using a dashed box. This is merely intended to intuitively describe a rough position of the mounting part 262, and is not intended to strictly limit a boundary of the mounting part 262.

Figure 62:
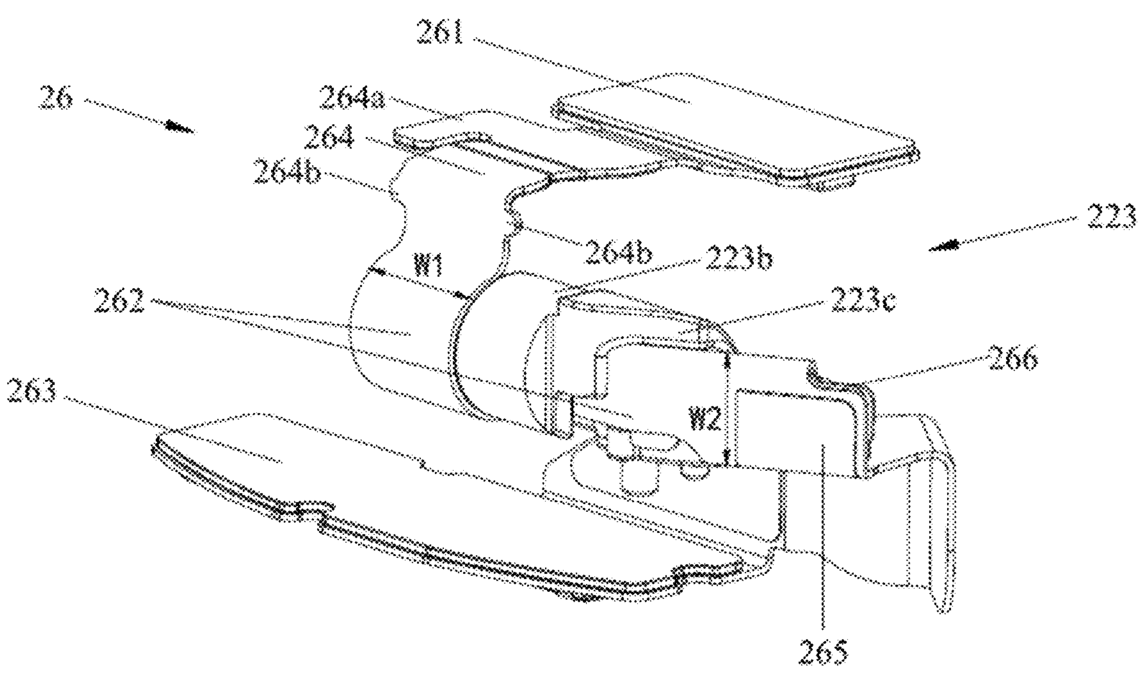
FIG. 62 is a schematic diagram of an assembly structure including a second shaft and a flexible circuit board in a rotating shaft assembly.

In this embodiment, a quantity of wires in the flexible circuit board 26 needs to meet a design requirement, and a width size of the flexible circuit board 26 affects the quantity of wires in the flexible circuit board 26. Therefore, the width size (for example, a minimum width size) of the flexible circuit board 26 needs to meet the design requirement. FIG. 59 and FIG. 62 show a width size W1 of the wound part and a folding width size W2 of the laminated part (an unfolded width of an unfolded laminated part is approximately 2×W2) of the mounting part 262 of the flexible circuit board 26, where the width size W1 of the wound part and the folding width size W2 of the laminated part may be designed based on a requirement.

As shown in FIG. 59 to FIG. 61, the flexible circuit board 26 may further include a separation bracket 266. A structure of the separation bracket 266 may be designed based on a requirement, for example, roughly in a flat-plate shape. A quantity of separation brackets 266 may be determined based on a requirement, and there may be a single separation bracket 266 or at least two separation brackets 266. The separation bracket 266 is clamped between folded layers of the laminated part, and each layer may be connected (for example, bonded) to the separation bracket 266.

In this embodiment, the unfolded width of the laminated part is generally small, and it is difficult to maintain a folded form after the laminated part is folded (the folded layers are easily tilted). However, because the separation bracket 266 is provided, the separation bracket 266 may enable the laminated part to maintain the folded form. In addition, the separation bracket 266 may also limit a bending radius of the laminated part, to avoid damage caused by excessive bending of the laminated part. In another embodiment, based on a product requirement, the separation bracket 266 may not be provided. As shown in FIG. 59 and FIG. 61, the flexible circuit board 26 may further include a protective layer 265. For example, the protective layer 265 may be attached to a surface of the laminated part, and may be located at an end that is of the laminated part and that is far away from the wound part. A material of the protective layer 265 may be, for example, Mylar (Mylar). In this embodiment, the position and the material of the protective layer 265 may alternatively be designed based on a product requirement, and are not limited to the foregoing descriptions.

In this embodiment, the laminated part may be fastened to the third host housing 232, and the protective layer 265 may separate the laminated part from the third host housing 232, to prevent the flexible circuit board 26 from being damaged due to friction between the laminated part and the third host housing 232 (descriptions are further provided below). In addition, the protective layer 265 may further enhance a structure of the laminated part. In another embodiment, based on a product requirement, the protective layer 265 may not be provided.

Figure 63:
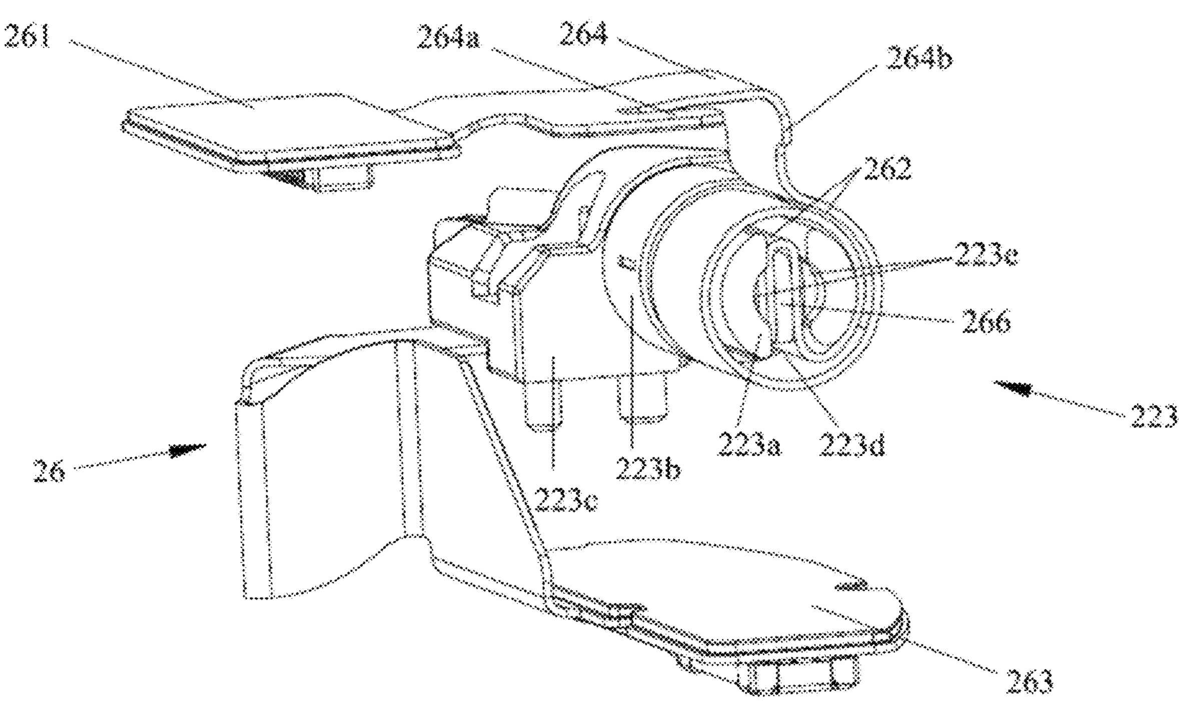
FIG. 63 is a schematic diagram of an assembly structure including a second shaft and a flexible circuit board in a rotating shaft assembly.

FIG. 62 and FIG. 63 each show an assembly structure including the flexible circuit board 26 and the second shaft 223. When the flexible circuit board 26 is assembled with the second shaft 223, the laminated part of the mounting part 262 of the flexible circuit board 26 in the unfolded state may be first folded. In this case, the wound part of the mounting part 262 may continue to be in an unfolded state. With reference to FIG. 58, FIG. 62, and FIG. 63, the entire mounting part 262 is then mounted from the third part 223c of the second shaft 223 into the channel 223d of the second shaft 223, so that the wound part of the mounting part 262 is positioned to the first part 223a of the second shaft 223. In this case, the wound part may be bent, so that the wound part is wound around the first part 223a, and a quantity of coils of the wound part may be determined based on an actual requirement. After the winding is completed, there is a specific distance between the wound part and an end portion that is of the first part 223a and that is far away from the second part 223b (that is, the wound part does not cover the end portion of the first part 223a). This helps avoid that the wound part is scratched and a life is affected (descriptions are further provided below). Both the electrical connection end 261 and the electrical connection end 263 of the flexible circuit board 26 are located outside the second shaft 223. The electrical connection end 261 and the electrical connection end 263 may be bent to adapt to an inner space of the host 2. The protective layer 265 and the connection part 264 of the flexible circuit board 26 may also be exposed outside the second shaft 223.

In this embodiment, an inner ring of the wound part of the flexible circuit board 26 is directly in contact with the first part 223a of the second shaft 223. A joint between the wound part and the laminated part may be fastened to the first part 223a, and a fastening manner may be, for example, bonding. Another region of the wound part may not be fastened and remain in a natural winding state, and the region may be relaxed to increase a diameter of the part, or may be tightened to decrease a diameter of the part.

In this embodiment, because the wound part of the flexible circuit board 26 is wound around the first part 223a of the second shaft 223, the width size W1 of the wound part may be ensured by using an axial size of the first part 223a. Because the laminated part of the flexible circuit board 26 is accommodated, in a folded state, in the channel 223d of the second shaft 223, the second shaft 223 needs only a small space to accommodate the laminated part whose unfolded width is 2×W2. This helps implement miniaturization of the second shaft 223, and further helps implement miniaturization of the host 2.

In conclusion, the second shaft 223 of the foregoing structure is designed, and the flexible circuit board 26 is mounted on the second shaft 223 in a bending and winding manner, so that an electrical connection of the host 2 can be implemented, the width size of the flexible circuit board 26 can be ensured to meet the design requirement, and miniaturization of the host 2 can be implemented.

In this embodiment, the second shaft 223 on which the flexible circuit board 26 is mounted may be mounted to the second inner cavity 222j of the shaft sleeve 222.

Figure 67:
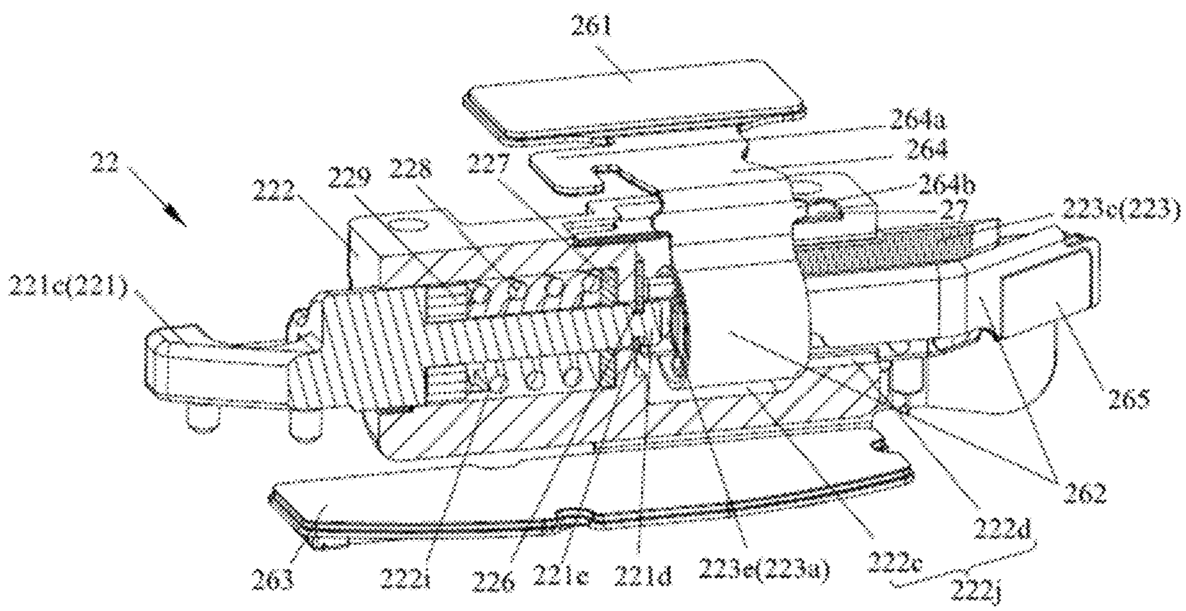
FIG. 67 is a schematic diagram of a sectional structure of a rotating shaft assembly.

With reference to FIG. 57 and FIG. 67, the first part 223a of the second shaft 223 is located in the first region 222c of the shaft sleeve 222. The second part 223b of the second shaft 223 may be located in the second region 222d of the second inner cavity 222j. The outer circumferential surface of the second part 223b may rotate and match the inner surface of the second region 222d. In other words, the outer circumferential surface of the second part 223b may be in contact with or may not be in contact with the inner surface of the second region 222d (with a small gap), and the inner surface of the second region 222d may rotate relative to the outer circumferential surface of the second part 223b. The third part 223c of the second shaft 223 is located outside the shaft sleeve 222.

Figure 64:
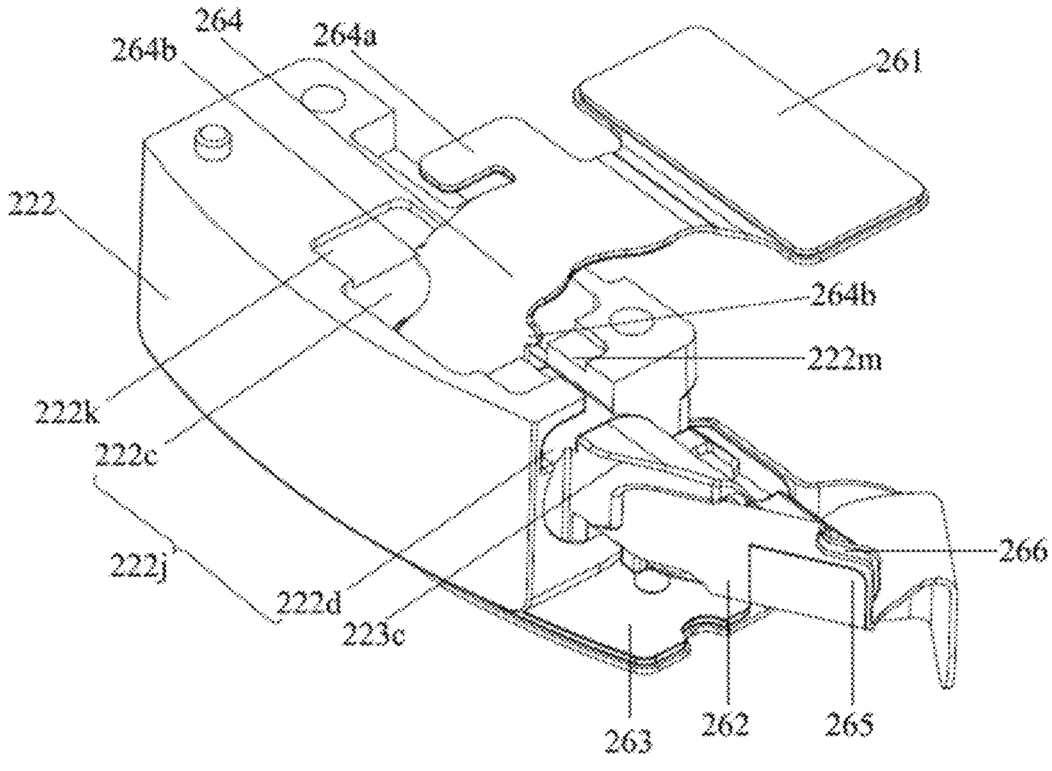
FIG. 64 is a schematic diagram of an assembly structure of a rotating shaft assembly.

As shown in FIG. 59, FIG. 64, and FIG. 67, the entire wound part of the flexible circuit board 26 is located in the first region 222c. A part of the laminated part of the flexible circuit board 26 is located in the first region 222c and the second region 222d, and the other part of the laminated part is located outside the shaft sleeve 222. Both the electrical connection end 261 and the electrical connection end 263 of the flexible circuit board 26 are located outside the shaft sleeve 222. The connection part 264 of the flexible circuit board 26 may pass through the opening of the first region 222c, and both the grounding portion 264a and the limiting portion 264b of the connection part 264 are located outside the shaft sleeve 222.

With reference to FIG. 64, in this embodiment, the electrical connection end 261 of the flexible circuit board 26 may be fastened to the first host circuit board assembly 212, and the electrical connection end 261 may move with the first part 21 of the host 2. Therefore, the connection part 264 connected to the electrical connection end 261 also moves with the electrical connection end 261. To enable the connection part 264 to move based on a design requirement, ensure that a motion of the connection part 264 is controllable, and avoid fatigue damage of the connection part 264, the connection part 264 may be clamped by using a clamping member, so as to limit the connection part 264. Descriptions are provided below.

Figure 65:
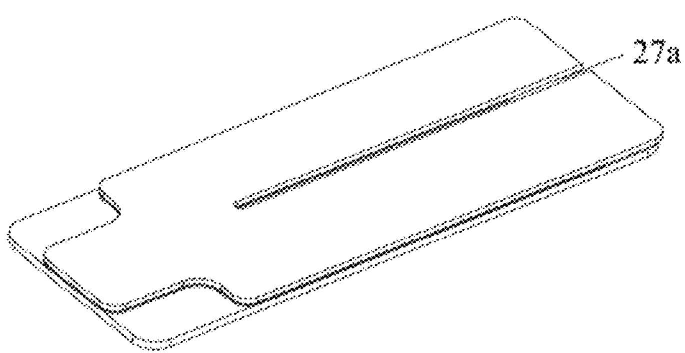
FIG. 65 is a schematic diagram of a structure of a clamping member in a rotating shaft assembly.

As shown in FIG. 65, a clamping member 27 may be roughly in a sheet shape, and a clamping gap 27a may be provided on the clamping member 27. The clamping gap 27a may be basically in a straight-line shape. One end of the clamping gap 27a passes through the clamping member 27, and the other end does not pass through the clamping member 27. The clamping member 27 may be manufactured by using a material that has good insulation and moisture resistance, for example, a Mylar (Mylar) sheet.

Figure 66:
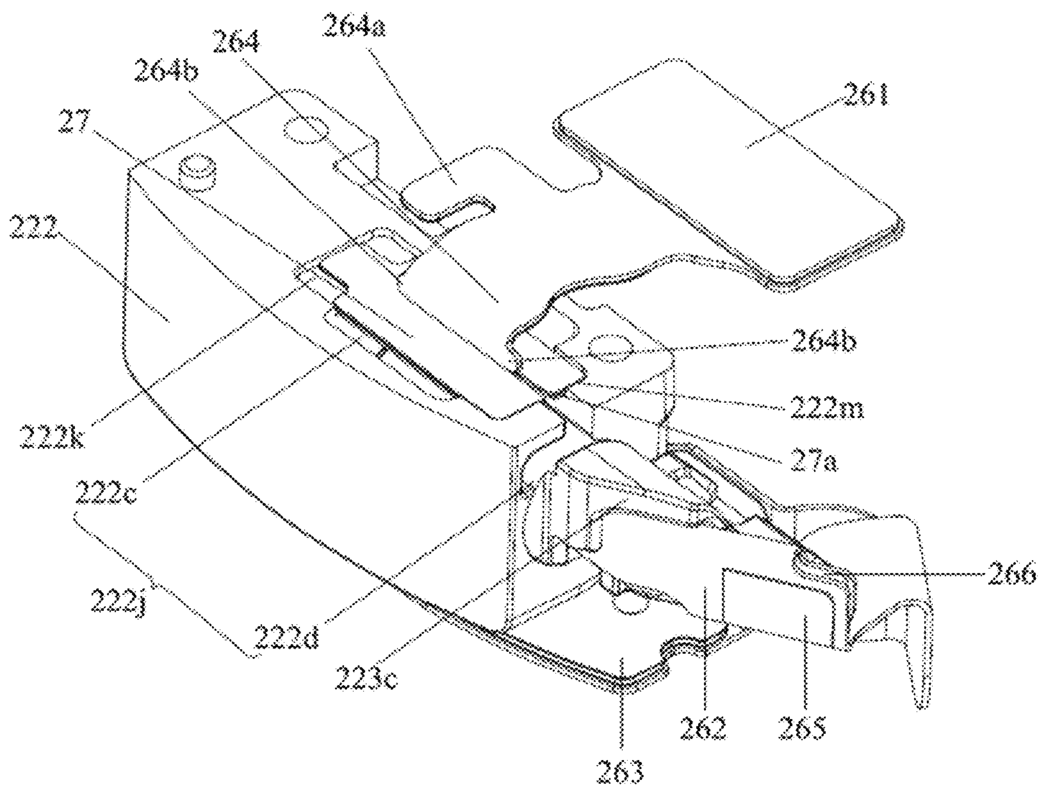
FIG. 66 is a schematic diagram of an assembly structure of a rotating shaft assembly.

As shown in FIG. 65 and FIG. 66, the connection part 264 may penetrate the clamping gap 27a of the clamping member 27, the limiting portion 264b of the connection part 264 may be clamped on an edge of the clamping gap 27a, the clamping member 27 may be fastened to the groove 222k and the groove 222m of the shaft sleeve 222, and the clamping member 27 covers at least a part of the first region 222c. In this way, the clamping member 27 can clamp the connection part 264 and limit the connection part 264. When the connection part 264 moves, because the clamping member 27 exists, a motion stroke of the connection part 264 meets a design requirement, and fatigue damage is not easily generated. In addition, the limiting portion 264b is designed to facilitate accurate positioning of the clamping member 27 and the flexible circuit board 26 during assembly in a production line, thereby ensuring an assembly yield. In another embodiment, the design of clamping the connection part 264 by using the clamping member 27 may be canceled.

The foregoing describes structures and assembly of the second shaft 223, the flexible circuit board 26, the shaft sleeve 222, and the clamping member 27. The following describes an overall assembly structure of the rotating shaft assembly 22 and an assembly relationship between the flexible circuit board 26, the second shaft 223, and the first shaft 221.

FIG. 67 shows a sectional view of an assembly structure including the rotating shaft assembly 22, the flexible circuit board 26, and the clamping member 27. To clearly represent the flexible circuit board 26, the flexible circuit board 26 is not sectioned. As shown in FIG. 67, an assembly relationship between the first shaft 221, the driven member 229, the elastic member 228, the bump matching member 227, and the shaft sleeve 222, and an assembly relationship between the second shaft 223, the flexible circuit board 26, the clamping member 27, and the shaft sleeve 222 are described above, and are not repeated herein. As described above, the end portion of the first part 223*a* of the second shaft 223 is not covered by the wound part of the flexible circuit board 26. This facilitates insertion of the end portion 221*d* of the first shaft 221 into the groove 223*e* of the first part 223*a* of the second shaft 223. There may be a specific gap between the end portion 221*d* and the wound part in the axial direction of the first shaft 221, to avoid interference between the end portion 221*d* and the wound part.

In addition, as shown in FIG. 44, FIG. 38, and FIG. 40, one shaft contact member 224 may be fastened in the mounting groove 222*g* that is of the shaft sleeve 222 and that is close to the second part 221*b* of the first shaft 221, and the shaft contact member 224 is in contact with the second part 221*b*. Similarly, another shaft contact member 224 may be fastened in the groove that is of the shaft sleeve 222 and that is close to the second part 223*b* of the second shaft 223, and the shaft contact member 224 is in contact with the second part 223*b* (due to a perspective reason, the groove that is assembled in the shaft sleeve 222 and that is close to the second part 223*b* and the shaft contact member 224 in the groove are not displayed). In this embodiment, the shaft contact member 224 may be a conductor, for example, a metal spring.

The following describes assembly structures of the rotating shaft assembly 22, the flexible circuit board 26, and the first part 21 and the second part 23 of the host 2 one by one.

Figure 68:
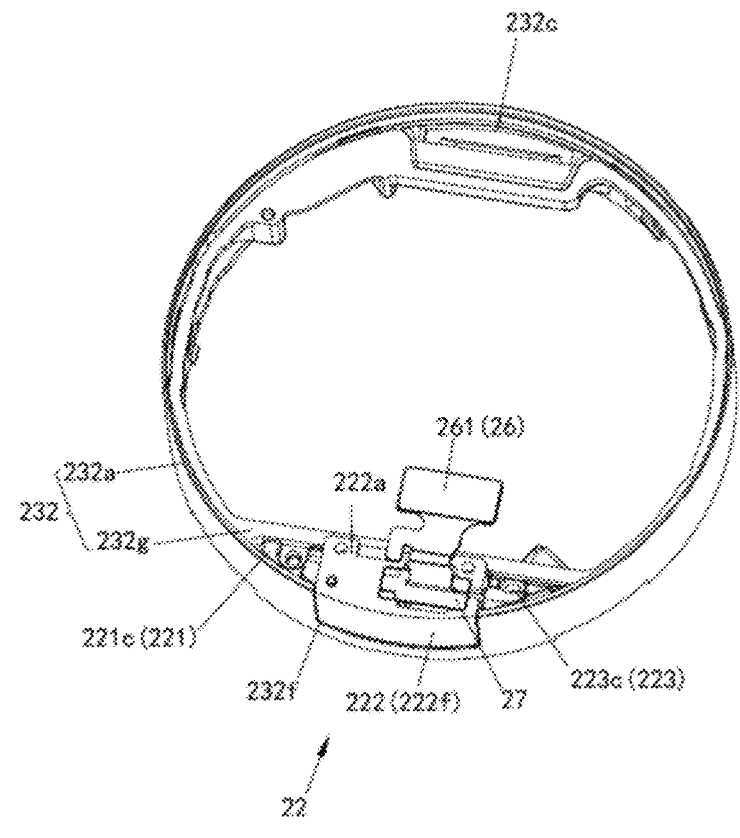
FIG. 68 is a schematic diagram of an assembly structure including a rotating shaft assembly and a third host housing.

As shown in FIG. 68, both the third part 221*c* of the first shaft 221 and the third part 223*c* of the second shaft 223 may be fastened to the inner bearing platform 232*g* of the third host housing 232. The shaft sleeve 222 may be located in the rotating shaft mounting space 232*f* of the third host housing 232, and the shaft sleeve 222 may rotate in the rotating shaft mounting space 232*f*. The second outer surface 222*f* of the shaft sleeve 222 may face an outer side of the circumferential side wall 232*a* of the third host housing 232. The electrical connection end 261 of the flexible circuit board 26 may be located on the inner side of the circumferential side wall 232*a*.

With reference to FIG. 67 and FIG. 68, the electrical connection end 263 of the flexible circuit board 26 may be located on the inner side of the circumferential side wall 232*a*, and is fastened to the inner bearing platform 232*g*. For example, the electrical connection end 263 may have an adhesive, and the electrical connection end 263 may be bonded to the inner bearing platform 232*g*. With reference to FIG. 67, FIG. 24, and FIG. 68, the protective layer 265 of the flexible circuit board 26 may be located on the inner side of the circumferential side wall 232*a*, and located between the circumferential side wall 232*a* and the laminated part of the flexible circuit board 26, to prevent friction caused by direct contact between the laminated part and the circumferential side wall 232*a*, and avoid damage to the flexible circuit board 26 due to the friction.

Figure 69:
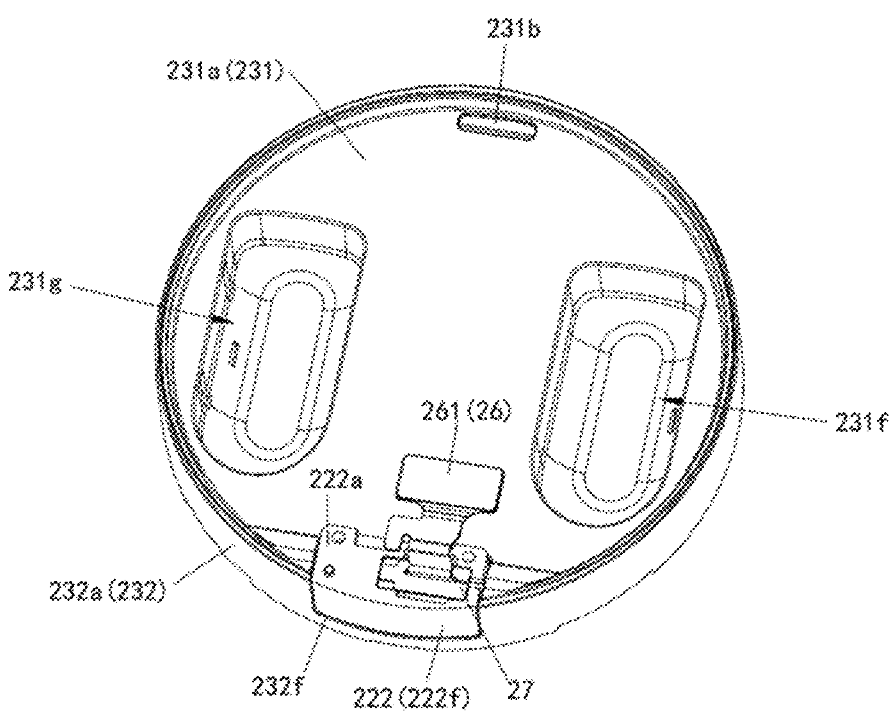
FIG. 69 is a schematic diagram of an assembly structure including a rotating shaft assembly, a third host housing, and a second host housing.

As shown in FIG. 69, the second bracket 231*a* of the second host housing 231 may be assembled and fastened to the third host housing 232, and the second host housing 231 may be located on the inner side of the circumferential side wall 232*a*. In a perspective of FIG. 69, the opening of the third accommodation groove 231*f* and the opening of the fourth accommodation groove 231*g* on the second bracket 231*a* face upward. The second bracket 231*a* covers both the third part 221*c* of the first shaft 221 and the third part 223*c* of the second shaft 223. The through hole 231*b* of the second bracket 231*a* and the shaft sleeve 222 may be respectively roughly located at two opposite ends of a same diameter of the circumferential side wall 232*a*. With reference to FIG. 69 and FIG. 68, the through hole 231*b* may communicate with the second opening 232*c* of the third host housing 232.

Figure 70:
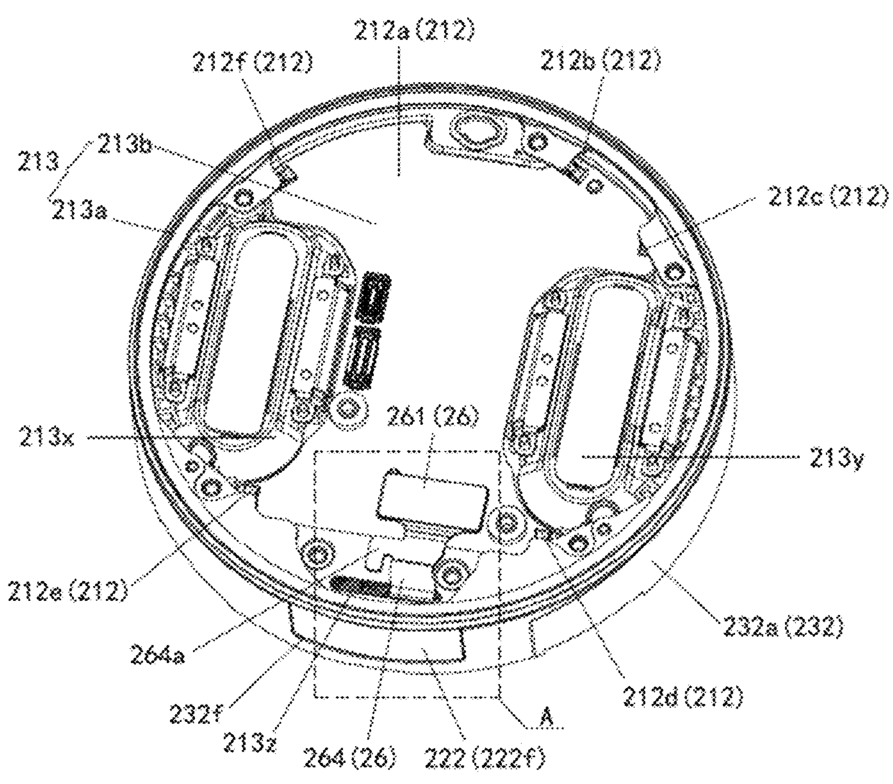
FIG. 70 is a schematic diagram of an assembly structure including a rotating shaft assembly, a third host housing, a second host housing, and a first host housing.

With reference to FIG. 70 and FIG. 69, the first host housing 213 may cover the second host housing 231 and the third host housing 232. From a perspective of FIG. 70, the opening of the first accommodation groove 213*y* and the opening of the second accommodation groove 213*x* of the first bracket 213*b* of the first host housing 213 may face downwards. In this embodiment, the opening of the first accommodation groove 213*y* may face the opening of the third accommodation groove 231*f*, and the opening of the first accommodation groove 213*y* may be aligned with the opening of the third accommodation groove 231*f*. The opening of the second accommodation groove 213*x* may face the opening of the fourth accommodation groove 231*g*, and the opening of the second accommodation groove 213*x* may be aligned with the opening of the fourth accommodation groove 231*g*.

With reference to FIG. 70 and FIG. 69, the first frame body 213*a* in the first host housing 213 may be fixedly connected to a side that is of the shaft sleeve 222 and that has the first outer surface 222*a*, and the first frame body 213*a* may cover a part of a region of the first outer surface 222*a* and a part of a region of the clamping member 27. The other part of the region of the first outer surface 222*a* and the other part of the region of the clamping member 27 may be exposed from the through hole 213*z* of the first frame body 213*a*. The electrical connection end 261 and the connection part 264 of the flexible circuit board 26 may pass through the through hole 213*z* of the first frame body 213*a*. The electrical connection end 261 may be connected to the circuit board of the first host circuit board assembly 212, so that the flexible circuit board 26 is electrically connected to the first host circuit board assembly 212. The grounding portion 264*a* of the connection part 264 may pass through the through hole 213*z*, and is connected to the first frame body 213*a* through a conductor, where the conductor may be, for example, conductive foam or a conductive adhesive. In this way, the flexible circuit board 26 can be grounded, to avoid interference to antenna radiation performance of the host 2 (descriptions are further provided below). The limiting portion 264*b* of the connection part 264 is located in the through hole 213*z*.

Figure 71:
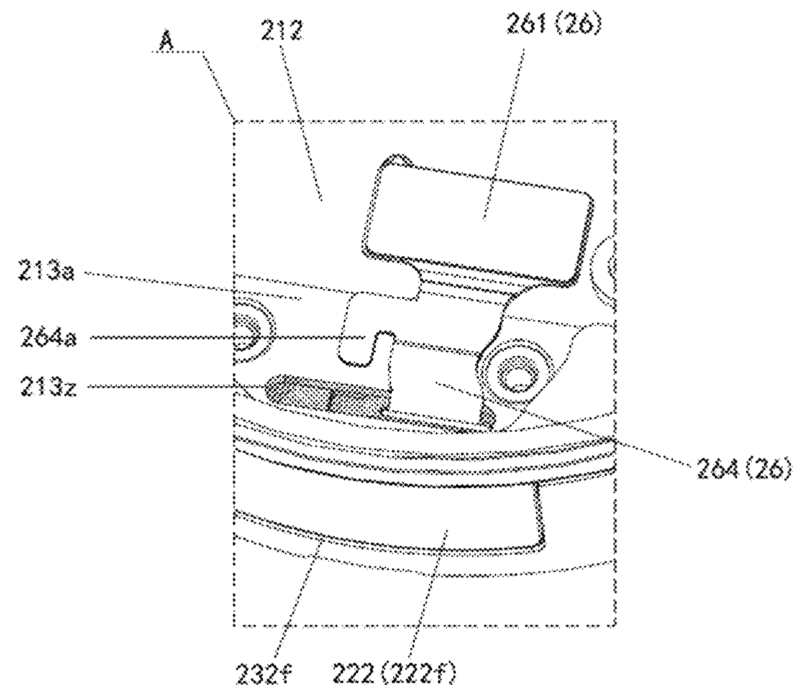
FIG. 71 is a schematic diagram of a partially enlarged structure at a position A in FIG. 70.

As shown in FIG. 71 and FIG. 69, the through hole 213*z* of the first frame body 213*a* may be filled with a sealing material (which is represented by a shadow), the sealing material may fill the through hole 213*z* and cover the first outer surface 222*a* and a surface of the clamping member 27, and the sealing material surrounds the connection part 264 of the flexible circuit board 26. The sealing material may be, for example, sealant. The sealing material has a sealing function, and can prevent moisture from intruding the electrical connection end 261 and the first host circuit board assembly 212 through the through hole 213*z* of the first frame body 213*a*. The moisture may come from the outside, and the outside moisture may enter the through hole through an assembly gap between the shaft sleeve 222 and the circumferential side wall 232*a*. The moisture may alternatively come from the inside of the host 2, and the moisture in the host 2 may enter the through hole through an assembly gap between the shaft sleeve 222 and the second bracket 231*a*.

In another embodiment, a structure design may be adjusted (for example, a position and/or a size of the through hole of the first frame body 213*a* may be adjusted), so that only a part of the region of the clamping member 27 may be exposed from the through hole 213*z* of the first frame body 213*a*, and the first outer surface 222*a* of the shaft sleeve 222 is completely covered by the first frame body 213*a*. Correspondingly, the sealing material in the through hole 213*z* covers only the surface of the clamping member 27. Alternatively, in another embodiment, based on an actual requirement, the first frame body 213*a* may not be provided with the through hole 213*z*, and may be sealed without filling the sealing material.

Figure 72:
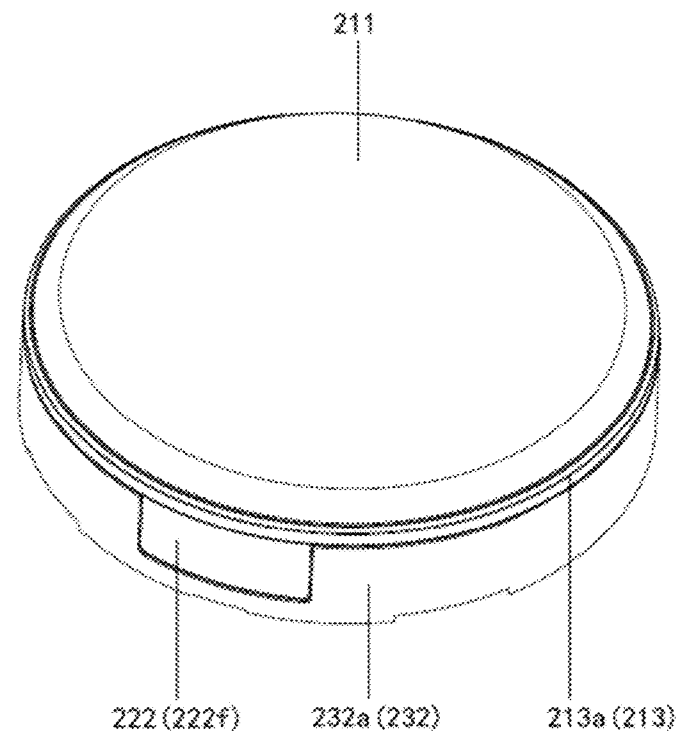
FIG. 72 is a schematic diagram of an assembly structure of a host in a wearable device.

As shown in FIG. 72, the display 211 is mounted on the first host housing 213. With reference to FIG. 72, FIG. 70, and FIG. 6, the display 211 may cover the first bracket 213*b* of the first host housing 213, the first host circuit board assembly 212, the electrical connection end 261 and the connection part 264 of the flexible circuit board 26, and a part of the first frame body 213*a* of the first host housing 213. A circumferential edge of the first frame body 213*a* may surround the display 211. In addition, FIG. 72 shows that in the closed state of the host 2, the second outer surface 222*f* of the shaft sleeve 222 may be seen as an appearance surface of the host 2.

In conclusion, in the host 2, the shaft sleeve 222 of the rotating shaft assembly 22 is fixedly connected to the first part 21, both the first shaft 221 and the second shaft 223 of the rotating shaft assembly 22 are fixedly connected to the second part 23, and the first part 21 may rotate around the first shaft 221 and the second shaft 223 together with the shaft sleeve 222.

The following describes mechanism motions generated in the host 2 in opening and closing processes of the host 2.

Figure 73:
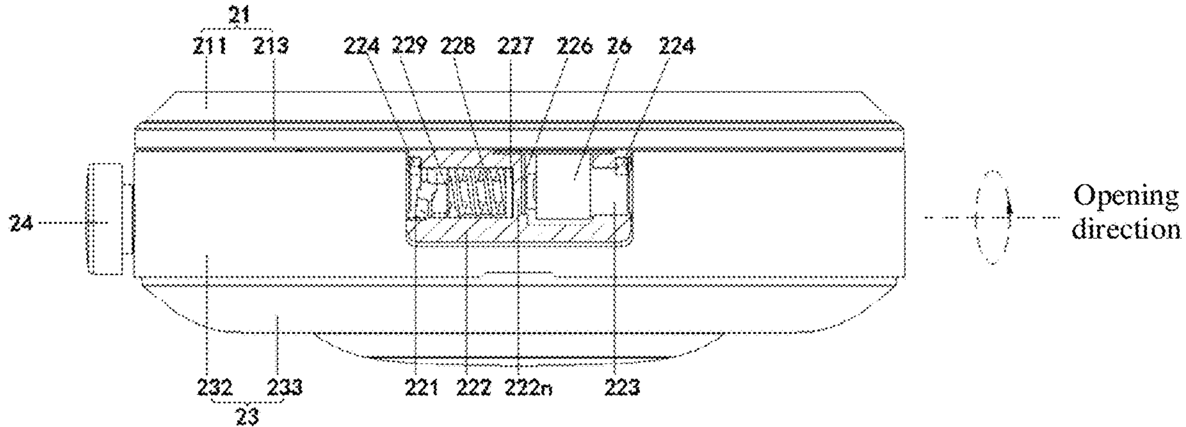
FIG. 73 is a schematic partial sectional view of an assembly structure of a host in a wearable device.
Figure 74:
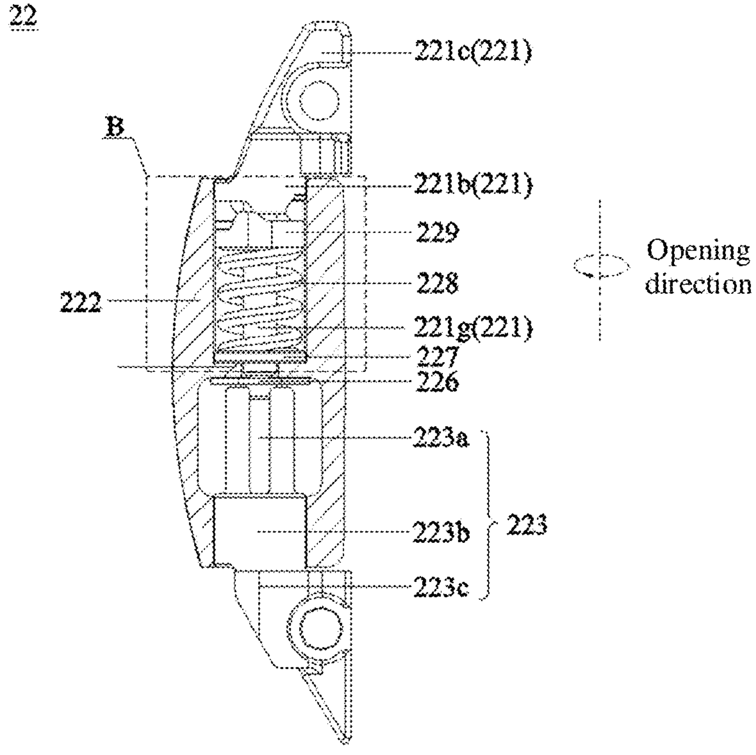
FIG. 74 is a schematic diagram of a sectional structure of a rotating shaft assembly.
Figure 75:
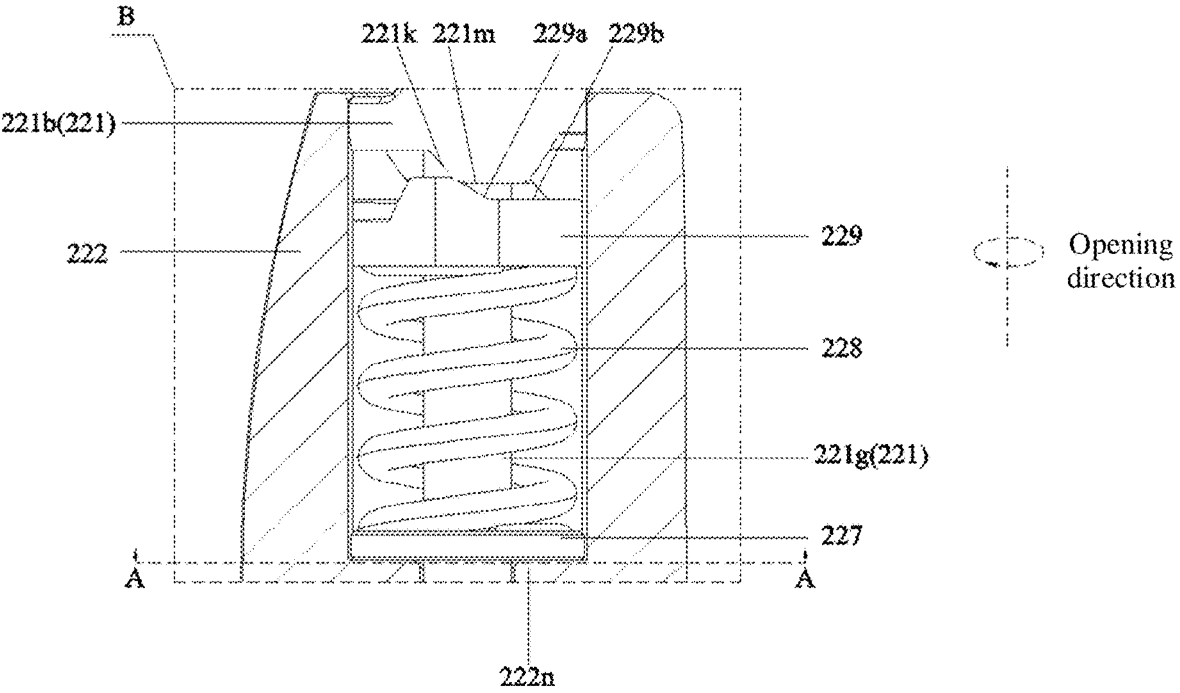
FIG. 75 is a schematic diagram of a partially enlarged structure at a position B in FIG. 74.

FIG. 73 is a schematic side view of the host 2 in the closed state, and FIG. 74 is a schematic top view of the rotating shaft assembly 22 of the host 2 in FIG. 73. In FIG. 73 and FIG. 74, to display an internal state of the rotating shaft assembly 22, the shaft sleeve 222 is sectioned for display. It should be noted that a section of the shaft sleeve 222 in FIG. 73 is perpendicular to a section of the shaft sleeve 222 in FIG. 74. FIG. 75 is a partially enlarged schematic diagram at a position B in FIG. 74.

As described above, when the host 2 is in the closed state, the latch portion 213*d* in the first part 21 and the buckle 251*e* of the open button 25 form a buckle connection, so that the first part 21 is latched by the second part 23.

As shown in FIG. 73 and FIG. 75, when the host 2 is in the closed state, an end of the elastic member 228 presses against the driven member 229, so that the driven member 229 maintains in contact with the second part 221*b*. A top (namely, an end that is of the first slope 229*a* and that is far away from the plane 229*b*) of the first slope 229*a* of the driven member 229 may be in contact with a top (namely, an end that is of the slope 221*k* and that is close to the plane 221*m*) of the slope 221*k* of the second part 221*b* of the first shaft 221, and there is a gap between the plane 229*b* of the driven member 229 and the plane 221*m* of the second part 221*b*. A force applied by the slope 221*k* on the first slope 229*a* may enable the driven member 229 to have a trend of rotating in an opening direction, and the first part 21 of the host 2 may rotate in the opening direction to be opened relative to the second part 23.

As shown in FIG. 75, due to matching between the driven member 229 and the shaft sleeve 222, when the driven member 229 has a trend of rotating in a clockwise direction, the shaft sleeve 222 also has a trend of rotating in the opening direction. The shaft sleeve 222 is fixedly connected to the first part 21. Therefore, the first part 21 also has a trend of rotating in the opening direction. However, because the first part 21 is latched by the second part 23, the first part 21 cannot actually rotate in the opening direction.

As shown in FIG. 75, the other end of the elastic member 228 presses against the bump matching member 227, so that the bump matching member 227 presses against the spacer plate 222*n*.

Figure 76:
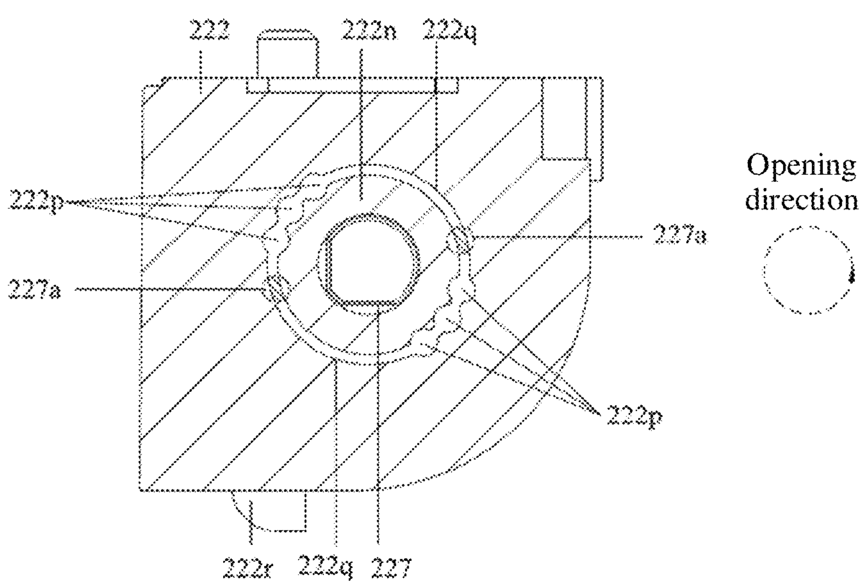
FIG. 76 is a schematic diagram of an A-A sectional structure of the structure shown in FIG. 75.

FIG. 76 is a schematic diagram of an A-A sectional structure of FIG. 75. FIG. 76 shows a sectional view of a matching structure including the bump matching member 227 and the spacer plate 222*n* when the host 2 is in the closed state, where the bumps 227*a* on the bump matching member 227 are shown by dashed lines. As shown in FIG. 76, the bumps 227*a* are located in the chute 222*q* on the spacer plate 222*n*, and there is a specific spacing between the bump 227*a* and the matching grooves 222*p*.

When the user presses the cap 251 of the open button 25, the buckle 251*e* of the open button 25 and the latch portion 213*d* of the first part 21 no longer form the buckle connection, and the first part 21 is no longer latched by the second part 23. In this case, the first part 21 starts the first rotation stroke segment.

Figure 77:
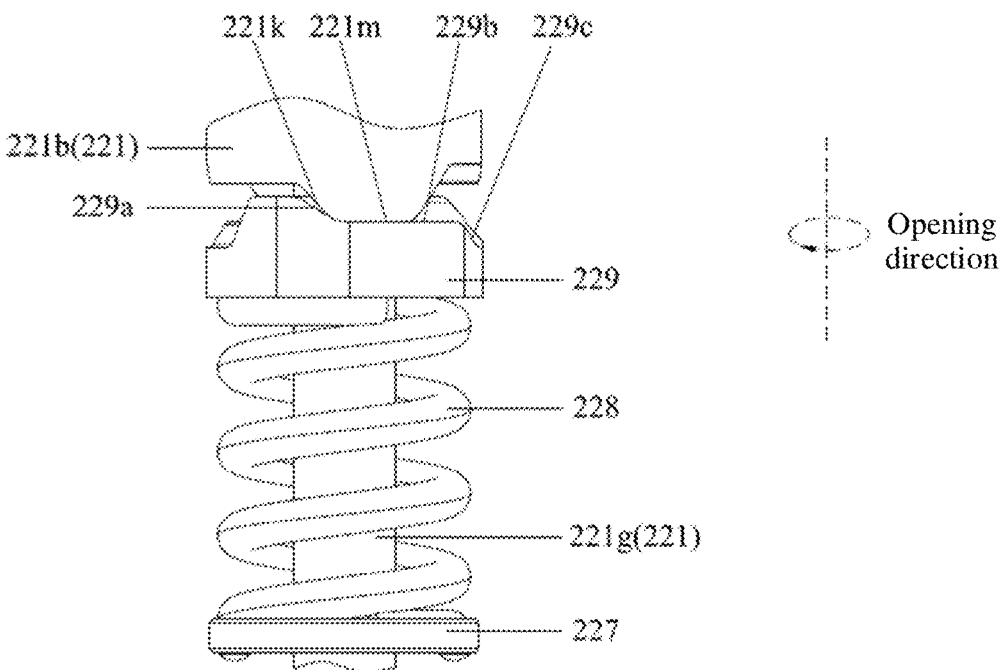
FIG. 77 is a schematic diagram of a matching structure including a first shaft, a driven member, and an elastic member in a rotating shaft assembly.

As shown in FIG. 77 (in FIG. 77, to clearly indicate matching between the driven member 229 and the second part 221*b*, the shaft sleeve 222 is not shown, and this also applied to the following), under a joint action of the elastic member 228 and the slope 221*k*, the driven member 229 performs a composite motion. The driven member 229 rotates in the opening direction and moves towards the second part 221*b* at the same time, until a root portion of the first slope 229*a* (namely, an end that is of the first slope 229*a* and that is connected to the plane 229*b*) is in contact with the top of the slope 221*k*, and the plane 229*b* is in contact with the plane 221*m* (impact of inertia on a position of the driven member 229 may be ignored through a structure design). With reference to FIG. 73, when the driven member 229 moves, the shaft sleeve 222 and the first part 21 also rotate around the second part 221*b* in the opening direction.

As shown in FIG. 73 and FIG. 2, when the driven member 229, the shaft sleeve 222, and the first part 21 stop rotating, the first part 21 completes the first rotation stroke segment, and the first part 21 opens the angle a relative to the second part 23, where the angle a may be, for example, about 15°. It is easy to understand that, in the first rotation stroke segment, the first part 21 is driven by the shaft sleeve 222 to rotate. Therefore, the first part 21 automatically rotates, and no external force needs to be applied by the user.

Figure 78:
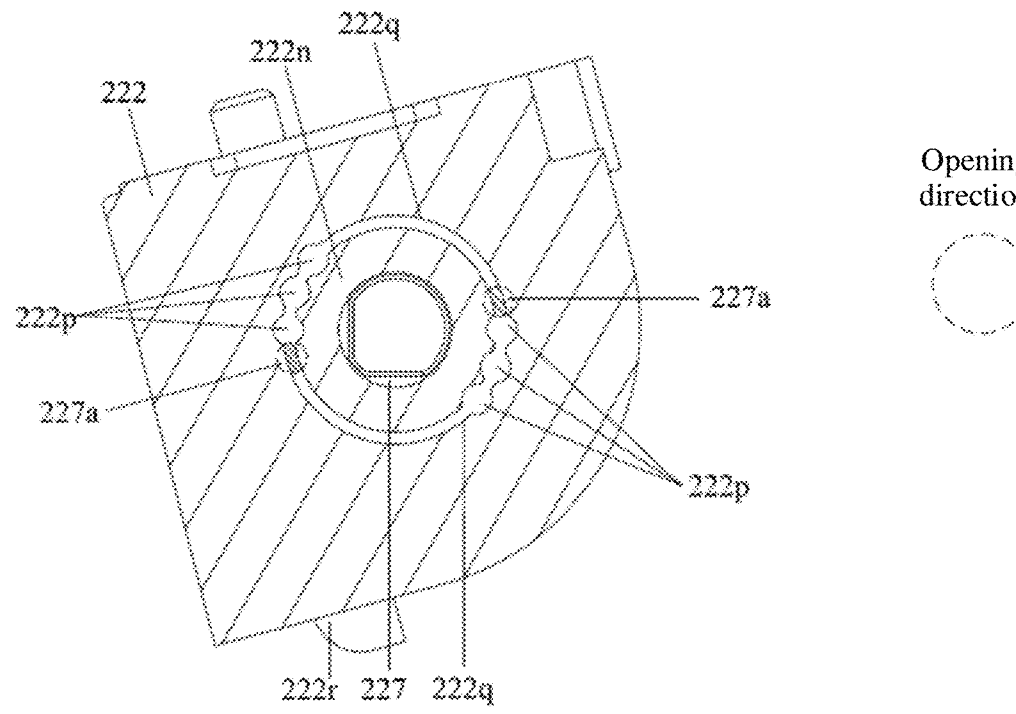
FIG. 78 is a schematic diagram of a structure showing a matching state of a shaft sleeve and a bump matching member in a rotating shaft assembly.

With reference to FIG. 76 and FIG. 78, in the first rotation stroke segment, because the shaft sleeve 222 rotates relative to the bump matching member 227, the bumps 227*a* of the bump matching member 227 slide in the chute 222*q* and gradually approach the matching grooves 222*p*. When the first rotation stroke segment ends, the bumps 227*a* each may just reach a joint between the chute 222*q* and the matching groove 222*p* (as shown in FIG. 78). In the first rotation stroke segment, the bumps 227*a* always smoothly slide in the chute 222*q*, no displacement (or referred to as a jolt) in a rotating shaft direction of the shaft sleeve 222 is generated between the bump matching member 227 and the shaft sleeve 222, and the bump matching member 227 does not impact the shaft sleeve 222. Therefore, when the user touches the first part 21, the user cannot experience a touch feeling feedback.

Alternatively, in another embodiment, when the first rotation stroke segment ends, the bumps 227*a* may enter the matching grooves 222*p*. When the bumps 227*a* enter first matching grooves 222*p* from the chute 222*q*, a displacement in the rotating shaft direction of the shaft sleeve 222 is generated between the bump matching member 227 and the shaft sleeve 222, and the bump matching member 227 may impact the shaft sleeve 222. Therefore, if the user touches the first part 21, the user may experience a touch feeling feedback.

As shown in FIG. 77, after the first part 21 is opened at the angle a relative to the second part 23, the plane 229*b* is in contact with the plane 221*m*, and a joint force applied by the elastic member 228 and the first shaft 221 to the driven member 229 in an axial direction of the main portion 221*g* is zero. Therefore, the driven member 229 cannot continue to rotate by relying only on driving of the elastic member 228 and the first shaft 221. In other words, the first part 21 cannot continue to automatically rotate. In this case, the user may rotate the first part 21 in the opening direction. The first part 21 may drive the shaft sleeve 222 to rotate in the opening direction, and the shaft sleeve 222 may further drive the driven member 229 to rotate in the opening direction. It is easy to understand that, in a rotation process of the driven member 229, the plane 229*b* is in slidable contact with the plane 221*m*. Therefore, the driven member 229 only rotates, and no displacement occurs in the axial direction of the main portion 221*g*.

Figure 79:
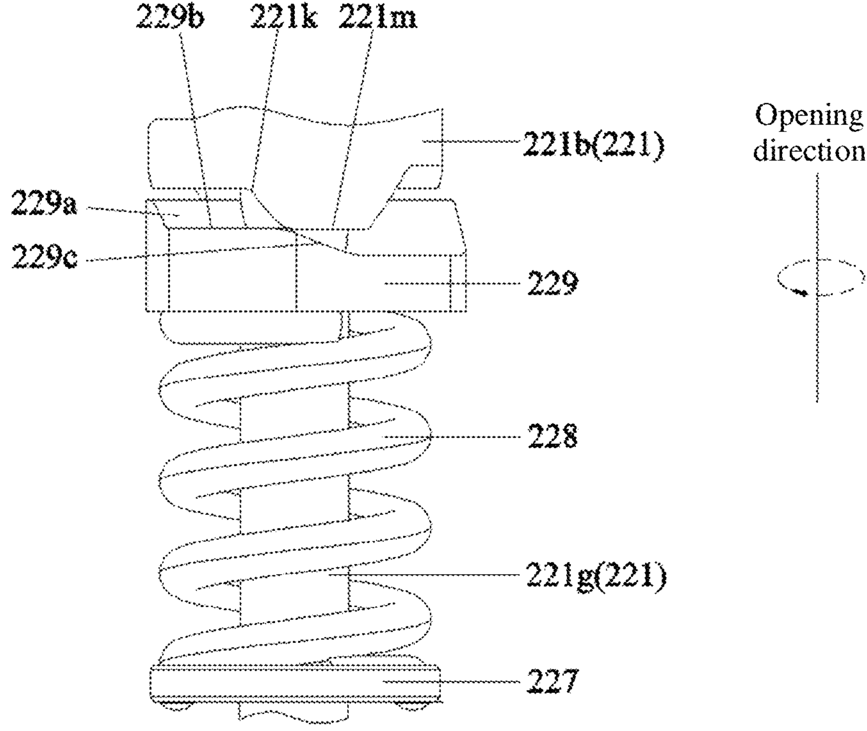
FIG. 79 is a schematic diagram of a matching structure including a first shaft, a driven member, and an elastic member in a rotating shaft assembly.

As shown in FIG. 79, when the end that is of the plane 229*b* and that is far away from the first slope 229*a* is in contact with the top of the slope 221*k* (or the top of the second slope 229*c* is in contact with the top of the slope 221*k*), the first part 21 may complete the second stroke segment. As shown in FIG. 3, when the second stroke segment is completed, the first part 21 is opened at the angle b relative to the second part 23, where the angle b may be, for example, about 75°. As described above, in the second stroke segment, the first part 21 needs to be manually rotated by the user.

Figure 80:
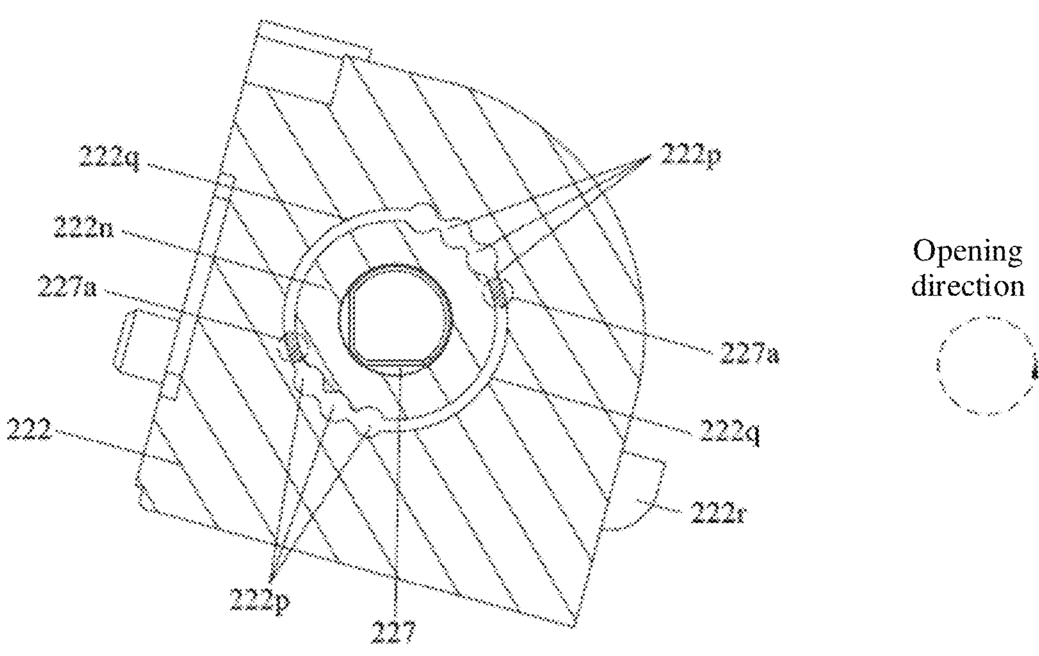
FIG. 80 is a schematic diagram of a structure showing a matching state of a shaft sleeve and a bump matching member in a rotating shaft assembly.

With reference to FIG. 78 and FIG. 80, in the second rotation stroke segment, the bumps 227*a* sequentially enter the matching grooves 222*p*. When the second rotation stroke segment, the bumps 227*a* may slide out of the matching grooves 222*p* and enter the chute 222*q*. In the second rotation stroke segment, when the bumps 227*a* enter and exit each matching groove 222*p*, a displacement in the rotating shaft direction of the shaft sleeve 222 is generated between the bump matching member 227 and the shaft sleeve 222, and the bump matching member 227 may impact the shaft sleeve 222. Therefore, the user may experience a touch feeling feedback.

As shown in FIG. 3, after the first part 21 is opened at the angle b relative to the second part 23, the first part 21 may start to enter the third stroke segment. A rotation characteristic of the first part 21 in the third stroke segment is similar to a rotation characteristic of the first part 21 in the first stroke segment, and the first part 21 also automatically rotates in the third stroke segment. Details are described below.

Figure 81:
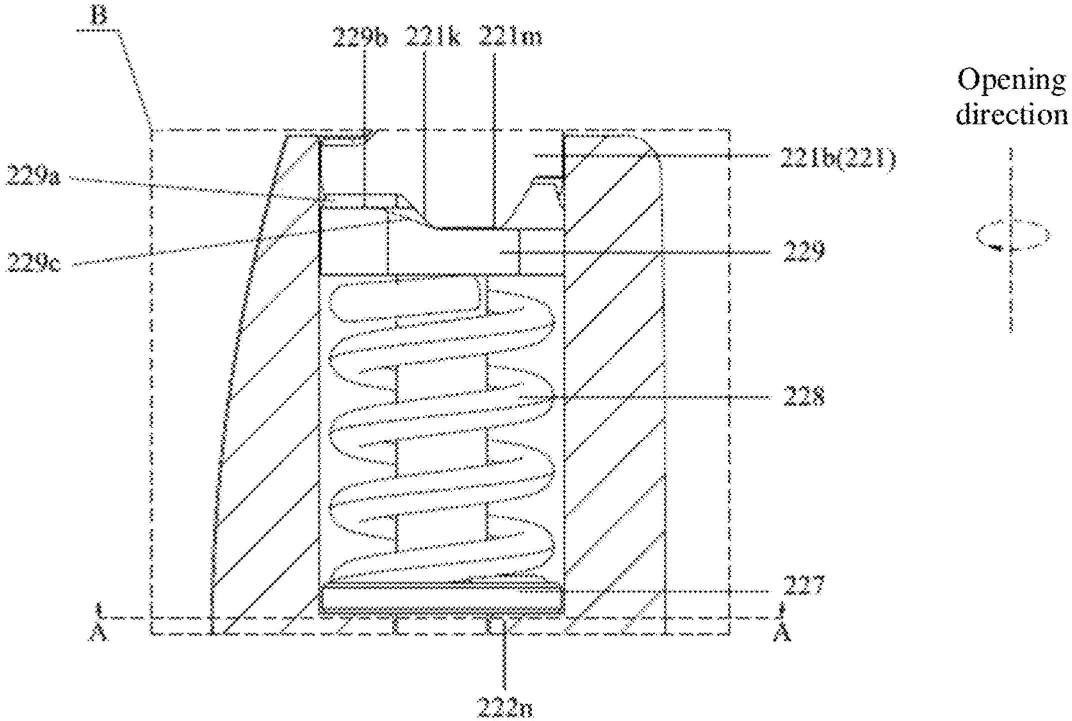
FIG. 81 is a schematic diagram of a matching structure including a first shaft, a driven member, and an elastic member in a rotating shaft assembly.

As shown in FIG. 79 and FIG. 81, when the third stroke segment starts, the top of the second slope 229*c* is in contact with the top of the slope 221*k*. Under the joint action of the elastic member 228 and the slope 221*k*, the driven member 229 performs a composite motion. The driven member 229 rotates in the opening direction and moves towards the second part 221*b* at the same time, until a root portion of the second slope 229*c* (namely, an end that is of the second slope 229*c* and that is far away from the plane 229*b*) is in contact with the top of the slope 221*k*. When the driven member 229 moves, the shaft sleeve 222 and the first part 21 also rotate around the second part 221*b* in the opening direction.

Figure 83:
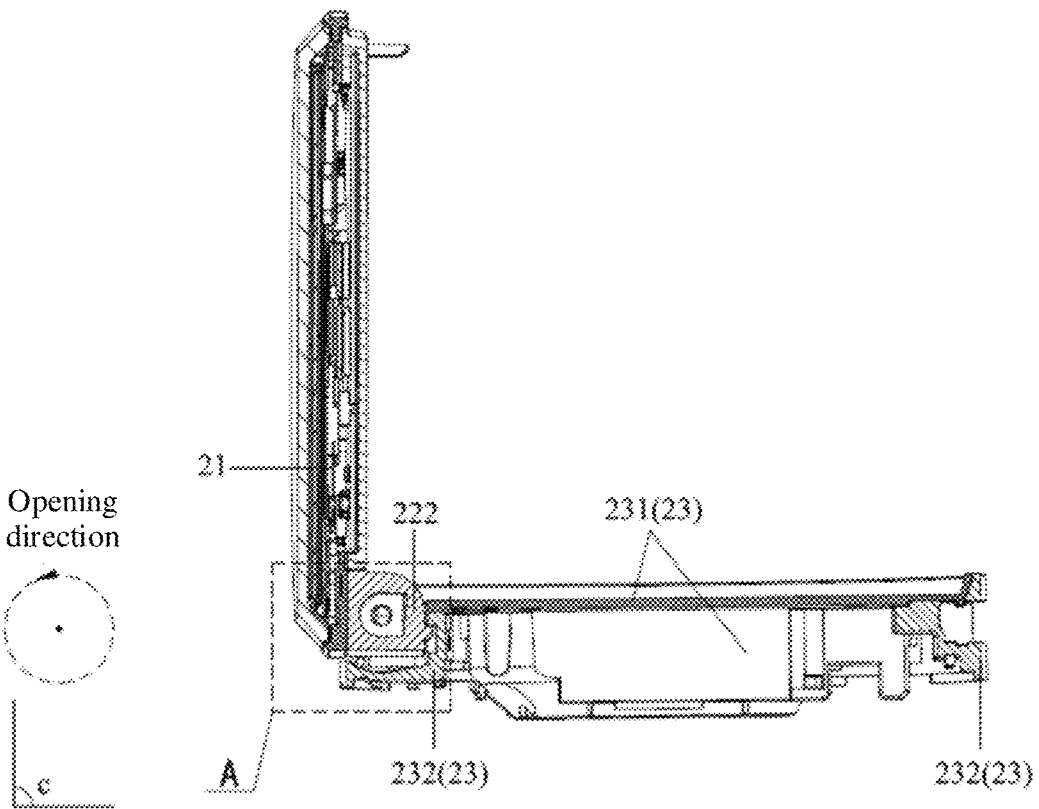
FIG. 83 is a schematic diagram of a structure in which a first part of a host is opened to a limit position relative to a second part.
Figure 84:
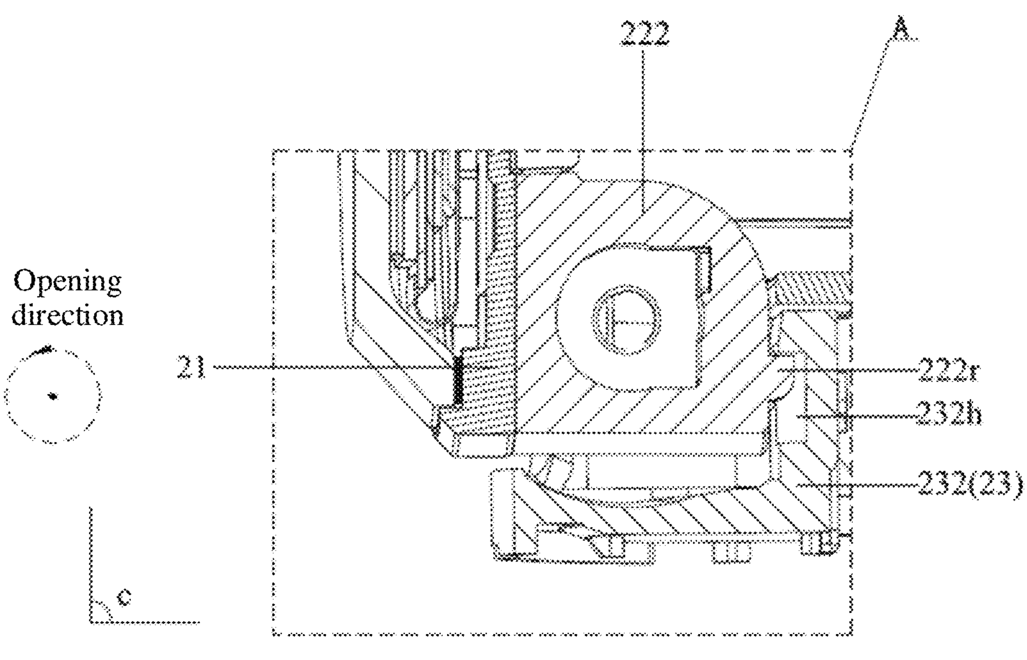
FIG. 84 is a schematic diagram of a partially enlarged structure at a position A in FIG. 83.

As shown in FIG. 83 and FIG. 84, the limiting protrusion 222*r* on the shaft sleeve 222 may enter the limiting groove 232*h* of the third host housing 232, and the limiting protrusion 222*r* abuts against the inner wall of the limiting groove 232*h*. In this case, the shaft sleeve 222 cannot continue to rotate in the opening direction, and therefore the first part 21 also stops rotating.

When the driven member 229, the shaft sleeve 222, and the first part 21 stop rotating, the first part 21 completes the third rotation stroke segment. As shown in FIG. 5, the first part 21 is opened at the angle c relative to the second part 23, where the angle c may be, for example, about 90°. It is easy to understand that, in the third stroke segment, the first part 21 is driven by the shaft sleeve 222 to rotate. Therefore, the first part 21 automatically rotates, and no external force needs to be applied by the user.

In this embodiment, the limiting groove 232*h* matches the limiting protrusion 222*r*, so that motion limiting can be performed on the first part 21 through the third host housing 232. Because the third host housing 232 has a larger size (compared with the rotating shaft assembly 22), and has good structural strength, assembly reliability of the limiting groove 232*h* and the limiting protrusion 222*r* is high, thereby helping ensure matching reliability of the host 2. It may be understood that, based on an actual requirement, in another embodiment, when the third stroke segment ends, the first part 21 may stop rotating through matching between the two-step ladder of the driven member and the two-step ladder of the first shaft 221. There is no need to design the limiting protrusion 222*r* on the shaft sleeve, and there is also no need to provide the limiting groove 232*h* on the third host housing 232.

Figure 82:
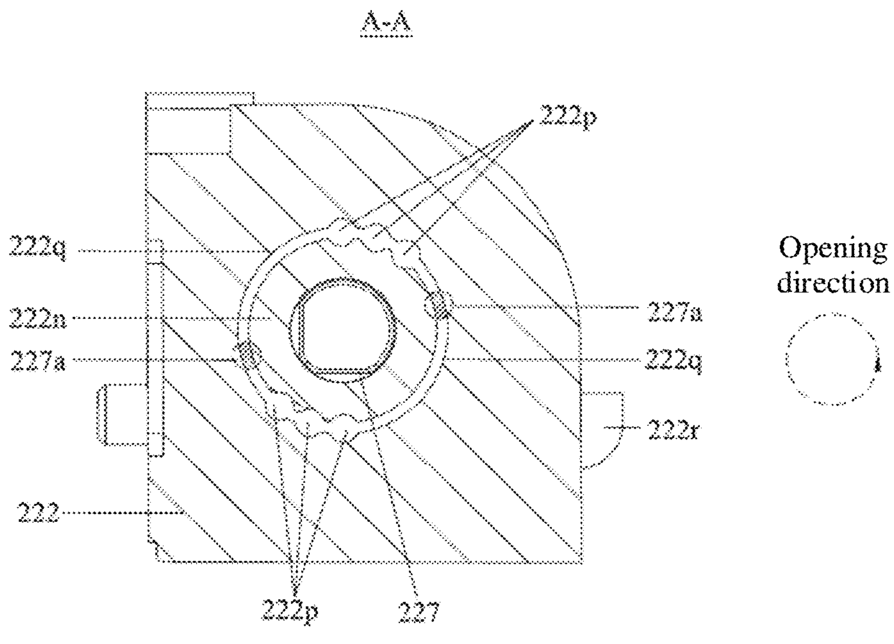
FIG. 82 is a schematic diagram of a structure showing a matching state of a shaft sleeve and a bump matching member in a rotating shaft assembly.

With reference to FIG. 80 and FIG. 82, in the third rotation stroke segment, the bumps 227*a* smoothly slide in the chute 222*q*, no displacement in the rotating shaft direction of the shaft sleeve 222 is generated between the bump matching member 227 and the shaft sleeve 222, and the bump matching member 227 does not impact the shaft sleeve 222. Therefore, when the user touches the first part 21, the user cannot experience a touch feeling feedback.

With reference to FIG. 73, FIG. 67, and FIG. 62, in a process of opening the first part 21, the electrical connection end 261 of the flexible circuit board 26 rotates with the first part 21, the wound part of the flexible circuit board 26 may be gradually loosened, and a diameter of the wound part may be gradually increased.

According to the foregoing descriptions of the opening process of the host 2, it is easy to understand that in an entire process of closing the opened first part 21, the first part 21 needs to be manually rotated in an opposite direction of the opening direction until the first part 21 is latched by the open button. In a stroke in which the opening angle of the first part 21 is reduced from the angle b to the angle a, because the bumps 227*a* sequentially slide into and out of each matching groove 222*p*, the bump matching member 227 may impact the shaft sleeve 222, and therefore there is a touch feeling feedback. In another stroke, because the bumps 227*a* slide smoothly in the chute 222*q*, the bump matching member 227 does not impact the shaft sleeve 222, and therefore there is no touch feeling feedback. In addition, in a process of closing the first part 21, the electrical connection end 261 of the flexible circuit board 26 rotates with the first part 21, the wound part of the flexible circuit board 26 may be gradually tightened, and a diameter of the wound part may be gradually decreased.

According to the foregoing descriptions, it is easy to understand that the assembly structure including the first shaft 221, the driven member 229, the elastic member 228, and the shaft sleeve 222 in the rotating shaft assembly 22 is used to construct a cam mechanism and implement opening and closing of the host 2. The second shaft 223 in the rotating shaft assembly 22 is configured for mounting and winding the flexible circuit board 26. In this embodiment, two shafts, namely, the first shaft 221 and the second shaft 223, are separately designed, so that the flexible circuit board 26 is easily assembled to the second shaft 223 and the shaft sleeve 222.

Due to a manufacturing error, the first shaft 221 and the second shaft 223 may not be concentric after being assembled (the axis of the first shaft 221 does not overlap the axis of the second shaft 223). If no corresponding measure is taken, stress is generated when the rotating shaft assembly 22 performs a mechanism motion, reliability of the rotating shaft assembly 22 is reduced, and an abnormal voice may be further caused. In this embodiment, the end portion **221*d* of the first shaft 221 matches the groove 223*e* of the second shaft 223**, so that an assembly tolerance can be absorbed, and stress caused by eccentricity can be reduced or avoided.

Different from this embodiment, in another embodiment, the first shaft and the second shaft may not be connected, and the end portion of the second shaft may not be provided with a groove configured to accommodate the end portion of the first shaft. Alternatively, in another embodiment, there may be no design in which a flexible circuit board is wound around a shaft, and an integrated single shaft may be used to replace the first shaft 221 and the second shaft 223. In this case, the limiting member 226 may be canceled.

According to the foregoing descriptions, it is easy to understand that the assembly structure including the elastic member 228, the bump matching member 227, and the shaft sleeve 222 in the rotating shaft assembly 22 is used to implement a touch feeling feedback in the opening and closing processes of the host 2. In another embodiment, the touch feeling feedback design may be canceled. To be specific, the bump matching member 227 and the chute **222*q* and the matching grooves 222*p* on the spacer plate 222*n* of the shaft sleeve 222 may be canceled. In this case, the elastic member may directly press against the spacer plate 222*n***.

In this embodiment, when the shaft sleeve 222 rotates, the shaft contact member 224 mounted on the shaft sleeve 222 rotates with the shaft sleeve 222, and the shaft contact member 224 maintains contact with the first shaft 221 and the second shaft 223. In other words, the shaft contact member 224 is in slidable contact with the first shaft 221 and the second shaft 223.

Two Feeding Paths of an Antenna System of the Host 2

In this embodiment, both the first frame body **213*a* and the third host housing 232 of the host 2 may be used as antennas in the antenna system of the host 2. The following describes two feeding paths of the antenna system of the host 2**.

As shown in FIG. 70, the first frame body **213*a* may be in contact with the feeding spring 212*f* of the first host circuit board assembly 212, so that a radio frequency signal can be fed into the first frame body 213*a* through the feeding spring 212*f*. In addition, the first frame body 213*a* may be in contact with the grounding spring 212*b*, the grounding spring 212*c*, the grounding spring 212*d*, and the grounding spring 212*e* of the first host circuit board assembly 212. In this way, the first frame body 213*a* can be grounded. Therefore, the first frame body 213*a*** can be used as an antenna.

As described above, the first frame body **213*a* is connected to the shaft sleeve 222, the shaft contact member 224 on the shaft sleeve 222 is in contact with both the first shaft 221 and the second shaft 223, and both the first shaft 221 and the second shaft 223 are connected to the third host housing 232. Therefore, the radio frequency signal can be transmitted from the first frame body 213*a* to the third host housing 232 through the shaft sleeve 222, the shaft contact member 224, the first shaft 221, and the second shaft 223. Therefore, the third host housing 232** can also be used as an antenna.

It can be learned that, the first host circuit board assembly 212 is connected to the first frame body **213*a* and the third host housing 232** through a physical mechanical structure, to form a first feeding path of the antenna system.

When the host 2 is in the closed state, in an axial direction (or a thickness direction of the host 2) of the first frame body **213*a*, there is a tiny gap between the first frame body 213*a* and the third host housing 232, and the gap is, for example, 0.1 mm. Because of the gap, the first frame body 213*a* may feed the third host housing 232 through coupling, so that the third host housing 232** can be used as an antenna.

It can be learned that, the first host circuit board assembly 212 is connected to the first frame body **213*a* through a physical mechanical structure, and then is electrically coupled to the third host housing 232**, to form a second feeding path of the antenna system.

When the host 2 is in the closed state, radiation of the third host housing 232 in the second feeding path is strong, and the host 2 and the first frame body **213*a* jointly ensure antenna performance through the third host housing 232. When the host 2 is in the open state, radiation of the third host housing 232 in the second feeding path is weak. In this case, antenna performance is ensured mainly by relying on radiation of the first frame body 213*a*. However, compared with that in the closed state of the host 2, a radiation direction of the antenna system of the host 2 in the open state changes, so that a communication requirement of the host 2 in the open state can be met. Therefore, in this embodiment, two feeding paths of the antenna system are designed, so that different communication requirements of the host 2 in the open state and the closed state can be met, and antenna performance of the host 2** in different states can be ensured.

It is easy to understand that, in another embodiment, there may be no second feeding path. In other words, the first frame body **213*a* does not feed the third host housing 232** through coupling.

In this embodiment, the flexible circuit board 26 may cause interference to radiation performance of the first frame body **213*a* and the third host housing 232, and in particular, a larger length of the flexible circuit board 26 causes more severe interference. As described above, the grounding portion 264*a* of the flexible circuit board 26 may be connected to the first frame body 213*a* through the conductor. In this way, the flexible circuit board 26 can be grounded, to avoid interference of the flexible circuit board 26 to the antenna radiation performance of the host 2. In another embodiment, based on a product requirement, the foregoing grounding design may not be performed on the flexible circuit board 26**.

Earphone 3

In this embodiment, structures of the first earphone 31 and the second earphone 32 may be completely consistent. The following uses the first earphone 31 as an example for description.

Figure 85:
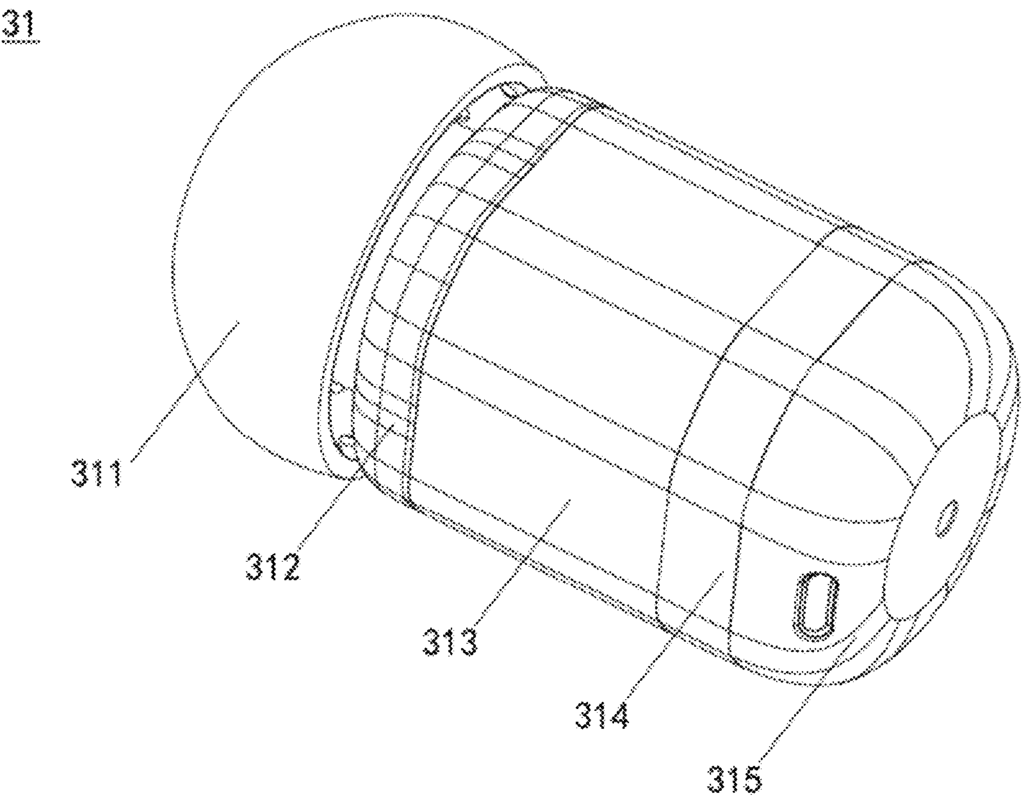
FIG. 85 is a schematic diagram of an assembly structure of a first earphone of the wearable device in FIG. 6.
Figure 86:
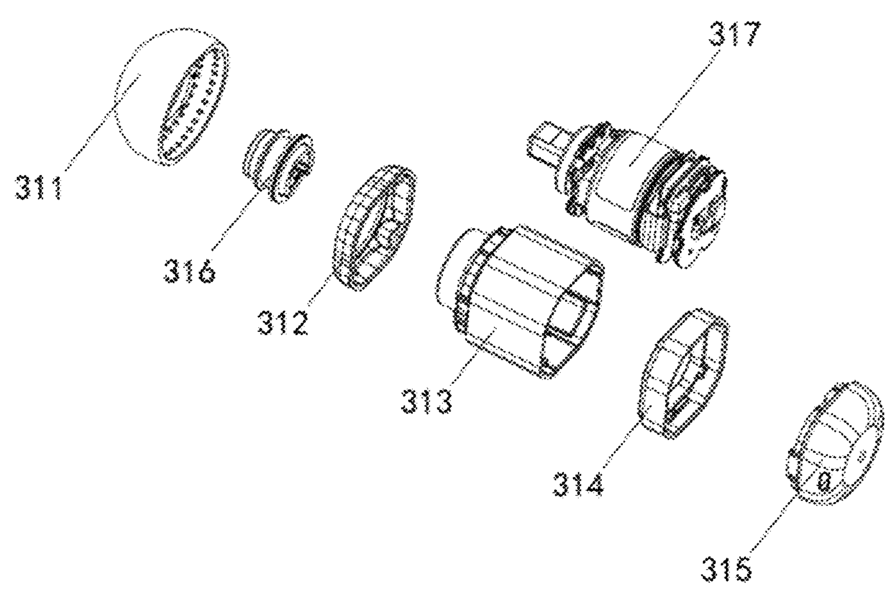
FIG. 86 is a schematic exploded view of a structure of the first earphone in FIG. 85.

As shown in FIG. 85 and FIG. 86, the first earphone 31 may include an earplug 311, an earplug support assembly 316, a first electrode 312, an earphone front-housing assembly 313, a second electrode 314, an earphone rear-housing assembly 315, and an electronic assembly 317. Both the earplug support assembly 316 and the first electrode 312 may be mounted on one end of the earphone front-housing assembly 313, and both the second electrode 314 and the earphone rear-housing assembly 315 may be mounted on the other end of the earphone front-housing assembly 313. The earplug 311 and the earplug support assembly 316 are located at a same end of the earphone front-housing assembly 313, and the earplug 311 is mounted at an end that is of the earplug support assembly 316 and that is far away from the earphone front-housing assembly 313. The electronic assembly 317 may be mounted in a space enclosed by the earplug support assembly 316, the first electrode 312, the earphone front-housing assembly 313, the second electrode 314, and the earphone rear-housing assembly 315.

The following first describes structures and assembly of the earplug 311, the earplug support assembly 316, the first electrode 312, the earphone front-housing assembly 313, the second electrode 314, and the earphone rear-housing assembly 315 in the first earphone 31, and then describes a structure and assembly of the electronic assembly 317.

As shown in FIG. 85, in this embodiment, the first electrode 312, the earphone front-housing assembly 313, the second electrode 314, and the earphone rear-housing assembly 315 may roughly form an octahedron appearance. An outer circumferential surface of the octahedron may include planes and arc surfaces. The planes and the arc surfaces are connected and alternately arranged to form a circle (to be specific, each plane is connected between two arc surfaces, and each arc surface is connected between two planes). The octahedron appearance of the first earphone 31 is in a centrosymmetric shape. In another embodiment, the first earphone may alternatively have another centrosymmetric appearance shape. For example, the first earphone is roughly cylindrical, tetrahedron, or the like.

In this embodiment, a radial size of the first earphone 31 may be greater than a groove depth of the first accommodation groove 213*y*. For example, the radial size of the first earphone 31 may be at least twice the groove depth of the first accommodation groove 213*y*. The radial size may be a distance between two planes that are opposite to each other on the first earphone 31.

Earphone Front-Housing Assembly 313

Figure 87:
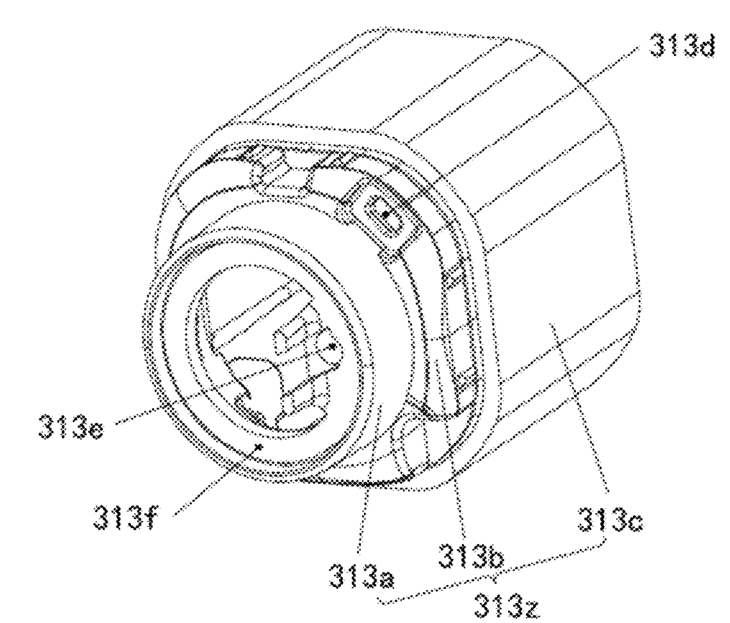
FIG. 87 is a schematic diagram of an assembly structure of an earphone front-housing assembly in a first earphone.
Figure 88:
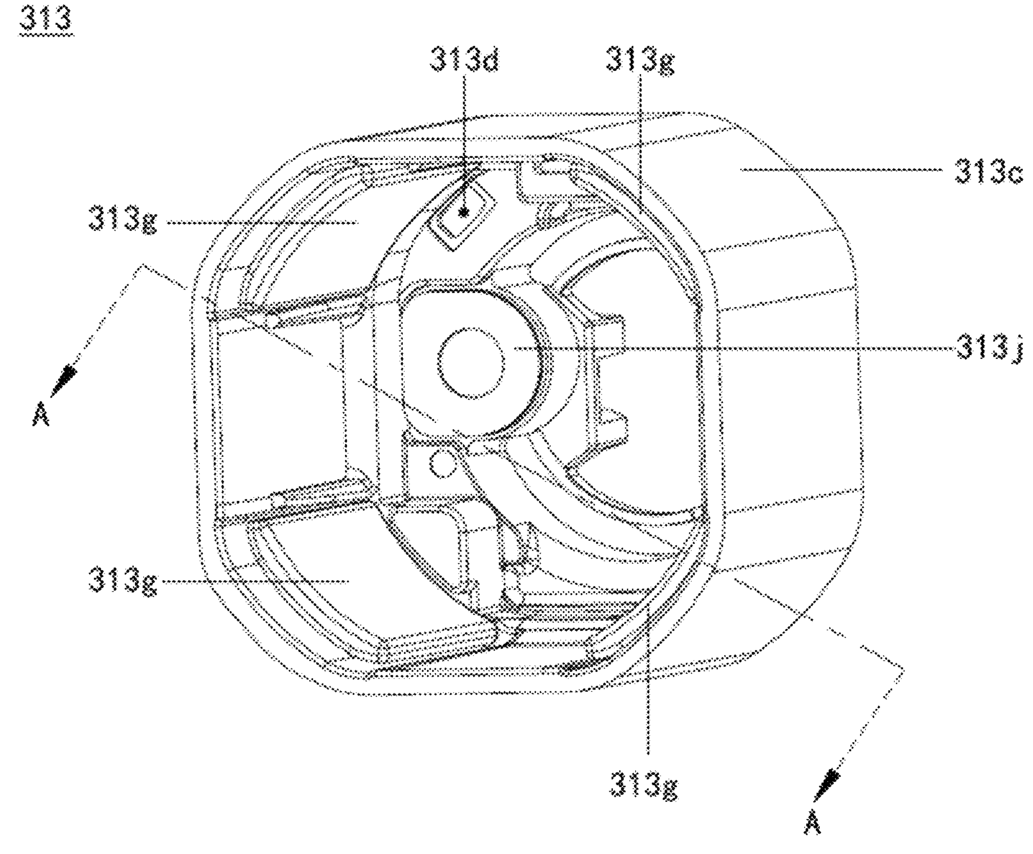
FIG. 88 is a schematic diagram of an assembly structure of an earphone front-housing assembly in a first earphone.
Figure 89:
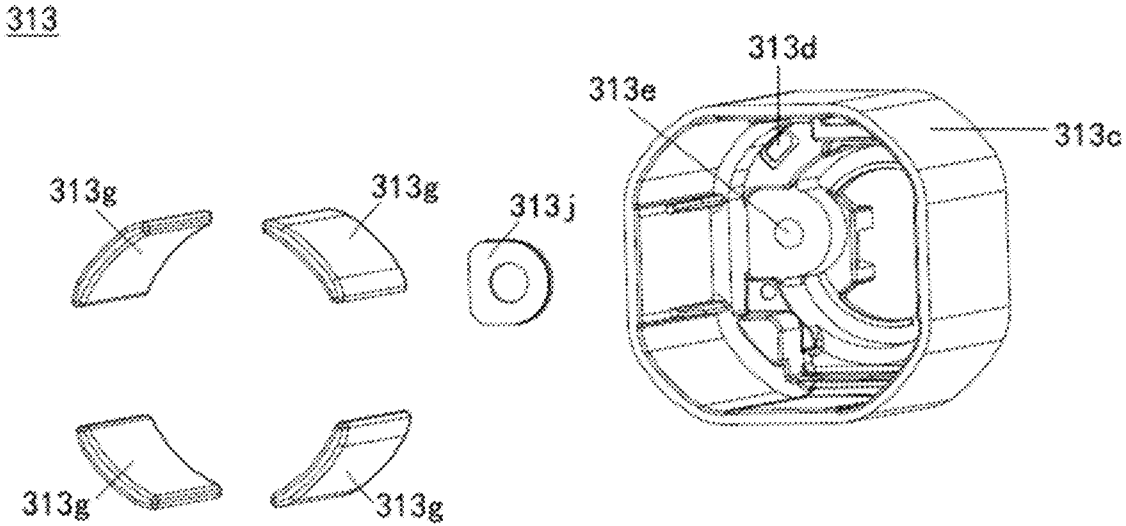
FIG. 89 is a schematic exploded view of a structure of an earphone front-housing assembly in a first earphone.

As shown in FIG. 87, FIG. 88, and FIG. 89, the earphone front-housing assembly 313 may include an earphone front housing 313*z*, a noise reduction microphone mesh 313*j*, and an earphone magnet 313*g*.

As shown in FIG. 87 and FIG. 88, the earphone front housing 313*z* may be in a hollow tubular structure with openings at two ends. The earphone front housing 313*z* may include a first part 313*a*, a second part 313*b*, and a third part 313*c* that are sequentially connected. A circumferential length of the first part 313*a* may be less than a circumferential length of the second part 313*b*, and the circumferential length of the second part 313*b* may be less than a circumferential length of the third part 313*c*. The circumferential length refers to a size in a direction of a center line that surrounds the tubular structure of the earphone front housing 313*z*. The third part 313*c* may be roughly of an octahedron tubular structure, and a wall of the third part 313*c* may include flat parts and arc-shaped parts. The flat parts and the arc-shaped parts are connected and alternately arranged to form a circle (to be specific, each flat part is connected between two arc-shaped parts, and each arc-shaped part is connected between two flat parts).

Figure 90:
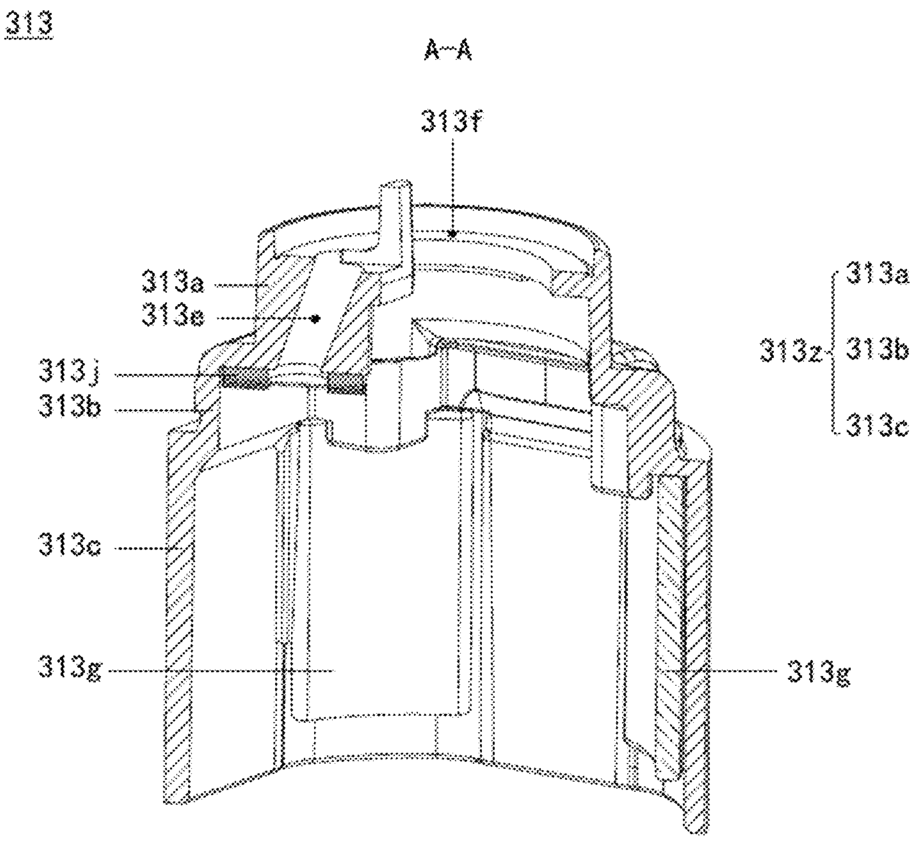
FIG. 90 is a schematic diagram of an A-A sectional structure of the earphone front-housing assembly in FIG. 88.

As shown in FIG. 87 and FIG. 90, an end that is of the first part 313*a* and that is far away from the second part 313*b* may form a mounting groove 313*f*, and the mounting groove 313*f* may enclose a circle. A voice pickup channel 313*e* may be further provided in a wall of the earphone front housing 313*z*, and the voice pickup channel 313*e* may extend roughly along a straight line. One end of the voice pickup channel 313*e* passes through a bottom surface of the mounting groove 313*f*, and the other end of the voice pickup channel 313*e* is connected to an inner cavity of the earphone front housing 313*z*. The second part 313*b* may be provided with a through hole 313*d*, and the through hole 313*d* is connected to the inner cavity of the earphone front-housing 313*z*.

Noise Reduction Microphone Mesh 313*j*

The noise reduction microphone mesh 313*j* may be roughly in a sheet shape, and may include several layers of materials, such as an acoustic mesh and an adhesive layer. As shown in FIG. 89 and FIG. 90, the noise reduction microphone mesh 313*j* may be fastened in the earphone front housing 313*z*, and an end that is of the voice pickup channel 313*e* and that is far away from the mounting groove 313*f* is sealed, so that a voice in the voice pickup channel 313*e* may pass through the noise reduction microphone mesh 313*j*.

Earphone Magnet 313*g*

As shown in FIG. 89, the earphone magnet 313*g* in this embodiment may be a single magnet. The earphone magnet 313*g* may have a single magnetic field direction. Alternatively, the earphone magnet 313*g* may have at least two magnetic field directions, and the earphone magnet 313*g* may form a Halbach array (which may be obtained by magnetizing different physical regions of a single magnet in different directions). For example, the earphone magnet 313*g* is a Halbach array having two different magnetic field directions.

In another embodiment, the earphone magnet may be formed by splicing at least two single magnets. The earphone magnet may have at least two magnetic field directions, and the earphone magnet forms a Halbach array.

As shown in FIG. 89, the earphone magnet 313*g* in this embodiment may be roughly of a curved plate structure, and the curved plate structure may be bent in a direction surrounding a center line of the first earphone 31. A shape of the earphone magnet 313*g* may adapt to a shape of an inner wall of the third part 313*c* of the earphone front-housing 313*z*. The earphone magnet 313*g* may be fastened to the inner wall of the third part 313*c* of the earphone front housing 313*z*, for example, fastened to an inner wall of the arc-shaped part of the third part 313*c*.

As shown in FIG. 89, there may be four earphone magnets 313*g* in this embodiment, the four earphone magnets 313*g* may be evenly distributed on the inner wall of the third part 313*c* at an equal spacing, and one earphone magnet 313*g* is mounted on an inner wall of each arc-shaped part of the third part 313*c*. Specifications of the four earphone magnets 313*g* may be the same, and magnetic field directions of the four earphone magnets 313*g* may be consistent.

In another embodiment, a quantity of earphone magnets may be designed based on a product requirement. For example, there may be only one earphone magnet, the earphone magnet may enclose a closed ring structure, and a shape of the earphone magnet may match the shape of the inner wall of the third part 313*c*. The earphone magnet may form a Halbach array, and the earphone magnet and four regions that are in a one-to-one correspondence with four arc-shaped parts of the third part 313*c* may have different magnetic field directions.

Alternatively, for example, there may be three earphone magnets, each earphone magnet may be of a curved structure surrounding a center line of the first earphone, and the three earphone magnets may be distributed on the inner wall of the third part of the earphone front housing at a spacing. The three earphone magnets may be evenly distributed at an equal spacing or unevenly distributed at a non-equal spacing. In this design, the third part of the earphone front housing may be roughly of an octahedron tubular structure or roughly of a cylindrical structure.

Assembly Jig 100 and Assembly Technique of the Earphone Magnet 313*g*

Figure 91:
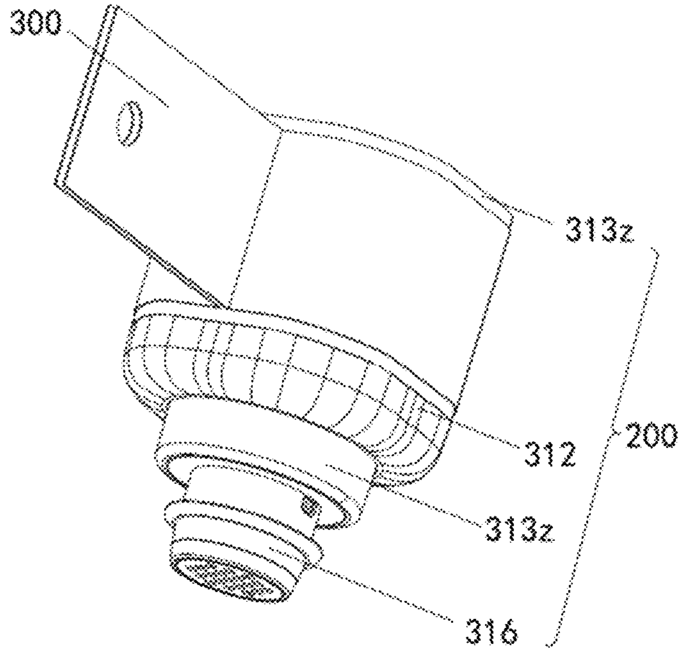
FIG. 91 is a schematic diagram of a structure in which a clamp clamps an intermediate assembly.

In this embodiment, to ensure that the magnet can be mounted accurately, an assembly jig may be used to assist in mounting the earphone magnet 313*g*. According to a product assembly requirement, the earphone magnet 313*g* and the earphone front housing 313*z* may be directly assembled, and the assembly jig may be customized based on this. Alternatively, as shown in FIG. 91, the earplug support assembly 316, the first electrode 312, and the like may be first mounted on the earphone front housing 313*z* to form an intermediate assembly 200, and then the earphone magnet 313*g* is mounted in the earphone front housing 313*z* of the intermediate assembly 200. The assembly jig may be customized based on this. The following uses the latter assembly manner as an example for description.

Figure 92:
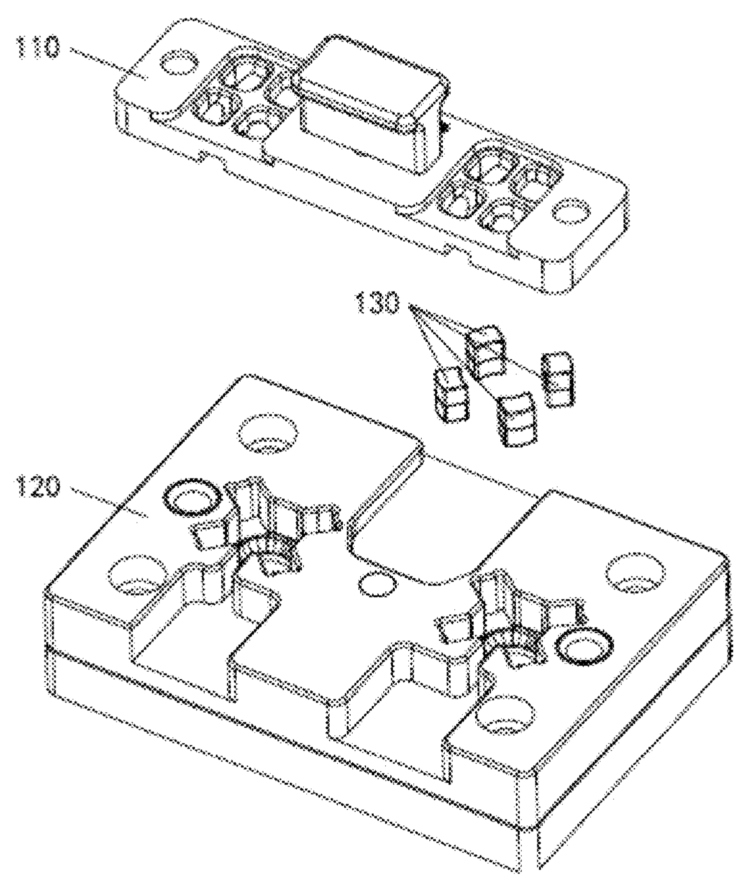
FIG. 92 is a schematic exploded view of a structure of an assembly jig according to an embodiment of this application.

As shown in FIG. 91 and FIG. 92, to assemble the intermediate assembly 200, this embodiment provides the assembly jig 100. The intermediate assembly 200 may include the earplug support assembly 316, the first electrode 312, and the earphone front housing 313*z* that are pre-assembled (assembly structures of the earplug support assembly 316, the first electrode 312, and the earphone front housing 313*z* are described in detail below). For ease of taking, placing, and positioning the intermediate assembly 200, a clamp 300 may be sleeved on a periphery of the earphone front housing 313*z* in the intermediate assembly 200. The clamp 300 may be in a hoop shape, and the clamp 300 wraps and clamps the earphone front housing 313*z*. The clamp 300 may also be used in another assembly process of the first earphone 31.

As shown in FIG. 92, the assembly jig 100 in this embodiment may include a base 120, a jig magnet 130, and an upper cover 110.

Figure 93:
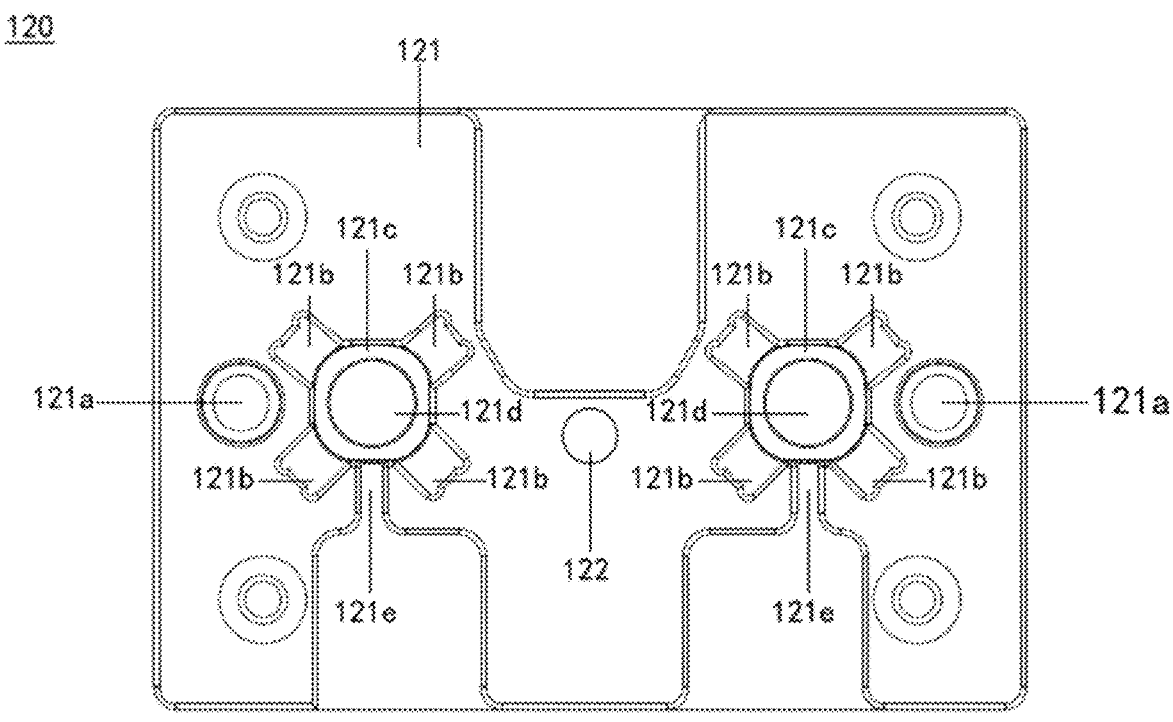
FIG. 93 is a schematic diagram of a structure of a base of an assembly jig.
Figure 94:
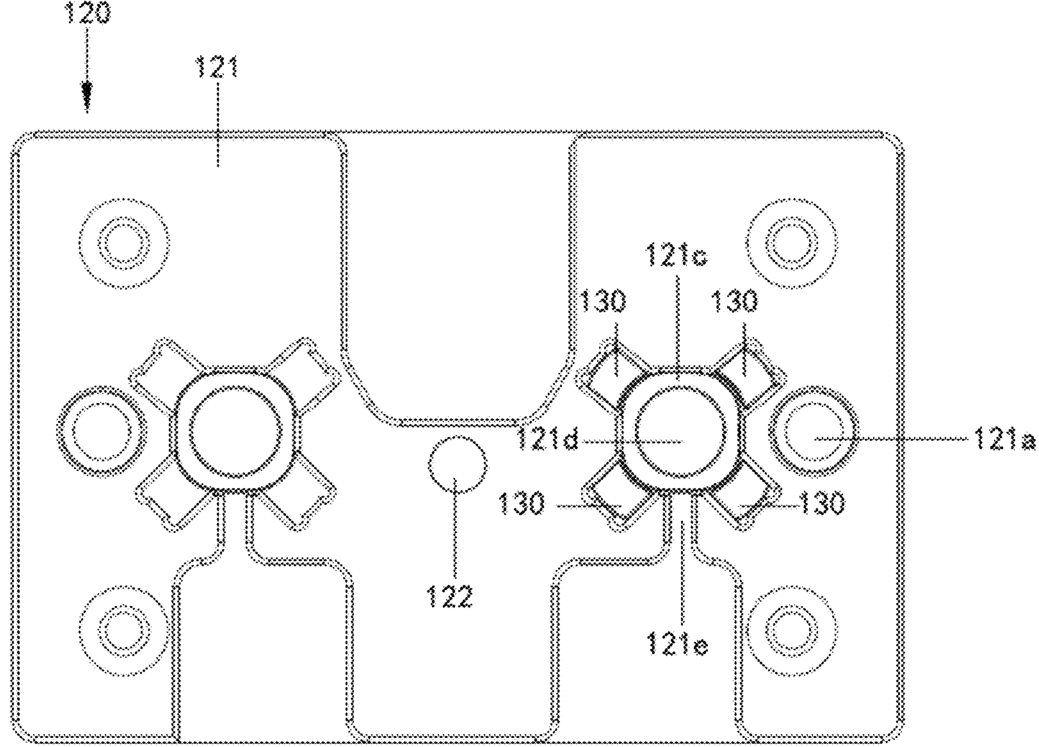
FIG. 94 is a schematic diagram of a structure of a base of an assembly jig.

As shown in FIG. 93 and FIG. 94, the base 120 may include a base plate 121 and a base magnet 122 fastened on the base plate 121. The base plate 121 may be provided with an upper cover positioning hole 121*a*. For example, there are two upper cover positioning holes 121*a*, and the two upper cover positioning holes 121*a* are respectively located at two ends of the base plate 121. A workpiece positioning groove 121*c*, jig magnet mounting grooves 121*b*, and a clamp accommodation groove 121*e* may be further provided in a region (for example, a right region in a perspective of FIG. 93) of the base plate 121.

As shown in FIG. 93, an inner surface of a bottom of the workpiece positioning groove 121*c* may be shaped with an outer surface of the first electrode 312. A through hole 121*d* may be provided on a bottom wall of the workpiece positioning groove 121*c*, and the through hole 121*d* is configured to allow the earphone front housing 313*z* and the earplug support assembly 316 to pass through.

As shown in FIG. 93, the jig magnet mounting grooves 121*b* may be located on an outer side of the workpiece positioning groove 121*c*, and may be connected to the workpiece positioning groove 121*c*. It may be considered that the jig magnet mounting grooves 121*b* penetrate the side wall of the workpiece positioning groove 121*c*. A quantity of jig magnet mounting grooves 121*b* may be consistent with a quantity of jig magnets 130. For example, there are four jig magnet mounting grooves 121*b*. The four jig magnet mounting grooves 121*b* may be distributed around the workpiece positioning groove 121*c* at an equal spacing.

With reference to FIG. 92 and FIG. 94, one jig magnet 130 may be mounted in each jig magnet mounting groove 121*b*. The jig magnet 130 may include only a single magnet, or may be formed by connecting at least two single magnets.

As shown in FIG. 93, the clamp accommodation groove 121*e* may be located on a periphery of the workpiece positioning groove 121*c*, and may be connected to the workpiece positioning groove 121*c*. The clamp accommodation groove 121*e* may be located between two jig magnet mounting grooves 121*b*.

As shown in FIG. 93, a same workpiece positioning groove 121*c*, a through hole 121*d*, same jig magnet mounting grooves 121*b*, and a same jig accommodation groove 121*e* may also be provided in another region (for example, a left region in the perspective of FIG. 93) of the base plate 121. This design enables the assembly jig 100 to assemble two intermediate assemblies 200 at the same time. The positioning grooves 121*c*, the through holes 121*d*, the jig magnet mounting grooves 121*b*, and the clamp accommodation grooves 121*e* in the two regions of the base plate 121 may be located between the two upper cover positioning holes 121*a*.

Figure 95:
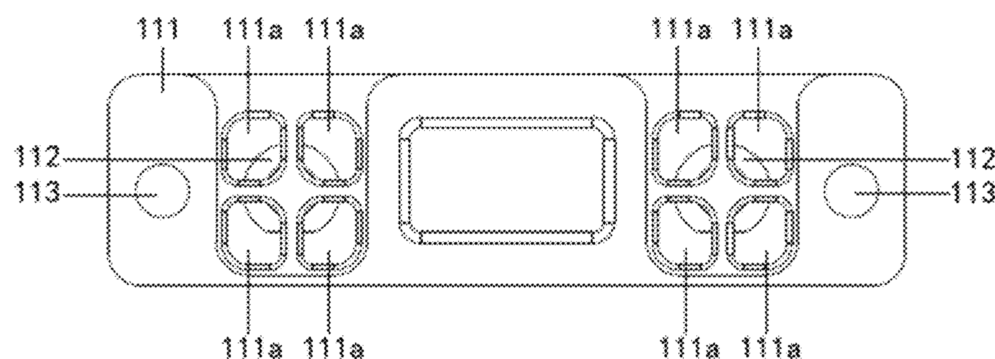
FIG. 95 is a schematic diagram of a structure of an upper cover of an assembly jig.
Figure 96:
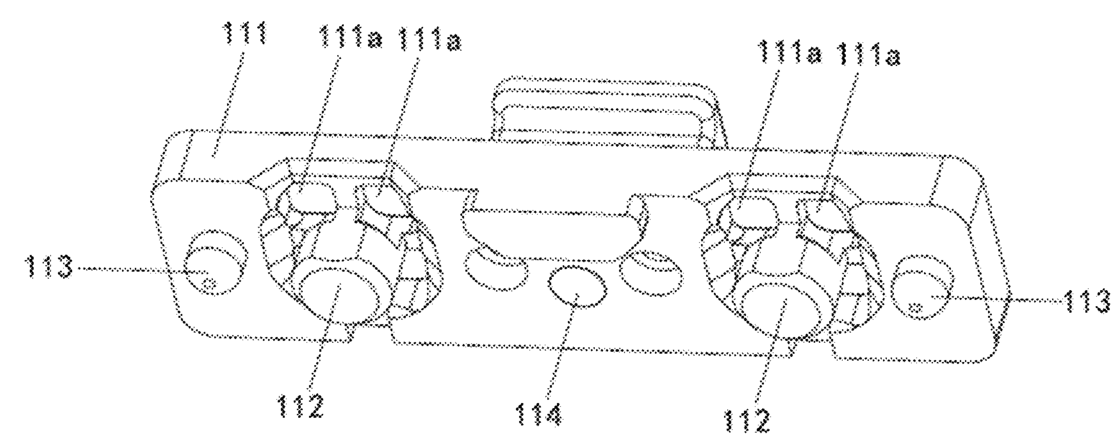
FIG. 96 is a schematic diagram of a structure of an upper cover of an assembly jig.

As shown in FIG. 95 and FIG. 96, the upper cover 110 may include a cover plate 111, an upper cover positioning rod 113, an upper cover limiting rod 112, and an upper cover magnet 114.

There may be two upper cover positioning rods 113, and the two upper cover positioning rods 113 are respectively located at two ends of the cover plate 111. Magnet placement through holes 111*a* may be provided in a region (for example, a right region in a perspective of FIG. 95) of the cover plate 111. A quantity of magnet placement through holes 111*a* may be consistent with the quantity of earphone magnets 313*g*. For example, there are also four magnet placement through holes 111*a*. The four magnet placement through holes 111*a* may roughly form a 2×2 matrix.

The upper cover limiting rod 112 is disposed on a side of the cover plate 111 in a thickness direction, and a center of the upper cover limiting rod 112 may be roughly located between the four magnet placement through holes 111*a*. In addition, for each magnet placement through hole 111*a* and the upper cover limiting rod 112, a part of a projection of the upper cover limiting rod 112 in an axial direction of the magnet placement through hole 111*a* falls within a projection of the magnet placement through hole 111*a* in the axial direction of the magnet placement through hole 111*a*. In other words, from the perspective of FIG. 95, each magnet placement through hole 111*a* has a part of the upper cover limiting rod 112, and the part may be referred to as a limiting part. It is easy to understand that a quantity of limiting parts is the same as the quantity of earphone magnets 313*g*. A shape of the upper cover limiting rod 112 may adapt to a shape of the inner cavity of the earphone front housing 313*z*.

The upper cover magnet 114 may be fastened to the cover plate 111, and may be located on a same side of the cover plate 111 as the upper cover limiting rod 112.

As shown in FIG. 95 and FIG. 96, the same magnet placement through holes 111*a* and upper cover limiting rod 112 may also be provided in another region (for example, a left region in the perspective of FIG. 95) of the cover plate 111. This design enables the assembly jig 100 to assemble two intermediate assemblies 200 at the same time. The magnet placement through holes 111*a* and the upper cover limiting rods 112 in the two regions of the cover plate 111 may be located between the two upper cover positioning rods 113.

With reference to FIG. 97 to FIG. 101, the following schematically describes a process of using the assembly jig 100 to mount four earphone magnets 313*g* into one intermediate assembly 200.

Figure 97:
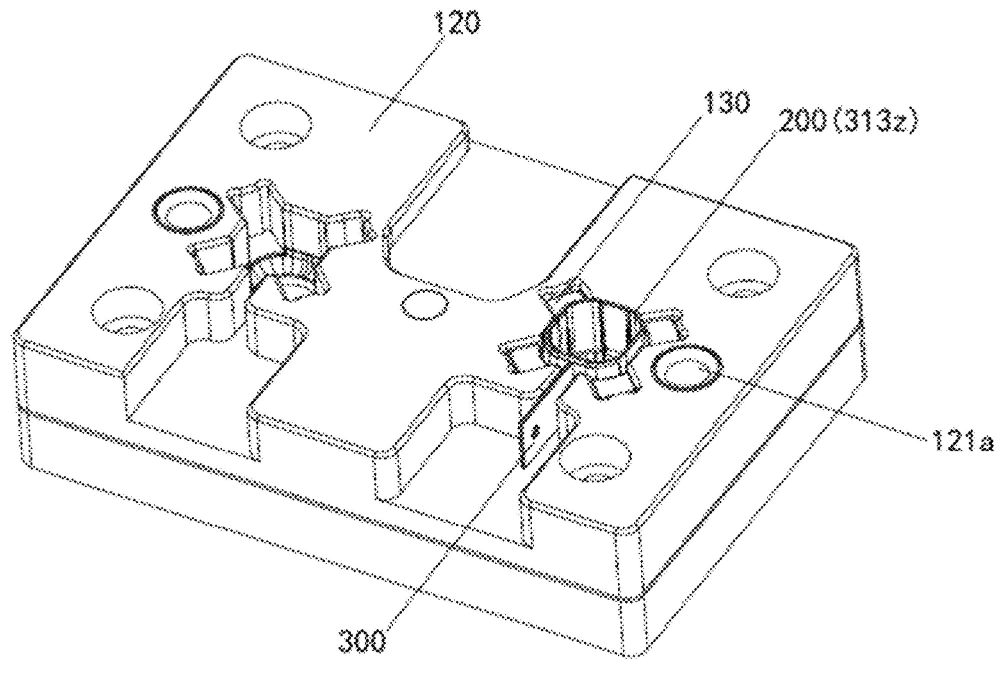
FIG. 97 is a schematic diagram of a structure in which a clamp and an intermediate assembly are placed into a base.

With reference to FIG. 91 and FIG. 97, the clamp 300 and the intermediate assembly 200 are first positioned to the base 120, so that an annular part of the clamp 300 is placed into the workpiece positioning groove 121*c*, and the other part of the clamp 300 is placed into the clamp accommodation groove 121*e*; the earplug support assembly 316 and the earphone front housing 313*z* enter the through hole 121*d*; the first electrode 312 enters the workpiece positioning groove 121*c*, and an outer surface of the first electrode 312 matches an inner surface of the workpiece positioning groove 121*c*. In this case, each jig magnet 130 may correspond to one mounting position, in the earphone front housing 313*z*, for mounting the earphone magnet 313*g*.

Figure 98:
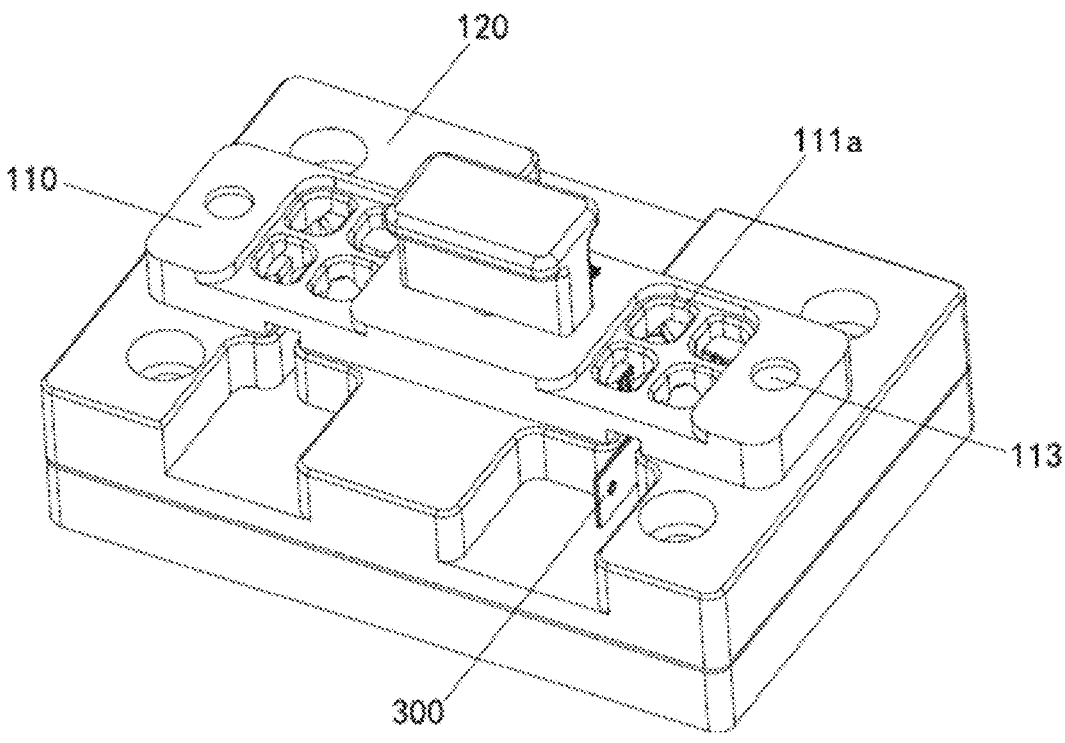
FIG. 98 is a schematic diagram of a structure in which an upper cover is matched with a base.
Figure 99:
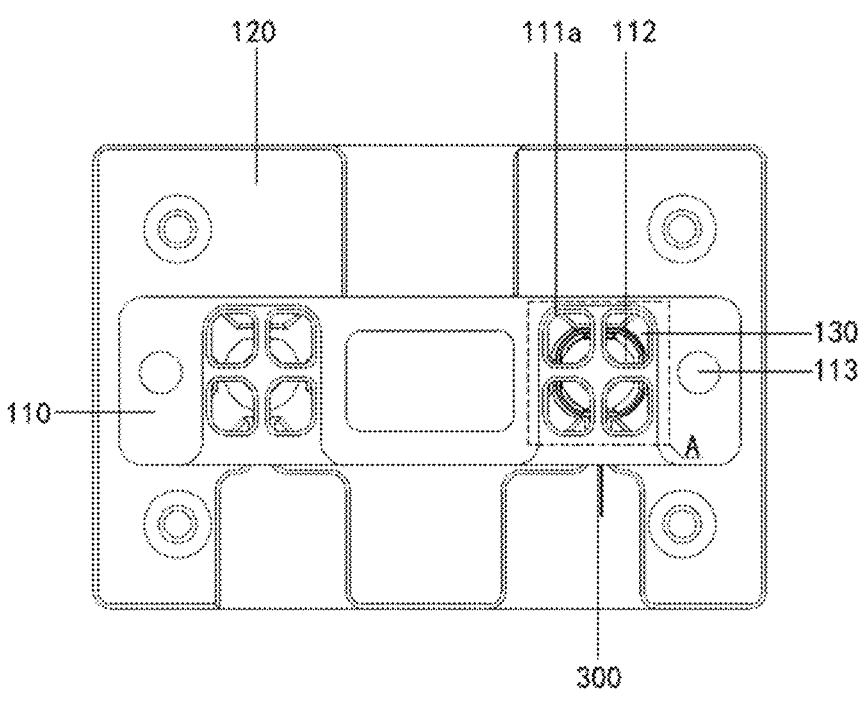
FIG. 99 is a schematic diagram of a structure in which an upper cover is matched with a base.
Figure 100:
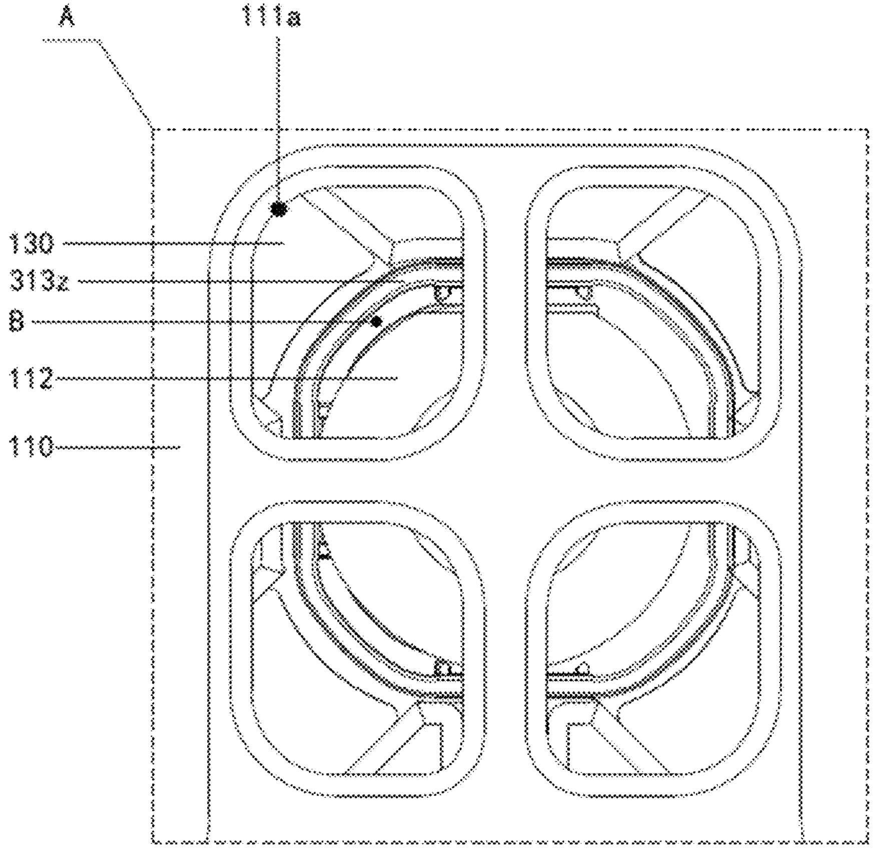
FIG. 100 is a schematic diagram of a partially enlarged structure at a position A in FIG. 99.

With reference to FIG. 98, FIG. 96, and FIG. 97, the upper cover 110 is mounted on the base 120, so that the cover plate 111 is in contact with the base 120; and the upper cover positioning rod 113 is inserted into the upper cover positioning hole 121*a*, so that the upper cover magnet 114 is magnetically attracted to the base magnet 122. With reference to FIG. 96 and FIG. 91, in this case, the upper cover limiting rod 112 in the upper cover 110 is inserted into the inner cavity of the earphone front housing 313*z*. With reference to FIG. 99, FIG. 100, and FIG. 94, each magnet placement through hole 111*a* has a part of the workpiece positioning groove 121*c*. In other words, projections of different regions of the workpiece positioning groove 121*c* in the axial direction of the magnet placement through hole 111*a* respectively fall into each magnet placement through hole 111*a*. From perspectives of FIG. 99 and FIG. 100, each magnet placement through hole 111*a* of the upper cover 110 has a part of the earphone front housing 313*z*. In other words, projections of different regions of the earphone front housing 313*z* in the axial direction of the magnet placement through hole 111*a* respectively fall into each magnet placement through hole 111*a*.

In addition, as shown in FIG. 100, a gap B is formed between each limiting part of the upper cover limiting rod 112 and an inner wall of the earphone front housing 313*z* (for brevity, only one gap B is marked in the figure). Each gap B is used for mounting one earphone magnet 313*g*. There is one jig magnet 130 near each gap B.

Figure 101:
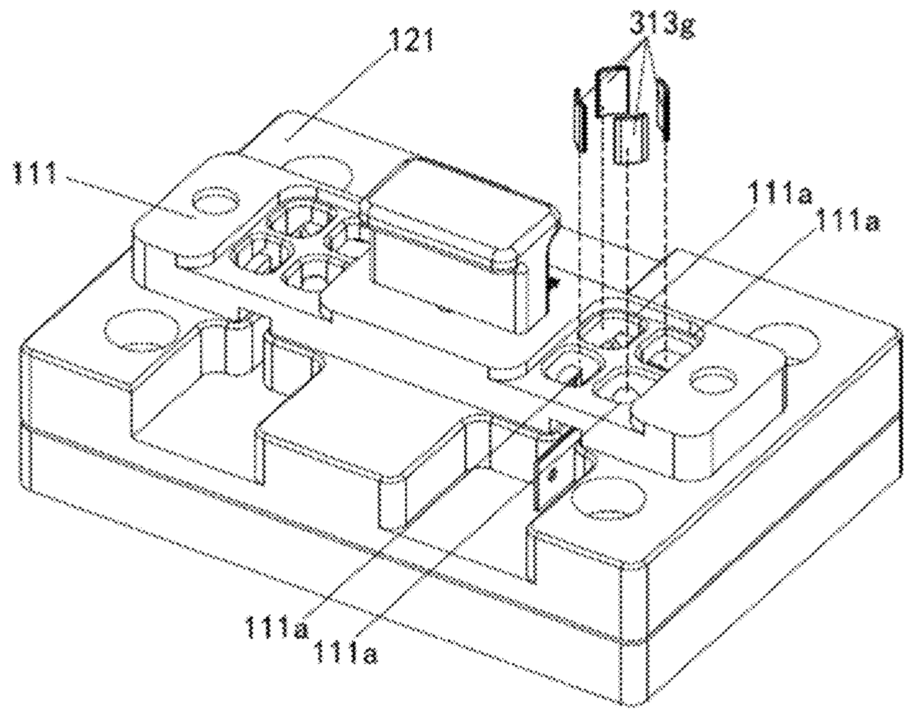
FIG. 101 is a schematic diagram of a structure in which an earphone magnet is mounted into an assembly jig.

As shown in FIG. 101, four earphone magnets 313*g* are respectively inserted into four gaps B from the four magnet placement through holes 111*a*, so that there is one earphone magnet 313*g* in each gap B, and each earphone magnet 313*g* is positioned to a mounting position in the earphone front housing 313*z*. The jig magnet 130 near each gap B may be magnetically attracted to the earphone magnet 313*g* in the gap B, so that the earphone magnet 313*g* may be maintained at the mounting position in the earphone front housing 313*z*. In this way, pre-positioning of the earphone magnets 313*g* can be completed.

Then, the upper cover 110 may be removed to expose the intermediate assembly 200 and the earphone magnets 313*g* that are pre-positioned in the intermediate assembly 200. Then, the earphone magnet 313*g* may be fastened on the inner wall of the earphone front housing 313*z* by using an appropriate technique. For example, the earphone magnet 313*g* may be bonded to the inner wall of the earphone front housing 313*z* by using a dispensing technique. An adhesive used in the dispensing technique may be, for example, a quick-dry adhesive.

It is easy to understand from the foregoing descriptions that the base 120 can position the intermediate assembly 200 well, a matching structure including the upper cover 110 and the base 120 can accurately limit mounting spaces of the earphone magnets 313*g*, and the jig magnets 130 can conveniently and reliably maintain the earphone magnets 313*g* in the mounting positions of the earphone front housing 313*z*. Therefore, using the assembly jig 100 can greatly improve assembly precision and reliability of the earphone magnets 313*g*, make an assembly technique simple, and achieve good mass production.

First Electrode 312

Figure 102:
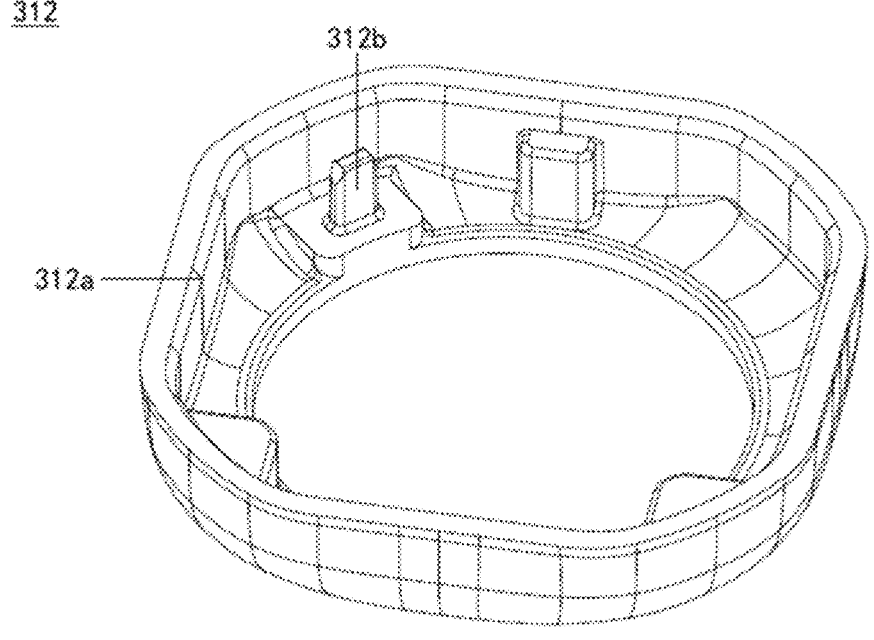
FIG. 102 is a schematic diagram of a structure of a first electrode of a first earphone.

As shown in FIG. 102, the first electrode 312 may include an electrode body 312*a* and a conduction portion 312*b*. The electrode body 312*a* may be roughly of a ring structure surrounding the center line of the first earphone 31. The conduction portion 312*b* may be roughly columnar, and the conduction portion 312*b* may protrude from an inner surface of the electrode main body 312*a*. The first electrode 312 may be made of a conductive material, for example, a metal material.

With reference to FIG. 102 and FIG. 87, the first electrode 312 may be mounted to the earphone front housing 313*z*. The electrode body 312*a* of the first electrode 312 matches the second part 313*b* of the earphone front housing 313*z*. The conduction portion 312*b* of the first electrode 312 may pass through the through hole 313*d* of the earphone front housing 313*z*, and is electrically connected to a circuit board (descriptions are provided below) of a first earphone circuit board assembly located in the inner cavity of the earphone front housing 313*z*, so that the first electrode 312 is used as a charging electrode. Descriptions of a detailed assembly structure are further provided below.

Earplug Support Assembly 316

Figure 103:
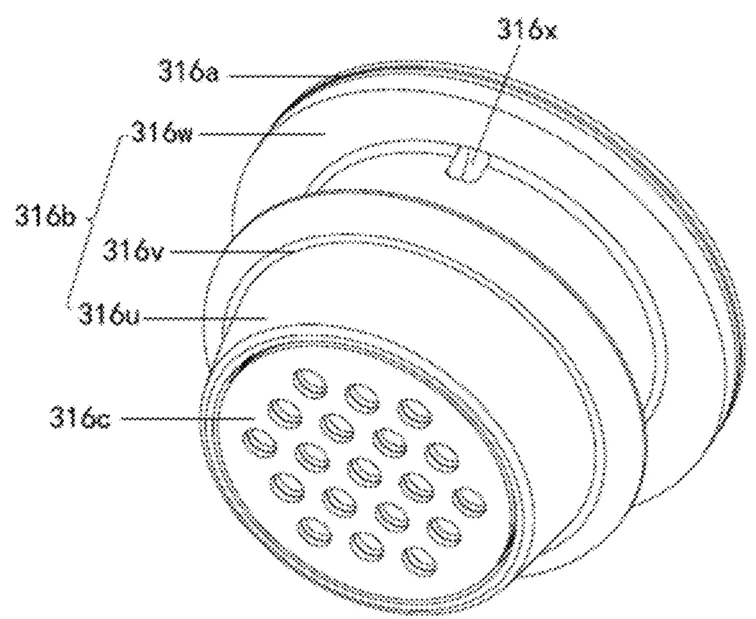
FIG. 103 is a schematic diagram of a structure of an earplug support assembly of a first earphone.
Figure 104:
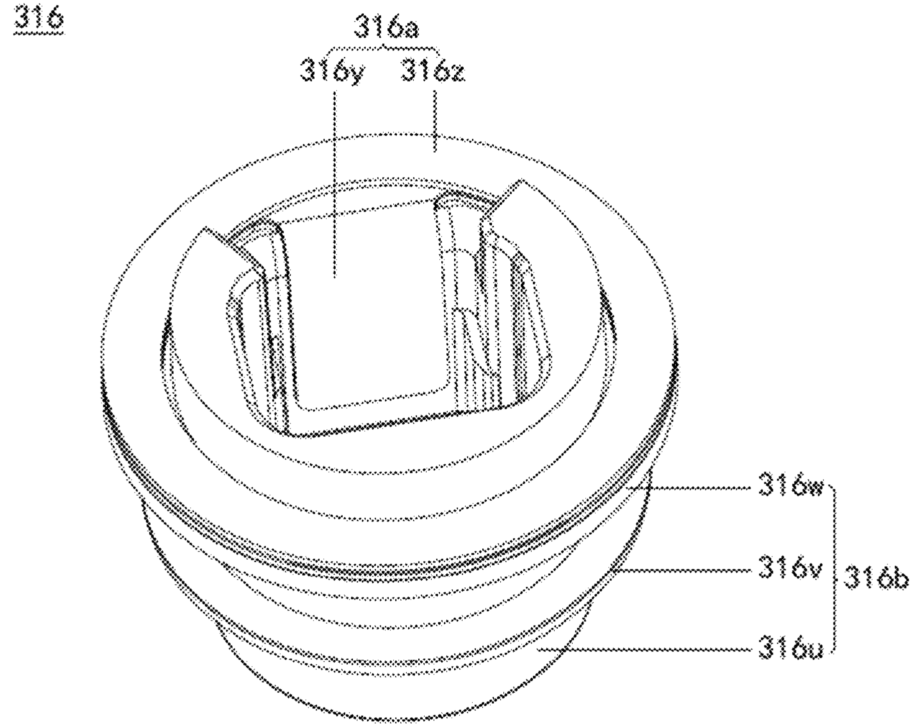
FIG. 104 is a schematic diagram of a structure of an earplug support assembly of a first earphone.
Figure 105:
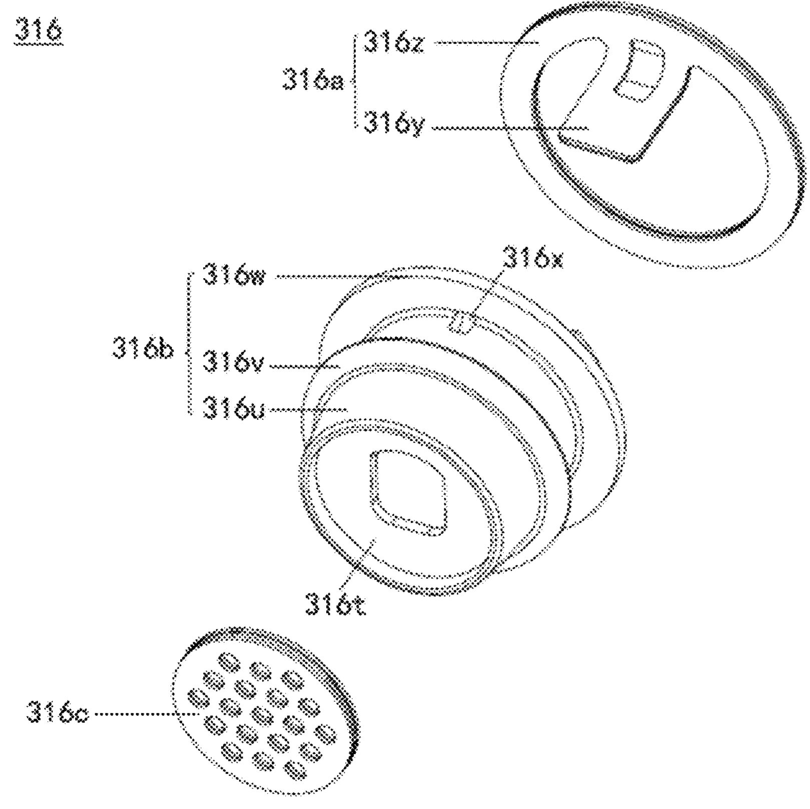
FIG. 105 is a schematic exploded view of a structure of an earplug support assembly.

As shown in FIG. 103, FIG. 104, and FIG. 105, the earplug support assembly 316 may include an earplug support 316*b*, a front vent acoustic mesh 316*a*, and a speaker mesh 316*c*.

As shown in FIG. 103 to FIG. 105, the earplug support 316*b* may include a support body 316*u*, a first skirt edge 316*v*, and a second skirt edge 316*w*. The support body 316*u* may be roughly of a hollow tubular structure with openings at two ends. Both the first skirt edge 316*v* and the second skirt edge 316*w* may be bosses protruding from an outer circumferential surface of the support body 316*u*, and both the first skirt edge 316*v* and the second skirt edge 316*w* may surround the support body 316*u*. Both the first skirt edge 316*v* and the second skirt edge 316*w* may be located between the two ends of the support body 316*u*. There is a specific spacing between the first skirt edge 316*v* and the second skirt edge 316*w*.

Figure 106:
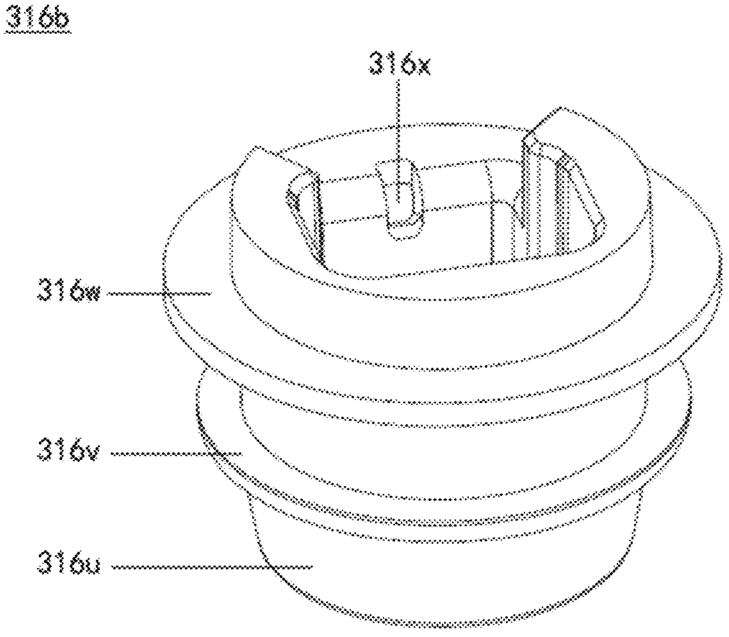
FIG. 106 is a schematic diagram of a structure of an earplug support in an earplug support assembly.

As shown in FIG. 106 and FIG. 103, an end that is of the support body 316*u* and that is close to the second skirt edge

316*w* may have a notch and roughly form a C-shaped structure. This end of the support body 316*u* may further have a front vent 316*x*, and the front vent 316*x* passes through a wall of the support body 316*u*. An opening that is of the front vent 316*x* and that is on the outer circumferential surface of the support body 316*u* may be located on a side that is of the second skirt edge 316*w* and that faces the first skirt edge 316*v*, and the opening may be connected to the second skirt edge 316*w*.

As shown in FIG. 105, an end that is of the support body 316*u* and that is close to the first skirt edge 316*v* may form a mounting groove 316*t*, a through hole is provided on a bottom wall of the mounting groove 316*t*, and the through hole communicates with an inner cavity of the support body 316*u*.

In this embodiment, the entire earplug support 316*b* may be manufactured by using a conductive material, or only a part of the earplug support 316*b* is manufactured by using a conductive material. The conductive material is, for example, metal. The earplug support 316*b* may accommodate a speaker in the electronic assembly 317 (descriptions are provided below). Therefore, the earplug support 316*b* may also be referred to as a voice-emitting mouth.

The front vent acoustic mesh 316*a* may be roughly in a sheet shape, and may include several layers of materials, such as an acoustic mesh and an adhesive layer. A bent front vent acoustic mesh 316*a* is shown in the figure. As shown in FIG. 105, the front vent acoustic mesh 316*a* may include a fastening region 316*z* and a blocking region 316*y*. The fastening region 316*z* may be in a ring shape. The blocking region 316*y* may be in a rectangular strip shape, and the blocking region 316*y* may be connected to an inner side of the fastening region 316*z*. The blocking region 316*y* can allow air and sound waves to pass through.

As shown in FIG. 105, FIG. 104, and FIG. 106, the front vent acoustic mesh 316*a* may be mounted to the earplug support 316*b*. The fastening region 316*z* may be mounted on a side that of the second skirt edge 316*w* and that is far away from the first skirt edge 316*v*. For example, an adhesive layer in the fastening region 316*z* may be bonded to the side of the second skirt edge 316*w*. The blocking region 316*y* may be bent into the inner cavity of the support body 316*u*, and is attached to an inner wall of the support body 316*u*. For example, an adhesive layer in the blocking region 316*y* may be bonded to the inner wall of the support body 316*u*. In addition, the blocking region 316*y* may block the front vent 316*x*.

With reference to FIG. 103, FIG. 104, and FIG. 87, the earplug support 316*b* may be mounted in the mounting groove 313*f* of the earphone front housing 313*z*. For example, the earplug support 316*b* may be bonded to the bottom surface of the mounting groove 313*f* through the adhesive layer in the fastening region 316*z*. Descriptions of a detailed assembly structure are further provided below.

Speaker Mesh 316*c*

As shown in FIG. 105, the speaker mesh 316*c* may be roughly in a sheet shape, and may include several layers of material, such as an acoustic mesh, an adhesive layer, and a PET sheet. A plurality of voice-emitting holes may be provided on the speaker mesh 316*c*.

As shown in FIG. 105, the speaker mesh 316*c* may be mounted in the mounting groove 316*t* of the support body 316*u*. A voice (from the speaker, where descriptions are provided below) in the inner cavity of the support body 316*u* enters a human ear through the speaker mesh 316*c*.

Based on a product requirement, in another embodiment, the earplug support may further have another appropriate structure, and is not limited to the foregoing descriptions. A front vent may not be provided on the earplug support, but may be provided on the earphone front housing 313*z*. For example, the front vent is provided on the first part 313*a* of the earphone front housing 313*z*, and is connected to the voice pickup channel 313*e*. An aperture of the front vent may be small (for example, less than 0.22 mm). In this case, the front vent acoustic mesh 316*a* may be omitted.

Earplug 311

Figure 107:
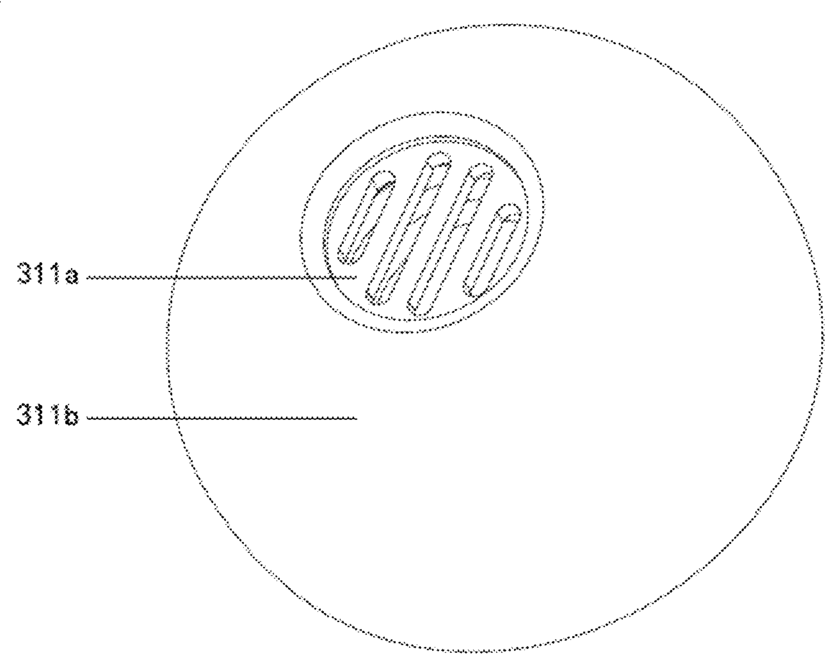
FIG. 107 is a schematic diagram of a structure of an earplug of a first earphone.
Figure 108:
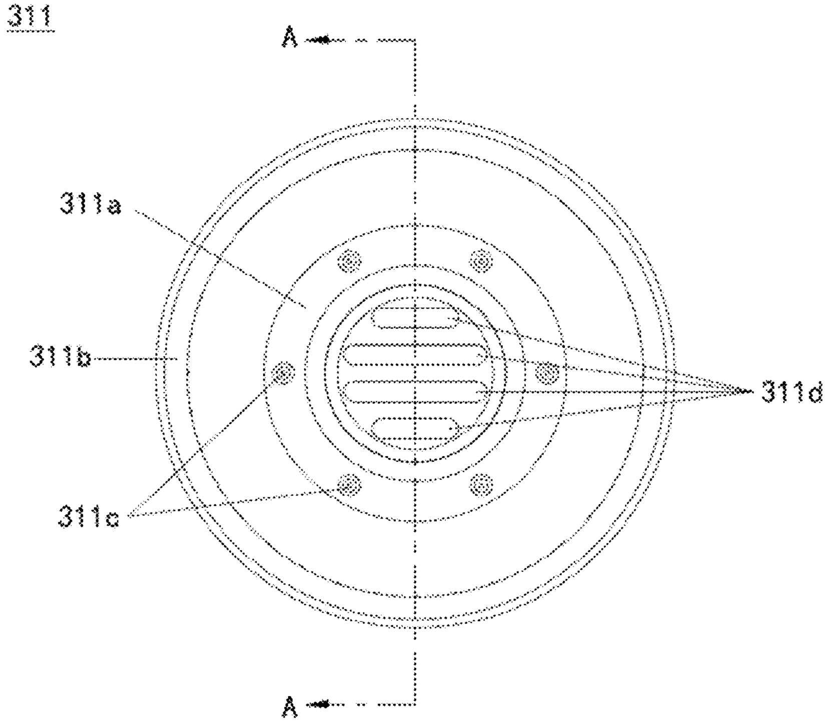
FIG. 108 is a schematic diagram of a structure of an earplug of a first earphone.
Figure 109:
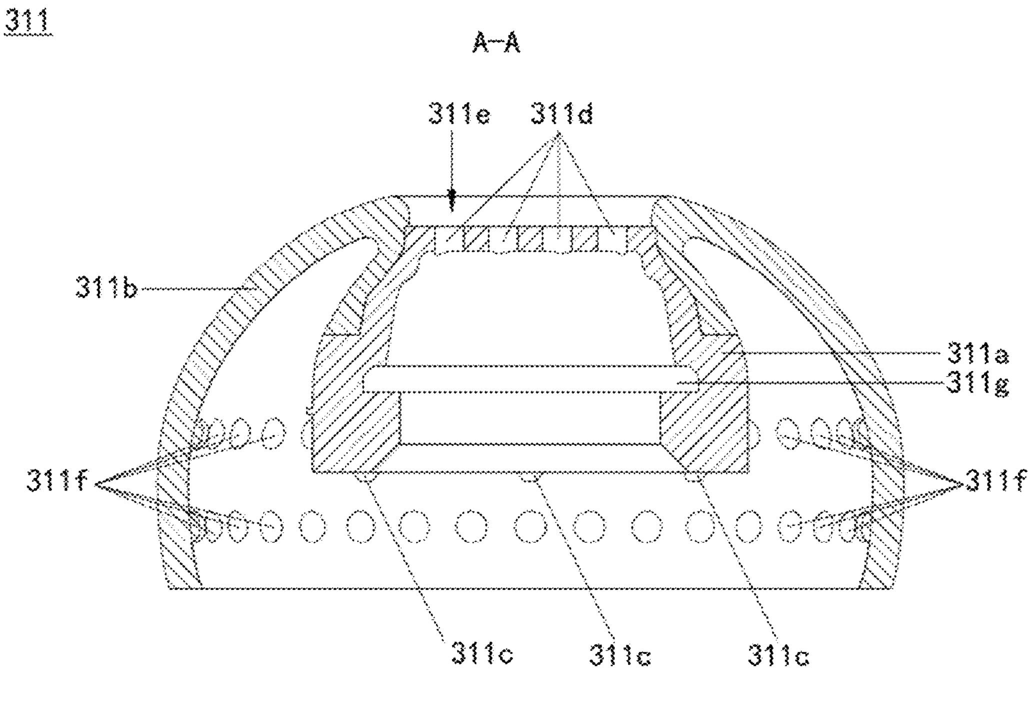
FIG. 109 is a schematic diagram of an A-A sectional structure of the earplug in FIG. 108.

As shown in FIG. 107, FIG. 108, and FIG. 109, the earplug 311 may include an earplug inner cover 311*a* and an earplug outer cover 311*b*, and the earplug inner cover 311*a* and the earplug outer cover 311*b* may be fixedly connected.

As shown in FIG. 108 and FIG. 109, the earplug inner cover 311*a* may be roughly of a hollow rotary body structure with openings at two ends. Several voice-emitting through holes 311*d* may be formed at an end of the earplug inner cover 311*a* in an axial direction, and all these voice-emitting through holes 311*d* are connected to an inner cavity of the earplug inner cover 311*a*. These voice-emitting through holes 311*d* are spaced from each other and may be arranged according to a specific rule.

Figure 110:
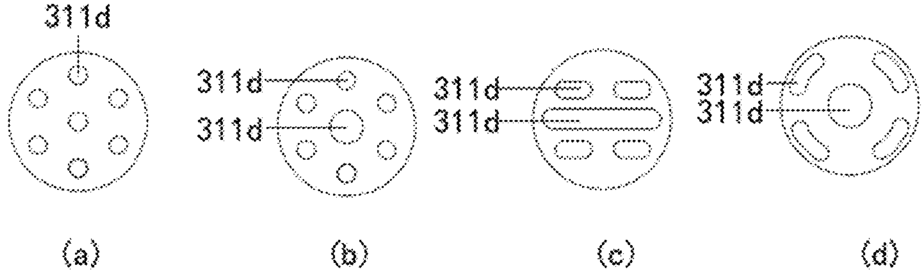
FIG. 110 is a schematic diagram of structures of several voice pickup through holes of an earplug inner cover in an earplug.

As shown in FIG. 108, in an implementation, these voice-emitting through holes 311*d* may be arranged side by side. Shapes of the voice-emitting through holes 311*d* may be consistent or similar. For example, each voice-emitting through hole 311*d* may be a runway-shaped hole. In another implementation, shapes and an arrangement manner of the voice-emitting through holes 311*d* may be designed based on a product requirement. For example, FIG. 110 shows shapes and arrangements of four types of voice-emitting through holes 311*d*.

In this embodiment, a speaker is provided in the inner cavity of the earplug inner cover 311*a*, and a voice from the speaker may pass through the voice-emitting through holes 311*d* to enter a human ear (descriptions are further provided below). An end that is of the earplug inner cover 311*a* and on which the voice-emitting through holes 311*d* are formed may be of an ear scale-proof structure, and the ear scale-proof structure can reduce or prevent ear scale from entering the speaker.

As shown in FIG. 109, a slot 311*g* may be further formed on an inner wall of the earplug inner cover 311*a*, the slot 311*g* encloses a circle, and the slot 311*g* may be far away from the voice-emitting through holes 311*d*. The slot 311*g* is configured to match the first skirt edge 316*v* of the earplug support 316*b*, so that the earplug inner cover 311*a* is mounted to the earplug support 316*b* (a detailed assembly structure is further described below).

As shown in FIG. 108 and FIG. 109, several second bumps 311*c* may be provided on a surface of an end that is of the earplug inner cover 311*a* and that is back to the voice-emitting through holes 311*d*, and these second bumps 311*c* may be spaced from each other and enclose a circle.

As shown in FIG. 107 to FIG. 109, the earplug outer cover 311*b* may be roughly a hollow rotary body with openings at two ends. An end of the earplug outer cover 311*b* in an axial direction may be fixedly connected to the end that is of the earplug inner cover 311*a* and on which the voice-emitting through holes 311*d* are formed. The earplug outer cover 311*b* may surround a periphery of the earplug inner cover 311*a*. Several first bumps 311*f* may be provided on an inner wall of the other end of the earplug outer cover 311*b* in the axial direction. These second bumps 311*c* may be spaced from each other and enclose a circle.

In this embodiment, the earplug inner cover 311*a* may be made of a harder material that is not easy to deform, to form a reliable connection to the earplug support 316*b*, and accommodate and protect the earplug support 316*b*. The earplug outer cover 311*b* may be made of a softer material that is easy to deform, to be attached to and adapt to an ear canal.

Second Electrode 314

Figure 111:
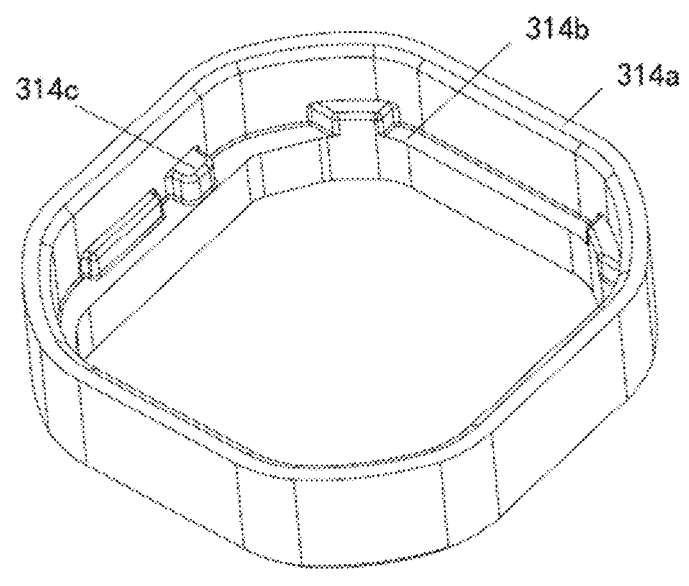
FIG. 111 is a schematic diagram of a structure of a second electrode of a first earphone.

As shown in FIG. 111, the second electrode 314 may include an electrode body 314*a*, an inner bearing platform 314*b*, and a conduction portion 314*c*. The electrode body 314*a* may be roughly of a ring structure surrounding the center line of the first earphone 31. The inner bearing platform 314*b* is located on an inner side of the electrode body 314*a*, and the inner bearing platform 314*b* may surround the electrode body 314*a*. The conduction portion 314*c* may be roughly columnar, and the conduction portion 314*c* may be located on the inner side of the electrode body 314*a*, and may protrude from the inner bearing platform 314*b*. The second electrode 314 may be made of a conductive material, for example, a metal material.

With reference to FIG. 111 and FIG. 88, the second electrode 314 may be connected to the earphone front housing 313*z*. The electrode body 314*a* of the second electrode 314 matches the third part 313*c* of the earphone front housing 313*z*. The conduction portion 314*c* of the second electrode 314 may be electrically connected to a circuit board (descriptions are provided below) that is located in the second electrode 314 and that is in a second earphone circuit board assembly 317*g*, so that the second electrode 314 is used as another charging electrode. Descriptions of a detailed assembly structure are further provided below.

Earphone Rear-Housing Assembly 315

Figure 112:
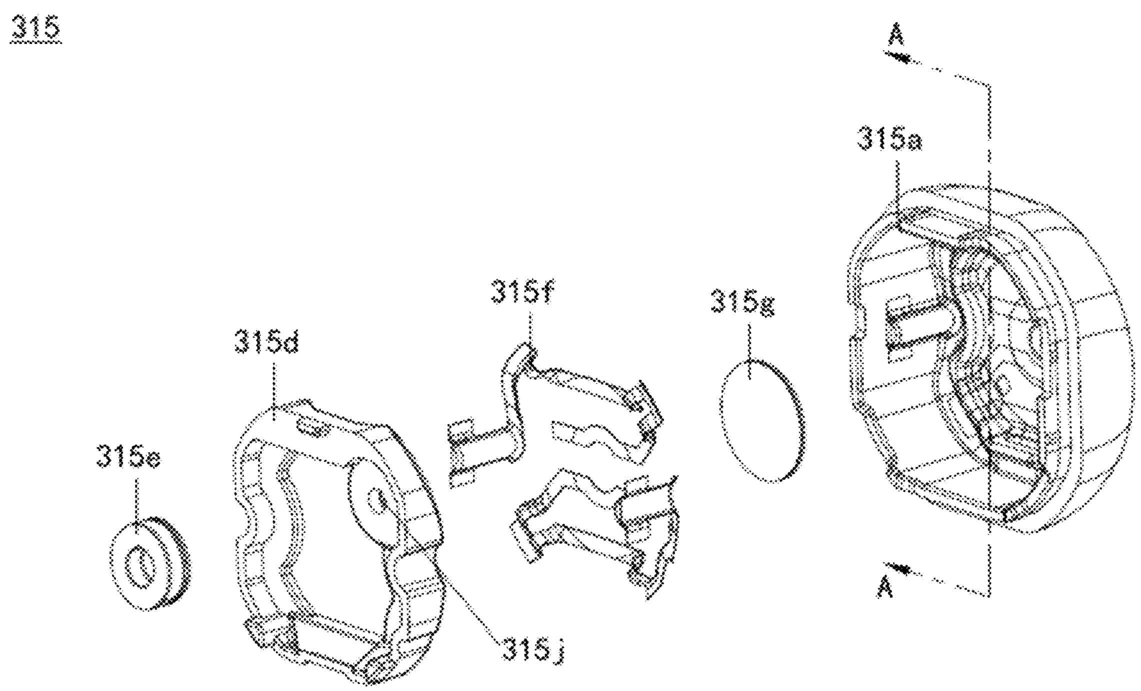
FIG. 112 is a schematic exploded view of a structure of an earphone rear-housing assembly in a first earphone.
Figure 113:
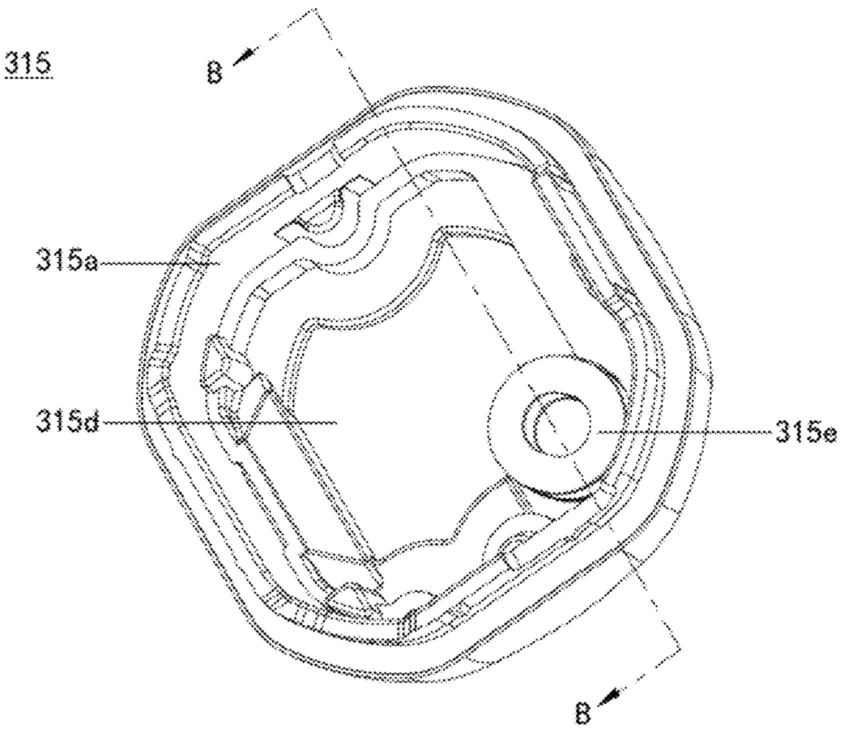
FIG. 113 is a schematic diagram of an assembly structure of an earphone rear-housing assembly.
Figure 114:
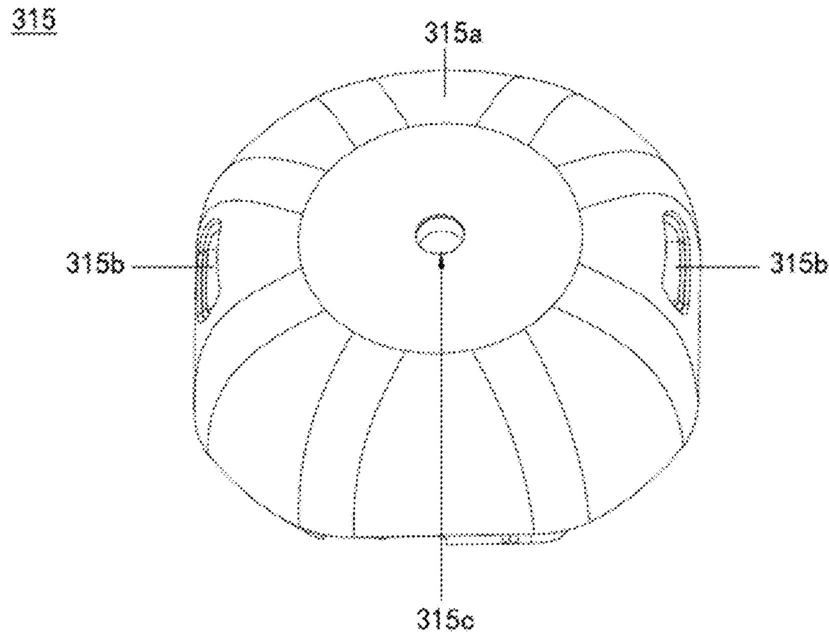
FIG. 114 is a schematic diagram of a structure of an earphone rear housing in an earphone rear-housing assembly.

As shown in FIG. 112, FIG. 113, and FIG. 114, the earphone rear-housing assembly 315 may include an earphone rear housing 315*a*, a first primary microphone mesh 315*g*, an antenna 315*f*, a rear housing support 315*d*, and a second primary microphone mesh 315*e*. The first primary microphone mesh 315*g*, the antenna 315*f*, the rear housing support 315*d*, and the second primary microphone mesh 315*e* may all be accommodated on an inner side of the earphone rear housing 315*a*.

Figure 115:
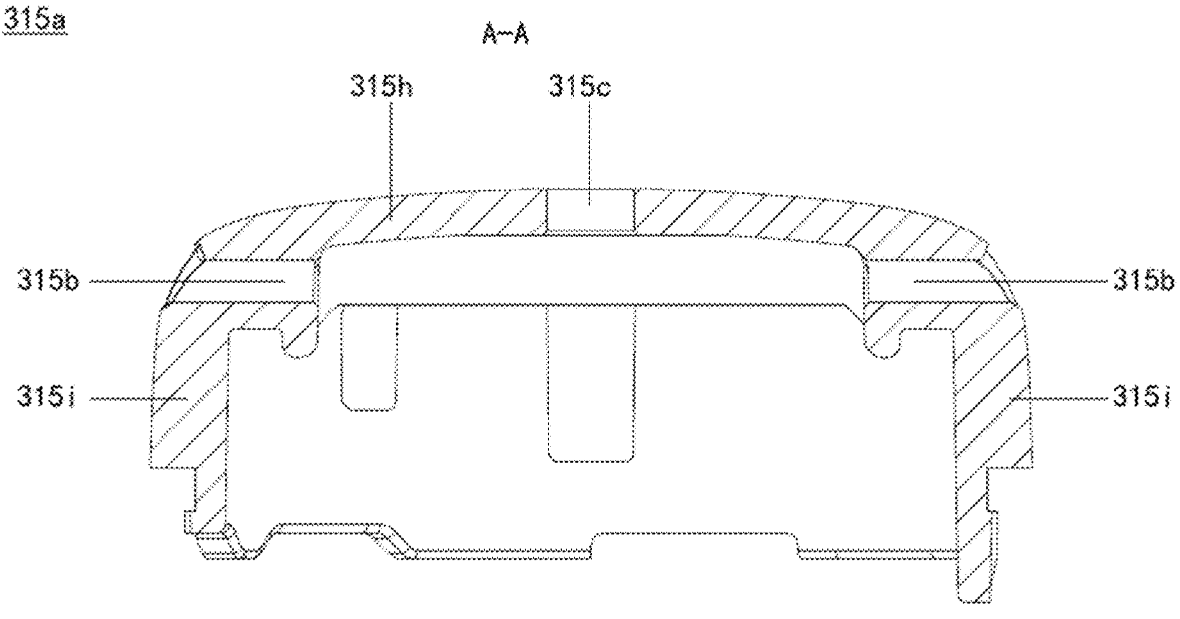
FIG. 115 is a schematic diagram of an A-A sectional structure of an earphone rear housing in FIG. 112.

As shown in FIG. 113, FIG. 114, and FIG. 115 (FIG. 115 is a schematic diagram of an A-A sectional structure of the earphone rear housing 315*a* in FIG. 112), the earphone rear housing 315*a* may be roughly in a bowl shape. The earphone rear housing 315*a* may include a bottom wall 315*h* and a circumferential side wall 315*i* surrounding a circumferential edge of the bottom wall 315*h*, and the circumferential side wall 315*i* and the bottom wall 315*h* form an open cavity. A voice pickup through hole 315*c* may be provided on the bottom wall 315*h*, and the voice pickup through hole 315*c* communicates with an inner cavity of the earphone rear housing 315*a*. Several wind noise prevention through holes 315*b* may be provided on the circumferential side wall 315*i*, and the wind noise prevention through holes 315*b* are connected to the inner cavity of the earphone rear housing 315*a*. For example, there may be two wind noise prevention through holes 315*b*, and the two wind noise prevention through holes 315*b* may be basically symmetrically distributed on two sides of the voice pickup through hole 315*c*. Alternatively, a quantity of wind noise prevention through holes 315*b* may be greater than or equal to 2, for example, three or four, and these wind noise prevention through holes 315*b* may be disposed at a spacing.

Antenna 315*f*

In this embodiment, the antenna 315*f* may be a common-mode antenna, and may include two antenna branches that are physically separated but can work in a coupled manner. The two antenna branches are coupled to enable the antenna 315*f* to work in a specified frequency band. The antenna 315*f* may be, for example, a Bluetooth antenna, and the specified frequency band may be, for example, 2.4 GHz.

Figure 116:
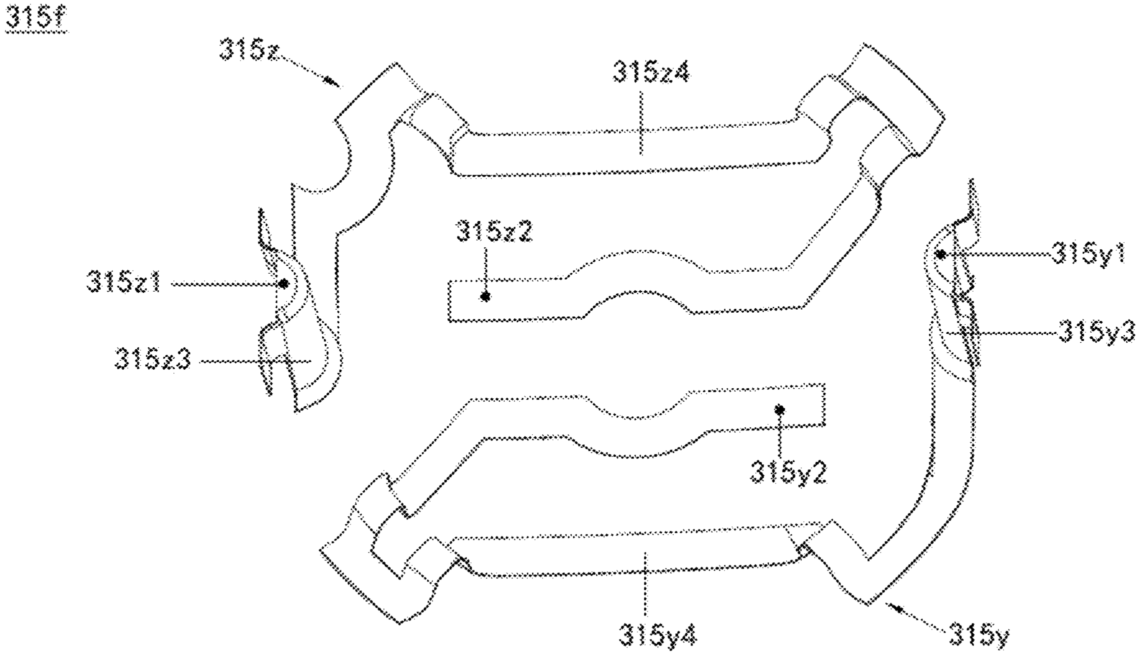
FIG. 116 is a schematic diagram of a structure of an antenna in an earphone rear-housing assembly.

As shown in FIG. 116, in an implementation 1 of this embodiment, the antenna 315*f* may include a first antenna branch 315*z* and a second antenna branch 315*y*. The first antenna branch 315*z* and the second antenna branch 315*y* each may be roughly of a bent narrow-strip structure.

As shown in FIG. 116, the first antenna branch 315*z* may include a first segment 315*z*3 and a second segment 315*z*4, and the first segment 315*z*3 and the second segment 315*z*4 are bent and connected. For example, the first segment 315*z*3 and the second segment 315*z*4 may be roughly perpendicular to each other. An end that is of the first segment 315*z*3 and that is far away from the second segment 315*z*4 is referred to as a head end 315*z*1, and an end that is of the second segment 315*z*4 and that is far away from the first segment 315*z*3 is referred to as a tail end 315*z*2. In other words, the head end 315*z*1 and the tail end 315*z*2 are respectively two opposite ends of the first antenna branch 315*z*. The first segment 315*z*3 may be roughly in a straight-line shape, and the second segment 315*z*4 may be in a bent shape.

As shown in FIG. 116, similarly, the second antenna branch 315*y* may include a third segment 315*y*3 and a fourth segment 315*y*4, and the third segment 315*y*3 and the fourth segment 315*y*4 are bent and connected. For example, the third segment 315*y*3 and the fourth segment 315*y*4 may be roughly perpendicular to each other. An end that is of the third segment 315*y*3 and that is far away from the fourth segment 315*y*4 is referred to as a head end 315*y*1, and an end that is of the fourth segment 315*y*4 and that is far away from the third segment 315*y*3 is referred to as a tail end 315*y*2. In other words, the head end 315*y*1 and the tail end 315*y*2 are respectively two opposite ends of the second antenna branch 315*y*. The third segment 315*y*3 may be roughly in a straight-line shape, and the fourth segment 315*y*4 may be in a bent shape. As shown in FIG. 116, the first antenna branch 315*z* and the second antenna branch 315*y* may be basically centrally symmetric. In other words, the first antenna branch 315*z* basically overlaps the second antenna branch 315*y* after being rotated around a center by 180°. For an entire region occupied by the first antenna branch 315*z* and the second antenna branch 315*y*, from the head end 315*z*1 to the tail end 315*z*2 of the first antenna branch 315*z*, the first antenna branch 315*z* is bent and extends along an outward-inward path (for example, in a perspective of FIG. 116, the first antenna branch 315*z* is bent in the clockwise direction); and from the head end 315*y*1 to the tail end 315*y*2 of the second antenna branch 315*y*, the second antenna branch 315*y* is bent and extends along an outward-inward path (for example, in the perspective of FIG. 116, the second antenna branch 315*y* is bent in the clockwise direction). The head end 315*z*1 and the head end 315*y*1 are on an outer side, and the head end 315*z*1 is far away from the head end 315*y*1. Both the tail end 315*z*2 and the tail end 315*y*2 are located between the head end 315*z*1 and the head end 315*y*1, the tail end 315*z*2 is close to the tail end 315*y*2, and the tail end 315*z*2 and the tail end 315*y*2 are coupled, so that the antenna 315*f* works in the 2.4G frequency band.

In the following descriptions, both the head end 315*z*1 and the head end 315*y*1 are connected to a feed point on a circuit board of a third earphone circuit board assembly 317*h* in the electronic assembly 317, so that both the first antenna branch 315*z* and the second antenna branch 315*y* can receive and send signals. The two feed points may be symmetric with respect to the center line of the first earphone 31.

With reference to FIG. 116, FIG. 112, and FIG. 115, in the implementation 1, the antenna 315*f* may be disposed on an inner wall of the earphone rear housing 315*a*, both the head end 315*z*1 and the head end 315*y*1 may be located on an inner surface of the circumferential side wall 315*i* of the earphone rear housing 315*a*, and both the tail end 315*z*2 and the tail end 315*y*2 may be located on an inner surface of the bottom wall 315*h* of the earphone rear housing 315*a*. For the first antenna branch 315*z*, from the head end 315*z*1 to the tail end 315*z*2, the second segment 315*z*4 of the first antenna branch 315*z* may extend roughly in a direction from the circumferential side wall 315*i* to the bottom wall 315*h*; and for the second antenna branch 315*y*, from the head end 315*y*1 to the tail end 315*y*2, the fourth segment 315*y*4 of the second antenna branch 315*y* may also extend roughly in the direction from the circumferential side wall 315*i* to the bottom wall 315*h*.

The antenna 315*f* may be, for example, formed on the inner wall of the earphone rear housing 315*a* by using a laser direct structuring (laser direct structuring, LDS) technique. In other words, the antenna 315*f* may be, for example, an LDS antenna.

Different wearing angles of the first earphone 31 in the ear canal enable the first antenna branch 315*z* to be closer to the human body, or the second antenna branch 315*y* to be closer to the human body. Antenna performance of an antenna branch closer to the human body deteriorates (for example, antenna efficiency is lower), and signal quality of the antenna deteriorates.

Therefore, when the first earphone 31 works at different wearing angles, the first earphone 31 may detect which antenna branch of the antenna 315*f* has better signal quality, select the antenna branch (an antenna branch that is farther away from the human body) with better signal quality as a feeding end, and use the other antenna branch as a grounding end. For example, a received signal strength (received signal strength indicator, RSSI) value may be detected to determine signal quality of the antenna branch. A controller and a switch circuit may be built in the first earphone 31. The controller is configured to: determine an antenna branch with better signal quality; and switch, through the switch circuit, the antenna branch to be the feeding end, and an antenna branch with worse signal quality to be the grounding end. For example, the controller may be disposed on the circuit board in the second earphone circuit board assembly 317*g* (descriptions are provided below). For example, the switch circuit may be disposed on the circuit board in the third earphone circuit board assembly 317*h* (descriptions are provided below). It may be understood that positions of the controller and the switch circuit may be designed based on a requirement, and are not limited to the foregoing descriptions.

For example, when the first earphone 31 is worn at a first wearing angle, the second antenna branch 315*y* is farther away from the human body. The first earphone 31 may detect that signal quality of the second antenna branch 315*y* is better, select the second antenna branch 315*y* as the feeding end, and use the first antenna branch 315*z* as the grounding end. Alternatively, when the first earphone 31 is worn at a second wearing angle, the first antenna branch 315*z* is farther away from the human body. The first earphone 31 may detect that signal quality of the first antenna branch 315*z* is better, select the first antenna branch 315*z* as the feeding end, and use the second antenna branch 315*y* as the grounding end.

According to the antenna 315*f* in this implementation, two antenna branches that are centrally symmetrically distributed and work in a coupled manner are designed, so that antenna performance of the first earphone 31 can be ensured when the user wears the first earphone 31 at different wearing angles, thereby ensuring communication quality of the first earphone 31 and ensuring user experience.

Figure 117:
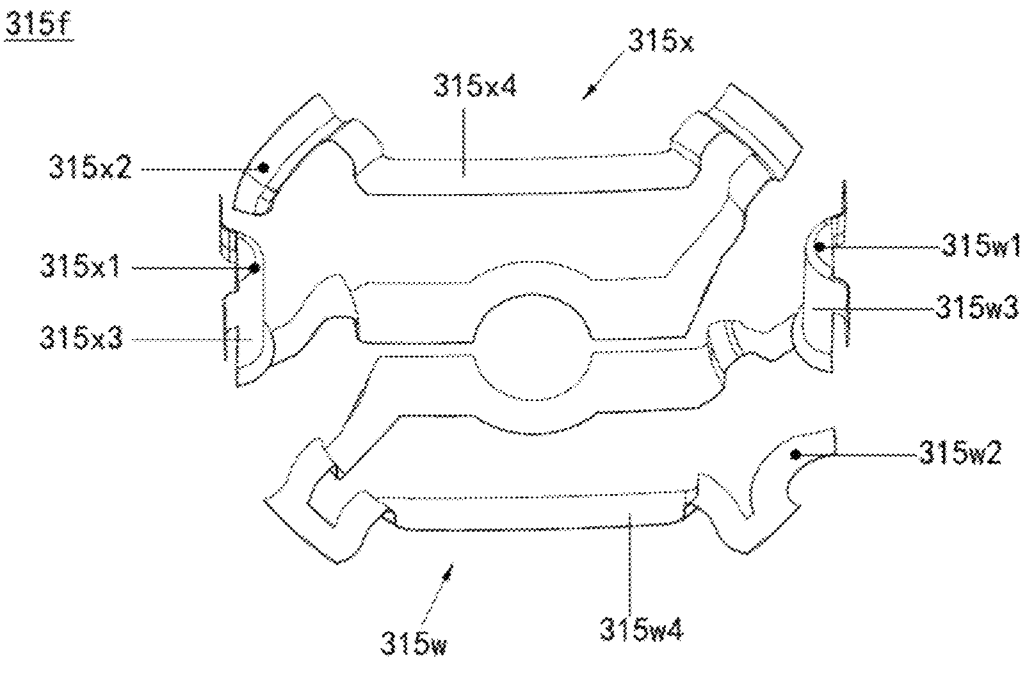
FIG. 117 is another schematic diagram of a structure of an antenna in an earphone rear-housing assembly.

As shown in FIG. 117, in an implementation 2 of this embodiment, the antenna 315*f* may include a first antenna branch 315*x* and a second antenna branch 315*w*. The first antenna branch 315*x* and the second antenna branch 315*w* each may be roughly of a bent narrow-strip structure.

As shown in FIG. 117, the first antenna branch 315*x* may include a first segment 315*x*3 and a second segment 315*x*4, and the first segment 315*x*3 and the second segment 315*x*4 are bent and connected. For example, the first segment 315*x*3 and the second segment 315*x*4 may be roughly perpendicular to each other. An end that is of the first segment 315*x*3 and that is far away from the second segment 315*x*4 is referred to as a head end 315*x*1, and an end that is of the second segment 315*x*4 and that is far away from the first segment 315*x*3 is referred to as a tail end 315*x*2. In other words, the head end 315*x*1 and the tail end 315*x*2 are respectively two opposite ends of the first antenna branch 315*x*. The first segment 315*x*3 may be roughly in a straight-line shape, and the second segment 315*x*4 may be in a bent shape.

As shown in FIG. 117, similarly, the second antenna branch 315*w* may include a third segment 315*w*3 and a fourth segment 315*w*4, and the third segment 315*w*3 and the fourth segment 315*w*4 are bent and connected. For example, the third segment 315*w*3 and the fourth segment 315*w*4 may be roughly perpendicular to each other. An end that is of the third segment 315*w*3 and that is far away from the fourth segment 315*w*4 is referred to as a head end 315*w*1, and an end that is of the fourth segment 315*w*4 and that is far away from the third segment 315*w*3 is referred to as a tail end 315*w*2. In other words, the head end 315*w*1 and the tail end 315*w*2 are respectively two opposite ends of the second antenna branch 315*w*. The third segment 315*w*3 may be roughly in a straight-line shape, and the fourth segment 315*w*4 may be in a bent shape.

As shown in FIG. 117, the first antenna branch 315*x* and the second antenna branch 315*w* may be basically centrally symmetric.

Different from those in the implementation 1, in the implementation 2, for an entire region occupied by the first antenna branch 315*x* and the second antenna branch 315*w*, from the head end 315*x*1 to the tail end 315*x*2 of the first antenna branch 315*x*, the first antenna branch 315*x* is bent and extends along an inward-outward path (for example, in a perspective of FIG. 117, the first antenna branch 315*x* is bent in a counterclockwise direction); and from the head end 315*w*1 to the tail end 315*w*2 of the second antenna branch 315*w*, the second antenna branch 315*w* is bent and extends along an inward-outward path (for example, in the perspective of FIG. 117, the second antenna branch 315*w* is bent in the counterclockwise direction). The head end 315*x*1, the tail end 315*x*2, the head end 315*w*1, and the tail end 315*w*2 are all on an outer side. The head end 315*x*1 is close to the head end 315*w*1, and coupling is generated, so that the antenna 315*f* works in the 2.4G frequency band.

As shown in FIG. 117, FIG. 112, and FIG. 115, in the implementation 2, the antenna 315*f* may be disposed on the inner wall of the earphone rear housing 315*a*. Both the head end 315*x*1 and the head end 315*w*1 may be located on an inner surface of the circumferential side wall 315*i* of the earphone rear housing 315*a*. Both the tail end 315*x*2 and the tail end 315*w*2 may be located on an inner surface of the bottom wall 315*h* of the earphone rear housing 315*a*, and may be close to the circumferential side wall 315*i*. Different from those in the implementation 1, for the first antenna branch 315*x*, from the head end 315*x*1 to the tail end 315*x*2, the second segment 315*x*4 of the first antenna branch 315*x* may extend roughly in a direction from the bottom wall 315*h* to the circumferential side wall 315*i*; and for the second antenna branch 315*w*, from the head end 315*w*1 to the tail end 315*w*2, the fourth segment 315*w*4 of the second antenna branch 315*w* may also extend roughly in the direction from the bottom wall 315*h* to the circumferential side wall 315*i*.

The implementation 2 provides another topology structure of the antenna 315*f*, to meet an antenna design requirement of the first earphone 31.

Figure 118:
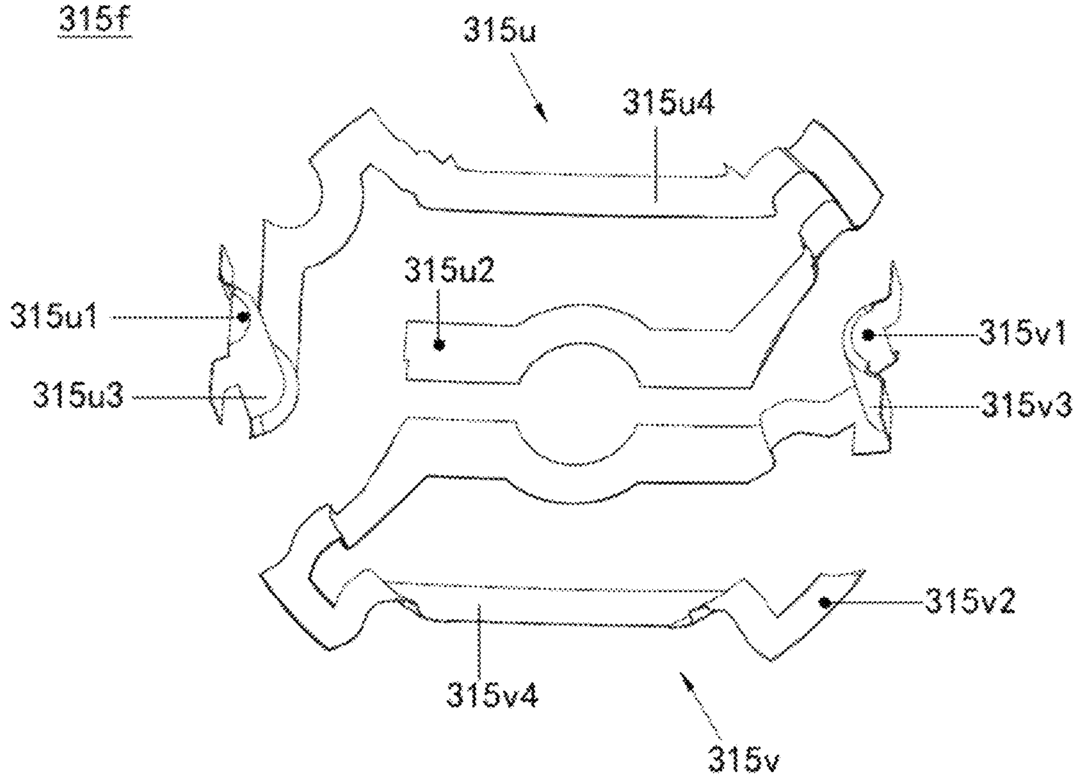
FIG. 118 is another schematic diagram of a structure of an antenna in an earphone rear-housing assembly.

As shown in FIG. 118, in an implementation 3 of this embodiment, the antenna 315*f* may include a first antenna branch 315*u* and a second antenna branch 315*v*. The first antenna branch 315*u* and the second antenna branch 315*v* each may be roughly of a bent narrow-strip structure.

As shown in FIG. 118, the first antenna branch 315*u* may include a first segment 315*u*3 and a second segment 315*u*4, and the first segment 315*u*3 and the second segment 315*u*4 are bent and connected. For example, the first segment 315*u*3 and the second segment 315*u*4 may be roughly perpendicular to each other. An end that is of the first segment 315*u*3 and that is far away from the second segment 315*u*4 is referred to as a head end 315*u*1, and an end that is of the second segment 315*u*4 and that is far away from the first segment 315*u*3 is referred to as a tail end 315*u*2. In other words, the head end 315*u*1 and the tail end 315*u*2 are respectively two opposite ends of the first antenna branch 315*u*. The first segment 315*u*3 may be roughly in a straight-line shape, and the second segment 315*u*4 may be in a bent shape.

As shown in FIG. 118, similarly, the second antenna branch 315*v* may include a third segment 315*v*3 and a fourth segment 315*v*4, and the third segment 315*v*3 and the fourth segment 315*v*4 are bent and connected. For example, the third segment 315*v*3 and the fourth segment 315*v*4 may be roughly perpendicular to each other. An end that is of the third segment 315*v*3 and that is far away from the fourth segment 315*v*4 is referred to as a head end 315*v*1, and an end that is of the fourth segment 315*v*4 and that is far away from the third segment 315*v*3 is referred to as a tail end 315*v*2. In other words, the head end 315*v*1 and the tail end 315*v*2 are respectively two opposite ends of the second antenna branch 315*v*. The third segment 315*v*3 may be roughly in a straight-line shape, and the fourth segment 315*v*4 may be in a bent shape.

Different from those in the implementation 1, in the implementation 3, for an entire region occupied by the first antenna branch 315*u* and the second antenna branch 315*v*, from the head end 315*u*1 to the tail end 315*u*2 of the first antenna branch 315*u*, the first antenna branch 315*u* is bent and extends along an outward-inward path (for example, in a perspective of FIG. 118, the first antenna branch 315*u* is bent in the clockwise direction); and from the head end 315*v*1 to the tail end 315*v*2 of the second antenna branch 315*v*, the second antenna branch 315*v* is bent and extends along an inward-outward path (for example, in the perspective of FIG. 118, the second antenna branch 315*v* is bent in a counterclockwise direction). The head end 315*u*1, the head end 315*v*1, and the tail end 315*v*2 are all on an outer side, and the tail end 315*u*2 is on an inner side. The tail end 315*u*2 is close to the head end 315*v*1, and coupling is generated, so that the antenna 315*f* works in the 2.4G frequency band.

As shown in FIG. 117, FIG. 112, and FIG. 115, in the implementation 3, the antenna 315*f* may be disposed on the inner wall of the earphone rear housing 315*a*. Both the head end 315*u*1 and the head end 315*v*1 may be located on an inner surface of the circumferential side wall 315*i* of the earphone rear housing 315*a*. Both the tail end 315*u*2 and the tail end 315*v*2 may be located on an inner surface of the bottom wall 315*h* of the earphone rear housing 315*a*, and the tail end 315*v*2 may be further close to the circumferential side wall 315*i*. Different from those in the implementation 1, for the first antenna branch 315*u*, from the head end 315*u*1 to the tail end 315*u*2, the second segment 315*u*4 of the first antenna branch 315*u* may extend roughly in a direction from the circumferential side wall 315*i* to the bottom wall 315*h*; and for the second antenna branch 315*v*, from the head end 315*v*1 to the tail end 315*v*2, the fourth segment 315*v*4 of the second antenna branch 315*v* may extend roughly in a direction from the bottom wall 315*h* to the circumferential side wall 315*i*.

The implementation 3 provides another topology structure of the antenna 315*f*, to meet an antenna design requirement of the first earphone 31.

The foregoing implementations schematically enumerate three topology structures and three coupling manners of the antenna 315*f*. Embodiments of this application are actually not limited thereto. Another topology structure and coupling manner of the antenna 315*f* may alternatively be designed based on a product requirement. For example, from the head end to the tail end, the second segment may extend roughly in the direction from the bottom wall 315*h* to the circumferential side wall 315*i*, and the fourth segment may extend roughly in the direction from the circumferential side wall 315*i* to the bottom wall 315*h*. The head end of the first antenna branch may be coupled to the tail end of the second antenna branch, so that the antenna 315*f* works in the specified frequency band.

The foregoing describes three types of schematic topology structures of the antenna 315*f*. It may be understood that, in this embodiment, a specific structure of the antenna 315*f* may be designed based on a product requirement, and is not limited to the foregoing descriptions. For ease of description, the antenna 315*f* in the implementation 1 is used as an example for the following descriptions of content related to the antenna 315*f*.

First Primary Microphone Mesh 315*g*

The first primary microphone mesh 315*g* may be roughly in a circular sheet shape, and may include several layers of materials, such as an acoustic mesh and an adhesive layer. With reference to FIG. 112 and FIG. 115, the first primary microphone mesh 315*g* may be fixedly connected to the bottom wall 315*h* of the earphone rear housing 315*a*. For example, an adhesive layer in the first primary microphone mesh 315*g* may be bonded to the bottom wall 315*h*. In addition, the first primary microphone mesh 315*g* covers the voice pickup through hole 315*c*, and a voice entering the voice pickup through hole 315*c* may pass through the first primary microphone mesh 315*g* and enter the inner cavity of the earphone rear housing 315*a*.

Rear Housing Support 315*d*

Figure 119:
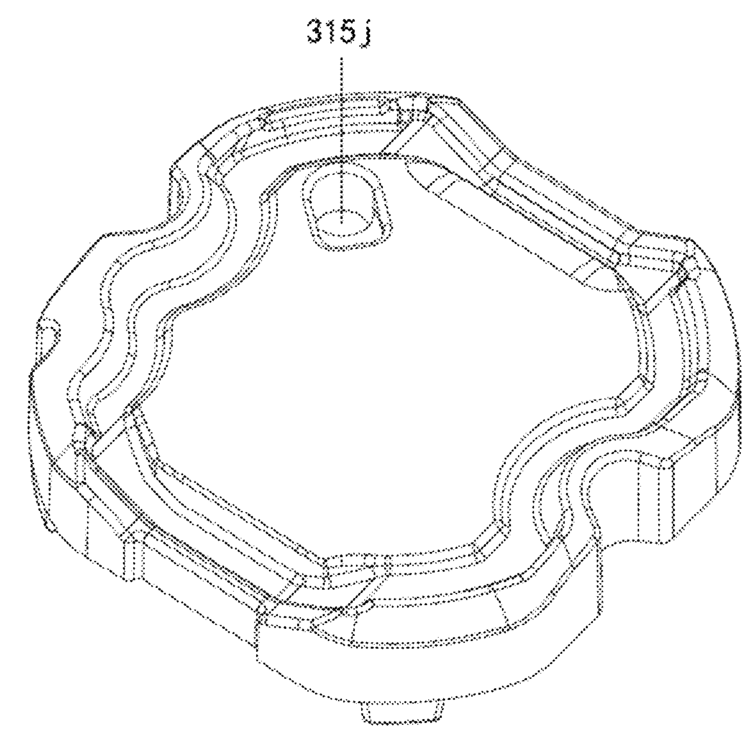
FIG. 119 is a schematic diagram of a structure of a rear housing support in an earphone rear-housing assembly.

As shown in FIG. 112 and FIG. 119, the rear housing support 315*d* may be roughly in a cover shape. A through hole 315*j* may be provided on the rear housing support 315*d*.

Second Primary Microphone Mesh 315*e*

As shown in FIG. 112, the second primary microphone mesh 315*e* may be roughly in a circular sheet shape, and may include several layers of materials, such as an acoustic mesh, foam, and an adhesive layer. With reference to FIG. 112 and FIG. 119, the second primary microphone mesh 315*e* may be fastened to a side of the rear housing support 315*d*. For example, an adhesive layer in the second primary microphone mesh 315*e* may be bonded to the side of the rear housing support 315*d*. In addition, the second primary microphone mesh 315*e* covers the through hole 315*j*, and a voice entering the through hole 315*j* may pass through the second primary microphone mesh 315*e*.

Figure 120:
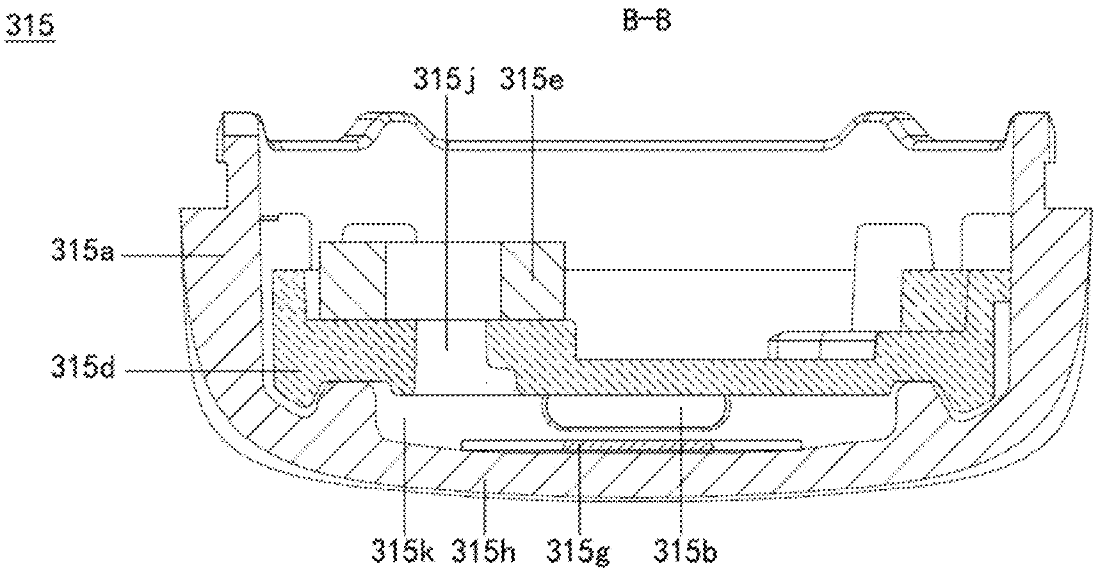

FIG. 120 is a B-B sectional view of the earphone rear-housing assembly 315 in FIG. 113, and FIG. 120 may represent an assembly structure of the earphone rear-housing assembly 315. As shown in FIG. 120, the first primary microphone mesh 315*g* may be fastened to the inner surface of the bottom wall 315*h* of the earphone rear housing 315*a*. With reference to FIG. 120 and FIG. 114, the first primary microphone mesh 315*g* covers the voice pickup through hole 315*c* (the voice pickup through hole 315*c* is not displayed in FIG. 120 due to a position of a sectional surface in FIG. 113). The rear housing support 315*d* is mounted in the inner cavity of the earphone rear housing 315*a*, and there is a specific spacing between the rear housing support 315*d* and each of the bottom wall 315*h* and the first primary microphone mesh 315*g*. Therefore, the rear housing support 315*d* and the earphone rear housing 315*a* enclose a wind noise prevention cavity 315*k*. The wind noise prevention through hole 315*b* is connected to the wind noise prevention cavity 315*k*.

As shown in FIG. 120, the second primary microphone mesh 315*e* is located in the inner cavity of the earphone rear housing 315*a*, the second primary microphone mesh 315*e* may be fastened to a side that is of the rear housing support 315*d* and that is far away from the bottom wall 315*h*, and the second primary microphone mesh 315*e* covers the through hole 315*j* of the rear housing support 315*d*.

The foregoing describes in detail the structures of the earplug 311, the earplug support assembly 316, the first electrode 312, the earphone front-housing assembly 313, the second electrode 314, and the earphone rear-housing assembly 315 in the first earphone 31. The following describes an overall assembly structure including the components.

Figure 121:
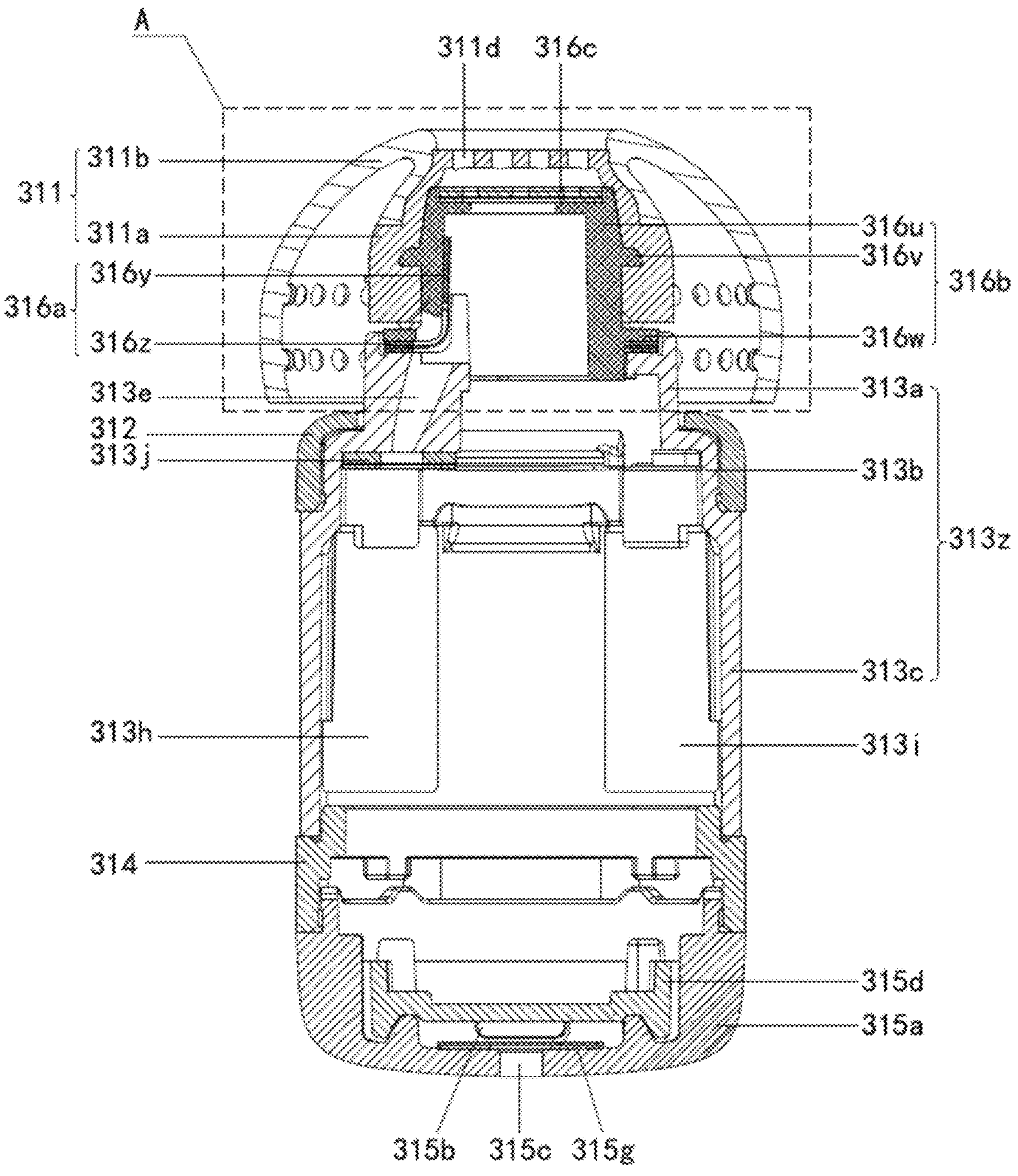
Figure 122:
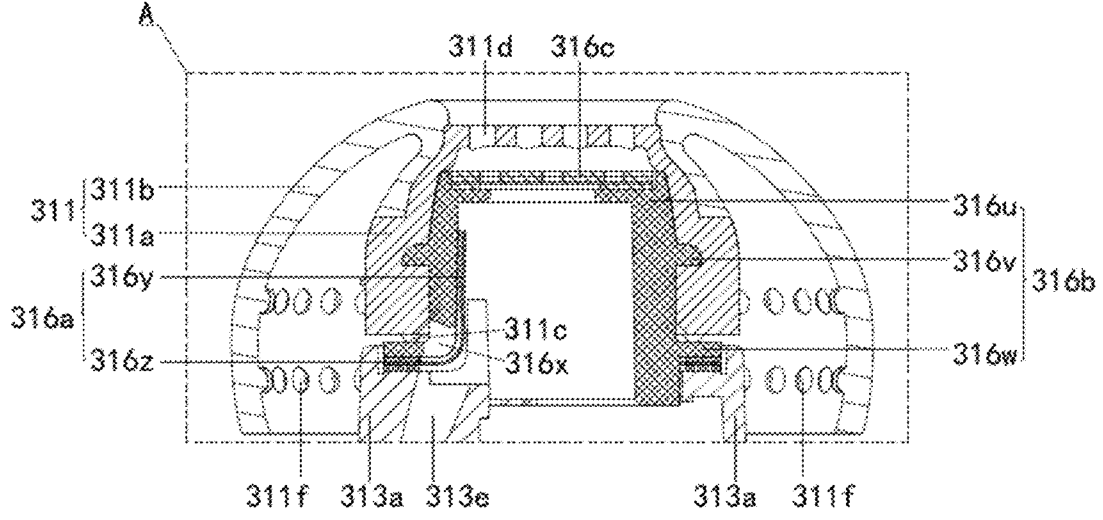

FIG. 121 is a schematic diagram of a sectional structure of the first earphone 31. Some structures are not displayed due to a position selection of a sectional section. FIG. 122 is a partially enlarged schematic diagram at a position A in FIG. 121.

As shown in FIG. 121, the first electrode 312 may match the second part 313*b* of the earphone front housing 313*z*. With reference to FIG. 102 and FIG. 87, the conduction portion 312*b* of the first electrode 312 may pass through the through hole 313*d* on the second part 313*b*, and extend into the inner cavity of the earphone front housing 313*z*.

As shown in FIG. 121 and FIG. 122, the earplug support 316*b* may match the first part 313*a* of the earphone front housing 313*z*. With reference to FIG. 122 and FIG. 90, the second skirt edge 316*w* of the earplug support 316*b* may be bonded to the mounting groove 313*f* of the first part 313*a* through the fastening region 316*z* of the front vent acoustic mesh 316*a*. The support body 316*u* of the earplug support 316*b* may extend into the inner cavity of the earphone front housing 313*z*. In addition, as shown in FIG. 122, the front vent 316*x* on the earplug support 316*b* may be close to the voice pickup channel 313*e* on the earphone front housing 313*z*, and the blocking region 316*y* of the front vent acoustic mesh 316*a* is located between the front vent 316*x* and the voice pickup channel 313*e*.

As shown in FIG. 122, the earplug inner cover 311*a* may be sleeved on a periphery of the earplug support 316*b*. With reference to FIG. 109 and FIG. 122, the slot 311*g* of the earplug inner cover 311*a* may match the first skirt edge 316*v* of the earplug support 316*b*, and there may be a specific spacing between the end that is of the earplug inner cover 311*a* and on which the voice-emitting through holes 311*d* are provided and the speaker mesh 316*c* on the earplug support 316*b*. The second bumps 311*c* on the earplug inner cover 311*a* may be in contact with the second skirt edge 316*w* of the earplug support 316*b*, so that there is a gap between the earplug inner cover 311*a* and the second skirt edge 316*w*, to prevent the earplug inner cover 311*a* from blocking the front vent 316*x* near the second skirt edge 316*w*. It may be understood that the second bumps 311*c* may be staggered with the front vent 316*x*, to prevent the second bumps 311*c* from blocking the front vent 316*x*.

As shown in FIG. 122, the earplug outer cover 311*b* surrounds a periphery of the earplug inner cover 311*a*, a lower end of the earplug outer cover 311*b* may surround a periphery of the first part 313*a* of the earphone front housing 313*z*, and first bumps 311*f* on the inner wall of the earplug outer cover 311*b* may also surround the periphery of the first part 313*a*. Designing the first bumps 311*f* may increase structural strength of the earplug outer cover 311*b*, so that when the first earphone 31 is worn by the user, shaking or vibration of the earplug outer cover 311*b* is reduced, thereby reducing a "stethoscope effect".

As shown in FIG. 121, the second electrode 314 is connected to the third part 313*c* of the earphone front housing 313*z* and the earphone rear housing 315*a*.

In this embodiment, the earplug support assembly 316, the earphone front-housing assembly 313, the second electrode 314, and the earphone rear-housing assembly 315 may enclose the inner cavity of the first earphone 31, and the electronic assembly 317 is accommodated in the inner cavity.

In this embodiment, after the first earphone 31 is placed in position in the third accommodation groove 231*f*, the first electrode 312 may be in contact with the first charging spring 231*e* in the third accommodation groove 231*f*, and the second electrode 314 may be in contact with the second charging spring 231*c*, so that the host 2 charges the first earphone 31. Because the first electrode 312 and the second electrode 314 each are of a 360-degree closed ring structure, when the first earphone 31 is placed into the third accommodation groove 231*f* at any angle, the first electrode 312 may always be in contact with the first charging spring 231*e*, and the second electrode 314 may always be in contact with the second charging spring 231*c*, to ensure that the host 2 charges the first earphone 31. Such a structure of the first electrode 312 and the second electrode 314 enables the user to place the first earphone 31 into the third accommodation groove 231*f* at will. This improves user experience.

It is easy to understand that, in another embodiment, one of the first electrode and the second electrode has a 360-degree closed ring structure, and the other electrode is not 360-degree closed, but forms an open ring structure. In this way, it can also be ensured that, on a premise that the first earphone can be charged, the first earphone is randomly placed within a specific angle range.

Figure 123:
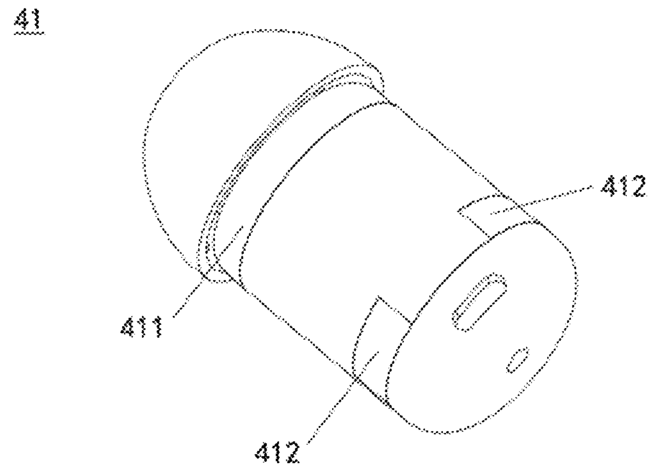

For example, for the first earphone 41 shown in FIG. 123, the first electrode 411 still has a 360-degree closed ring structure, but there are two or more second electrodes 412, the second electrodes 412 are disposed at a spacing, and the second electrodes 412 may be distributed on a same circle. Each second electrode 412 may be of an open ring structure.

Alternatively, in another embodiment, there is a single second electrode 412, and the second electrode 412 is of an open ring structure with a notch. For example, a surrounding angle of the second electrode 412 may be 120 degrees, 180 degrees, 270 degrees, or the like (but less than 360 degrees).

Alternatively, in another embodiment, neither the first electrode nor the second electrode is 360-degree closed, and the first electrode and the second electrode each are of a single open ring structure with a notch. Alternatively, one of the first electrode and the second electrode is of a single open ring structure with a notch, and a quantity of the other electrode is at least two, where the at least two electrodes are disposed at a spacing and distributed on a same circle. Alternatively, there are at least two first electrodes and two second electrodes, and the first electrodes and the second electrodes are disposed at spacings and distributed on a same circle. The design may also ensure that, on the premise that the first earphone can be charged, the first earphone can be randomly placed within a specific angle range.

In this embodiment, the first electrode 312 is electrically connected to the first charging spring 231*e*, or the second electrode 314 is electrically connected to the second charging spring 231*c*, and the first electrode 312 or the second electrode 314 may be further configured to implement communication between the first earphone 31 and the host 2. To be specific, the first electrode 312 or the second electrode 314 may be further multiplexed as a communication electrode of the first earphone 31, to implement communication between the first earphone 31 and the host 2.

Figure 124:
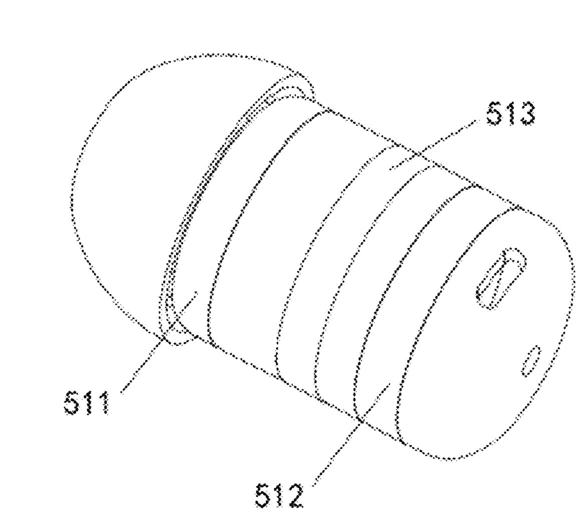

Different from that this embodiment, in another embodiment, as shown in FIG. 124, the first earphone 51 may have a first electrode 512 and a second electrode 512, and the first electrode 512 and the second electrode 512 are dedicated to implementing charging of the first earphone 51 by the host. In addition, the first earphone 51 further has a communication electrode 513, and the communication electrode 513 is dedicated to communication with the host. It may be understood that the first electrode 512, the second electrode 512, and the communication electrode 513 shown in FIG. 124 each are of a 360-degree closed ring structure, and this is merely an example. Actually, structures, quantities, and distribution of first electrodes 512, second electrodes 512, and communication electrodes 513 may all be designed based on a product requirement.

Electronic Assembly 317

Figure 125:
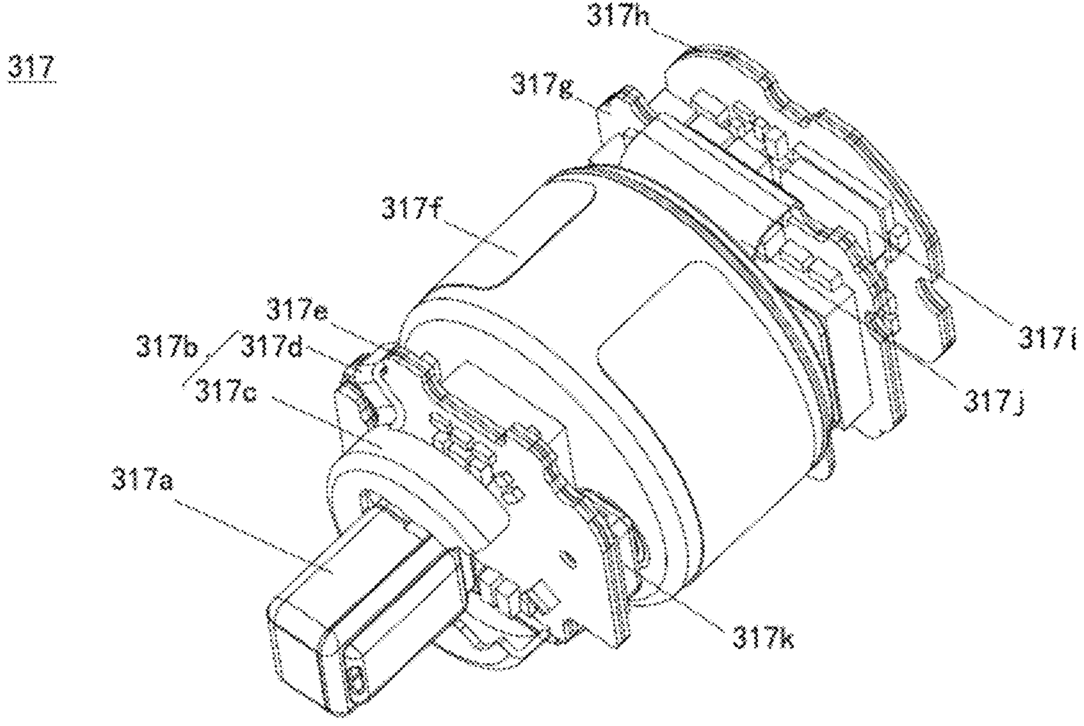
Figure 126:
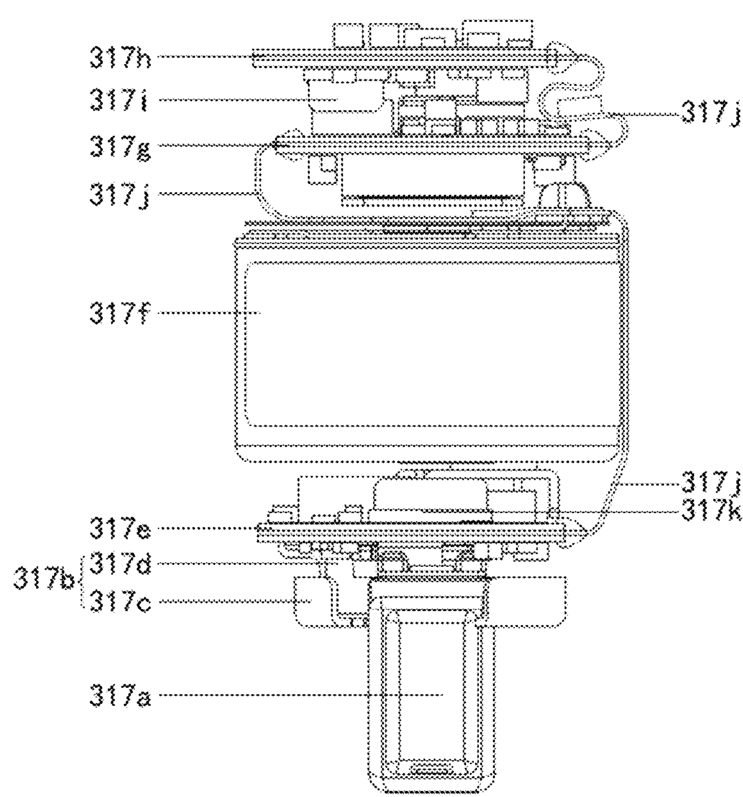

FIG. 125 and FIG. 126 each show a schematic structure of the electronic assembly 317 according to this embodiment. It may be understood that a structure of the electronic assembly 317 to be described below is merely an example, and is not intended to limit embodiments of this application.

As shown in FIG. 125 and FIG. 126, the electronic assembly 317 may include the first earphone circuit board assembly 317*e*, the second earphone circuit board assembly 317*g*, the third earphone circuit board assembly 317*h*, a flexible circuit board 317*j*, a speaker 317*a*, a wearing detection plate 317*b*, a secondary microphone 317*k*, an earphone battery 317*f*, and a primary microphone 317*i*.

First Earphone Circuit Board Assembly 317*e*, Second Earphone Circuit Board Assembly 317*g*, and Third Earphone Circuit Board Assembly 317*h*

The first earphone circuit board assembly 317*e*, the second earphone circuit board assembly 317*g*, and the third earphone circuit board assembly 317*h* are sequentially stacked and arranged at spacings, and the three may be electrically connected through the flexible circuit board 317*j*. The first earphone circuit board assembly 317*e*, the second earphone circuit board assembly 317*g*, and the third earphone circuit board assembly 317*h* each may include a circuit board and a circuit and a component arranged on the circuit board.

For example, a wearing detection sensor may be arranged on the circuit board of the first earphone circuit board assembly 317*e*, and the wearing detection sensor is configured to implement wearing detection of the first earphone 31. The wearing detection sensor may include, for example, at least one of a gravity sensor (gravity sensor, G-sensor), an inertial measurement unit (inertial measurement unit, IMU) sensor, a bone conduction sensor, an infrared (infrared radiation, IR) sensor, a voice accelerometer (voice accelerometer, VACC), a voice pickup unit (voice pickup unit, VPU), and the like. A magnetic field sensor may be further arranged on the circuit board of the first earphone circuit board assembly 317*e*, and the magnetic field sensor is configured to detect a variation of a magnetic flux of a host magnet, to implement box-in and box-out detection of the first earphone 31 (a principle of box-in and box-out detection is further described below). The magnetic field sensor is, for example, a Hall effect sensor or a magnetometer. For example, there may be two magnetic field sensors. For example, a charging circuit and a discharging circuit may be arranged on the circuit board of the second earphone circuit board assembly 317*g*. For example, a radio frequency circuit may be arranged on the circuit board of the third earphone circuit board assembly 317*h*.

Speaker 317*a*

As shown in FIG. 126, the speaker 317*a* may be electrically connected to the circuit board of the first earphone circuit board assembly 317*e*. The speaker 317*a* may be located on a side that is of the first earphone circuit board assembly 317*e* and that is far away from the second earphone circuit board assembly 317*g*.

Wearing Detection Plate 317*b*

As shown in FIG. 125 and FIG. 126, the wearing detection plate 317*b* may include a plate 317*c* and a connection pin 317*d* that are connected, and the connection pin 317*d* is led out from the plate 317*c*, and may be electrically connected (for example, soldered) to the circuit board of the first earphone circuit board assembly 317*e*. The plate 317*c* may be located on a same side of the first earphone circuit board assembly 317*e* as the speaker 317*a*. The wearing detection plate 317*b* can conduct electricity, for example, may be made of a metal material. When the wearing detection plate 317*b* is close to the human body, a coupling capacitance can be generated. When a distance between the wearing detection plate 317*b* and the human body changes, a coupling capacitance value changes. Wearing detection of the first earphone 31 may be implemented through detecting and processing of the coupling capacitance value of the wearing detection plate 317*b*.

Secondary Microphone 317*k*

As shown in FIG. 125 and FIG. 126, the secondary microphone 317*k* is located on a side that is of the first earphone circuit board assembly 317*e* and that is far away from the speaker 317*a*, and may be electrically connected to the circuit board of the first earphone circuit board assembly 317*e*. The secondary microphone 317*k* may be arranged on the circuit board of the first earphone circuit board assembly 317*e*. A through hole may be provided at a part, corresponding to the secondary microphone 317*k*, on the circuit board of the first earphone circuit board assembly 317*e*, and a voice can be picked up by the secondary microphone 317*k* through the through hole. The secondary microphone 317*k* is configured to implement noise reduction, and may be further configured to perform wearing detection.

Earphone Battery 317*f*

As shown in FIG. 125 and FIG. 126, the earphone battery 317*f* may be located between the first earphone circuit board assembly 317*e* and the second earphone circuit board assembly 317*g*. An electrode pin of the earphone battery 317*f* may be electrically connected to the circuit board of the first earphone circuit board assembly 317*e*.

Primary Microphone 317*i*

As shown in FIG. 125 and FIG. 126, the primary microphone 317*i* may be located between the second earphone circuit board assembly 317*g* and the third earphone circuit board assembly 317*h*, and may be electrically connected to the circuit board of the third earphone circuit board assembly 317*h*. The primary microphone 317*i* may be arranged on the circuit board of the third earphone circuit board assembly 317*h*. A through hole may be provided at a position, corresponding to the primary microphone 317*i*, on the circuit board of the third earphone circuit board assembly 317*h*, and a human voice may be picked up by the primary microphone 317*i* through the through hole.

Figure 127:
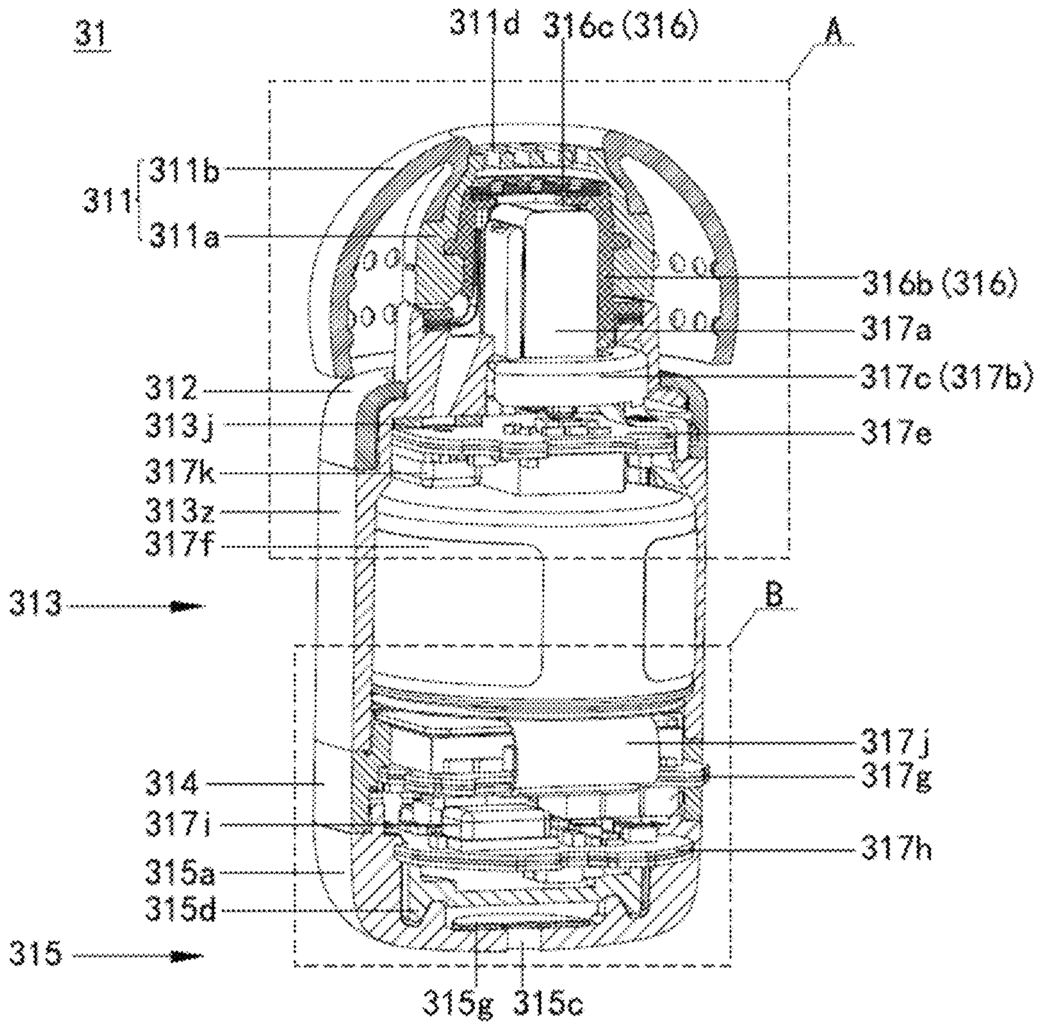
Figure 128:
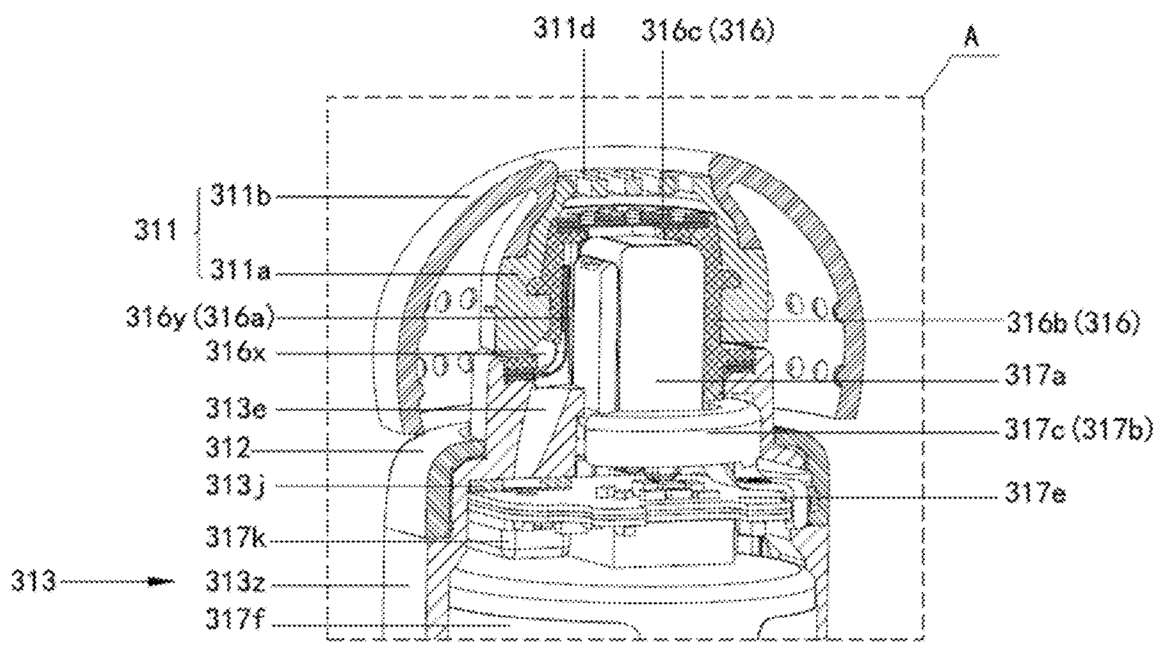
Figure 129:
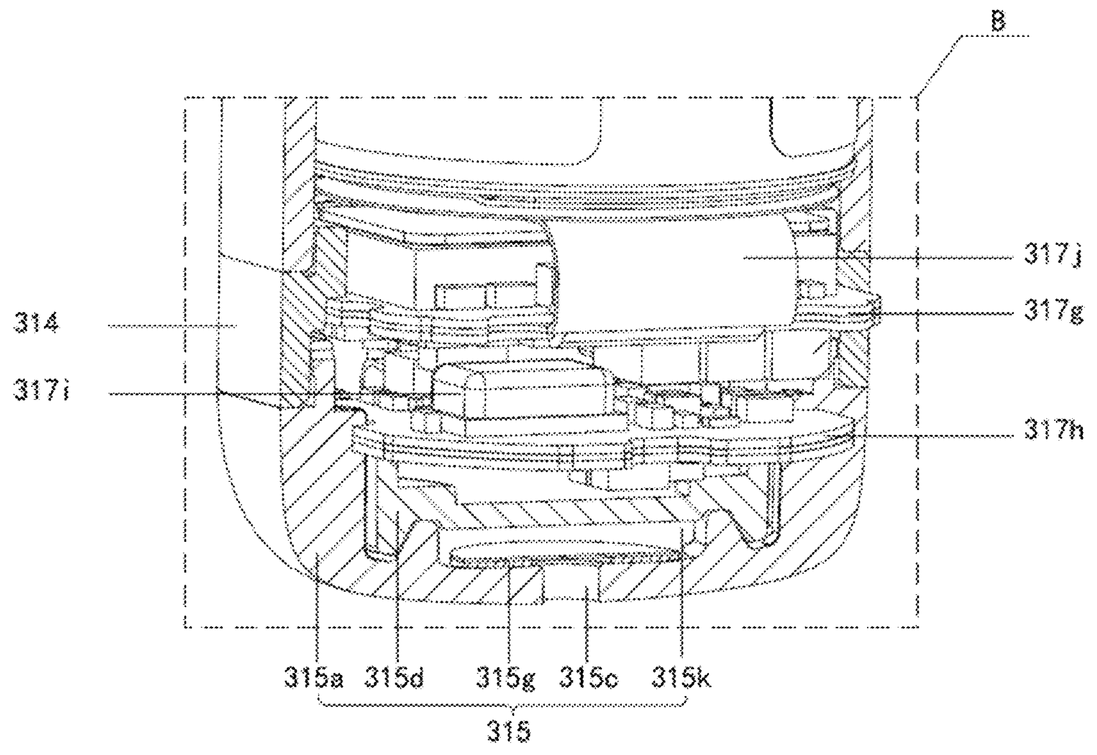

FIG. 127 shows an assembly structure including the electronic assembly 317 and another component of the first earphone 31. FIG. 128 is a partially enlarged schematic diagram at a position A in FIG. 127, and FIG. 129 is a partially enlarged schematic diagram at a position B in FIG. 127.

As shown in FIG. 127, the electronic assembly 317 may be accommodated in an inner cavity enclosed by the earplug support assembly 316, the earphone front-housing assembly 313, the second electrode 314, and the earphone rear-housing assembly 315.

As shown in FIG. 128, at least a part of the speaker 317*a* may be located in the inner cavity of the earplug support 316*b*. A sound wave emitted by the speaker 317*a* may be transmitted through the speaker mesh 316*c* and the voice-emitting through hole 311*d*, and enter the ear canal. Because of the front vent 316*x*, atmospheric pressure in the inner cavity of the earplug support 316*b* is balanced with external atmospheric pressure, to ensure that the speaker 317*a* can normally work. In addition, the front vent 316*x* can also improve a noise reduction depth of the secondary microphone 317*k*.

As shown in FIG. 128, for example, the plate 317*c* of the wearing detection plate 317*b* may be fixedly connected (for example, soldered) to an end that is of the earplug support 316*b* and that is far away from the speaker mesh 316*c*, and the wearing detection plate 317*b* and the earplug support 316*b* may be connected to form a conductor having a large area. Therefore, both the wearing detection plate 317*b* and the earplug support 316*b* may generate coupling capacitances, so that the wearing detection plate 317*b* and the earplug support 316*b* may be used for wearing detection. In other words, in addition to providing support and accommodating functions, the earplug support 316*b* may be further reused as a detection plate for wearing detection.

It may be understood that, based on a product requirement, the assembly structure including the wearing detection plate and the earplug support may alternatively be in another form, and is not limited to the foregoing descriptions. For example, if only a part of the earplug support is made of a conductive material, the wearing detection plate may be fixedly connected to the part of the earplug support, and the assembly structure including the wearing detection plate and the earplug support may be designed based on respective structures of the wearing detection plate and the earplug support and an inner space of the first earphone.

In this embodiment, the wearing detection plate 317*b* and the earplug support 316*b* are jointly used as a detection plate for wearing detection, so that an area of the detection plate can be increased, and consistency and reliability of wearing detection can be ensured. Because the earplug support 316*b* is closer to the inside of the ear canal than the wearing detection plate 317*b*, capacitance detection data of the earplug support 316*b* is more accurate and reliable. This helps improve overall reliability of wearing detection. In addition, when the earplug support 316*b* is reused as a detection plate used for wearing detection, an overall size of the first earphone 31 is not affected, and a stacking space in the first earphone 31 can be further reduced.

In addition, if the earplug support 316*b* is manufactured by using a material with high strength such as metal, a wall thickness and an overall structural size of the earplug support 316*b* may be small on a premise that structural strength of the earplug support 316*b* meets a requirement. This can enable the earplug outer cover 311*b* to have a sufficient compression deformation space, thereby helping ensure wearing comfort of the user.

In this embodiment, for example, the wearing detection sensor, the wearing detection plate 317*b*, and the earplug support 316*b* may be jointly used to implement wearing detection. This design can greatly improve consistency and reliability of wearing detection, and reduce a probability of false detection.

Based on a product requirement, in another embodiment, any one or any two of the wearing detection sensor, the wearing detection plate 317*b*, and the earplug support 316*b* may alternatively be used to implement wearing detection.

As shown in FIG. 128, the first earphone circuit board assembly 317*e* may be located in the earphone front housing 313*z*. With reference to FIG. 102, FIG. 87, FIG. 88, and FIG. 128, the conduction portion 312*b* of the first electrode 312 may pass through the through hole 313*d* of the earphone front housing 313*z*, and is electrically connected (for example, soldered) to the circuit board of the first earphone circuit board assembly 317*e*, so that the first electrode 312 is used as a charging electrode.

As shown in FIG. 128, a side of the circuit board of the first earphone circuit board assembly 317*e* may be attached to the noise reduction microphone mesh 313*j*. The secondary microphone 317*k* is located on the other side of the circuit board, and the secondary microphone 317*k* may correspond to the noise reduction microphone mesh 313*j*. Noise in the ear canal may sequentially pass through the speaker mesh 316*c*, the voice pickup channel 313*e*, the noise reduction microphone mesh 313*j*, and the through hole that is on the circuit board of the first earphone circuit board assembly 317*e* and that corresponds to the secondary microphone 317*k*, and be picked up by the secondary microphone 317*k*. The speaker 317*a* may generate a phase-inverted signal whose phase is opposite to a phase of the noise signal, and the phase-inverted signal may cancel the noise signal. In this way, the first earphone 31 can implement active noise reduction.

When the first earphone 31 works, the voice of the speaker 317*a* and the noise in the ear canal may pass through the front vent acoustic mesh 316*a*, and leak to the outside through the front vent 316*x*. In this way, pressure inside and outside the ear canal can be balanced, to improve wearing comfort of the user. The front vent acoustic mesh 316*a* that blocks the front vent 316*x* may alternatively be removed. In this case, the front vent 316*x* may be made small. For example, a diameter of the front vent 316*x* is less than 0.22 mm.

In addition, the secondary microphone 317*k* may also be used for wearing detection, and a principle is that the speaker 317*a* may send a sound wave signal of a specific frequency. If the first earphone 31 is not worn by the user, a large quantity of sound wave signals may be leaked to the outside through the front vent 316*x*, and signal strength of the sound wave signals picked up by the secondary microphone 317*k* is low. If the first earphone 31 is worn by the user, because the front vent 316*x* is blocked to an extent or completely, the secondary microphone 317*k* can pick up more sound wave signals, and signal strength of the sound wave signals picked up by the secondary microphone 317*k* is high. Therefore, whether the first earphone 31 is worn by the user may be determined through detection on signal strength of a signal picked up by the secondary microphone 317*k*.

As shown in FIG. 129, the second earphone circuit board assembly 317*g* may be located on an inner side of the second electrode 314. With reference to FIG. 111 and FIG. 129, the conduction portion 314*c* of the second electrode 314 may be electrically connected (for example, soldered) to the circuit board of the second earphone circuit board assembly 317*g*, so that the second electrode 314 is used as a charging electrode.

As shown in FIG. 129, the third earphone circuit board assembly 317*h* may be carried on the rear housing support 315*d*. With reference to FIG. 129 and FIG. 120, a side that is of the third earphone circuit board assembly 317*h* and that is far away from the primary microphone 317*i* may be attached to the second primary microphone mesh 315*e*. The primary microphone 317*i* may correspond to the second primary microphone mesh 315*e*. A voice emitted by the user may sequentially pass through the voice pickup through hole 315*c*, the first primary microphone mesh 315*g*, the through hole 315*j* on the rear housing support 315*d*, the second primary microphone mesh 315*e*, and the through hole that is on the circuit board of the third earphone circuit board assembly 317*h* and that corresponds to the primary microphone 317*i*, and be picked up by the primary microphone 317*i*.

With reference to FIG. 129 and FIG. 120, after entering a wind noise prevention cavity 315*k* from one wind noise prevention through hole 315*b*, an external airflow may flow out of the wind noise prevention cavity 315*k* from another wind noise prevention through hole 315*b*. In this way, wind noise caused by the external airflow can be reduced or prevented from being picked up by the primary microphone 317*i*.

With reference to FIG. 116 and FIG. 129, the head end 315*z*1 and the head end 315*y*1 of the antenna 315*f* each are connected to, for example, soldered, a feed point on the circuit board of the third earphone circuit board assembly 317*h*. The two feed points may be symmetric with respect to the center line of the first earphone 31. In this way, the antenna 315*f* can radiate and receive signals.

Features and Functions of the Wearable Device 1

In this embodiment, because the wearable device 1 includes the host 2 and the earphone, the wearable device 1 may have the following features and functions. For some features or functions that the host 2 and the earphone both have, because the first earphone (for example, the first earphone 31, the first earphone 41, and the first earphone 51) is completely consistent with the second earphone, for brevity, the first earphone 31 is mainly used as an example for description.

1. When the Host 2 is Opened, the First Earphone 31 is Attached to the First Part 21 of the Host 2.

With reference to FIG. 1 and FIG. 4, in this embodiment, when the host 2 is in the closed state, the first earphone 31 is accommodated in a space enclosed by the first accommodation groove 213*y* of the first part 21 and the third accommodation groove 231*f* of the second part 23.

Figure 130:
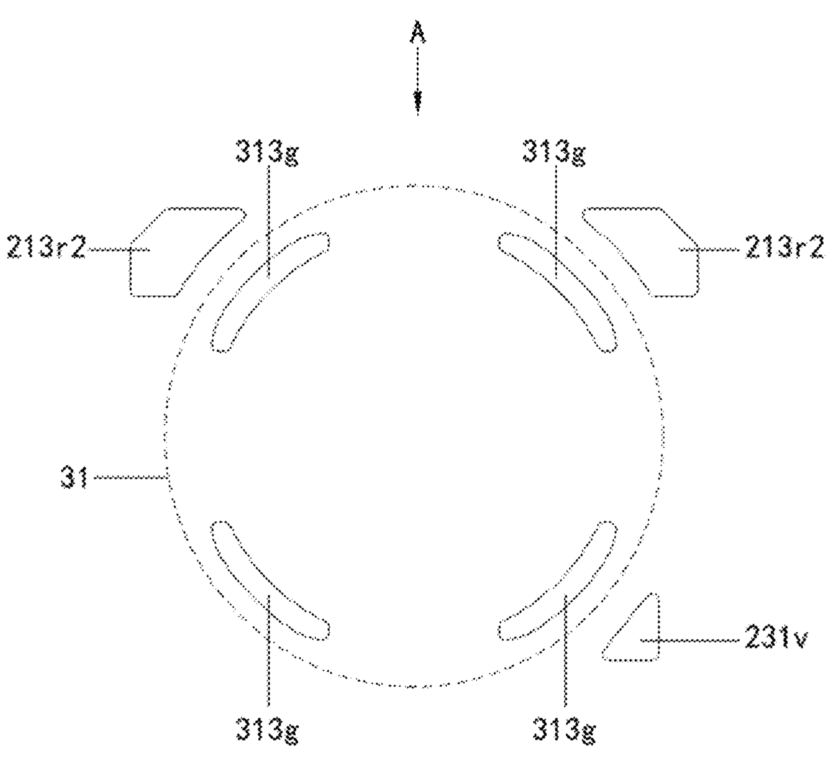

FIG. 130 shows, from a side-view perspective, a position relationship between the first host attachment magnet 213*r*2 in the first part 21, the second host attachment magnet 231*v* in the second part 23, and the earphone magnet 313*g* in the first earphone 31 when the host 2 is in the closed state. As shown in FIG. 130, the first host attachment magnet 213*r*2 and the second host attachment magnet 231*v* each are magnetically attracted to the earphone magnet 313*g*.

In this embodiment, a magnetic field of the first host attachment magnet 213*r*2 is strong, and a magnetic attraction force between the first host attachment magnet 213*r*2 and the earphone magnet 313*g* is large; and a magnetic field of the second host attachment magnet 231*v* is weak, and a magnetic attraction force between the second host attachment magnet 231*v* and the earphone magnet 313*g* is small. Refer to FIG. 1 to FIG. 4. When the host 2 is gradually opened from the closed state, because the magnetic attraction force of the first host attachment magnet 213*r*2 is greater than the magnetic attraction force of the second host attachment magnet 231*v*, the first earphone 31 is attached to the first part 21, and rotates with the first part 21 relative to the second part 23.

In this embodiment, to enable a strong magnetic attraction force between the first host attachment magnet 213*r*2 and the earphone magnet 313*g*, an appropriate magnet design may be performed.

Figure 131:
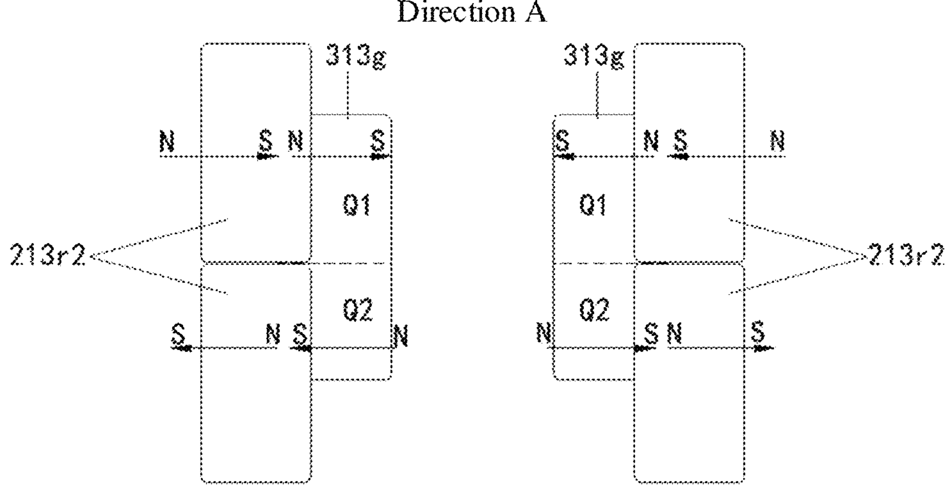

As shown in FIG. 131, in an implementation 1 of this embodiment, each first host attachment magnet 213*r*2 is a Halbach array formed by splicing two single magnets, and magnetic field directions (represented by using arrows pointing from N to S) of the two single magnets are different, so that each first host attachment magnet 213*r*2 has two magnetic field directions. With reference to FIG. 131 and FIG. 130, schematically, in each first host attachment magnet 213*r*2, a magnetic field direction of one single magnet (for example, a single magnet in an upper part in FIG. 131) roughly points from a radial outer side of the first earphone 31 to a radial inner side, and a magnetic field direction of the other single magnet (for example, a single magnet in a lower part in FIG. 131) roughly points from the radial inner side of the first earphone 31 to the radial outer side.

As shown in FIG. 131, each earphone magnet 313*g* may be a Halbach array formed by a single magnet, and different parts of each earphone magnet 313*g* may have different magnetic field directions. With reference to FIG. 131 and FIG. 130, schematically, a magnetic field direction of a part Q1 of each earphone magnet 313*g* roughly points from the radial outer side of the first earphone 31 to the radial inner side, and a magnetic field direction of the other part Q2 roughly points from the radial inner side of the first earphone 31 to the radial outer side. A design in which each earphone magnet 313*g* is a single magnet can reduce assembly difficulty of the earphone magnet 313*g*. In another implementation, each earphone magnet 313*g* may alternatively be formed by splicing several (for example, two) single magnets.

The design of the first host attachment magnet 213*r*2 and the earphone magnet 313*g* enables the first host attachment magnet 213*r*2 to be magnetically attracted to the earphone magnet 313*g*. In addition, through product verification, this design enables a large magnetic attraction force between the first host attachment magnet 213*r*2 and the earphone magnet 313*g*.

Different from that in the implementation 1, as shown in FIG. 132, in an implementation 2 of this embodiment, each first host attachment magnet 213*r*2 is a Halbach array having four magnetic field directions. Each first host attachment magnet 213*r*2 may be formed by splicing four single magnets, or may be a single magnet having four magnetic field directions. The magnet design in the implementation 2 can meet a design requirement that the first earphone 31 is magnetically attracted to the first part 21.

Different from that in the implementation 1, as shown in FIG. 133, in an implementation 3 of this embodiment, each first host attachment magnet 213*r*2 is a single magnet having a single magnetic field direction. For example, the magnetic field direction of each first host attachment magnet 213*r*2 may roughly point from the radial inner side of the first earphone 31 to the radial outer side. Each earphone magnet 313*g* is a single magnet having a single magnetic field direction. For example, the magnetic field direction of each earphone magnet 313*g* may roughly point from the radial inner side of the first earphone 31 to the radial outer side. The magnet design in the implementation 3 can meet a design requirement that the first earphone 31 is magnetically attracted to the first part 21.

Different from that in the implementation 1, as shown in FIG. 134, in an implementation 4 of this embodiment, each first host attachment magnet 213*r*2 is a Halbach array having three magnetic field directions. Each first host attachment magnet 213*r*2 may be formed by splicing three single magnets, or may be a single magnet having three magnetic field directions. Each earphone magnet 313*g* may have a single magnetic field direction. In addition, the first electrode 312 and the second electrode 314 may be manufactured by using a material that can be magnetically attracted by the first host attachment magnet 213*r*2, for example, a magnetic conductive material (for example, steel plate cold common (steel plate cold common, SPCC) or SUS430). Both the first electrode 312 and the second electrode 314 may be magnetically attracted to the first host attachment magnet 213*r*2. The magnet design in the implementation 4 can not only meet a design requirement that the first earphone 31 is magnetically attracted to the first part 21, but also has a simple design structure, is easy to be manufactured, and has low costs.

Alternatively, different from that in the implementations, in an implementation 5, the first earphone 31 may not need to have a built-in earphone magnet. The first electrode 312 and the second electrode 314 may be manufactured by using a material that can be magnetically attracted by the first host attachment magnet 213*r*2, for example, a magnetic conductive material (for example, SPCC or SUS430). As shown in FIG. 135, both the first electrode 312 and the second electrode 314 may be magnetically attracted to the first host attachment magnet 213*r*2. In the implementation 5, the first host attachment magnet 213*r*2 may be flexibly designed based on a requirement, and may have a single magnetic field direction or several magnetic field directions. The magnet design in the implementation 5 can not only meet a design requirement that the first earphone 31 is magnetically attracted to the first part 21, but also has a simple design structure, is easy to be manufactured, and has low costs.

In this embodiment, as shown in FIG. 136, because the radial size of the first earphone 31 may be at least twice the groove depth of the first accommodation groove 213*y*, a majority of the first earphone 31 is exposed outside the first accommodation groove 213*y*. This design is convenient for the user to directly take the first earphone 31 from the first part 21 after the host 2 is opened.

In the foregoing implementations, the magnet design of the first host attachment magnet 213*r*2 and the earphone magnet 313*g* is described. Actually, a magnet design may also be performed on the second host attachment magnet 231*v* and the earphone magnet 313*g* with reference to the foregoing principle, provided that magnetic field strength of the second host attachment magnet 231*v* is less than magnetic field strength of the first host attachment magnet 213*r*2.

It may be understood from the foregoing descriptions that, based on a product requirement, in another embodiment, magnetic field strength of the first host attachment magnet 213*r*2 may alternatively be less than magnetic field strength of the second host attachment magnet 231*v*, so that after the host 2 is opened, the first earphone 31 is not sucked up by the first part 21, but is still accommodated in the second part 23. Alternatively, no first accommodation groove is provided on the first part of the host, and the first earphone may be attached to the first part after the host is opened.

2. When the First Earphone 31 is Placed on the First Part 21, the First Earphone 31 May be Automatically Placed in Position.

As shown in FIG. 137, FIG. 138, and FIG. 139, after the host 2 is opened and the first earphone 31 is taken out from the host 2, the user may pick up the first earphone 31 and enable the first earphone 31 to be in a posture roughly matching the first accommodation groove 213*y* (to be specific, the earplug 311 of the first earphone 31 roughly faces an end that is of the first accommodation groove 213*y* and that is configured to accommodate the earplug 311, the earphone rear-housing assembly 315 of the first earphone 31 roughly faces an end that is of the first accommodation groove 213*y* and that is configured to accommodate the earphone rear-housing assembly 315, and the first earphone 31 may rotate around the center line of the first accommodation groove 213*y* at any angle), and then put the first earphone 31 close to the first accommodation groove 213*y*. Under an effect of the magnetic attraction force of the first host attachment magnet 213*r*2 in the first part 21 on the earphone magnet 313*g* in the first earphone 31, the first earphone 31 is corrected to a posture matching the first accommodation groove 213*y*, and is automatically adsorbed in the first accommodation groove 213*y*, so that the first earphone 31 can be accurately and appropriately placed into the first accommodation groove 213*y*.

According to the automatic in-position design in this embodiment, the user can conveniently place the first earphone 31 on the host 2, and the placement can be completed without precise alignment, thereby improving user experience.

3. When the First Earphone 31 is Placed into the Second Part 23, and the First Earphone 31 is not Easy to be Separated from the Second Part 23.

If the user places the first earphone 31 in the third accommodation groove 231*f* of the second part 23, the first earphone 31 is adsorbed in the third accommodation groove 231*f* under an effect of the magnetic attraction force of the second host attachment magnet 231*v* in the second part 23 on the earphone magnet 313*g* in the first earphone 31. Even if the host 2 is turned over, the first earphone 31 is not detached from the third accommodation groove 231*f*.

In addition, both the second charging spring 231*c* and the first charging spring 231*e* in the third accommodation groove 231*f* may apply specific extrusion pressure to the first earphone 31, and the extrusion pressure can increase friction between the first earphone 31 and the second host housing 231 in the second part 23, so that it is more difficult for the first earphone 31 to be detached from the third accommodation groove 231*f*.

4. The First Earphone 31 May be Placed into the Accommodation Groove at a Random Angle.

In this embodiment, the first earphone 31 can overlap the first earphone 31 each time the first earphone 31 is rotated around the center line of the first earphone 31 by a specific angle. Therefore, the rotated first earphone 31 can always be accurately accommodated in the first accommodation groove 213*y* or the third accommodation groove 231*f*, and adapt to the inner wall of the first accommodation groove 213*y* or the third accommodation groove 231*f*. This enables the user to place the first earphone 31 into the first accommodation groove 213*y* or the third accommodation groove 231*f* without holding the first earphone 31 at a fixed angle.

For example, for the first earphone 31 that is roughly octahedron, the first earphone 31 can overlap the first earphone 31 each time the first earphone 31 is rotated around the center line of the first earphone 31 by 90°. Even if the user rotates the first earphone 31 by 90°, 180°, 270°, or the like, the first earphone 31 can still adapt to the inner wall of the first accommodation groove 213*y* or the third accommodation groove 231*f*. Therefore, the first earphone 31 can be smoothly and accurately placed into the first accommodation groove 213*y* or the third accommodation groove 231*f*. In addition, with reference to FIG. 137 to FIG. 139, when the first earphone 31 is placed into the first accommodation groove 213*y*, because the magnetic force of the first host attachment magnet 213*r*2 has an angle correction function, even if the user rotates the first earphone 31 randomly (for example, rotates 10°, 35°, or) 55°, the magnetic force of the first host attachment magnet 213*r*2 can correct an angle of the first earphone 31 to a normal angle. In this way, the first earphone 31 can be smoothly and accurately placed into the first accommodation groove 213*y*, and adapt to the inner wall of the first accommodation groove 213*y*.

For example, for the first earphone 31 that is roughly cylindrical, the first earphone 31 can overlap the first earphone 31 after being rotated around the center line of the first earphone 31 by any angle. Therefore, even if the user rotates the first earphone 31 by any angle, the first earphone 31 can still adapt to the inner wall of the first accommodation groove or the third accommodation groove. In this way, the first earphone 31 can be smoothly and accurately placed into the first accommodation groove or the third accommodation groove.

5. Detection of the Open/Closed State of the Host 2

As shown in FIG. 140, the first part 21 of the host 2 has a magnetic field sensor 212*g* (which may be referred to as a first magnetic field sensor), and the magnetic field sensor 212*g* may be, for example, disposed on the circuit board 212*a* in the first part 21. The magnetic field sensor 212*g* is configured to detect a magnetic flux of the state detection magnet 231*x* in the second part 23 of the host 2. The magnetic flux of the state detection magnet 231*x* detected by the magnetic field sensor 212*g* may be in direct proportion to a spacing between the magnetic field sensor 212*g* and the state detection magnet 231*x*. When the host 2 is in the closed state, the magnetic flux detected by the magnetic field sensor 212*g* is the largest. When the host 2 is completely opened, the magnetic flux detected by the magnetic field sensor 212*g* is the smallest.

In this embodiment, the magnetic field sensor 212*g* may be, for example, a Hall effect sensor or a magnetometer. The Hall effect sensor can detect a change of the magnetic flux. When the Hall effect sensor detects that the magnetic flux exceeds a hardware threshold of the Hall effect sensor, the Hall effect sensor can generate a corresponding signal and report the signal to a processor of the host 2. The processor of the host 2 may perform corresponding processing based on the signal of the Hall effect sensor. Different from the Hall effect sensor, the magnetometer can detect a value of the magnetic flux and report the value to the processor of the host 2. The processor of the host 2 may determine whether the magnetic flux detected by the magnetometer exceeds a software threshold built in the processor, and perform corresponding processing based on a determining result. The following uses an example in which the magnetic field sensor 212*g* is a Hall effect sensor for description.

As shown in FIG. 140, after the user presses the cap 251, the host 2 is gradually opened from the closed state, the spacing between the magnetic field sensor 212*g* and the state detection magnet 231*x* gradually increases, and the magnetic flux of the state detection magnet 231*x* detected by the magnetic field sensor 212*g* tends to decrease. When the magnetic flux detected by the magnetic field sensor 212*g* is less than a first threshold, a first signal may be generated. The processor of the host 2 determines, based on the first signal, that the host 2 is in the open state.

On the contrary, when the host 2 is gradually closed from the open state, the spacing between the magnetic field sensor 212*g* and the state detection magnet 231*x* gradually decreases, and the magnetic flux of the state detection magnet 231*x* detected by the magnetic field sensor 212*g* tends to increase. When the magnetic flux detected by the magnetic field sensor 212*g* is greater than a second threshold, a second signal may be generated. The processor of the host 2 determines, based on the second signal, that the host 2 is in the closed state.

In this embodiment, when the processor of the host 2 determines that the host 2 is in the open state, the processor controls the display 211 to perform corresponding interface display.

In this embodiment, when it is determined that the host 2 is in the open state and the first earphone 31 is in the third accommodation groove 231*f* (the following describes how to detect whether the first earphone 31 is located in the third accommodation groove 231*f*), the communication electrode of the host 2 may send a signal to the communication electrode of the first earphone 31, to wake up the first earphone 31. When it is determined that the host 2 is in the closed state and the first earphone 31 is located in the host 2, the host 2 may start foreign matter detection, and after determining that no foreign matter enters, start charging the first earphone 31. In another embodiment, positions of the magnetic field sensor 212*g* and the state detection magnet 231*x* may be interchanged. To be specific, the magnetic field sensor 212*g* may be in the second part 23, and the state detection magnet 231*x* may be in the first part 21.

6. Detection of an In-Box/Out-Box State of the First Earphone 31

The in-box/out-box state of the first earphone 31 refers to a relative position relationship between the first earphone 31 and the first accommodation groove 213*y* and a relative position relationship between the first earphone 31 and the third accommodation groove 231*f*, and includes several position states, such as the first earphone 31 is in the first accommodation groove 213*y* and in the third accommodation groove 231*f* (the host 2 is closed and the first earphone 31 is in the host 2), the first earphone 31 is located in the first accommodation groove 213*y* and outside the third accommodation groove 231*f* (the host 2 is opened and the first earphone 31 is attached to the first part 21), or the first earphone 31 is located in the third accommodation groove 231*f* and outside the first accommodation groove 213*y* (the host 2 is opened and the first earphone 31 is attached to the second part 23).

In this embodiment, both the host 2 and the first earphone 31 may detect the in-box/out-box state of the first earphone 31. Descriptions are sequentially provided below.

(1) The Host 2 Detects the In-Box/Out-Box State of the First Earphone 31

As shown in FIG. 141, the second part 23 of the host 2 has a magnetic field sensor 237 and a magnetic field sensor 238 (both may be referred to as second magnetic field sensors, as shown in dashed boxes). The magnetic field sensor 237 may be close to an outer surface of the groove wall of the third accommodation groove 231*f*, and the magnetic field sensor 238 may be close to an outer surface of the groove wall of the fourth accommodation groove 231*g*. The magnetic field sensor 237 and the magnetic field sensor 238 each may be, for example, a single-axis Hall effect sensor or a magnetometer. The following uses an example in which the magnetic field sensor 237 and the magnetic field sensor 238 each are a Hall effect sensor for description.

The magnetic field sensor 237 is configured to detect a change of a magnetic flux of the earphone magnet 313*g* in the first earphone 31. The magnetic flux of the earphone magnet 313*g* detected by the magnetic field sensor 237 may be in direct proportion to a distance between the magnetic field sensor 237 and the earphone magnet 313*g*. When the first earphone 31 is located in the third accommodation groove 231*f* (which may be that the host 2 is closed and the first earphone 31 is in the host 2, or the host 2 is opened and the first earphone 31 is attached to the second part 23), the magnetic flux detected by the magnetic field sensor 237 is large. When the first earphone 31 leaves the third accommodation groove 231*f* and is attached to the first part 21, the magnetic flux detected by the magnetic field sensor 237 is small.

In this embodiment, when the magnetic flux detected by the magnetic field sensor 237 is greater than or equal to a third threshold, a third signal may be generated. The processor of the host 2 determines, based on the third signal, that the first earphone 31 is located in the third accommodation groove 231*f*.

In this embodiment, the processor of the host 2 may determine the in-box/out-box state of the first earphone 31 by combining the third signal sent by the magnetic field sensor 237 and the first signal or the second signal sent by the magnetic field sensor 212*g*. For example, when the processor receives the third signal and the first signal, the processor determines that the host 2 is opened and the first earphone 31 is attached to the second part 23. When the processor receives the third signal and the second signal, the processor determines that the host 2 is closed and the first earphone 31 is in the host 2.

When the magnetic flux detected by the magnetic field sensor 237 is less than the third threshold but is greater than or equal to a fourth threshold, a fourth signal may be generated. The processor of the host 2 determines, based on the fourth signal, that the first earphone 31 leaves the third accommodation groove 231*f* and is attached to the first part 21 (as shown in FIG. 141).

Similarly, the magnetic field sensor 238 is configured to detect a change of a magnetic flux of the earphone magnet in the second earphone 32. As described above, the host 2 may determine an in-box/out-box state of the second earphone 32 by using a signal sent by the magnetic field sensor 238 or by combining signals sent by the magnetic field sensor 238 and the magnetic field sensor 212*g*.

In conclusion, it is easy to understand that the magnetic field sensor 237 located in the second part 23 is configured to determine whether the first earphone 31 is in the third accommodation groove 231*f* or outside the third accommodation groove 231*f*. Similarly, the magnetic field sensor 238 located in the second part 23 is configured to detect whether the second earphone 32 is in the fourth accommodation groove 231*g* or outside the fourth accommodation groove 231*g*.

In another embodiment, at least one of the magnetic field sensor 237 and the magnetic field sensor 238 may alternatively be located in the first part 21 of the host 2. For example, the magnetic field sensor 237 may be located in the first part 21 (for example, close to the outer surface of the groove wall of the first accommodation groove 213*y*). The change of the magnetic flux of the earphone magnet 313*g* in the first earphone 31 may be detected through the magnetic field sensor 237, to determine whether the first earphone 31 is in the first accommodation groove 213*y* or outside the first accommodation groove 213*y*. A specific principle is the same as that described above. Details are not described herein again.

In this embodiment, when the host 2 determines that the first earphone 31 is in the third accommodation groove 231*f* and the host 2 is in the open state, the communication electrode of the host 2 may send a signal to the communication electrode of the first earphone 31, to wake up the first earphone 31. The host 2 may further charge the first earphone 31 through the first charging spring 231*e* and the second charging spring 231*c*. In addition, the host 2 may further start a charging overheat protection mechanism (descriptions are provided below). Based on a product requirement, alternatively, the first earphone 31 may not need to be charged and the charging overheat protection mechanism may not be started.

In this embodiment, when the host 2 determines that the first earphone 31 is in the host 2 and the host 2 is in the closed state, the host 2 may start a foreign matter detection mechanism (descriptions are provided below), and may further charge the first earphone 31 and start the charging overheat protection mechanism. Based on a product requirement, alternatively, the first earphone 31 may not need to be charged and the charging overheat protection mechanism may not be started.

In another embodiment, when the host 2 determines that the first earphone 31 is in the first accommodation groove 213*y* and the host 2 is in the open state, the first earphone 31 is woken up (a principle is described below).

(2) The First Earphone 31 Detects the In-Box/Out-Box State of the First Earphone 31

As shown in FIG. 142, the first earphone 31 may have a magnetic field sensor 317*z* (which may be referred to as a third magnetic field sensor, as represented by a dashed box), and the magnetic field sensor 317*z* may be, for example, disposed on the circuit board of the third earphone circuit board assembly 317*h*. The magnetic field sensor 317*z* may be, for example, a Hall effect sensor or a magnetometer. The following uses an example in which the magnetic field sensor 317*z* is a Hall effect sensor for description.

The magnetic field sensor 317*z* is configured to detect a change of a magnetic flux of the state detection magnet 231*x* in the second part 23 of the host 2. The magnetic flux of the state detection magnet 231*x* detected by the magnetic field sensor 317*z* may be in direct proportion to a spacing between the magnetic field sensor 317*z* and the state detection magnet 231*x*. When the first earphone 31 is located in the third accommodation groove 231*f* (which may be that the host 2 is closed and the first earphone 31 is in the host 2, or the host 2 is opened and the first earphone 31 is attached to the second part 23), the magnetic flux detected by the magnetic field sensor 317*z* is large. When the first earphone 31 leaves the third accommodation groove 231*f* and is attached to the first part 21, the magnetic flux detected by the magnetic field sensor 317*z* is small.

In this embodiment, when the magnetic flux detected by the magnetic field sensor 317*z* is greater than or equal to a fifth threshold, a sixth signal may be generated. A controller of the first earphone 31 determines, based on the sixth signal, that the first earphone 31 is located in the third accommodation groove 231*f*.

In this embodiment, the controller (which may be a central processing unit or a microcontroller unit (microcontroller unit, MCU)) of the first earphone 31 may determine the in-box/out-box state of the first earphone 31 by combining the sixth signal sent by the magnetic field sensor 317*z* and the first signal or the second signal (the first signal and the second signal may be transmitted through the communication electrode of the host 2 and the communication electrode of the first earphone 31) sent by the magnetic field sensor 212*g*. For example, when the controller receives the sixth signal and the first signal, the controller determines that the host 2 is opened and the first earphone 31 is attached to the second part 23. When the controller receives the sixth signal and the second signal, the controller determines that the host 2 is closed and the first earphone 31 is in the host 2.

When the magnetic flux detected by the magnetic field sensor 317*z* is less than the fifth threshold but is greater than or equal to the sixth threshold, a seventh signal may be generated. The controller of the first earphone 31 determines, based on the seventh signal, that the first earphone 31 leaves the third accommodation groove 231*f* and is attached to the first part 21.

As shown in FIG. 142, the second earphone 32 may also have a magnetic field sensor 327*z* (represented by a dashed box), and the magnetic field sensor 327*z* is configured to detect a change of a magnetic flux of the magnet 231*w* in the second part 23. The magnetic field sensor 327*z* may be, for example, a single-axis Hall effect sensor. As described above, the second earphone 32 may determine an in-box/out-box state of the second earphone 32 by using a signal sent by the magnetic field sensor 327*z* or by combining signals sent by the magnetic field sensor 327*z* and the magnetic field sensor 212*g*.

In this embodiment, the first earphone 31 detects the in-box/out-box state of the first earphone 31, so that the first earphone 31 performs a corresponding operation.

If the host 2 is in the closed state, and the first earphone 31 detects that the first earphone 31 is located in the third accommodation groove 231*f*, the first earphone 31 may be in a sleep state.

If the host 2 is in the open state, and the first earphone 31 detects that the first earphone 31 is located in the third accommodation groove 231*f*, the first earphone 31 may be woken up by the host 2. For example, the communication electrode of the host 2 may send a signal to the communication electrode of the first earphone 31, to wake up the first earphone 31.

If the host 2 is in the open state, and the first earphone 31 detects that the first earphone 31 is attached to the first part 21, a detection signal of the magnetic field sensor 317*z* triggers the controller of the first earphone 31 to work, to wake up the first earphone 31.

In this embodiment, both the host 2 and the first earphone 31 can detect the in-box/out-box state of the first earphone 31, so that a risk that may be caused by detection performed only by the host 2 or the first earphone 31 can be avoided (for example, if detection is performed only by the host 2, the in-box/out-box state of the first earphone 31 cannot be accurately detected if power of the host 2 is exhausted), and reliability of detection of the in-box/out-box state of the first earphone 31 can be ensured.

7. Foreign Matter Detection Mechanism

In this embodiment, if foreign matter (for example, liquid or solid or semi-solid dirt) enters the third accommodation groove 231*f* of the host 2, surfaces of the host 2 and the first earphone 31 may be contaminated, corroded, and rusted, and even a function abnormality may be caused, thereby affecting reliability and service life of the product. In particular, if the second charging spring 231*c* and the first charging spring 231*e* in the third accommodation groove 231*f* are in contact with a large quantity of foreign matter, a charging abnormality (or a communication abnormality) may be caused.

In view of this, as shown in FIG. 143, the foreign matter detection spring 231*d* is further disposed in the third accommodation groove 231*f*, and is configured to implement foreign matter detection. A detection principle may be as follows:

When at least one of the foreign matter detection spring 231*d*, the first charging spring 231*e*, and the second charging spring 231*c* is in contact with the foreign matter, a waveform of a charging signal of the host 2 changes. For example, after the foreign matter detection spring 231*d* and the first charging spring 231*e* are in contact with the foreign matter, or after the foreign matter detection spring 231*d* and the second charging spring 231*c* are in contact with the foreign matter, or after the foreign matter detection spring 231*d*, the first charging spring 231*e*, and the second charging spring 231*c* are in contact with the foreign matter, the waveform of the charging signal of the charging circuit of the host 2 changes. Such a charging signal whose waveform changes may be referred to as an abnormal charging signal. If only at least one of the first charging spring 231*e* and the second charging spring 231*c* is in contact with the foreign matter, the waveform of the charging signal of the host 2 does not change. Such a charging signal whose waveform does not change may be referred to as a normal charging signal.

If only one of the first charging spring 231*e*, the second charging spring 231*c*, and the foreign matter detection spring 231*d* is in contact with the foreign matter or none of the first charging spring 231*e*, the second charging spring 231*c*, and the foreign matter detection spring 231*d* is in contact with the foreign matter, the waveform of the charging signal of the host 2 does not change. In other words, the charging circuit generates the normal charging signal.

Therefore, the processor of the host 2 may determine, based on a type of the charging signal, whether there is foreign matter entering the third accommodation groove 231*f*. For example, when determining that the charging signal is an abnormal charging signal, the processor determines that there is foreign matter entering the third accommodation groove 231*f*. On the contrary, when determining that the charging signal is a normal charging signal, the processor determines that no foreign matter enters the third accommodation groove 231*f*.

In this embodiment, when the host 2 determines that there is foreign matter entering the third accommodation groove 231*f*, the processor in the host 2 may control the charging circuit in the host 2 to be turned off. Therefore, when the first earphone 31 is accommodated in the third accommodation groove 231*f*, there is no charging current between the first charging spring 231*e* and the first electrode of the first earphone 31, and there is no charging current between the second charging spring 231*c* and the second electrode of the first earphone 31. In this way, a charging abnormality (for example, a short circuit) can be prevented.

In this embodiment, when the host 2 determines that there is foreign matter entering the third accommodation groove 231*f*, the processor of the host 2 may further control an alarm module in the host 2 to send an alarm, so as to send a warning to the user. The alarm module may be, for example, a speaker, a buzzer, or a motor in the host 2. It may be understood that, based on a product requirement, an alarm mechanism is not necessary.

In this embodiment, when the host 2 determines that no foreign matter enters the third accommodation groove 231*f*, the processor in the host 2 may control the charging circuit in the host 2 to be turned on. Therefore, when the first earphone 31 is accommodated in the third accommodation groove 231*f*, the host 2 normally charges the first earphone 31.

In another embodiment, based on a product requirement, the host may not have the foreign matter detection mechanism.

8. The Host 2 Charges the First Earphone 31

With reference to the foregoing descriptions, because of structure designs of the first electrode and the second electrode in the first earphone 31, after the first earphone 31 is placed into the third accommodation groove 231*f* at a plurality of rotation angles, the first charging spring 231*e* can be in contact with the first electrode 312, and the second charging spring 231*c* can be in contact with the second electrode 314, to ensure that the host 2 normally charges the first earphone 31. This design can simplify user operations and improve user experience.

9. Charging Overheat Protection Mechanism of the Host 2

In this embodiment, when the host 2 charges the first earphone 31, heat is generated. This may cause an excessively high temperature rise of the host 2 or the first earphone 31. For example, due to improper use of the user or a short circuit of an internal circuit, a charging current of the host 2 is excessively large, and in this case, a temperature rise is easily excessively high. An excessively high temperature affects safety, service life, and reliability of the product, and may affect user experience.

In view of this, the host 2 may have a temperature detection module, and the temperature detection module may be disposed, for example, near the first accommodation groove 213*y* and/or the third accommodation groove 231*f*. The temperature detection module may be, for example, a thermistor. The temperature detection module is configured to detect a temperature at a mounting position of the temperature detection module, and report the temperature to the processor of the host 2. The processor may determine, based on detection information of the temperature detection module, whether a temperature rise exceeds a threshold. When the temperature rise is greater than or equal to the threshold, the processor may control the charging circuit of the host 2 to be turned off, so that the host 2 may not charge the first earphone 31, to suppress the temperature rise. If the temperature rise is less than the threshold, the processor may control the charging circuit of the host 2 to be turned on, so that the host 2 can charge the first earphone 31. This charging overheat protection mechanism can improve the safety, service life, and reliability of the product, and ensure user experience.

In this embodiment, when the processor in the host 2 determines that the temperature rise is excessively high, the processor may further control an alarm module in the host 2 to send an alarm, so as to send a warning to the user. The alarm module may be, for example, a speaker, a buzzer, or a motor in the host 2. It may be understood that, based on a product requirement, an alarm mechanism is not necessary.

In another embodiment, based on a product requirement, the host may not have the charging overheat protection mechanism.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A rotating shaft assembly, comprising:

a shaft sleeve, a second shaft, and a flexible circuit board, wherein:

the shaft sleeve comprises an inner cavity;

a channel is formed on the second shaft, a first part of the second shaft is located in the inner cavity and is rotatably connected to the shaft sleeve, and a second part of the second shaft is located outside the inner cavity; and the flexible circuit board comprises a first electrical connection end, a mounting part, and a second electrical connection end, the mounting part is located between the first electrical connection end and the second electrical connection end, both the first electrical connection end and the second electrical connection end are located outside the inner cavity, the mounting part comprises a wound part and a laminated part that are connected, the wound part is wound around the first part of the second shaft, the laminated part is in a folded state, and at least a part of the laminated part is accommodated in the channel of the second shaft.

2. The rotating shaft assembly according to claim 1, wherein:

a joint between the wound part and the laminated part is fastened to the second shaft.

3. The rotating shaft assembly according to claim 1, wherein:

the flexible circuit board comprises a separation bracket, and the separation bracket is fastened between folded layers of the laminated part.

4. The rotating shaft assembly according to claim 1, wherein:

the inner cavity of the shaft sleeve comprises an opening that communicates with outside;

the rotating shaft assembly comprises a clamping member, the clamping member is provided with a clamping gap, the clamping member is fastened on an outer side of the shaft sleeve and blocks at least a part of an area of the opening of the inner cavity, and the clamping gap communicates with the inner cavity; and the flexible circuit board comprises a connection part, the connection part connects the first electrical connection end and the wound part, and the connection part passes through the opening of the inner cavity and the clamping gap.

5. The rotating shaft assembly according to claim 4, wherein:

an edge of the connection part forms a limiting portion, and the limiting portion is clamped with an edge of the clamping gap.

6. The rotating shaft assembly according to claim 1, wherein:

the flexible circuit board comprises a protective layer, and the protective layer is attached to a surface of the laminated part.

7. The rotating shaft assembly according to claim 1, wherein:

the flexible circuit board comprises a grounding portion, and the grounding portion is configured to be grounded.

8. The rotating shaft assembly according to claim 1, wherein:

the rotating shaft assembly further comprises a driven member, an elastic member, and a first shaft;

the driven member includes a shaft matching surface and a through hole, the through hole of the driven member penetrates the shaft matching surface, the driven member is located in the inner cavity, the driven member is capable of sliding along a surface of the inner cavity, and the driven member is not capable of rotating relative to the shaft sleeve;

the elastic member is located in the inner cavity and presses against a surface of the driven member, and the surface of the driven member is away from the shaft matching surface;

the first shaft and the second shaft are respectively located at two opposite ends of the shaft sleeve; a first part of the first shaft is located in the inner cavity and is rotatably connected to the shaft sleeve; the first part of the first shaft passes through the through hole of the driven member, and matches the shaft matching surface of the driven member to form a cam mechanism; and a second part of the first shaft is located outside the inner cavity; and the shaft sleeve is capable of rotating around the first shaft and the second shaft, and a rotation stroke of the shaft sleeve comprises a first stroke segment, a second stroke segment, and a third stroke segment, wherein:

in the first stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft;

in the second stroke segment, the shaft sleeve is capable of being driven by an external force to rotate around the first shaft and the second shaft, to drive the driven member to rotate around the first shaft; and in the third stroke segment, the driven member is capable of being driven by the rebound force of the elastic member to move along the first shaft, and the driven member is capable of rotating around the first shaft under the joint action of the cam mechanism and the elastic member, to drive the shaft sleeve to rotate around the first shaft and the second shaft.

9. The rotating shaft assembly according to claim 8, wherein:

the shaft matching surface comprises a first slope, a plane, and a second slope that are sequentially connected, the first slope and the plane form a first obtuse angle, the plane and the second slope form a second obtuse angle, and the first slope, the plane, and the second slope form a two-step ladder;

in the first stroke segment, the first slope is in slidable contact with the first part of the first shaft;

in the second stroke segment, the plane is in slidable contact with the first part of the first shaft; and in the third stroke segment, the second slope is in slidable contact with the first part of the first shaft.

10. The rotating shaft assembly according to claim 8, wherein:

a spacer plate is disposed in the inner cavity of the shaft sleeve, at least two matching grooves and two chutes are disposed on a surface of the spacer plate, the at least two matching grooves are located between the two chutes, the at least two matching grooves are sequentially connected, every two adjacent matching grooves of the at least two matching grooves include a common side wall, and each chute of the two chutes is connected to a matching groove of the at least two matching grooves;

the rotating shaft assembly further comprises a bump matching member, a bump is disposed on a surface of the bump matching member, the bump matching member penetrates the first part of the first shaft, the bump matching member is capable of moving along the first shaft, the bump matching member is not capable of rotating around the first shaft, and the bump of the bump matching member matches a chute of the two chutes or the matching groove;

the elastic member is located between the driven member and the bump matching member, and two opposite ends of the elastic member press against the driven member and the bump matching member respectively;

in the first stroke segment, the shaft sleeve rotates relative to the bump matching member, and the bump of the bump matching member is in slidable contact with an inner wall of a first chute of the two chutes;

in the second stroke segment, the shaft sleeve rotates relative to the bump matching member, and the bump of the bump matching member is in slidable contact with inner walls of the at least two matching grooves in sequence; and in the third stroke segment, the shaft sleeve rotates relative to the bump matching member, and the bump of the bump matching member is in slidable contact with an inner wall of a second chute of the two chutes.

11. The rotating shaft assembly according to claim 10, wherein:

the first part of the first shaft passes through the spacer plate, and the first part of the first shaft that passes through the spacer plate includes a slot; and the rotating shaft assembly further comprises a limiting member, the limiting member includes an opening, the limiting member is in contact with the surface of the spacer plate, and the surface of the spacer plate is away from the matching groove, and an edge of the opening of the limiting member is clamped into the slot of the first shaft.

12. The rotating shaft assembly according to claim 8, wherein:

an end part of the first part of the second shaft includes a groove, the groove of the second shaft is located on an inner surface of the channel, and an end part of the first part of the first shaft is inserted into the groove of the second shaft.

13. An electronic device, comprising:

a first part, a second part, and a rotating shaft assembly, wherein:

the rotating shaft assembly comprises a shaft sleeve, a second shaft, and a flexible circuit board, wherein:

the shaft sleeve comprises an inner cavity;

a channel is formed on the second shaft, a first part of the second shaft is located in the inner cavity and is rotatably connected to the shaft sleeve, and a second part of the second shaft is located outside the inner cavity;

the flexible circuit board comprises a first electrical connection end, a mounting part, and a second electrical connection end, the mounting part is located between the first electrical connection end and the second electrical connection end, both the first electrical connection end and the second electrical connection end are located outside the inner cavity, the mounting part comprises a wound part and a laminated part that are connected, the wound part is wound around the first part of the second shaft, the laminated part is in a folded state, and at least a part of the laminated part is accommodated in the channel of the second shaft;

the first part of the electronic device is fixedly connected to an outer side of the shaft sleeve, the second part of the electronic device is fixedly connected to the second part of the second shaft, and the first part of the electronic device is capable of rotating relative to the second part of the electronic device by using the rotating shaft assembly, and is opened relative to the second part of the electronic device to open the electronic device or is closed with the second part of the electronic device to close the electronic device; and the first part of the electronic device has a first host circuit board assembly, the second part of the electronic device has a second host circuit board assembly, a third electrical connection end is electrically connected to the first host circuit board assembly, and a fourth electrical connection end is electrically connected to the second host circuit board assembly.

14. The electronic device according to claim 13, wherein:

the inner cavity of the shaft sleeve comprises an opening that communicates with outside;

the first part of the electronic device comprises a first host housing, an edge of the first host housing has a through hole, the first host housing is fixedly connected to a side that is of the shaft sleeve and that forms the opening, and the through hole of the first host housing corresponds to the opening of the shaft sleeve;

the first host circuit board assembly is fastened to the first host housing, and is located on a first side of the first host housing away from the shaft sleeve;

the rotating shaft assembly comprises a clamping member, the clamping member is provided with a clamping gap, the clamping member is fastened on the outer side of the shaft sleeve and blocks at least a part of an area of the opening of the inner cavity, the clamping gap communicates with the inner cavity, and the clamping member is located between the shaft sleeve and the first host housing;

the flexible circuit board comprises a connection part, the connection part connects the first electrical connection end and the wound part, and the connection part passes through the opening of the inner cavity, the clamping gap, and the through hole of the first host housing; and the through hole of the first host housing is filled with a sealing material.

15. The electronic device according to claim 13, wherein:

the first host circuit board assembly comprises a circuit board, and the circuit board has a ground point and a feed point; and the first part of the electronic device comprises a first host housing, the first host housing is fixedly connected to the outer side of the shaft sleeve, the first host circuit board assembly is fastened to a first side of the first host housing away from the shaft sleeve, the first host housing is electrically connected to both the ground point and the feed point, and the first host housing is used as an antenna of the electronic device.

16. The electronic device according to claim 15, wherein:

the rotating shaft assembly further comprises a shaft contact member, and the shaft contact member is fastened in the shaft sleeve and is in slidable contact with the first part of the second shaft; and the second part of the electronic device comprises a third host housing, the third host housing is fixedly connected to the first part of the second shaft, and the third host housing is used as a second antenna of the electronic device.

17. The electronic device according to claim 16, wherein:

when the electronic device is closed, there is a gap between the first host housing and the third host housing, and the first host housing is coupled to a second host housing.

18. The electronic device according to claim 15, wherein:

the flexible circuit board comprises a grounding portion, and the grounding portion is electrically connected to the first host housing, so that the flexible circuit board is grounded.

19. The electronic device according to claim 13, wherein:

the rotating shaft assembly further comprises a driven member, an elastic member, and a first shaft;

the driven member includes a shaft matching surface and a through hole, the through hole of the driven member penetrates the shaft matching surface, the driven member is located in the inner cavity, the driven member is capable of sliding along a surface of the inner cavity, and the driven member is not capable of rotating relative to the shaft sleeve;

the elastic member is located in the inner cavity, and presses against a surface of the driven member, and the surface of the driven member is away from the shaft matching surface;

the first shaft and the second shaft are respectively located at two opposite ends of the shaft sleeve; a first part of the first shaft is located in the inner cavity and is rotatably connected to the shaft sleeve; the first part of the first shaft passes through the through hole of the driven member, and matches the shaft matching surface of the driven member to form a cam mechanism; and a second part of the first shaft is located outside the inner cavity, and is fixedly connected to the second part of the electronic device; and in a process of switching the electronic device from a closed state to an open state, a rotation stroke of the first part of the electronic device sequentially comprises a first stroke segment, a second stroke segment, and a third stroke segment, wherein in the first stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft, so that the shaft sleeve drives the first part of the electronic device to rotate relative to the second part of the electronic device;

in the second stroke segment, the first part of the electronic device is capable of being driven by an external force to rotate relative to the second part of the electronic device, to drive the shaft sleeve and the driven member to rotate around the first shaft; and in the third stroke segment, the driven member is capable of being driven by the rebound force of the elastic member to move along the first shaft, and the driven member is capable of rotating around the first shaft under the joint action of the cam mechanism and the elastic member, to drive the shaft sleeve to rotate around the first shaft and the second shaft, so that the shaft sleeve drives the first part of the electronic device to rotate relative to the second part of the electronic device.

20. The electronic device according to claim 19, wherein:

the outer side of the shaft sleeve includes a limiting protrusion, and the second part of the electronic device includes a limiting groove; and when the third stroke segment ends, the limiting protrusion abuts against an inner wall of the limiting groove, so that the shaft sleeve and the first part of the electronic device stop rotating, and the first part of the electronic device is opened to a limit position relative to the second part of the electronic device.

21. The electronic device according to claim 13, wherein:

the electronic device comprises an open button; and the open button is mounted on the first part of the electronic device, the open button is configured to form a detachable connection to the second part of the electronic device, a part of the open button is exposed outside the first part of the electronic device, and when the part of the open button exposed outside the first part of the electronic device is pressed, the detachable connection is released; or the open button is mounted on the second part of the electronic device, the open button is configured to form a detachable connection to the first part of the electronic device, a part of the open button is exposed outside the second part of the electronic device, and when the part of the open button exposed outside the second part of the electronic device is pressed, the detachable connection is released.

22. The electronic device according to claim 13, wherein the electronic device comprises a wrist strap, and the wrist strap is connected to two opposite sides of the second part of the electronic device.

23. The electronic device according to claim 13, wherein:

a joint between the wound part and the laminated part is fastened to the second shaft.

24. The electronic device according to claim 13, wherein:

the flexible circuit board comprises a separation bracket, and the separation bracket is fastened between folded layers of the laminated part.

25. The electronic device according to claim 13, wherein:

the inner cavity of the shaft sleeve comprises an opening that communicates with outside;

the rotating shaft assembly comprises a clamping member, the clamping member is provided with a clamping gap, the clamping member is fastened on the outer side of the shaft sleeve and blocks at least a part of an area of the opening of the inner cavity, and the clamping gap communicates with the inner cavity; and the flexible circuit board comprises a connection part, the connection part connects the first electrical connection end and the wound part, and the connection part passes through the opening of the inner cavity and the clamping gap.

26. The electronic device according to claim 25, wherein:

an edge of the connection part forms a limiting portion, and the limiting portion is clamped with an edge of the clamping gap.

27. The electronic device according to claim 13, wherein:

the flexible circuit board comprises a protective layer, and the protective layer is attached to a surface of the laminated part.

28. The electronic device according to claim 13, wherein:

the flexible circuit board comprises a grounding portion, and the grounding portion is configured to be grounded.

29. The electronic device according to claim 13, wherein:

the rotating shaft assembly further comprises a driven member, an elastic member, and a first shaft;

the driven member includes a shaft matching surface and a through hole, the through hole of the driven member penetrates the shaft matching surface, the driven member is located in the inner cavity, the driven member is capable of sliding along a surface of the inner cavity, and the driven member is not capable of rotating relative to the shaft sleeve;

the elastic member is located in the inner cavity, and presses against a surface of the driven member, and the surface of the driven member is away from the shaft matching surface;

the first shaft and the second shaft are respectively located at two opposite ends of the shaft sleeve; a first part of the first shaft is located in the inner cavity and is rotatably connected to the shaft sleeve; the first part of the first shaft passes through the through hole of the driven member, and matches the shaft matching surface of the driven member to form a cam mechanism; and a second part of the first shaft is located outside the inner cavity; and the shaft sleeve is capable of rotating around the first shaft and the second shaft, and a rotation stroke of the shaft sleeve comprises a first stroke segment, a second stroke segment, and a third stroke segment, wherein:

in the first stroke segment, the driven member is capable of being driven by a rebound force of the elastic member to move along the first shaft, and the driven member is capable of rotating around the first shaft under a joint action of the cam mechanism and the elastic member, to drive the shaft sleeve to rotate around the first shaft and the second shaft;

in the second stroke segment, the shaft sleeve is capable of being driven by an external force to rotate around the first shaft and the second shaft, to drive the driven member to rotate around the first shaft; and in the third stroke segment, the driven member is capable of being driven by the rebound force of the elastic member to move along the first shaft, and the driven member is capable of rotating around the first shaft under the joint action of the cam mechanism and the elastic member, to drive the shaft sleeve to rotate around the first shaft and the second shaft.

30. The electronic device according to claim 29, wherein:

the shaft matching surface comprises a first slope, a plane, and a second slope that are sequentially connected, the first slope and the plane form a first obtuse angle, the plane and the second slope form a second obtuse angle, and the first slope, the plane, and the second slope form a two-step ladder;

in the first stroke segment, the first slope is in slidable contact with the first part of the first shaft;

in the second stroke segment, the plane is in slidable contact with the first part of the first shaft; and in the third stroke segment, the second slope is in slidable contact with the first part of the first shaft.

* * * * *